(12) United States Patent
Shinohara et al.

(10) Patent No.: US 9,077,380 B2
(45) Date of Patent: Jul. 7, 2015

(54) DATA PROCESSING DEVICE AND DATA PROCESSING METHOD

(75) Inventors: Yuji Shinohara, Kanagawa (JP); Makiko Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 91 days.

(21) Appl. No.: 14/111,045

(22) PCT Filed: Apr. 19, 2012

(86) PCT No.: PCT/JP2012/060617
§ 371 (c)(1),
(2), (4) Date: Oct. 10, 2013

(87) PCT Pub. No.: WO2012/147623
PCT Pub. Date: Nov. 1, 2012

(65) Prior Publication Data
US 2014/0040707 A1    Feb. 6, 2014

(30) Foreign Application Priority Data

Apr. 28, 2011   (JP) ................. 2011-101799

(51) Int. Cl.
*H03M 13/13* (2006.01)
*H03M 13/11* (2006.01)
(Continued)

(52) U.S. Cl.
CPC ............ *H03M 13/13* (2013.01); *H04L 1/0047* (2013.01); *H04L 1/005* (2013.01); *H04L 1/0057* (2013.01);
(Continued)

(58) Field of Classification Search
CPC ............... H03M 13/1137; H03M 13/1165; H03M 13/1168; H03M 13/13; H03M 13/152; H03M 13/255; H03M 13/2707; H03M 13/271; H03M 13/356; H04L 1/0047; H04L 1/005; H04L 1/0057; H04L 27/34
USPC ................. 714/752, 776, 758, 763, 766, 755; 370/310, 312, 328
See application file for complete search history.

(56) References Cited

U.S. PATENT DOCUMENTS 8,949,691 B2 * 2/2015 Shinohara et al. ............ 714/766
2009/0217129 A1 8/2009 Myung et al.
(Continued)

FOREIGN PATENT DOCUMENTS

EP    2 214 319 A1    8/2010
EP    2 216 908 A1    8/2010
(Continued)

OTHER PUBLICATIONS

U.S. Appl. No. 14/386,830, filed Sep. 22, 2014, Shinohara, et al.
(Continued)

*Primary Examiner* — John J Tabone, Jr.
(74) *Attorney, Agent, or Firm* — Oblon, McClelland, Maier & Neustadt, L.L.P.

(57) ABSTRACT

The present technology relates to a data processing device and a data processing method that enable tolerance against error of data to be improved. In the case in which an LDPC code having a code length of DVB-S.2 of 16200 bits and an encoding rate of 1/3 is modulated by 16 QAM, if a code bit of 4×2 bits and a (i+1)-th bit from a most significant bit of symbol bits of 4×2 bits of two consecutive symbols are set to bits b#i and y#i, a demultiplexer performs interchanging to allocate b0, b1, b2, b3, b4, b5, b6, and b7 to y6, y0, y3, y4, y5, y2, y1, and y7, respectively. The present invention can be applied to a transmission system transmitting an LDPC code or the like.

8 Claims, 159 Drawing Sheets

(51) Int. Cl.
*H03M 13/15* (2006.01)
*H03M 13/25* (2006.01)
*H03M 13/27* (2006.01)
*H03M 13/35* (2006.01)
*H04L 1/00* (2006.01)
*H04L 27/34* (2006.01)

(52) U.S. Cl.
CPC ...... *H03M 13/1137* (2013.01); *H03M 13/1165* (2013.01); *H03M 13/1168* (2013.01); *H03M 13/152* (2013.01); *H03M 13/255* (2013.01); *H03M 13/2707* (2013.01); *H03M 13/271* (2013.01); *H03M 13/356* (2013.01); *H04L 27/34* (2013.01)

(56) References Cited

U.S. PATENT DOCUMENTS

| | | | |
|---|---|---|---|
| 2010/0257426 A1* | 10/2010 | Yokokawa et al. | 714/752 |
| 2010/0269019 A1* | 10/2010 | Yokokawa et al. | 714/763 |
| 2010/0275100 A1* | 10/2010 | Yokokawa et al. | 714/763 |
| 2010/0275101 A1* | 10/2010 | Yokokawa et al. | 714/763 |
| 2010/0281329 A1* | 11/2010 | Yokokawa et al. | 714/752 |
| 2010/0325512 A1* | 12/2010 | Yokokawa et al. | 714/752 |
| 2011/0103502 A1 | 5/2011 | Vitale et al. | |
| 2013/0166992 A1* | 6/2013 | Shinohara et al. | 714/766 |
| 2013/0219431 A1* | 8/2013 | Hong et al. | 725/54 |
| 2013/0227378 A1* | 8/2013 | Yamamoto et al. | 714/776 |
| 2013/0254617 A1* | 9/2013 | Shinohara et al. | 714/752 |
| 2013/0290816 A1* | 10/2013 | Shinohara et al. | 714/776 |
| 2013/0291046 A1* | 10/2013 | Ko et al. | 725/116 |
| 2013/0297992 A1* | 11/2013 | Yamamoto et al. | 714/776 |
| 2013/0305113 A1* | 11/2013 | Shinohara et al. | 714/752 |
| 2013/0308505 A1* | 11/2013 | Hong et al. | 370/310 |
| 2013/0311850 A1* | 11/2013 | Shinohara et al. | 714/758 |
| 2014/0010154 A1* | 1/2014 | Hong et al. | 370/328 |
| 2014/0029502 A1* | 1/2014 | Hong et al. | 370/312 |
| 2014/0040707 A1* | 2/2014 | Shinohara et al. | 714/776 |
| 2014/0047295 A1* | 2/2014 | Shinohara et al. | 714/752 |
| 2014/0082452 A1* | 3/2014 | Shinohara et al. | 714/758 |
| 2014/0153625 A1* | 6/2014 | Vojcic et al. | 375/224 |
| 2014/0380135 A1* | 12/2014 | Hong et al. | 714/776 |
| 2015/0046765 A1* | 2/2015 | Shinohara et al. | 714/752 |
| 2015/0046766 A1* | 2/2015 | Shinohara et al. | 714/752 |

FOREIGN PATENT DOCUMENTS

| | | | |
|---|---|---|---|
| WO | WO 2009/104319 A1 | 8/2009 | |
| WO | WO 2009/107990 A2 | 9/2009 | |
| WO | WO 2009/109830 A1 | 9/2009 | |
| WO | WO 2009/116204 A1 | 9/2009 | |

OTHER PUBLICATIONS

U.S. Appl. No. 14/386,868, filed Sep. 22, 2014, Shinohara, et al.
Extended European Search Report issued Aug. 28, 2014 in Patent Application No. 12776253.2.
"Frame structure channel coding and modulation for a second generation digital terrestrial television broadcasting system (DVB-T2)", Digital Video Broadcasting (DVB), European Standard, ETSI EN 302 755 V1.3.1, XP014069159, Nov. 1, 2011, pp. 1-189.
Hyunkoo Yang, "Simulation results for new 16k-LDPC codes (1/3 & 2/5)", Samsung Electronics, Digital Video Broadcasting (DVB) Organization, XP017834765, Mar. 31, 2011, Slides 1-29.
Giovanni Vitale, et al., "Proposal for new demuxes in case of 16k S2 codes (1/3 & 2/5) + 16QAM", Digital Video Broadcasting (DVB) Organization, XP017834574, Apr. 12, 2011, Slides 1-10.
Makiko Kan, "Comparison between new 16k LDPC codes and S2/T2 16k codes", Sony Corporation, DVB-NGH, XP017834403, Feb. 17, 2011, Slides 1-20.
U.S. Appl. No. 14/112,972, filed Oct. 21, 2013, Shinohara, et al.
International Search Report issued May 29, 2012 in Application No. PCT/JP2012/060617.
"Digital Video Broadcasting (DVB); Frame structure channel coding and modulation for a second generation digital transmission system for cable systems (DVB-C2)", Digital Video Broadcasting, ETSI EN 302 769 V1.2.1, Apr. 2011, pp. 35-37.

* cited by examiner

FIG.3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 \\ 0 & 0 & 0 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG.13

| NOMINAL ENCODING RATES | N=64800 | | | | N=16200 | | | |
|---|---|---|---|---|---|---|---|---|
| | X | KX | K3 | M | X | KX | K3 | M |
| 1/4 | | | | | | | | |
| 1/3 | 12 | 5400 | 10800 | 48600 | | | | |
| 2/5 | 12 | 7200 | 14400 | 43200 | | | | |
| 1/2 | 12 | 8640 | 17280 | 38880 | 12 | 1440 | 1800 | 12960 |
| 3/5 | 8 | 12960 | 19440 | 32400 | 12 | 1800 | 3600 | 10800 |
| 2/3 | 12 | 12960 | 25920 | 25920 | 12 | 2160 | 4320 | 9720 |
| 3/4 | 13 | 4320 | 38880 | 21600 | 8 | 1800 | 5400 | 9000 |
| 4/5 | 12 | 5400 | 43200 | 16200 | 12 | 3240 | 6480 | 6480 |
| 5/6 | 11 | 6480 | 45360 | 12960 | 13 | 1080 | 9720 | 5400 |
| 8/9 | 13 | 5400 | 48600 | 10800 | 12 | 360 | 11520 | 4320 |
| 9/10 | 4 | 7200 | 50400 | 7200 | — | 0 | 12600 | 3600 |
| | 4 | 6480 | 51840 | 6480 | 13 | 360 | 12960 | 2880 |
| | | | | | 4 | 1800 | 12600 | 1800 |
| | | | | | — | — | — | — |

FIG.25

| NUMBER OF NECESSARY MEMORY COLUMNS | b=1 (FIRST TO THIRD INTERCHANGE METHODS) | b=2 (FOURTH INTERCHANGE METHOD) | WRITE START POSITION OF EACH OF mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | |
| 8 | 256QAM | 16QAM | 0 | 0 | 2 | 4 | 4 | 5 | 7 | 7 | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG.26

| NUMBER OF NECESSARY MEMORY COLUMNS | b=1 (FIRST TO THIRD INTERCHANGE METHODS) | b=2 (FOURTH INTERCHANGE METHOD) | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|---|
| 2 | QPSK | | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

WRITE START POSITION OF EACH OF mb COLUMNS

FIG.28

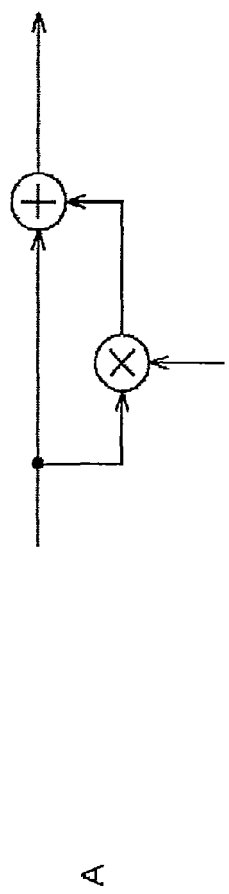
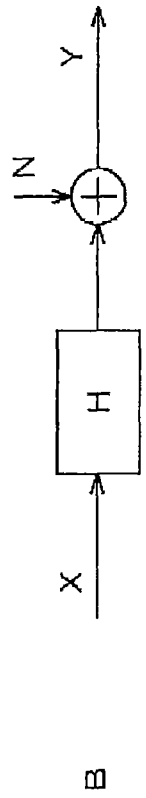

A EQUIVALENT REDUCTION MODEL OF FLUTTER $1/\alpha^2 = D/U$
$f_d$: doppler freq.
$t$: time OFDM SYMBOL IS TRANSMITTED BY CHANNEL
AND SIMULATION IS PERFORMED BY MODEL EXTRACTED
BY ONE CARRIER AFTER FFT AT RECEPTION SIDE.

B

$$Y = \underbrace{\left[1 + \alpha \cdot \exp\left(j2\pi \cdot m \cdot f_d \cdot T_s + j2\pi \cdot \frac{(N_u-1) \cdot f_d \cdot T_u}{N_u}\right) \cdot \frac{\text{sinc}(\pi \cdot f_d \cdot T_u)}{\text{sinc}(\pi \cdot f_d \cdot T_u/N_u)}\right]}_{H} \cdot X + N$$

$$E[N^2] = \underbrace{\alpha^2 \cdot \left\{1 - \left|\frac{\text{sinc}(\pi \cdot f_d \cdot T_u)}{\text{sinc}(\pi \cdot f_d \cdot T_u/N_u)}\right|^2\right\}}_{\text{POWER OF }|C|\text{: APPROXIMATED BY AWGN}}$$

$m$: symbol number
$T_s$: symbol length (sec)
$T_u$: effective symbol length (sec)
$N_u$: number of OFDM carriers

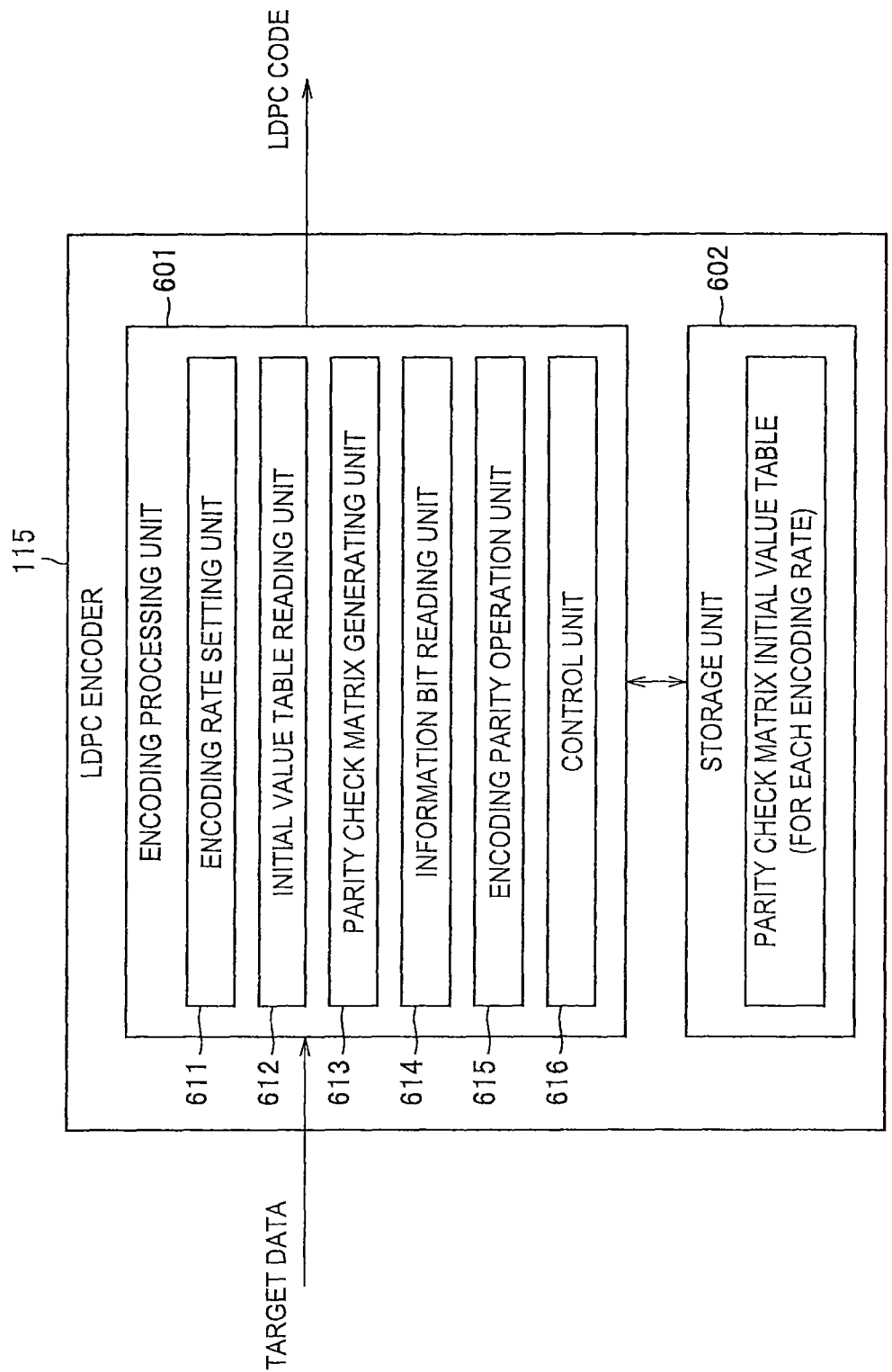

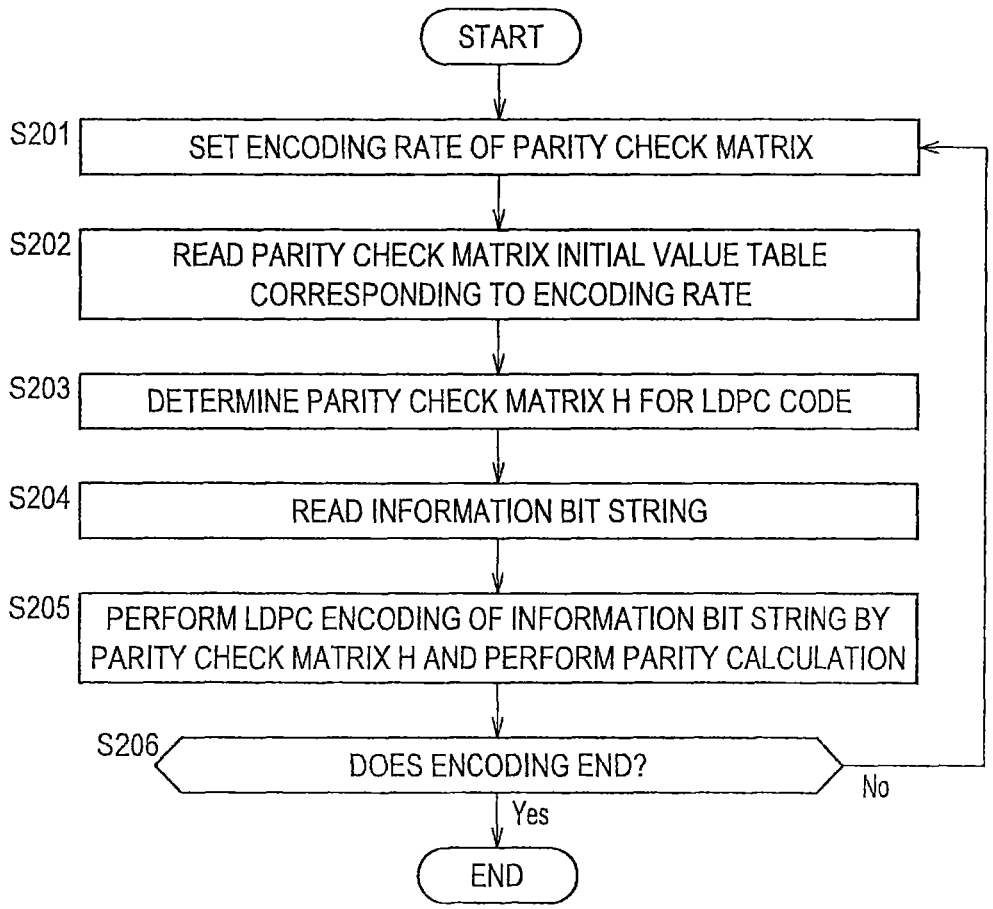

PARITY CHECK MATRIX INITIAL VALUE TABLE WHERE r=2/3, N=16200

PARITY CHECK MATRIX INITIAL VALUE TABLE WHERE r=3/4, N=16200

PARITY CHECK MATRIX INITIAL VALUE TABLE WHERE r=4/5, N=16200

PARITY CHECK MATRIX INITIAL VALUE TABLE WHERE r=5/6, N=16200

FIG.42

PARITY CHECK MATRIX INITIAL VALUE TABLE WHERE r=8/9, N=16200

PARITY CHECK MATRIX INITIAL VALUE TABLE WHERE r=2/3, N=64800

PARITY CHECK MATRIX INITIAL VALUE TABLE WHERE r=3/4, N=64800

PARITY CHECK MATRIX INITIAL VALUE TABLE WHERE r=4/5, N=64800

PARITY CHECK MATRIX INITIAL VALUE TABLE WHERE r=5/6, N=64800

PARITY CHECK MATRIX INITIAL VALUE TABLE WHERE r=8/9, N=64800

PARITY CHECK MATRIX INITIAL VALUE TABLE WHERE r=9/10, N=64800

DISPLAY ROW NUMBER OF PARITY CHECK MATRIX (INFORMATION MATRIX $H_A$) FOR EVERY 360 COLUMNS STARTING FROM FIRST COLUMN
ROW NUMBER OF PARITY CHECK MATRIX

```
 0  2084 1613 1548 1286 1460 3196 4297 2481 3369 3451 4620 2622
 1   122 1516 3449 2880 1407 1847 3799 3529  373  971 4358 3108
 2   259 3399  929 2650  864 3996 3833  107 5287  164 3125 2350
 3   342 3529                          ─ h₃,₅
 4  4198 2147
 5  1880 4836
 6  3864 4910
 7   243 1542
 8  3011 1436
 9  2167 2512
10  4606 1003
11  2835  705
12  3426 2365
13  3848 2474
14  1360 1743
 0   163 2536
 1  2583 1180
 2  1542  509
 3  4418 1005
 4  5212 5117
 5  2155 2922
 6   347 2696
 7   226 4296
 8  1560  487
 9  3926 1640
10   149 2928
11  2364  563
12   635  688
13   231 1684
14  1129 3894
```

↑ ↑ ↑ ↑
1ST COLUMN OF $H_A$
361ST COLUMN OF $H_A$
721ST COLUMN OF $H_A$
1081ST COLUMN OF $H_A$

PARITY CHECK MATRIX INITIAL VALUE TABLE

FIG.84

64QAM r1/3 16K

A CODE BITS

| Gb1 | Gb2 | Gb3 | Gb3 | Gb4 | Gb4 | Gb4 | Gb4 | Gb4 | Gb4 | Gb4 | Gb4 |
|---|---|---|---|---|---|---|---|---|---|---|---|
| b0 | b1 | b2 | b3 | b4 | b5 | b6 | b7 | b8 | b9 | b10 | b11 |

B SYMBOL BITS

| Gy1 | Gy1 | Gy2 | Gy2 | Gy3 | Gy3 | Gy1 | Gy1 | Gy2 | Gy2 | Gy3 | Gy3 |
|---|---|---|---|---|---|---|---|---|---|---|---|
| y0 | y1 | y2 | y3 | y4 | y5 | y6 | y7 | y8 | y9 | y10 | y11 |

FIG.95

64QAM r3/4 16K

A CODE BITS

| Gb1 | Gb2 | Gb2 | Gb2 | Gb2 | Gb2 | Gb3 | Gb4 | Gb4 | Gb4 |
|---|---|---|---|---|---|---|---|---|---|
| b0 | b1 | b2 | b3 | b4 | b5 | b6 | b7 | b8 | b9 | b10 | b11 |

B SYMBOL BITS

| y0 | y1 | y2 | y3 | y4 | y5 | y6 | y7 | y8 | y9 | y10 | y11 |
|---|---|---|---|---|---|---|---|---|---|---|---|
| Gy1 | Gy1 | Gy2 | Gy2 | Gy3 | Gy3 | Gy1 | Gy1 | Gy2 | Gy2 | Gy3 | Gy3 |

FIG. 98

64QAM r4/5 16K

A CODE BITS

| Gb1 | Gb1 | Gb1 | Gb1 | Gb1 | Gb1 | Gb1 | Gb1 | Gb2 | Gb3 | Gb3 |
|---|---|---|---|---|---|---|---|---|---|---|
| b0 | b1 | b2 | b3 | b4 | b5 | b6 | b7 | b8 | b9 | b10 b11 |

B SYMBOL BITS

| y0 | y1 | y2 | y3 | y4 | y5 | y6 | y7 | y8 | y9 | y10 y11 |
|---|---|---|---|---|---|---|---|---|---|---|
| Gy1 | Gy1 | Gy2 | Gy3 | Gy3 | Gy3 | Gy1 | Gy1 | Gy2 | Gy2 | Gy3 Gy3 |

FIG.101

64QAM r5/6 16K

A CODE BITS

B SYMBOL BITS

FIG.156

DATA PROCESSING DEVICE AND DATA PROCESSING METHOD

TECHNICAL FIELD

The present invention relates to a data processing device and a data processing method and particularly, to a data processing device and a data processing method that enable tolerance against error of data to be improved.

BACKGROUND ART

An LDPC (Low Density Parity Check) code has the high error correction capability and has been recently adopted widely to a transmission system including satellite digital broadcasting such as DVB (Digital Video Broadcasting)-S.2 performed in Europe (for example, refer to Non-Patent Literature 1). In addition, adopting of the LDPC code to next-generation terrestrial digital broadcasting has been examined.

From a recent study, it is known that performance near a Shannon limit is obtained from the LDPC code when a code length increases, similar to a turbo code. Because the LDPC code has a property that a shortest distance is proportional to the code length, the LDPC code has advantages of a block error probability characteristic being superior and a so-called error floor phenomenon observed in a decoding characteristic of the turbo code being rarely generated, as characteristics thereof.

Hereinafter, the LDPC code will be specifically described. The LDPC code is a linear code and it is not necessary for the LDPC code to be a binary code. However, in this case, it is assumed that the LDPC code is the binary code.

A maximum characteristic of the LDPC code is that a parity check matrix defining the LDPC code is sparse. In this case, the sparse matrix is a matrix in which the number of "1" of elements of the matrix is very small (a matrix in which most elements are 0).

FIG. 1 illustrates an example of a parity check matrix H of the LDPC code.

In the parity check matrix H of FIG. 1, a weight of each column (the column weight) (the number of "1") becomes "3" and a weight of each row (the row weight) becomes "6".

In encoding using the LDPC code (LDPC encoding), for example, a generation matrix G is generated on the basis of the parity check matrix H and the generation matrix G is multiplied by binary information bits, so that a code word (LDPC code) is generated.

Specifically, an encoding device that performs the LDPC encoding first calculates the generation matrix G in which an expression $GH^T=0$ is realized, between a transposed matrix $H^T$ of the parity check matrix H and the generation matrix G. In this case, when the generation matrix G is a K×N matrix, the encoding device multiplies the generation matrix G with a bit string (vector u) of information bits including K bits and generates a code word c (=uG) including N bits. The code word (LDPC code) that is generated by the encoding device is received at a reception side through a predetermined communication path.

The LDPC code can be decoded by an algorithm called probabilistic decoding suggested by Gallager, that is, a message passing algorithm using belief propagation on a so-called Tanner graph, including a variable node (also referred to as a message node) and a check node. Hereinafter, the variable node and the check node are appropriately referred to as nodes simply.

FIG. 2 illustrates a sequence of decoding of the LDPC code.

Hereinafter, a real value that is obtained by representing the likelihood of "0" of a value of an i-th code bit of the LDPC code (one code word) received by the reception side by a log likelihood ratio is appropriately referred to as a reception value $u_{0i}$. In addition, a message output from the check node is referred to as $u_j$ and a message output from the variable node is referred to as $v_i$.

First, in decoding of the LDPC code, as illustrated in FIG. 2, in step S11, the LDPC code is received, the message (check node message) $u_j$ is initialized to "0", and a variable k taking an integer as a counter of repetition processing is initialized to "0", and the processing proceeds to step S12. In step S12, the message (variable node message) $v_i$ is calculated by performing an operation (variable node operation) represented by an expression (1), on the basis of the reception value $u_{0i}$ obtained by receiving the LDPC code, and the message $u_j$ is calculated by performing an operation (check node operation) represented by an expression (2), on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

In this case, $d_v$ and $d_c$ in the expressions (1) and (2) represent parameters that show numbers of "1" of the parity check matrix H in a longitudinal direction (column) and a transverse direction (row), respectively, and can be arbitrarily set, respectively. For example, in the case of a (3, 6) code, $d_v$ becomes 3 and $d_c$ becomes 6.

In the variable node operation of the expression (1) and the check node operation of the expression (2), because a message input from an edge (line coupling the variable node and the check node) for outputting the message is not an operation target, an operation range becomes 1 to $d_v-1$ or 1 to $d_c-1$. The check node operation of the expression (2) is performed actually by previously making a table of a function R ($v_1$, $v_2$) represented by an expression (3) defined by one output with respect to two inputs $v_1$ and $v_2$ and using the table consecutively (recursively), as represented by an expression (4).

[Math. 3]

$$x = 2\tanh^{-1}\{\tan h(v_1/2)\tan h(v_2/2)\} = R(v_1, v_2) \tag{3}$$

[Math. 4]

$$u_j = R(v_1, R(v_2, R(v_3, \ldots R(v_{d_c-2}, V_{d_c-1})))) \tag{4}$$

In step S12, the variable k is incremented by "1" and the processing proceeds to step S13. In step S13, it is determined whether the variable k is more than the predetermined repetition decoding number of times C. When it is determined in step S13 that the variable k is not more than C, the processing returns to step S12 and the same processing is repeated hereinafter.

When it is determined in step S13 that the variable k is more than C, the processing proceeds to step S14, the message $v_i$ that corresponds to a decoding result to be finally output is calculated by performing an operation represented by an expression (5) and is output, and the decoding processing of the LDPC code ends.

[Math. 5]

$$v_i = u_{0i} + \sum_{j=1}^{d_v} u_j \qquad (5)$$

In this case, the operation of the expression (5) is performed using messages $u_j$ from all edges connected to the variable node, different from the variable node operation of the expression (1).

FIG. 3 illustrates an example of the parity check matrix H of the (3, 6) LDPC code (an encoding rate of 1/2 and a code length of 12).

In the parity check matrix H of FIG. 3, a weight of a column is set to 3 and a weight of a row is set to 6, similar to FIG. 1.

FIG. 4 illustrates a Tanner graph of the parity check matrix H of FIG. 3.

In FIG. 4, the check node is represented by "+" and the variable node is represented by "=". The check node and the variable node correspond to the row and the column of the parity check matrix H. A line that couples the check node and the variable node is the edge and corresponds to "1" of elements of the parity check matrix.

That is, when an element of a j-th row and an i-th column of the parity check matrix is 1, in FIG. 4, an i-th variable node (node of "=") from the upper side and a j-th check node (node of "+") from the upper side are connected by the edge. The edge shows that a code bit corresponding to the variable node has a restriction condition corresponding to the check node.

In a sum product algorithm that is a decoding method of the LDPC code, the variable node operation and the check node operation are repetitively performed.

FIG. 5 illustrates the variable node operation that is performed by the variable node.

In the variable node, the message $v_i$ that corresponds to the edge for calculation is calculated by the variable node operation of the expression (1) using messages $u_1$ and $u_2$ from the remaining edges connected to the variable node and the reception value $u_{0i}$. The messages that correspond to the other edges are also calculated by the same method.

FIG. 6 illustrates the check node operation that is performed by the check node.

In this case, the check node operation of the expression (2) can be rewritten by an expression (6) using a relation of an expression $a \times b = \exp\{\ln(|a|) + \ln(|b|)\} \times \text{sign}(a) \times \text{sign}(b)$. However, $\text{sign}(x)$ is 1 in the case of $x \geq 0$ and is $-1$ in the case of $x < 0$.

[Math. 6]

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right] \end{aligned} \qquad (6)$$

In $x \geq 0$, if a function $\phi(x)$ is defined as an expression $\phi(x) = \ln(\tan h(x/2))$, an expression $\phi^{-1}(x) = 2\tan h^{-1}(e^{-x})$ is realized. For this reason, the expression (6) can be changed to an expression (7).

[Math. 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

In the check node, the check node operation of the expression (2) is performed according to the expression (7).

That is, in the check node, as illustrated in FIG. 6, the message $u_j$ that corresponds to the edge for calculation is calculated by the check node operation of the expression (7) using messages $v_1, v_2, v_3, v_4,$ and $v_5$ from the remaining edges connected to the check node. The messages that correspond to the other edges are also calculated by the same method.

The function $\phi(x)$ of the expression (7) can be represented as $\phi(x) = \ln((e^x+1)/(e^x-1))$ and $\phi(x) = \phi^{-1}(x)$ is satisfied in $x > 0$. When the functions $\phi(x)$ and $\phi^{-1}(x)$ are mounted to hardware, the functions $\phi(x)$ and $\phi^{-1}(x)$ may be mounted using an LUT (Look Up Table). However, both the functions $\phi(x)$ and $\phi^{-1}(x)$ become the same LUT.

CITATION LIST

Non-Patent Literature

Non-Patent Literature 1: DVB-S.2: ETSI EN 302 307 V1.1.2 (2006-06)

SUMMARY OF INVENTION

Technical Problem

The LDPC code is adopted by DVB-S.2 to be a standard of satellite digital broadcasting or DVB-T.2 to be a standard of next-generation territorial digital broadcasting. In addition, adoption of the LDPC code in DVB-C.2 to be a standard of next-generation CATV (Cable Television) digital broadcasting is scheduled.

In digital broadcasting based on a DVB standard such as the DVB-S.2, the LDPC code becomes a symbol (symbolized) of orthogonal modulation (digital modulation) such as QPSK (Quadrature Phase Shift Keying) and the symbol is mapped to a signal point and is transmitted.

In the symbolization of the LDPC code, interchanging of code bits of the LDPC code is performed in a unit of code bits of two bits or more and the interchanged code bits become bits of the symbol.

As a method of interchanging the code bits to symbolize the LDPC code, various methods are suggested. For example, the interchange method is defined in the DVB-T.2.

Meanwhile, the DVB-T.2 is a standard of digital broadcasting exclusively used for a fixed terminal such as a television receiver installed in the home and may not be appropriate in digital broadcasting exclusively used for a portable terminal.

That is, as compared with the fixed terminal, in the portable terminal, it is necessary to decrease a circuit scale and decrease consumption power. Therefore, in the digital broadcasting exclusively used for the portable terminal, in order to alleviate load necessary for processing such as decoding of the LDPC code in the portable terminal, the repetition number of times (repetition decoding number of times C) of decoding of the LDPC code or the code length of the LDPC code may be restricted more than the case of the digital broadcasting exclusively used for the fixed terminal.

However, it is necessary to maintain tolerance against error to some extent, under the restriction.

The present invention has been made in view of the above circumstances and enables tolerance against error of data such as an LDPC code to be improved.

Solution to Problem

According to a first embodiment of the present technology, there is provided a data processing device or a data processing method including an encoding unit or an encoding step that performs LDPC encoding in which a code length is 16200 bits and an encoding rate is 1/3, based on a parity check matrix of an LDPC code, and an interchanging unit or an interchanging step that interchanges code bits of the encoded LDPC code with symbol bits of a symbol corresponding to any one of 16 signal points determined by 16 QAM. The encoded LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267. When code bits of 8 bits stored in eight storage units having storage capacities of 16200/8 bits and read from the respective storage units one bit by one bit are allocated to two consecutive symbols, the interchanging unit or the interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y6, y0, y3, y4, y5, y2, y1, and y7, respectively.

According to a second embodiment of the present technology, there is provided a data processing device or a data processing method including an encoding unit or an encoding step that performs LDPC encoding in which a code length is 16200 bits and an encoding rate is 2/5, based on a parity check matrix of an LDPC code, and an interchanging unit or an interchanging step that interchanges code bits of the encoded LDPC code with symbol bits of a symbol corresponding to any one of 16 signal points determined by 16 QAM. The encoded LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660. When code bits of 8 bits stored in eight storage units having storage capacities of 16200/8 bits and read from the respective storage units one bit by one bit are allocated to two consecutive symbols, the interchanging unit or the interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y7, y5 y4, y0, y3, y1, y2, and y6, respectively.

According to a third embodiment of the present technology, there is provided a data processing device or a data processing method including a reverse interchanging unit or a reverse interchanging step that interchanges symbol bits of a symbol corresponding to any one of 16 signal points determined by 16 QAM with code bits of an LDPC code in which a code length is 16200 bits and an encoding rate is 1/3, and a decoding unit or a decoding step that decodes the LDPC code interchanged by the reverse interchanging unit or the reverse interchanging step, based on a parity check matrix of the LDPC code. When code bits of 8 bits stored in eight storage units having storage capacities of 16200/8 bits and read from the respective storage units one bit by one bit are allocated to two consecutive symbols, the reverse interchanging unit or the reverse interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y6, y0, y3, y4, y5, y2, y1, and y7 with bits b0, b1, b2, b3, b4, b5, b6, and b7, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575

3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267.

According to a fourth embodiment of the present technology, there is provided a data processing device or a data processing method including a reverse interchanging unit or a reverse interchanging step that interchanges symbol bits of a symbol corresponding to any one of 16 signal points determined by 16 QAM with code bits of an LDPC code in which a code length is 16200 bits and an encoding rate is 2/5, and a decoding unit or a decoding step that decodes the LDPC code interchanged by the reverse interchanging unit or the reverse interchanging step, based on a parity check matrix of the LDPC code. When code bits of 8 bits stored in eight storage units having storage capacities of 16200/8 bits and read from the respective storage units one bit by one bit are allocated to two consecutive symbols, the reverse interchanging unit or the reverse interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y7, y5, y4, y0, y3, y1, y2, and y6 with bits b0, b1, b2, b3, b4, b5, b6, and b7, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

According to the first embodiment of the present technology, LDPC encoding in which a code length is 16200 bits and an encoding rate is 1/3 is performed based on a parity check matrix of an LDPC code, and code bits of the encoded LDPC code are interchanged with symbol bits of a symbol corresponding to any one of 16 signal points determined by 16 QAM. The encoded LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267. When code bits of 8 bits stored in eight storage units having storage capacities of 16200/8 bits and read from the respective storage units one bit by one bit are allocated to two consecutive symbols, the interchanging sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y6, y0, y3, y4, y5, y2, y1, and y7, respectively.

According to the second embodiment of the present technology, LDPC encoding in which a code length is 16200 bits and an encoding rate is 2/5 is performed based on a parity check matrix of an LDPC code, and code bits of the encoded LDPC code are interchanged with symbol bits of a symbol corresponding to any one of 16 signal points determined by 16 QAM. The encoded LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254

4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660. When code bits of 8 bits stored in eight storage units having storage capacities of 16200/8 bits and read from the respective storage units one bit by one bit are allocated to two consecutive symbols, the interchanging sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y7, y5 y4, y0, y3, y1, y2, and y6, respectively.

According to the third embodiment of the present technology, symbol bits of a symbol corresponding to any one of 16 signal points determined by 16 QAM are interchanged with code bits of an LDPC code in which a code length is 16200 bits and an encoding rate is 1/3, and the LDPC code interchanged is decoded, based on a parity check matrix of the LDPC code. When code bits of 8 bits stored in eight storage units having storage capacities of 16200/8 bits and read from the respective storage units one bit by one bit are allocated to two consecutive symbols, the reverse interchanging sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y6, y0, y3, y4, y5, y2, y1, and y7 with bits b0, b1, b2, b3, b4, b5, b6, and b7, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267.

According to the fourth embodiment of the present technology, symbol bits of a symbol corresponding to any one of 16 signal points determined by 16 QAM are interchanged with code bits of an LDPC code in which a code length is 16200 bits and an encoding rate is 2/5, and the LDPC code interchanged is decoded based on a parity check matrix of the LDPC code. When code bits of 8 bits stored in eight storage units having storage capacities of 16200/8 bits and read from the respective storage units one bit by one bit are allocated to two consecutive symbols, the reverse interchanging sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y7, y5, y4, y0, y3, y1, y2, and y6 with bits b0, b1, b2, b3, b4, b5, b6, and b7, respectively. The LDPC code includes information bits and parity bits. The parity check matrix includes an information matrix portion corresponding to the information bits and a parity matrix portion corresponding to the parity bits. The information matrix portion is represented by a parity check matrix initial value table. The parity check matrix initial value table is a table that represents positions of elements of 1 of the information matrix portion for every 360 columns and is configured as follows,
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

The data processing device may be an independent device and may be an internal block constituting one device.

Advantageous Effects of Invention

According to the present invention, tolerance against error can be improved.

BRIEF DESCRIPTION OF DRAWINGS

FIG. 3 is an illustration of an example of a parity check matrix of an LDPC code.

FIG. 13 is an illustration of a parity check matrix of an LDPC code defined in a standard of DVB-S.2.

FIG. 25 is an illustration of a column number of a memory 31 necessary for a column twist interleave and an address of a write start position.

FIG. 26 is an illustration of a column number of a memory 31 necessary for a column twist interleave and an address of a write start position.

FIG. 28 is an illustration of a model of a communication path adopted by simulation.

FIG. 31 is a block diagram illustrating a configuration example of an LDPC encoder 115.

FIG. 32 is a flowchart illustrating processing of an LDPC encoder 115.

FIG. 33 is an illustration of an example of a parity check matrix initial value table in which an encoding rate is 1/4 and a code length is 16200.

FIG. 34 is an illustration of an example of a parity check matrix initial value table in which an encoding rate is 1/3 and a code length is 16200.

FIG. 35 is an illustration of an example of a parity check matrix initial value table in which an encoding rate is 2/5 and a code length is 16200.

FIG. 36 is an illustration of an example of a parity check matrix initial value table in which an encoding rate is 1/2 and a code length is 16200.

FIG. 37 is an illustration of an example of a parity check matrix initial value table in which an encoding rate is 3/5 and a code length is 16200.

FIG. 38 is an illustration of an example of a parity check matrix initial value table in which an encoding rate is 2/3 and a code length is 16200.

FIG. 39 is an illustration of an example of a parity check matrix initial value table in which an encoding rate is 3/4 and a code length is 16200.

FIG. 40 is an illustration of an example of a parity check matrix initial value table in which an encoding rate is 4/5 and a code length is 16200.

FIG. 41 is an illustration of an example of a parity check matrix initial value table in which an encoding rate is 5/6 and a code length is 16200.

FIG. 42 is an illustration of an example of a parity check matrix initial value table in which an encoding rate is 8/9 and a code length is 16200.

FIG. 43 is an illustration of an example of a parity check matrix initial value table in which an encoding rate is 1/4 and a code length is 64800.

FIG. 44 is an illustration of an example of a parity check matrix initial value table in which an encoding rate is 1/4 and a code length is 64800.

FIG. 45 is an illustration of an example of a parity check matrix initial value table in which an encoding rate is 1/3 and a code length is 64800.

FIG. 46 is an illustration of an example of a parity check matrix initial value table in which an encoding rate is 1/3 and a code length is 64800.

FIG. 47 is an illustration of an example of a parity check matrix initial value table in which an encoding rate is 2/5 and a code length is 64800.

FIG. 48 is an illustration of an example of a parity check matrix initial value table in which an encoding rate is 2/5 and a code length is 64800.

FIG. 49 is an illustration of an example of a parity check matrix initial value table in which an encoding rate is 1/2 and a code length is 64800.

FIG. 50 is an illustration of an example of a parity check matrix initial value table in which an encoding rate is 1/2 and a code length is 64800.

FIG. 51 is an illustration of an example of a parity check matrix initial value table in which an encoding rate is 1/2 and a code length is 64800.

FIG. 52 is an illustration of an example of a parity check matrix initial value table in which an encoding rate is 3/5 and a code length is 64800.

FIG. 53 is an illustration of an example of a parity check matrix initial value table in which an encoding rate is 3/5 and a code length is 64800.

FIG. 54 is an illustration of an example of a parity check matrix initial value table in which an encoding rate is 3/5 and a code length is 64800.

FIG. 55 is an illustration of an example of a parity check matrix initial value table in which an encoding rate is 2/3 and a code length is 64800.

FIG. 56 is an illustration of an example of a parity check matrix initial value table in which an encoding rate is 2/3 and a code length is 64800.

FIG. 57 is an illustration of an example of a parity check matrix initial value table in which an encoding rate is 2/3 and a code length is 64800.

FIG. 58 is an illustration of an example of a parity check matrix initial value table in which an encoding rate is 3/4 and a code length is 64800.

FIG. 59 is an illustration of an example of a parity check matrix initial value table in which an encoding rate is 3/4 and a code length is 64800.

FIG. 60 is an illustration of an example of a parity check matrix initial value table in which an encoding rate is 3/4 and a code length is 64800.

FIG. 61 is an illustration of an example of a parity check matrix initial value table in which an encoding rate is 3/4 and a code length is 64800.

FIG. 62 is an illustration of an example of a parity check matrix initial value table in which an encoding rate is 4/5 and a code length is 64800.

FIG. 63 is an illustration of an example of a parity check matrix initial value table in which an encoding rate is 4/5 and a code length is 64800.

FIG. 64 is an illustration of an example of a parity check matrix initial value table in which an encoding rate is 4/5 and a code length is 64800.

FIG. 65 is an illustration of an example of a parity check matrix initial value table in which an encoding rate is 4/54 and a code length is 64800.

FIG. 66 is an illustration of an example of a parity check matrix initial value table in which an encoding rate is 5/6 and a code length is 64800.

FIG. 67 is an illustration of an example of a parity check matrix initial value table in which an encoding rate is 5/6 and a code length is 64800.

FIG. 68 is an illustration of an example of a parity check matrix initial value table in which an encoding rate is 5/6 and a code length is 64800.

FIG. 69 is an illustration of an example of a parity check matrix initial value table in which an encoding rate is 5/6 and a code length is 64800.

FIG. 70 is an illustration of an example of a parity check matrix initial value table in which an encoding rate is 8/9 and a code length is 64800.

FIG. 71 is an illustration of an example of a parity check matrix initial value table in which an encoding rate is 8/9 and a code length is 64800.

FIG. 72 is an illustration of an example of a parity check matrix initial value table in which an encoding rate is 8/9 and a code length is 64800.

FIG. 73 is an illustration of an example of a parity check matrix initial value table in which an encoding rate is 8/9 and a code length is 64800.

FIG. 74 is an illustration of an example of a parity check matrix initial value table in which an encoding rate is 9/10 and a code length is 64800.

FIG. 75 is an illustration of an example of a parity check matrix initial value table in which an encoding rate is 9/10 and a code length is 64800.

FIG. 76 is an illustration of an example of a parity check matrix initial value table in which an encoding rate is 9/10 and a code length is 64800.

FIG. 77 is an illustration of an example of a parity check matrix initial value table in which an encoding rate is 9/10 and a code length is 64800.

FIG. 78 is an illustration of a method of calculating a parity check matrix H from a parity check matrix initial value table.

FIG. 84 is an illustration of a code bit group and a symbol bit group when an LDPC code having a code length of 16 k and an encoding rate of 1/3 is modulated by 64 QAM and a multiple b is 2.

FIG. 95 is an illustration of a code bit group and a symbol bit group when an LDPC code having a code length of 16 k and an encoding rate of 3/4 is modulated by 64 QAM and a multiple b is 2.

FIG. 98 is an illustration of a code bit group and a symbol bit group when an LDPC code having a code length of 16 k and an encoding rate of 4/5 is modulated by 64 QAM and a multiple b is 2.

FIG. 101 is an illustration of a code bit group and a symbol bit group when an LDPC code having a code length of 16 k and an encoding rate of 5/6 is modulated by 64 QAM and a multiple b is 2.

FIG. 120 is an illustration of a code bit group and a symbol bit group when an LDPC code having a code length of 16 k and an encoding rate of 2/3 is modulated by 16 QAM and a multiple b is 2.

FIG. 121 is an illustration of an allocation rule when an LDPC code having a code length of 16 k and an encoding rate of 2/3 is modulated by 16 QAM and a multiple b is 2.

FIG. 122 is an illustration of interchange of code bits according to an allocation rule when an LDPC code having a code length of 16 k and an encoding rate of 2/3 is modulated by 16 QAM and a multiple b is 2.

FIG. 123 is an illustration of a code bit group and a symbol bit group when an LDPC code having a code length of 16 k and an encoding rate of 3/4 is modulated by 16 QAM and a multiple b is 2.

FIG. 124 is an illustration of an allocation rule when an LDPC code having a code length of 16 k and an encoding rate of 3/4 is modulated by 16 QAM and a multiple b is 2.

FIG. 125 is an illustration of interchange of code bits according to an allocation rule when an LDPC code having a code length of 16 k and an encoding rate of 3/4 is modulated by 16 QAM and a multiple b is 2.

FIG. 126 is an illustration of a code bit group and a symbol bit group when an LDPC code having a code length of 16 k and an encoding rate of 4/5 is modulated by 16 QAM and a multiple b is 2.

FIG. 127 is an illustration of an allocation rule when an LDPC code having a code length of 16 k and an encoding rate of 4/5 is modulated by 16 QAM and a multiple b is 2.

FIG. 128 is an illustration of interchange of code bits according to an allocation rule when an LDPC code having a code length of 16 k and an encoding rate of 4/5 is modulated by 16 QAM and a multiple b is 2.

FIG. 129 is an illustration of a code bit group and a symbol bit group when an LDPC code having a code length of 16 k and an encoding rate of 5/6 is modulated by 16 QAM and a multiple b is 2.

FIG. 130 is an illustration of an allocation rule when an LDPC code having a code length of 16 k and an encoding rate of 5/6 is modulated by 16 QAM and a multiple b is 2.

FIG. 131 is an illustration of interchange of code bits according to an allocation rule when an LDPC code having a code length of 16 k and an encoding rate of 5/6 is modulated by 16 QAM and a multiple b is 2.

Figure 132:
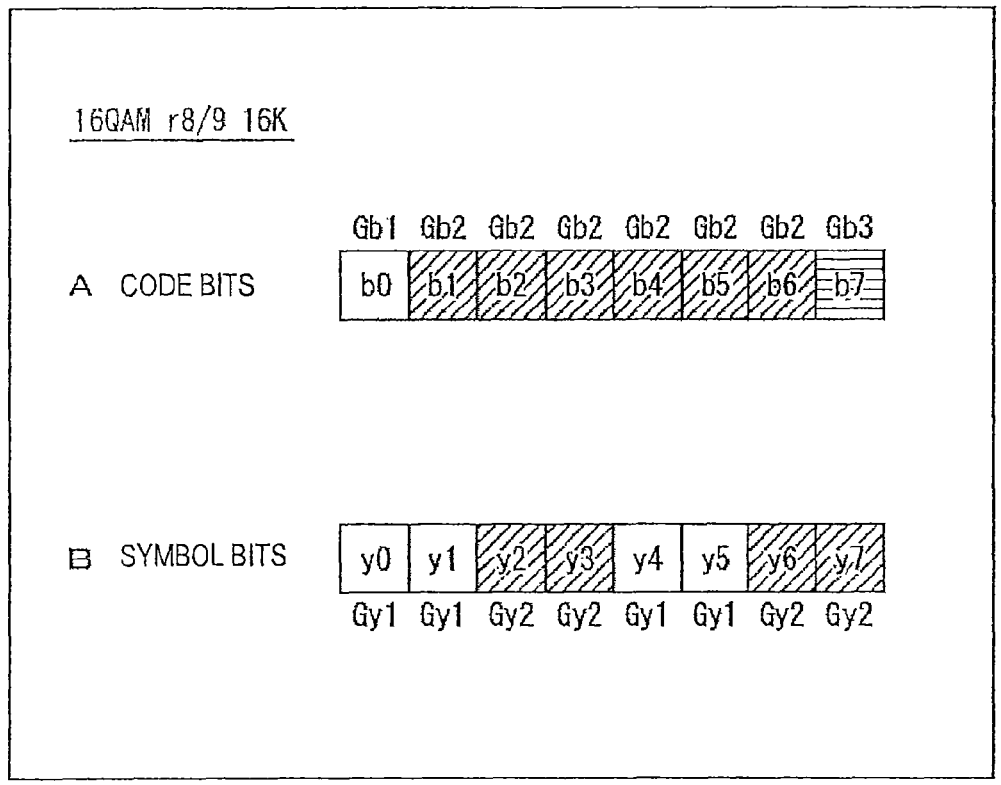

FIG. 132 is an illustration of a code bit group and a symbol bit group when an LDPC code having a code length of 16 k and an encoding rate of 8/9 is modulated by 16 QAM and a multiple b is 2.

Figure 133:
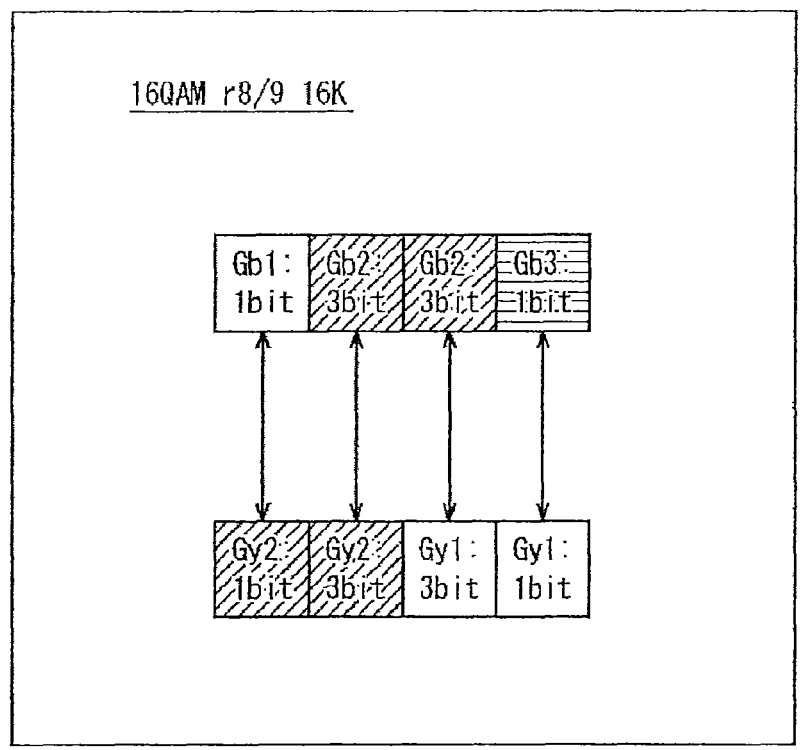

FIG. 133 is an illustration of an allocation rule when an LDPC code having a code length of 16 k and an encoding rate of 8/9 is modulated by 16 QAM and a multiple b is 2.

Figure 134:
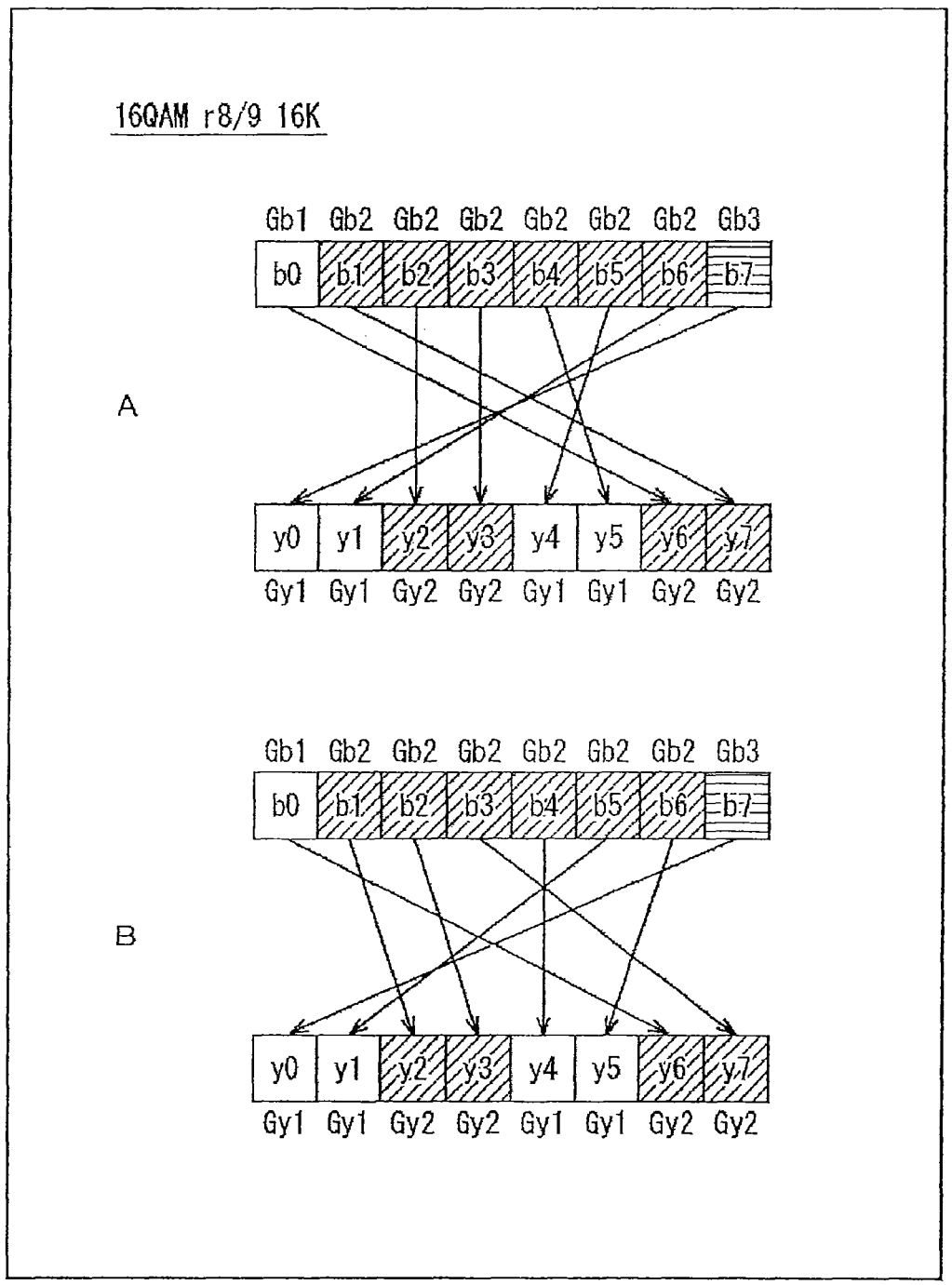

FIG. 134 is an illustration of interchange of code bits according to an allocation rule when an LDPC code having a code length of 16 k and an encoding rate of 8/9 is modulated by 16 QAM and a multiple b is 2.

Figure 135:
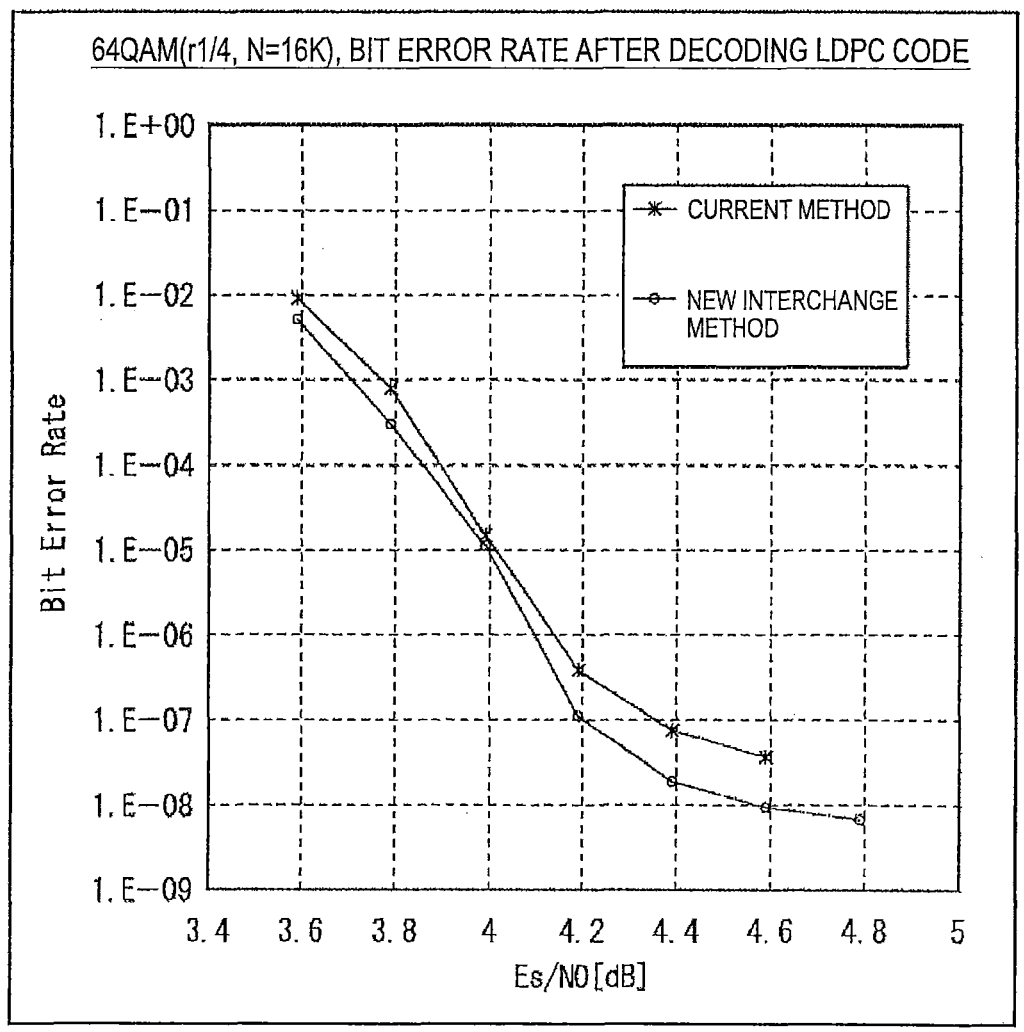

FIG. 135 is an illustration of results of simulation of a BER when an LDPC code having a code length of 16 k and an encoding rate of 1/4 is modulated by 64 QAM and a multiple b is 2.

Figure 136:
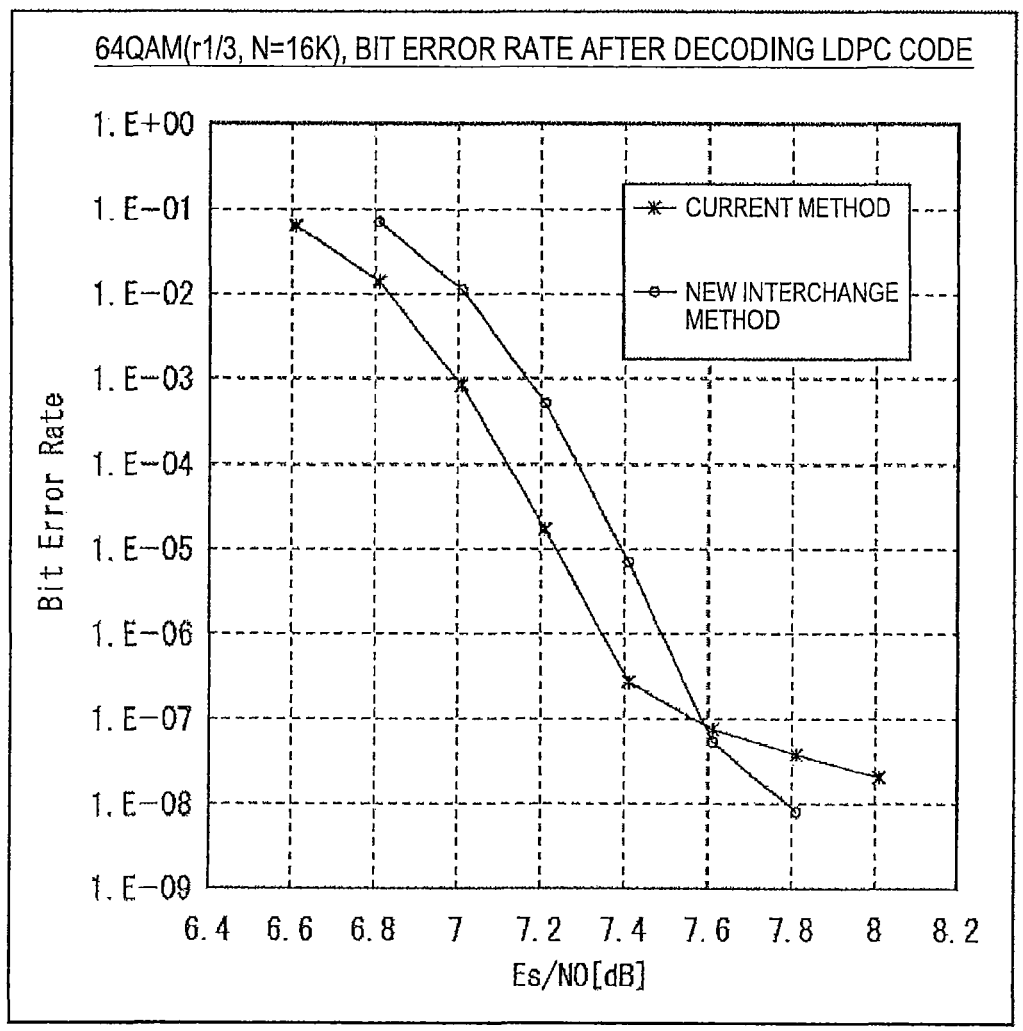

FIG. 136 is an illustration of results of simulation of a BER when an LDPC code having a code length of 16 k and an encoding rate of 1/3 is modulated by 64 QAM and a multiple b is 2.

Figure 137:
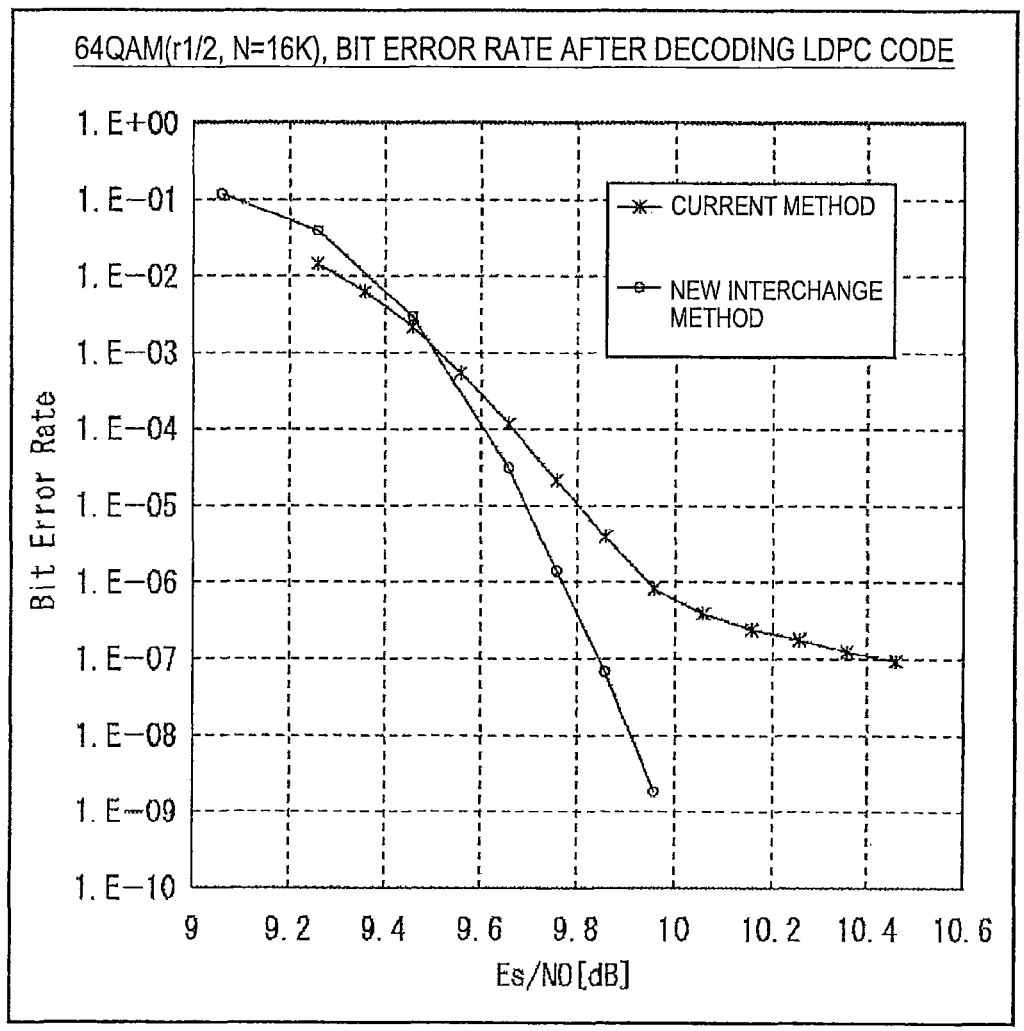

FIG. 137 is an illustration of results of simulation of a BER when an LDPC code having a code length of 16 k and an encoding rate of 1/2 is modulated by 64 QAM and a multiple b is 2.

Figure 138:
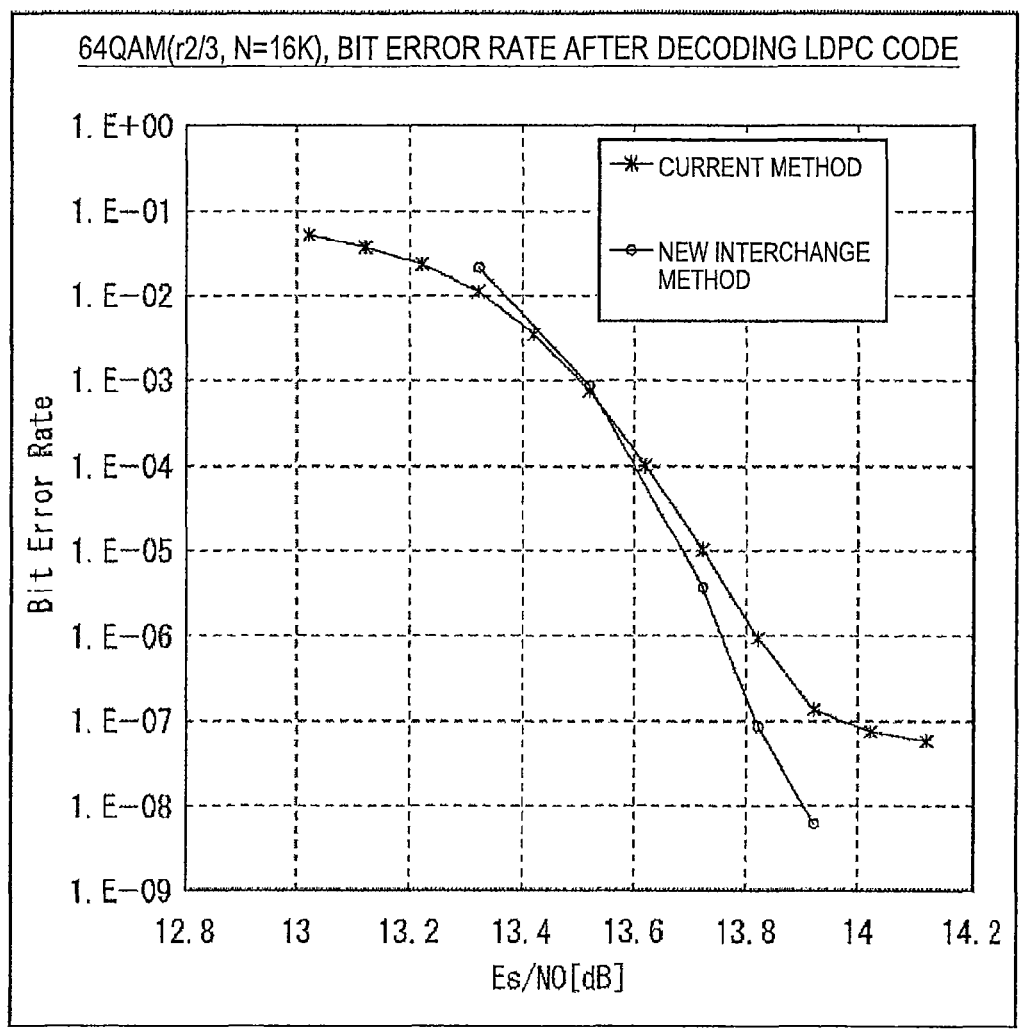

FIG. 138 is an illustration of results of simulation of a BER when an LDPC code having a code length of 16 k and an encoding rate of 2/3 is modulated by 64 QAM and a multiple b is 2.

Figure 139:
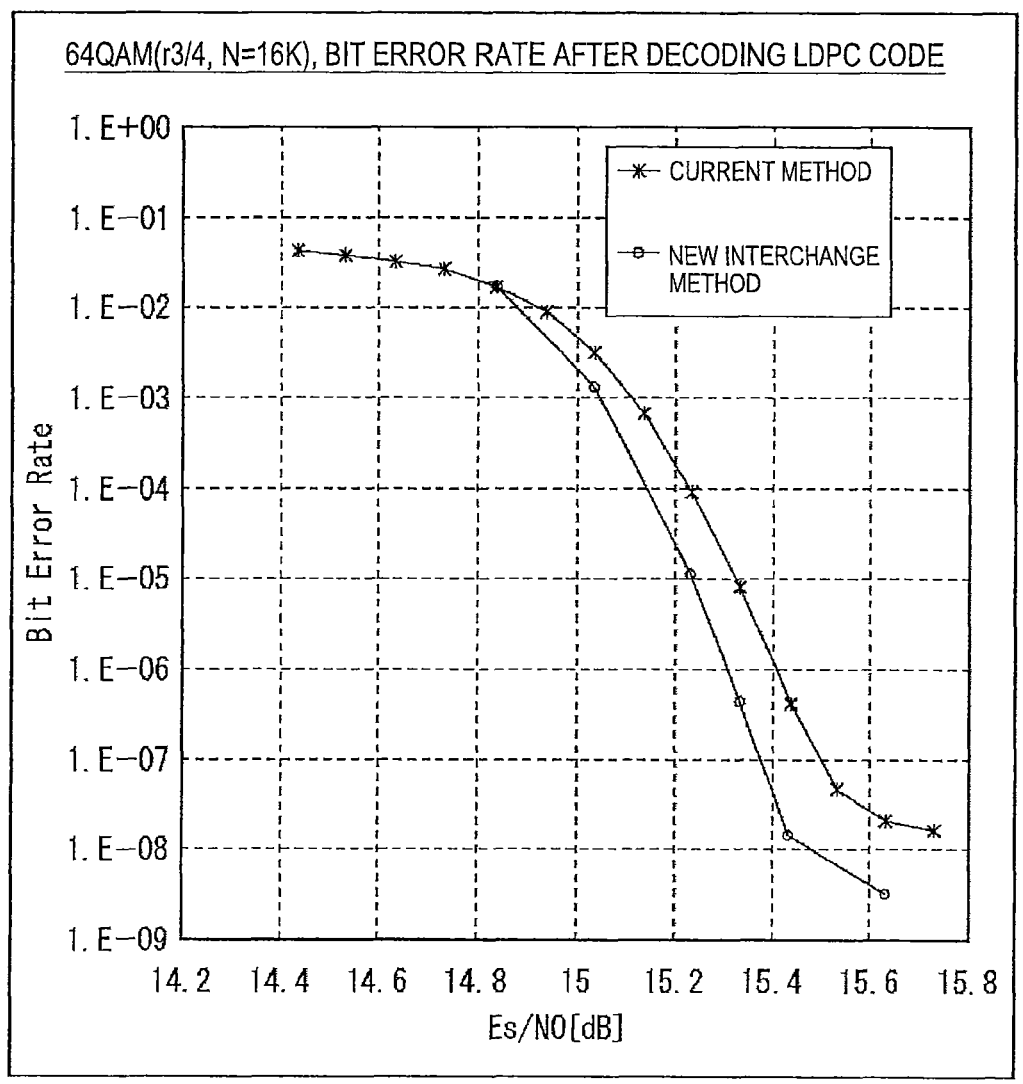

FIG. 139 is an illustration of results of simulation of a BER when an LDPC code having a code length of 16 k and an encoding rate of 3/4 is modulated by 64 QAM and a multiple b is 2.

Figure 140:
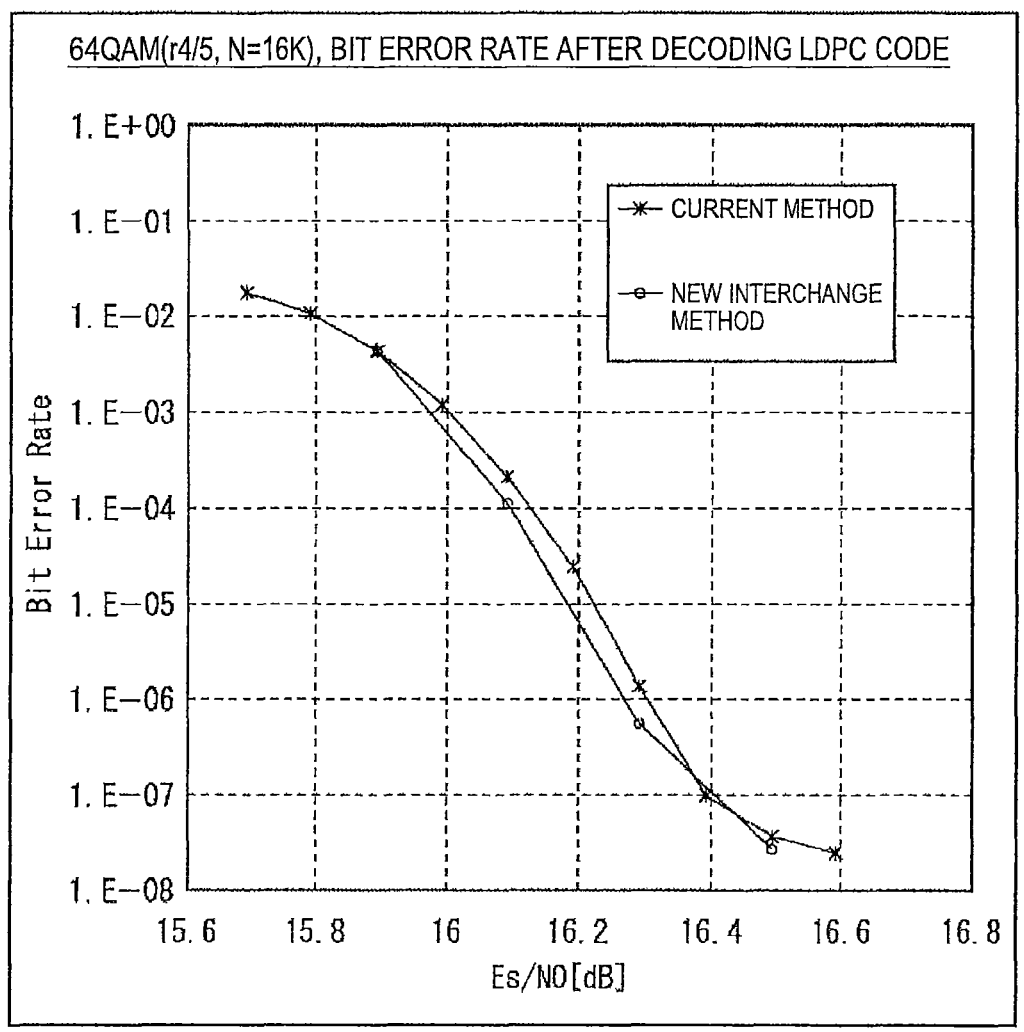

FIG. 140 is an illustration of results of simulation of a BER when an LDPC code having a code length of 16 k and an encoding rate of 4/5 is modulated by 64 QAM and a multiple b is 2.

Figure 141:
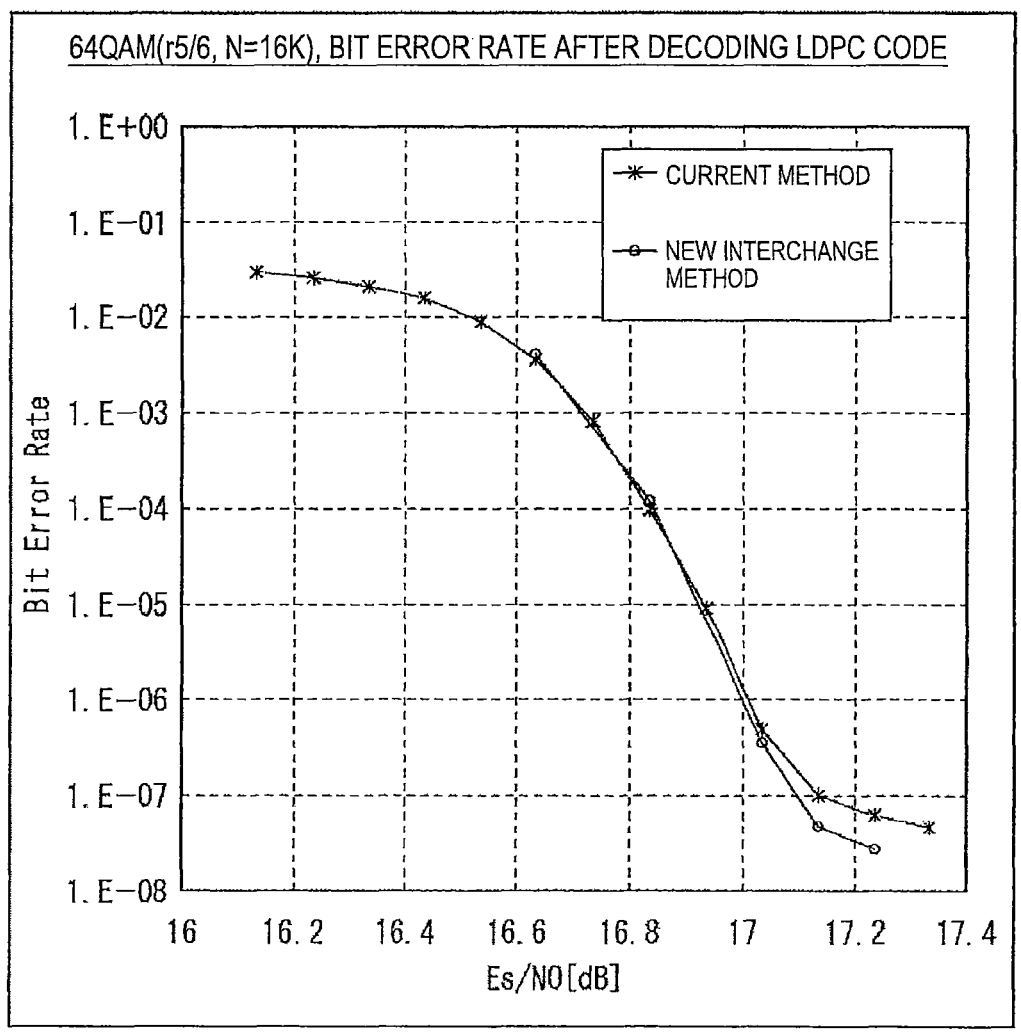

FIG. 141 is an illustration of results of simulation of a BER when an LDPC code having a code length of 16 k and an encoding rate of 5/6 is modulated by 64 QAM and a multiple b is 2.

Figure 142:
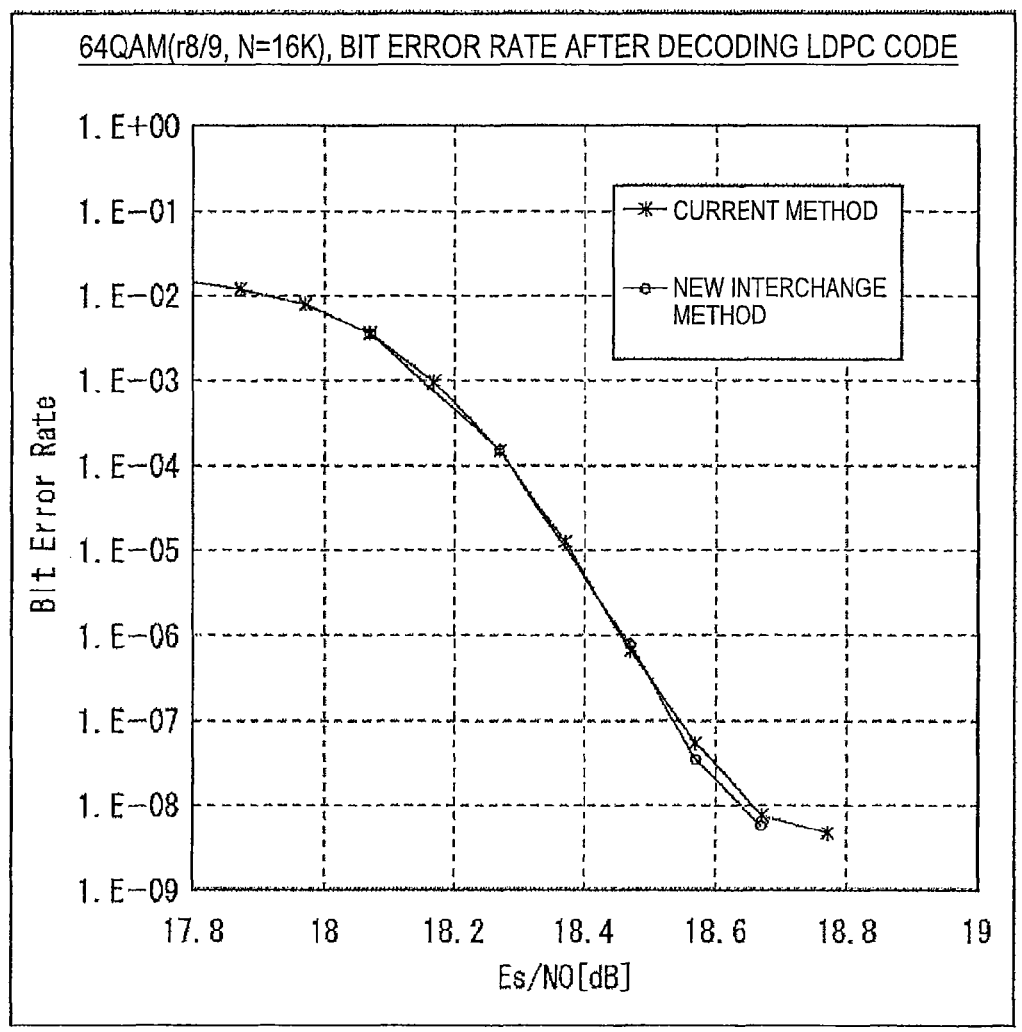

FIG. 142 is an illustration of results of simulation of a BER when an LDPC code having a code length of 16 k and an encoding rate of 8/9 is modulated by 64 QAM and a multiple b is 2.

Figure 143:
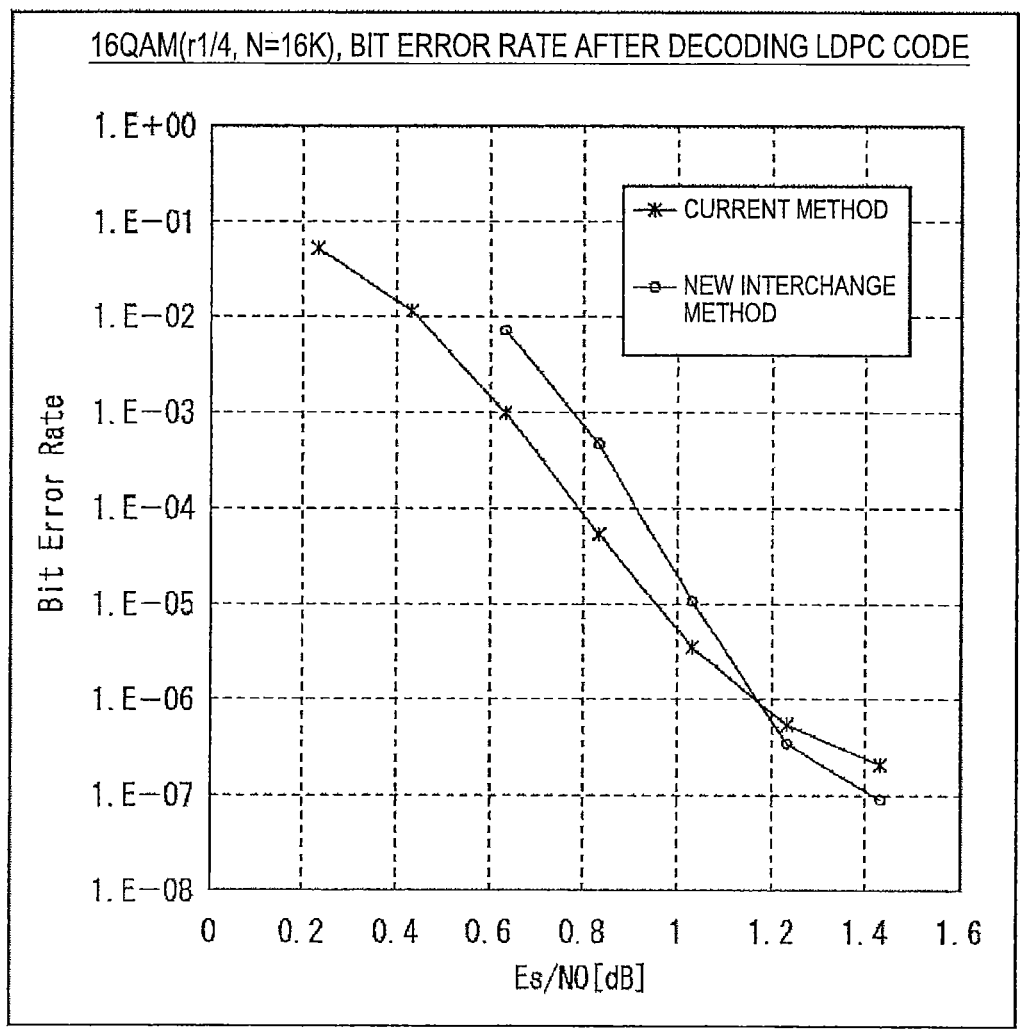

FIG. 143 is an illustration of results of simulation of a BER when an LDPC code having a code length of 16 k and an encoding rate of 1/4 is modulated by 16 QAM and a multiple b is 2.

Figure 144:
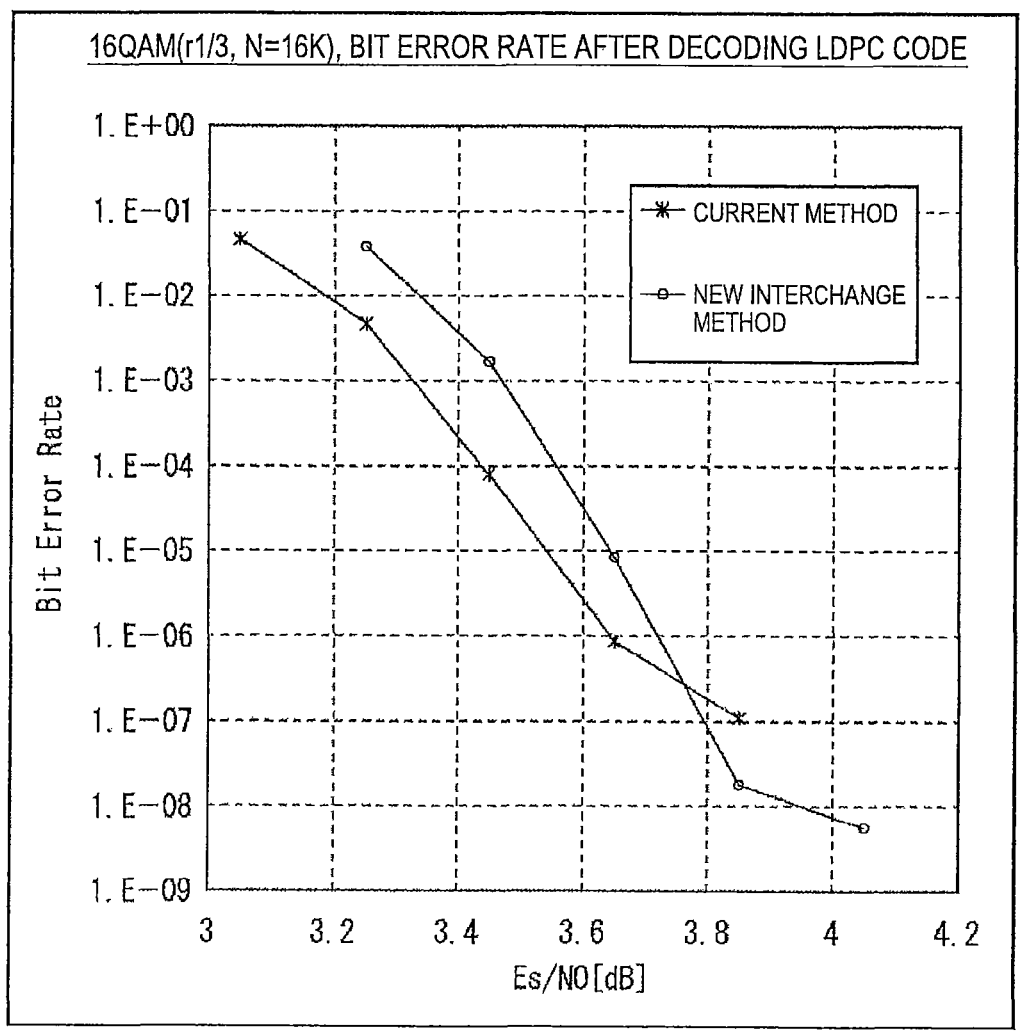

FIG. 144 is an illustration of results of simulation of a BER when an LDPC code having a code length of 16 k and an encoding rate of 1/3 is modulated by 16 QAM and a multiple b is 2.

Figure 145:
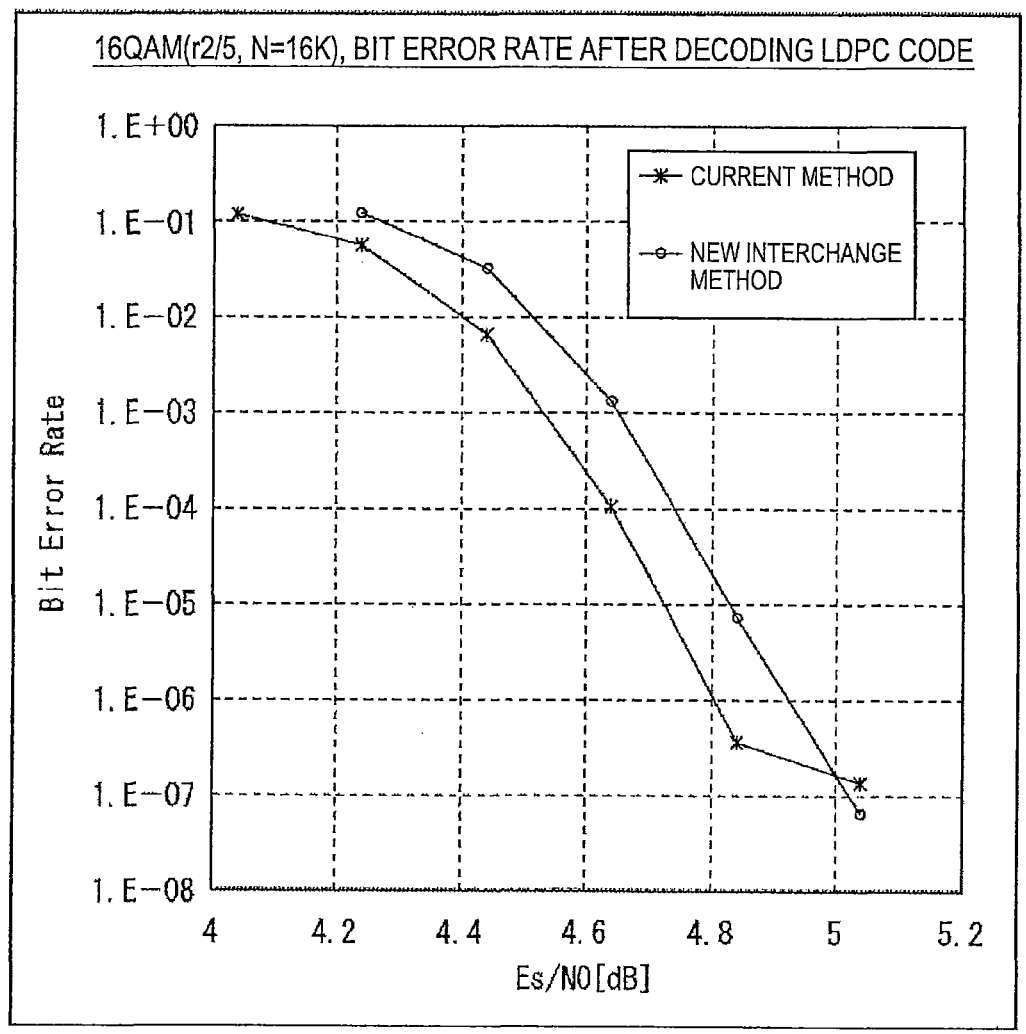

FIG. 145 is an illustration of results of simulation of a BER when an LDPC code having a code length of 16 k and an encoding rate of 2/5 is modulated by 16 QAM and a multiple b is 2.

Figure 146:
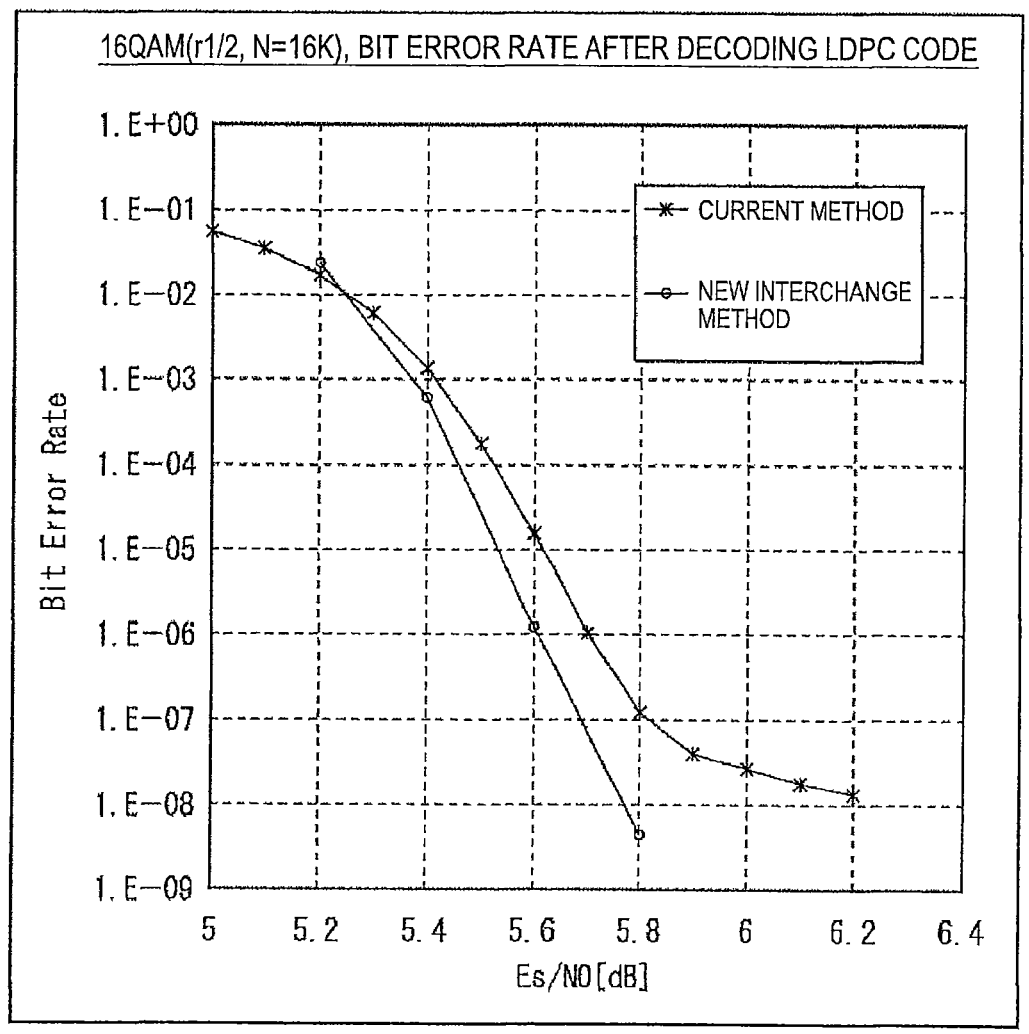

FIG. 146 is an illustration of results of simulation of a BER when an LDPC code having a code length of 16 k and an encoding rate of 1/2 is modulated by 16 QAM and a multiple b is 2.

Figure 147:
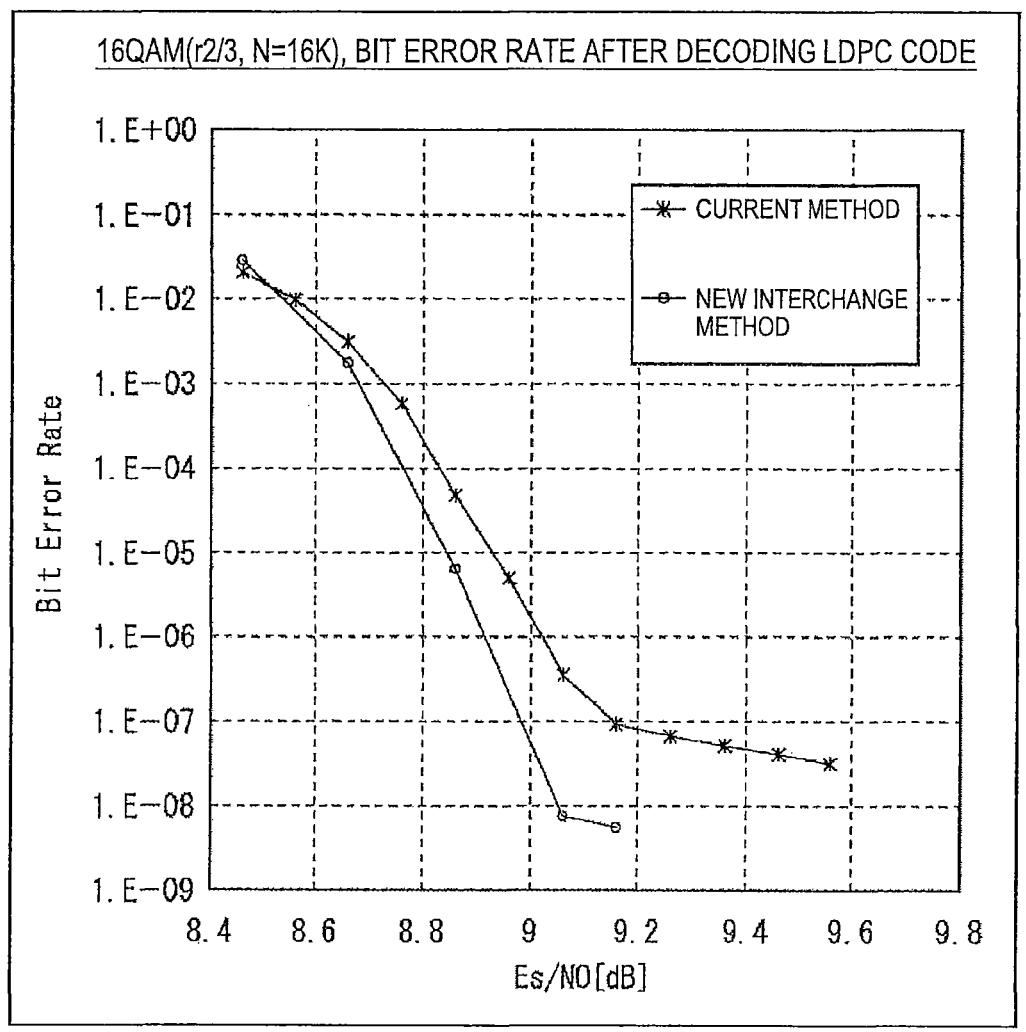

FIG. 147 is an illustration of results of simulation of a BER when an LDPC code having a code length of 16 k and an encoding rate of 2/3 is modulated by 16 QAM and a multiple b is 2.

Figure 148:
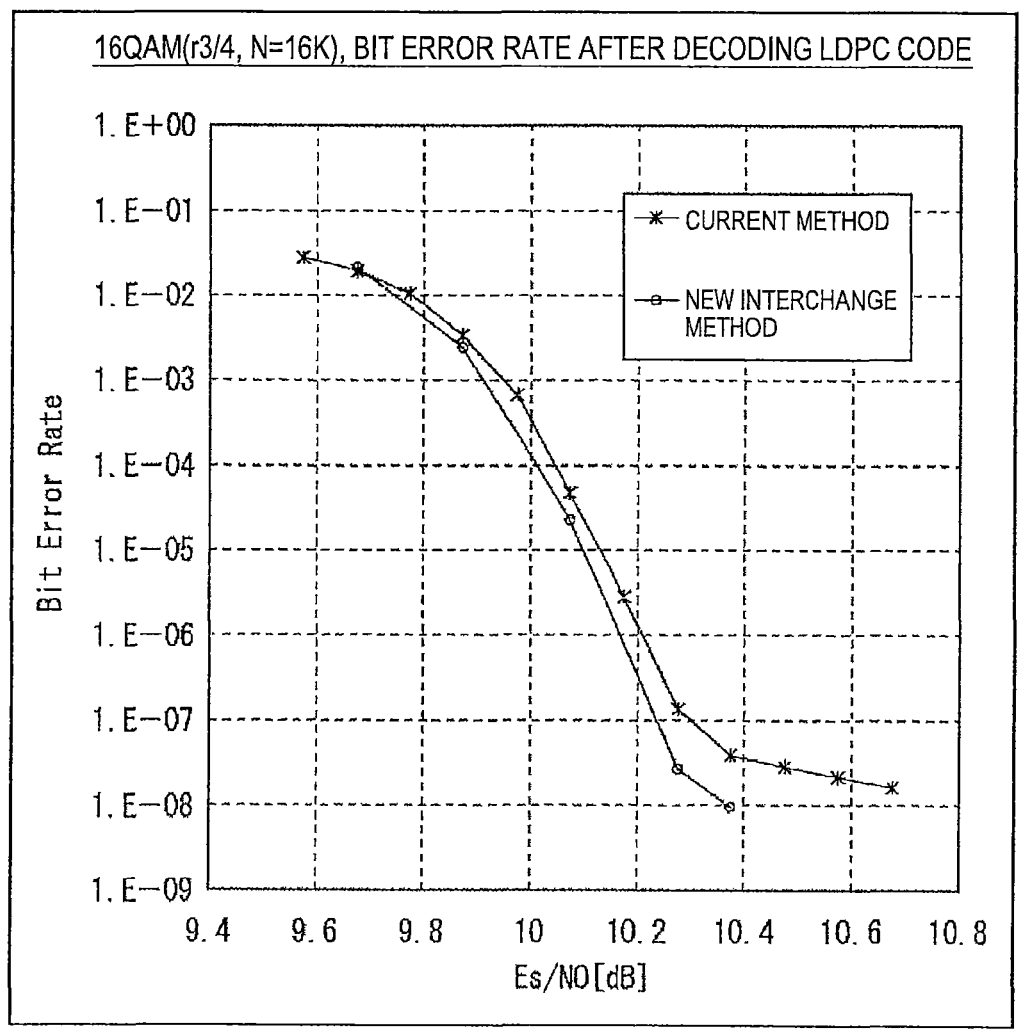

FIG. 148 is an illustration of results of simulation of a BER when an LDPC code having a code length of 16 k and an encoding rate of 3/4 is modulated by 16 QAM and a multiple b is 2.

Figure 149:
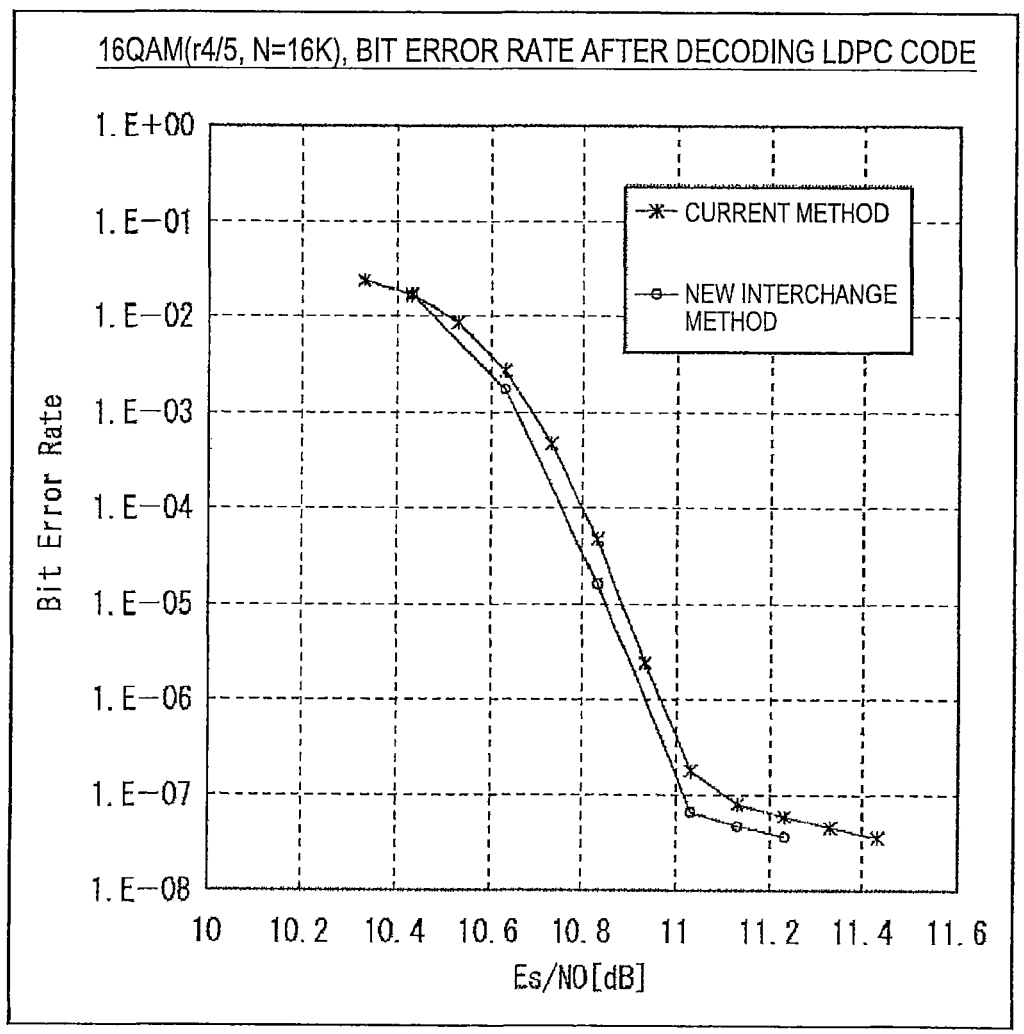

FIG. 149 is an illustration of results of simulation of a BER when an LDPC code having a code length of 16 k and an encoding rate of 4/5 is modulated by 16 QAM and a multiple b is 2.

Figure 150:
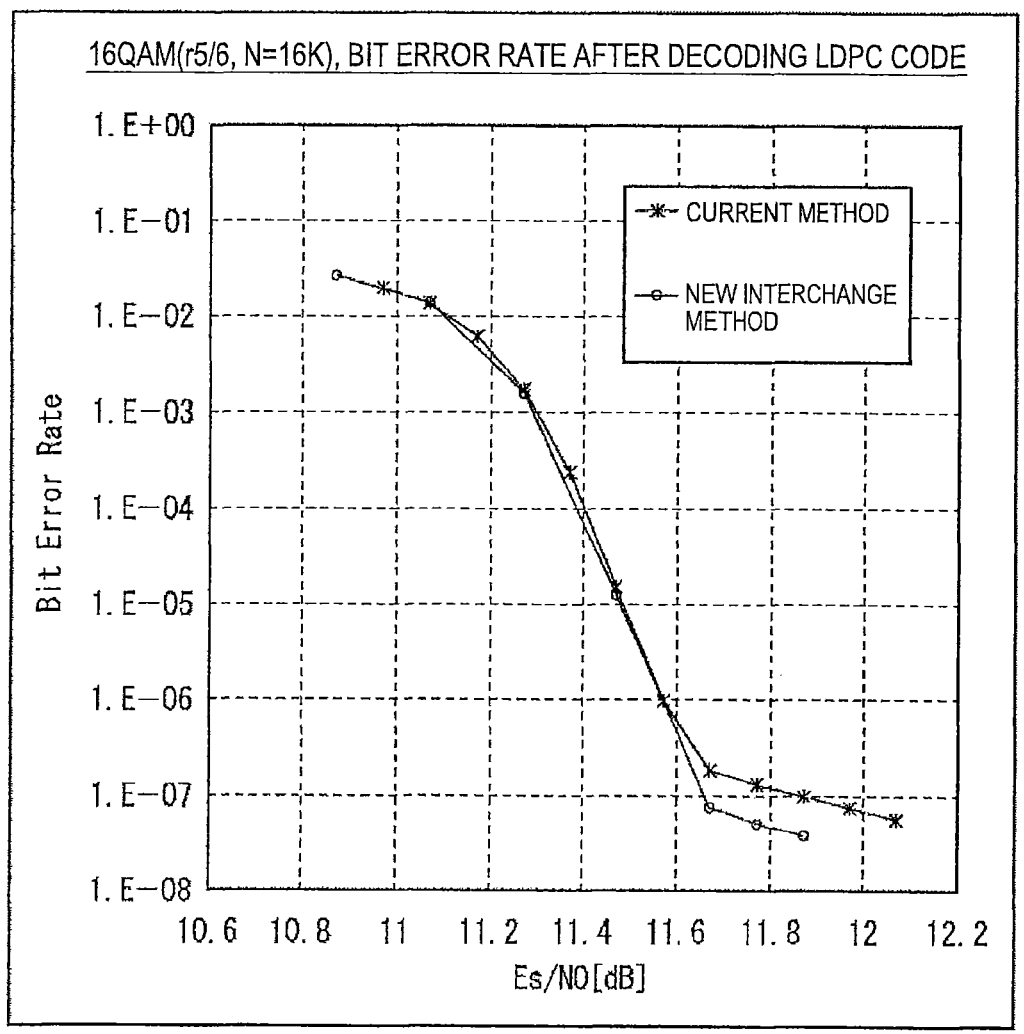

FIG. 150 is an illustration of results of simulation of a BER when an LDPC code having a code length of 16 k and an encoding rate of 5/6 is modulated by 16 QAM and a multiple b is 2.

Figure 151:
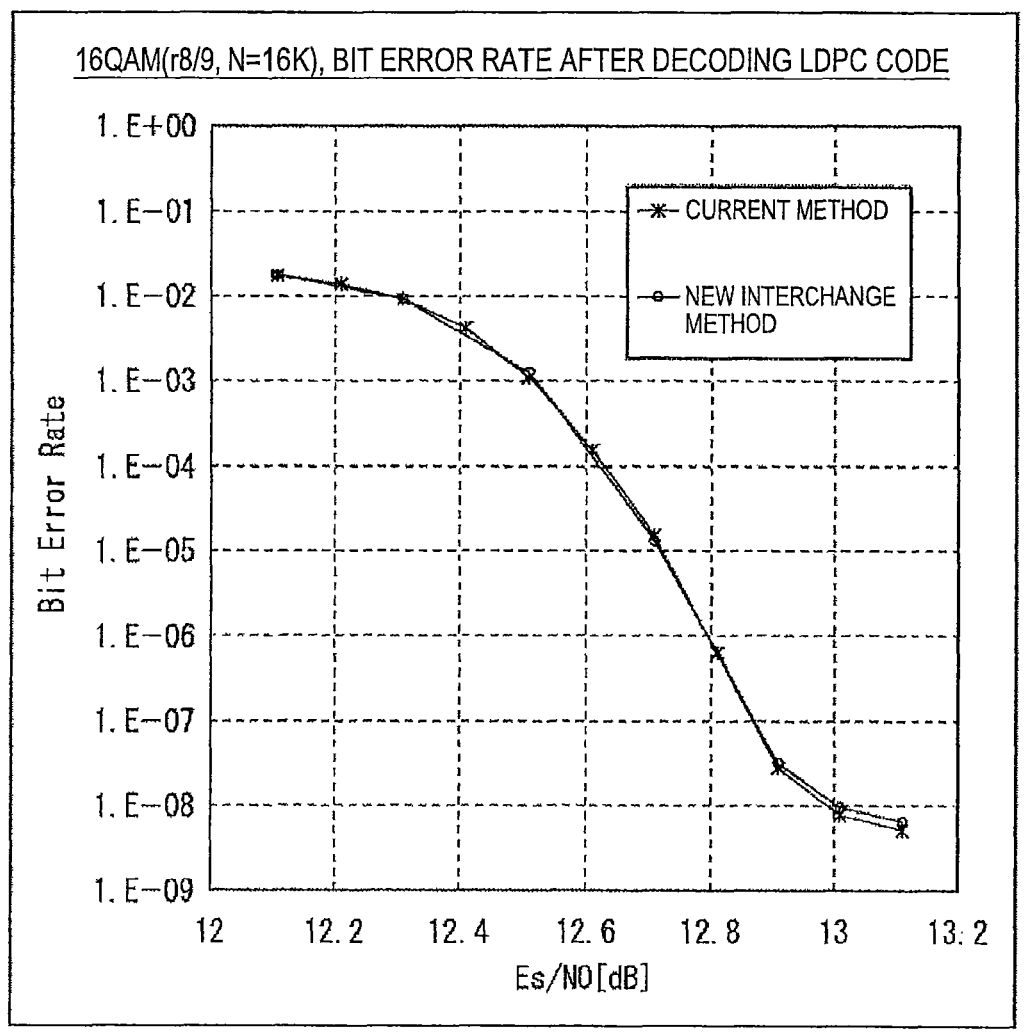

FIG. 151 is an illustration of results of simulation of a BER when an LDPC code having a code length of 16 k and an encoding rate of 8/9 is modulated by 16 QAM and a multiple b is 2.

Figure 152:
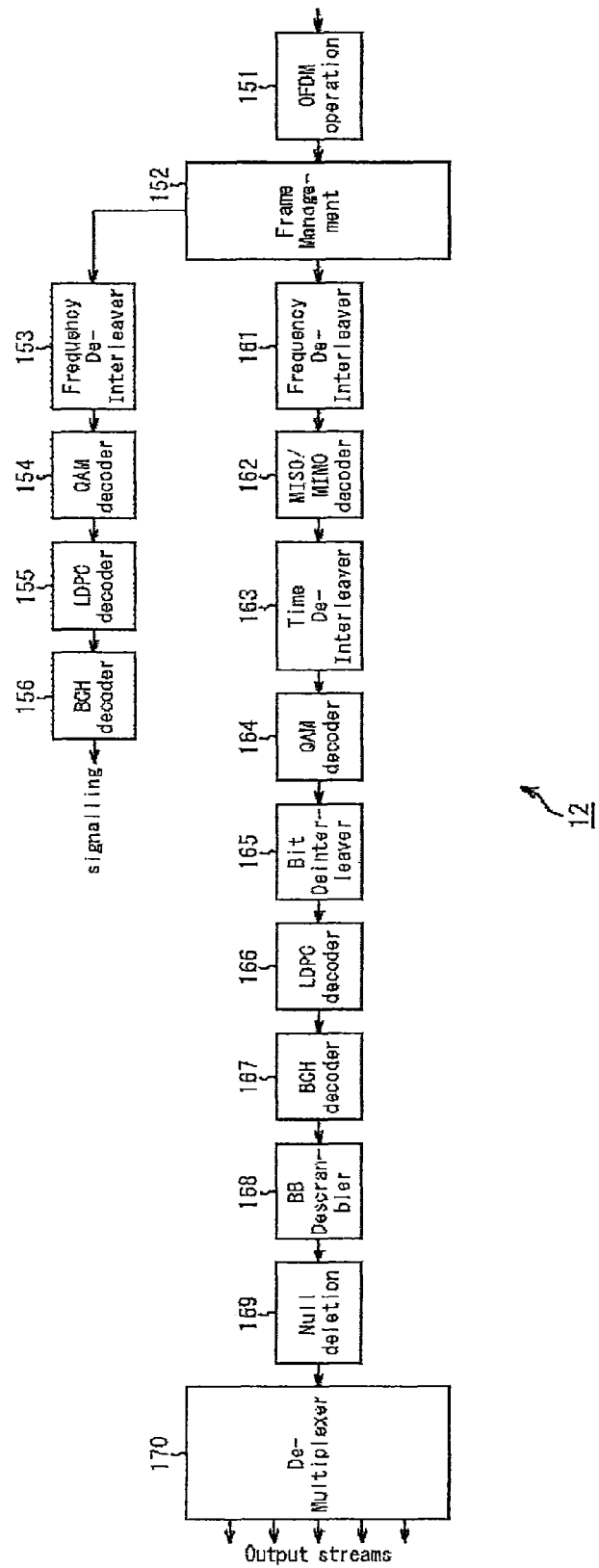

FIG. 152 is a block diagram illustrating a configuration example of a receiving device 12.

Figure 153:
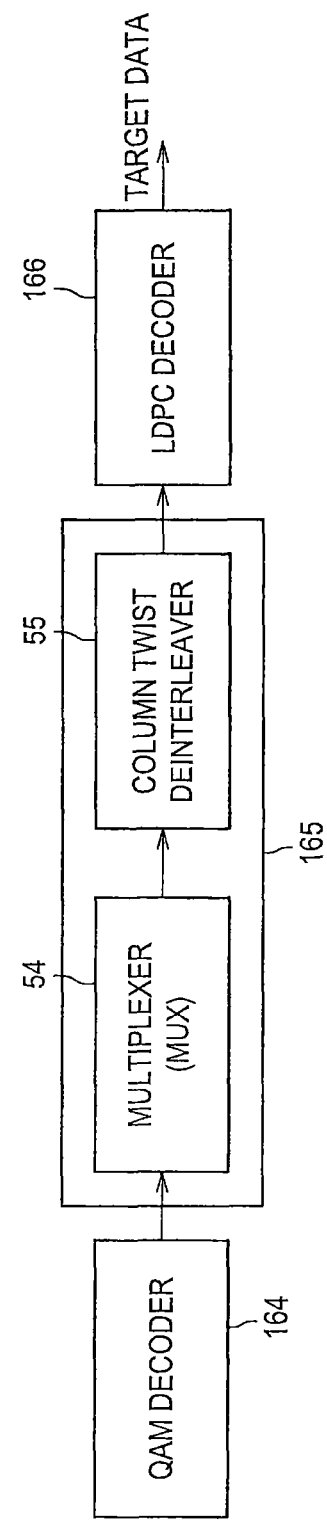

FIG. 153 is a block diagram illustrating a configuration example of a bit deinterleaver 165

Figure 154:
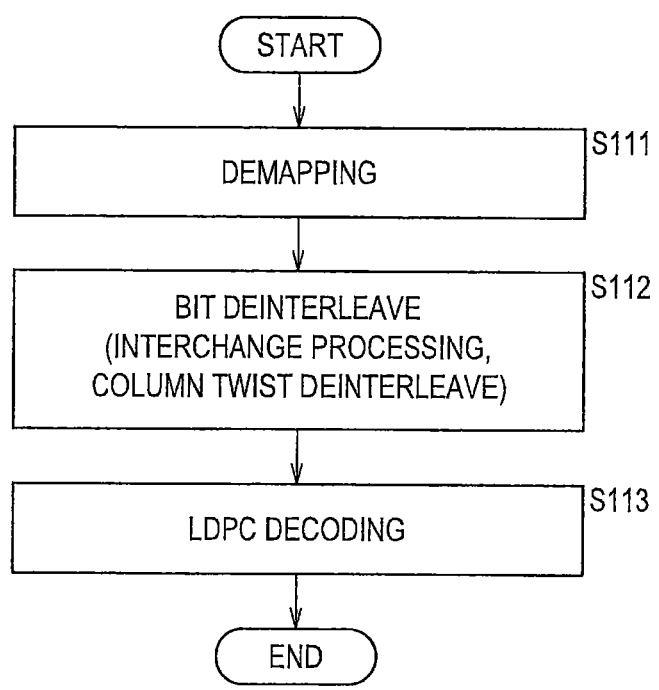

FIG. 154 is a flowchart illustrating processing executed by a QAM decoder 164, a bit deinterleaver 165, and an LDPC decoder 166.

Figure 155:
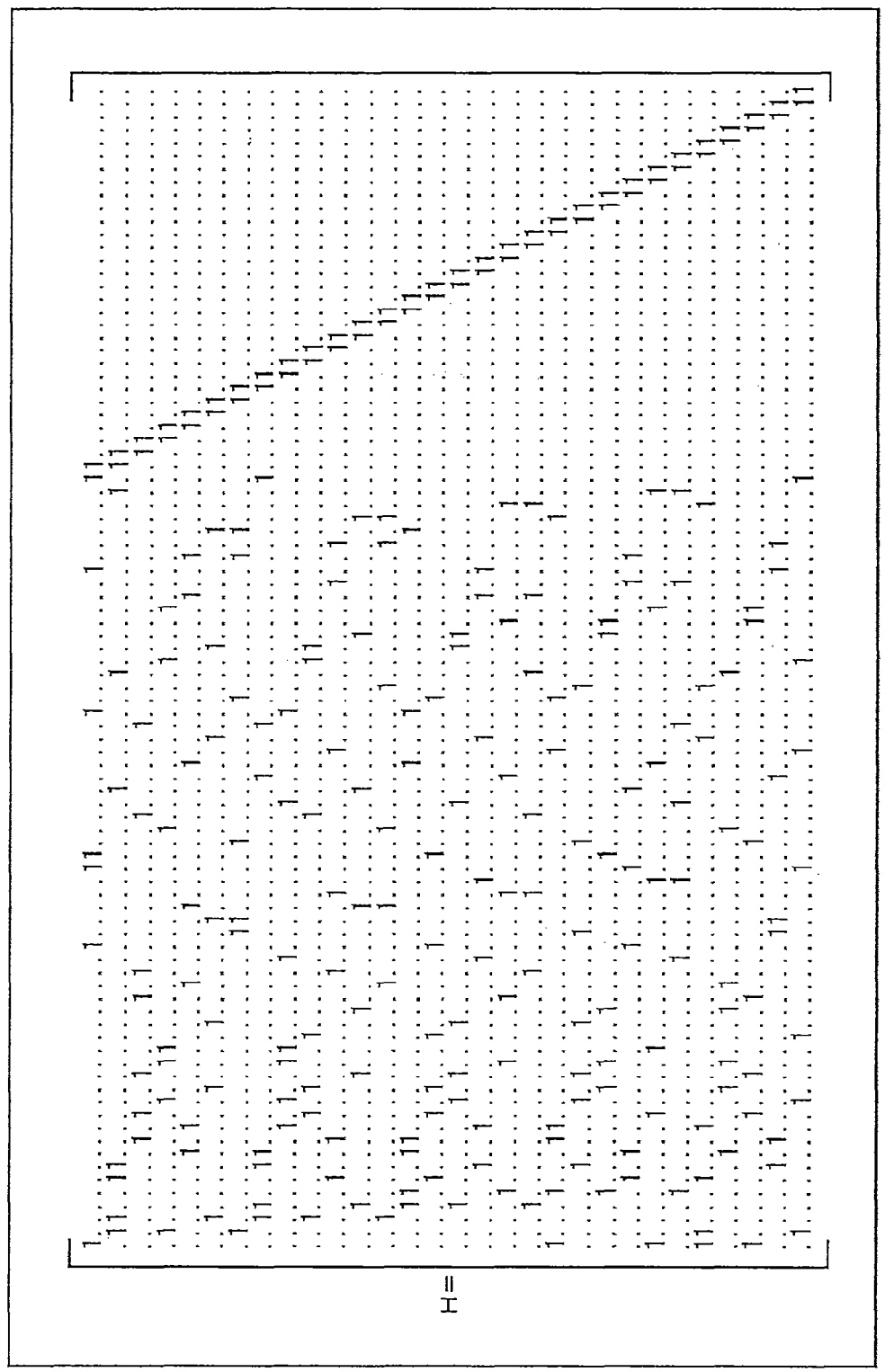

FIG. 155 is an illustration of an example of a parity check matrix of an LDPC code.

Figure 156:
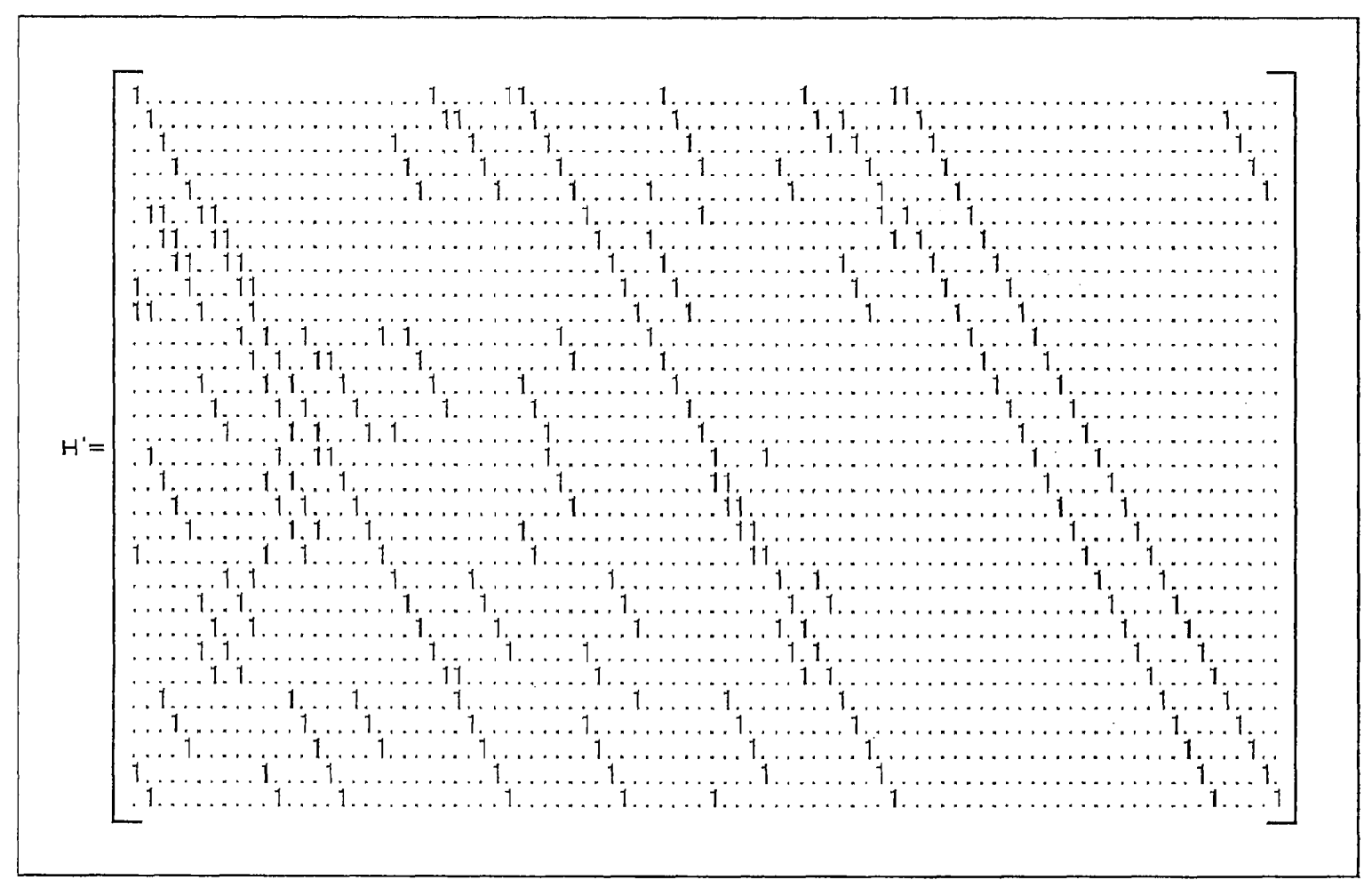

FIG. 156 is an illustration of a matrix (transformed parity check matrix) obtained by executing row replacement and column replacement with respect to a parity check matrix.

Figure 157:
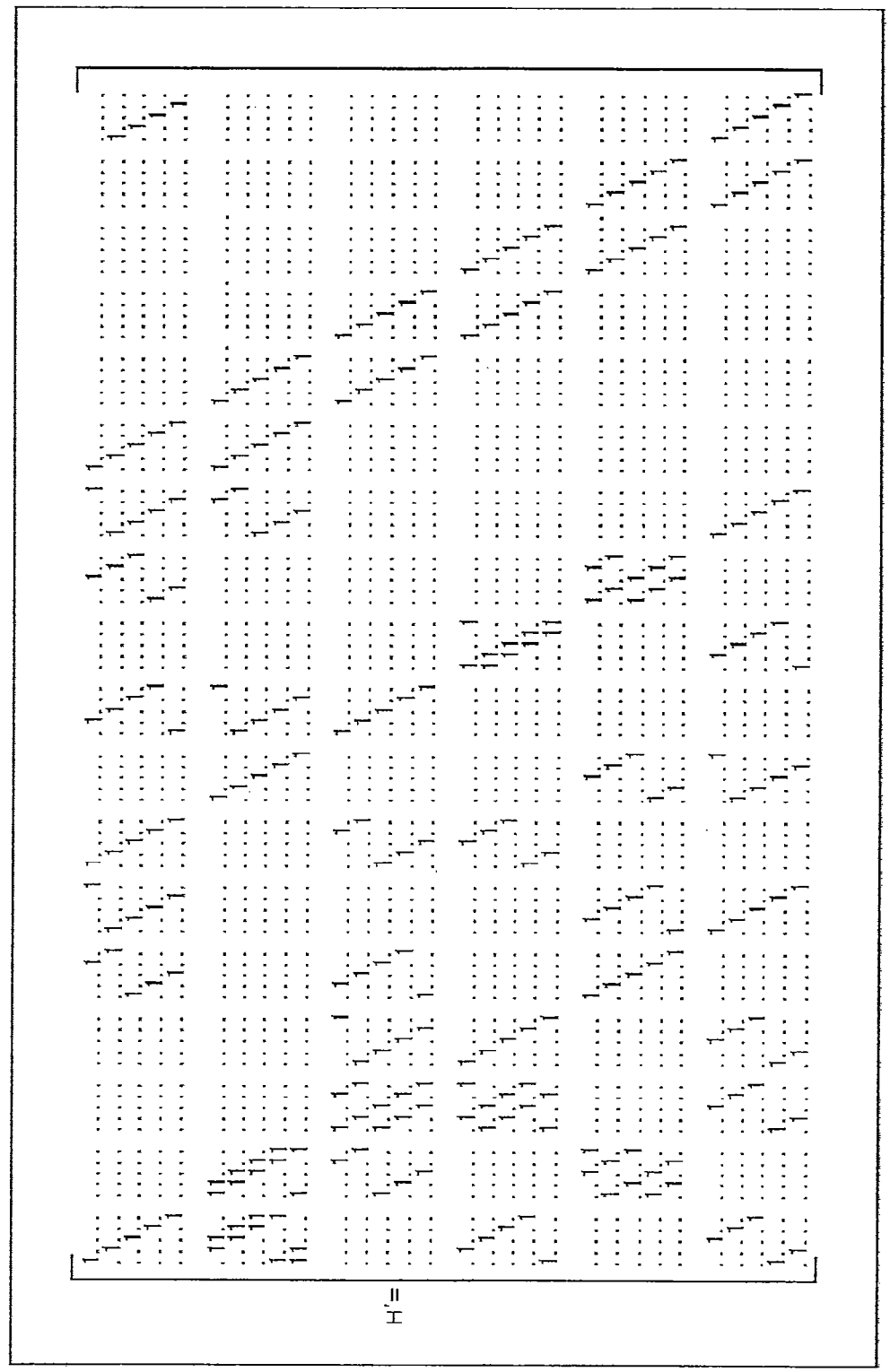

FIG. 157 is an illustration of a transformed parity check matrix divided in a 5×5 unit.

Figure 158:
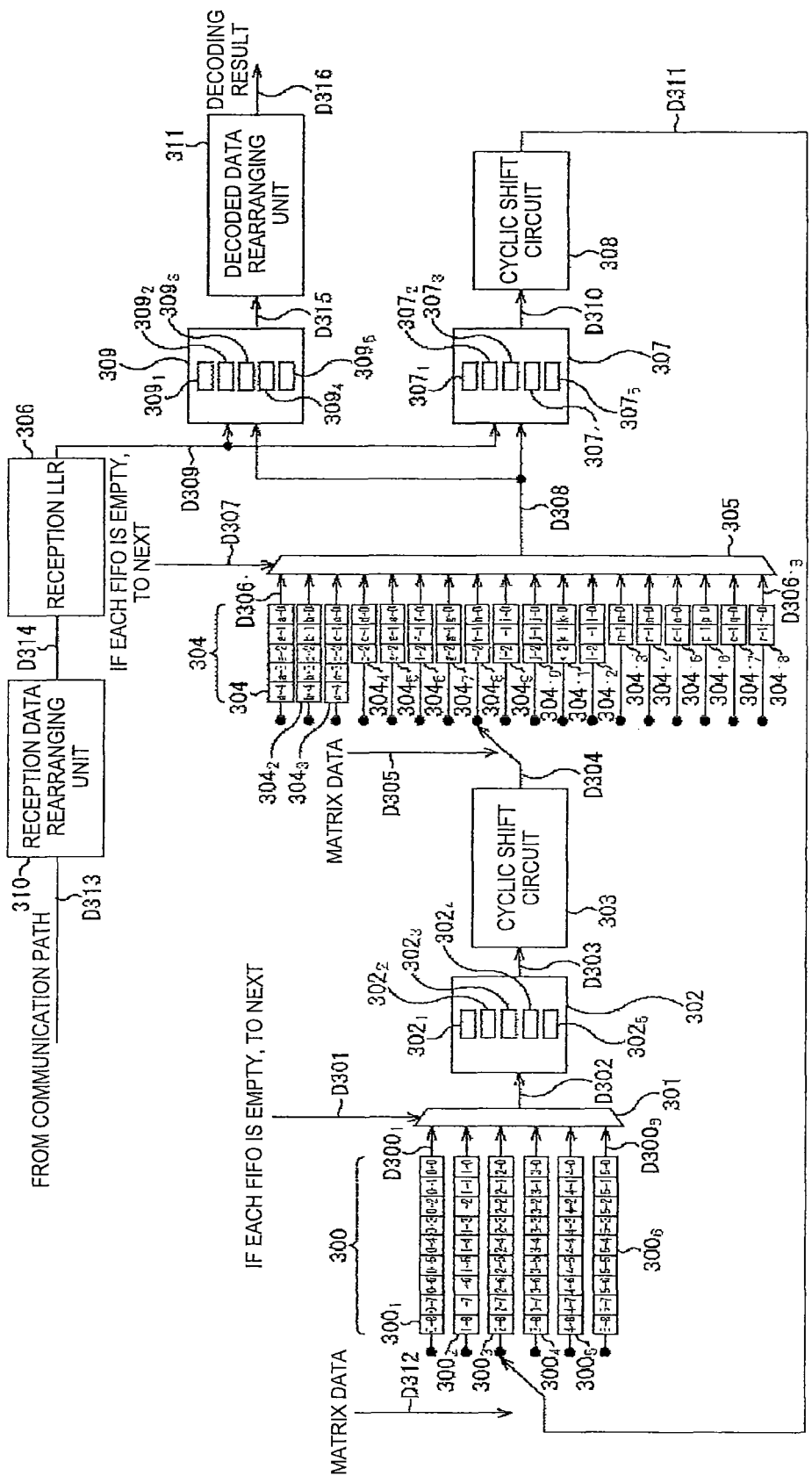

FIG. 158 is a block diagram illustrating a configuration example of a decoding device that collectively performs P node operations.

Figure 159:
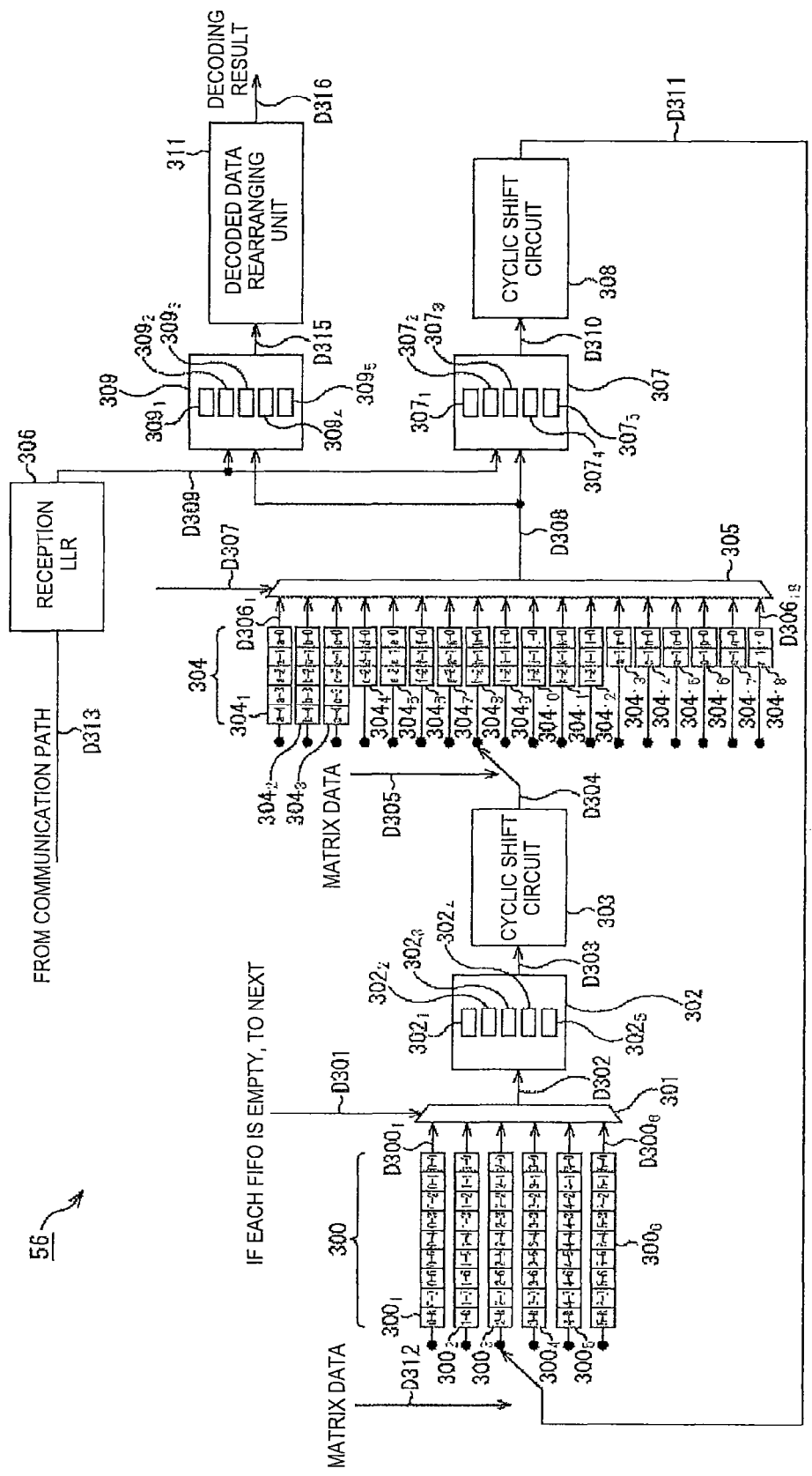

FIG. 159 is a block diagram illustrating a configuration example of an LDPC decoder 166.

Figure 160:
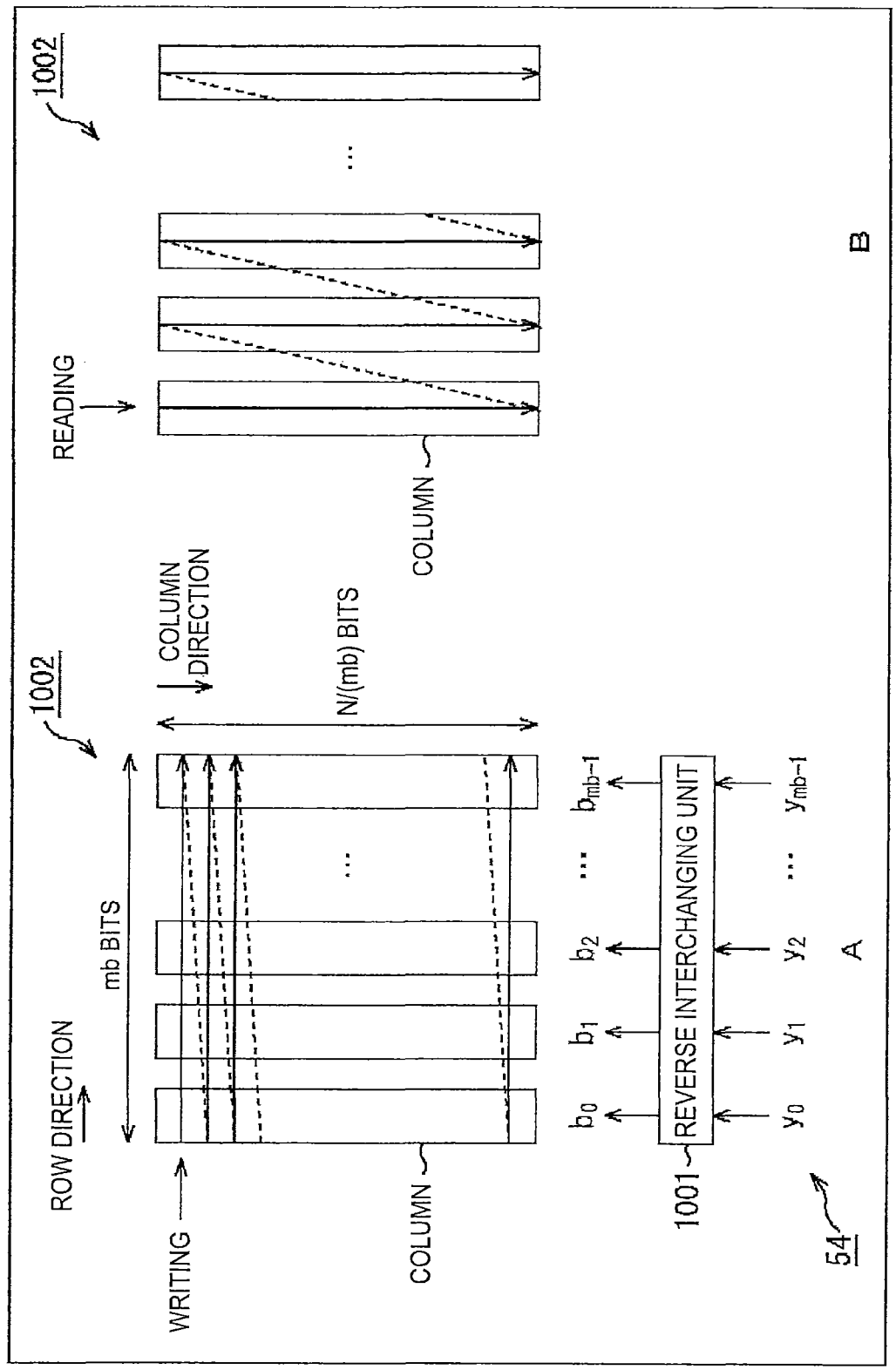

FIG. 160 is an illustration of processing of a multiplexer 54 constituting a bit deinterleaver 165.

Figure 161:
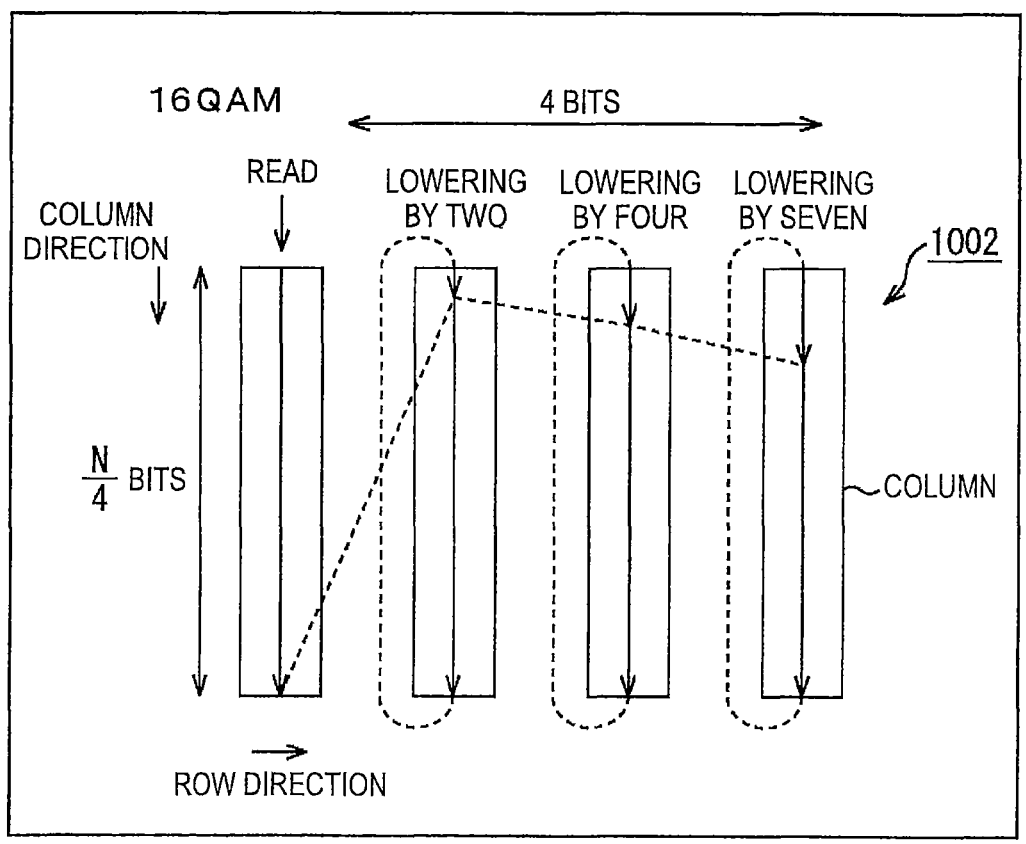

FIG. 161 is an illustration of processing of a column twist deinterleaver 55.

Figure 162:
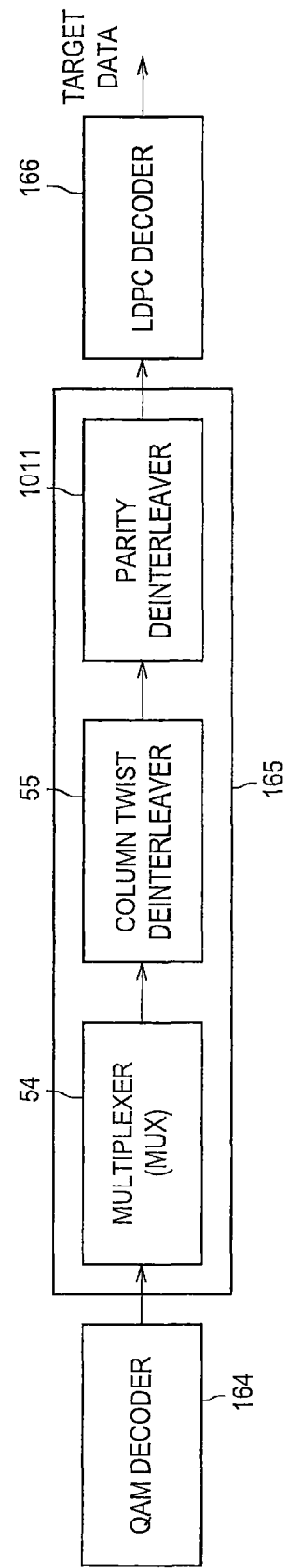

FIG. 162 is a block diagram illustrating another configuration example of a bit deinterleaver 165.

Figure 163:
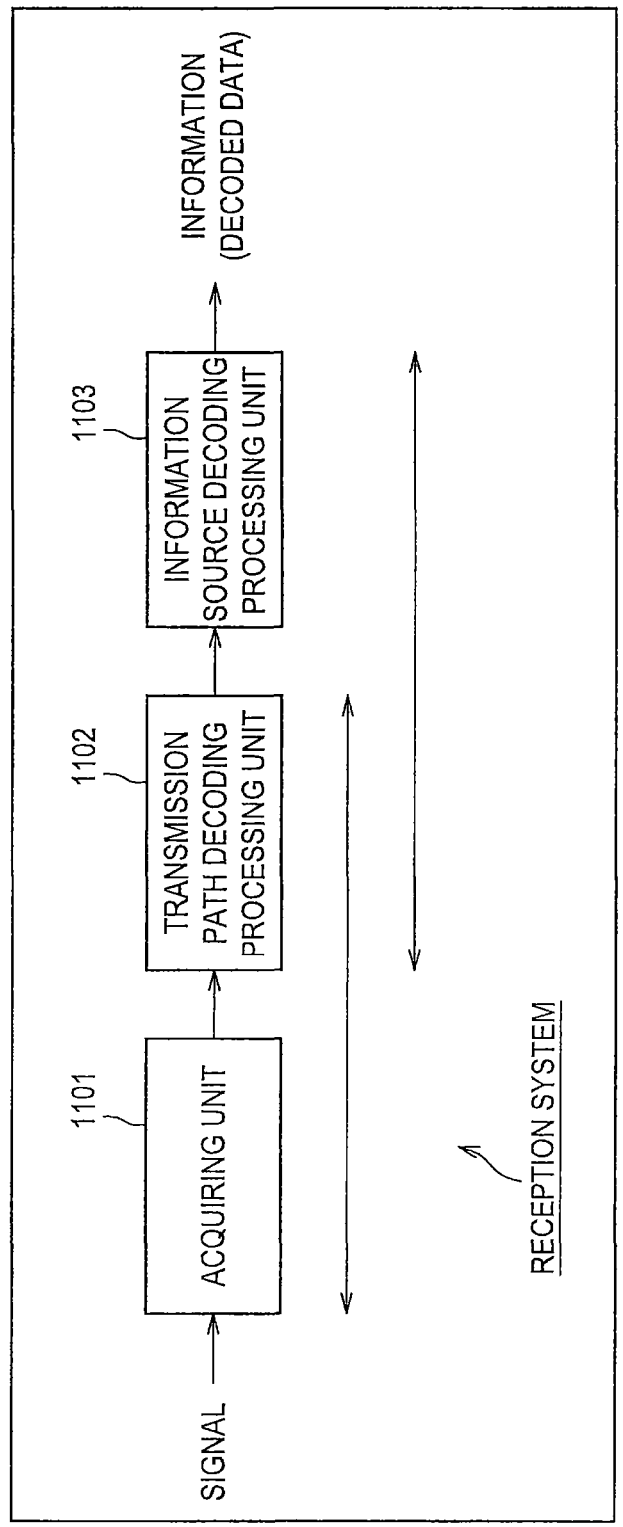

FIG. 163 is a block diagram illustrating a first configuration example of a reception system that can be applied to a receiving device 12.

Figure 164:
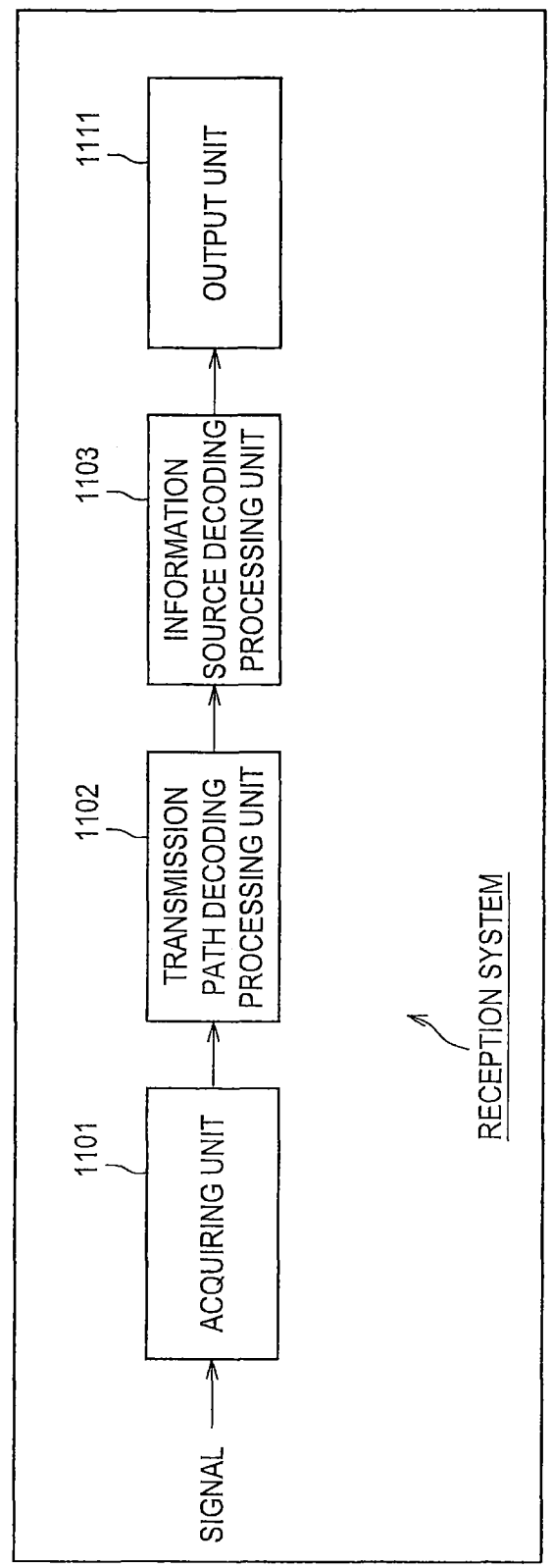

FIG. 164 is a block diagram illustrating a second configuration example of a reception system that can be applied to a receiving device 12.

Figure 165:
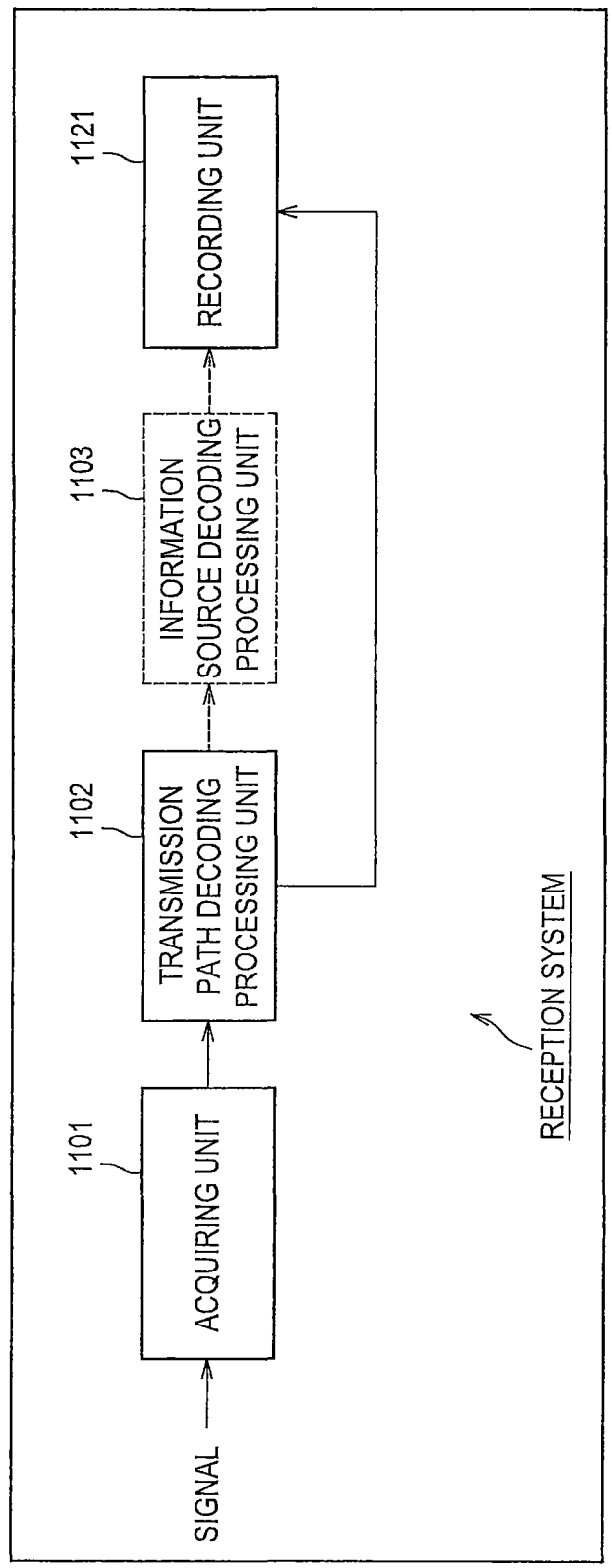

FIG. 165 is a block diagram illustrating a third configuration example of a reception system that can be applied to a receiving device 12.

Figure 166:
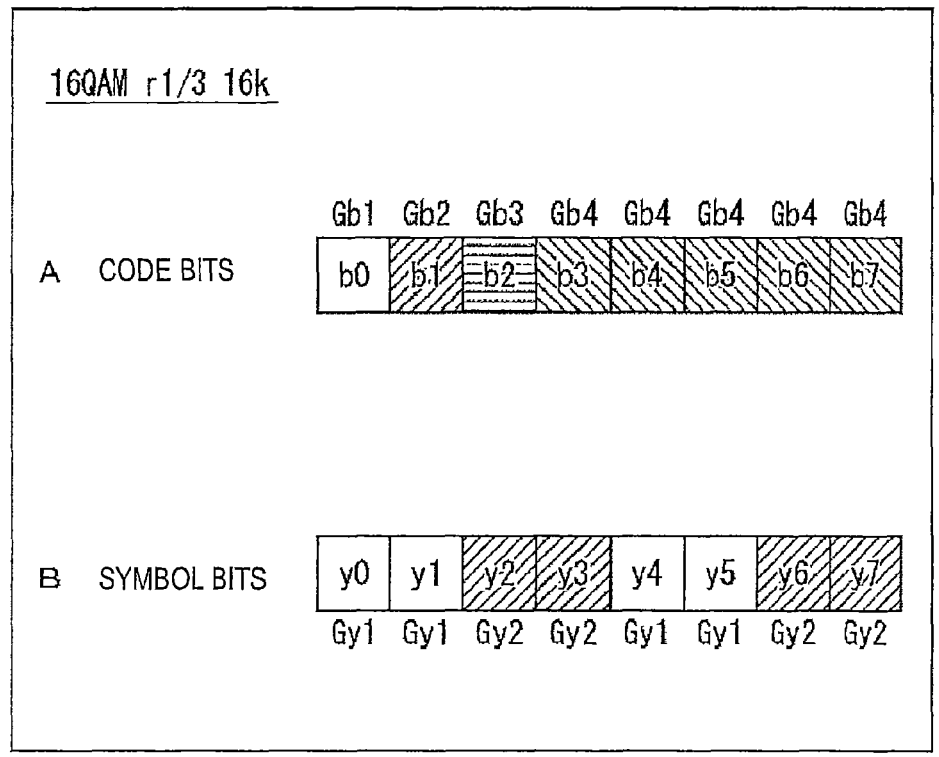

FIG. 166 is an illustration of a code bit group and a symbol bit group when an LDPC code having a code length of 16 k and an encoding rate of 1/3 is modulated by 16 QAM and a multiple b is 2.

Figure 167:
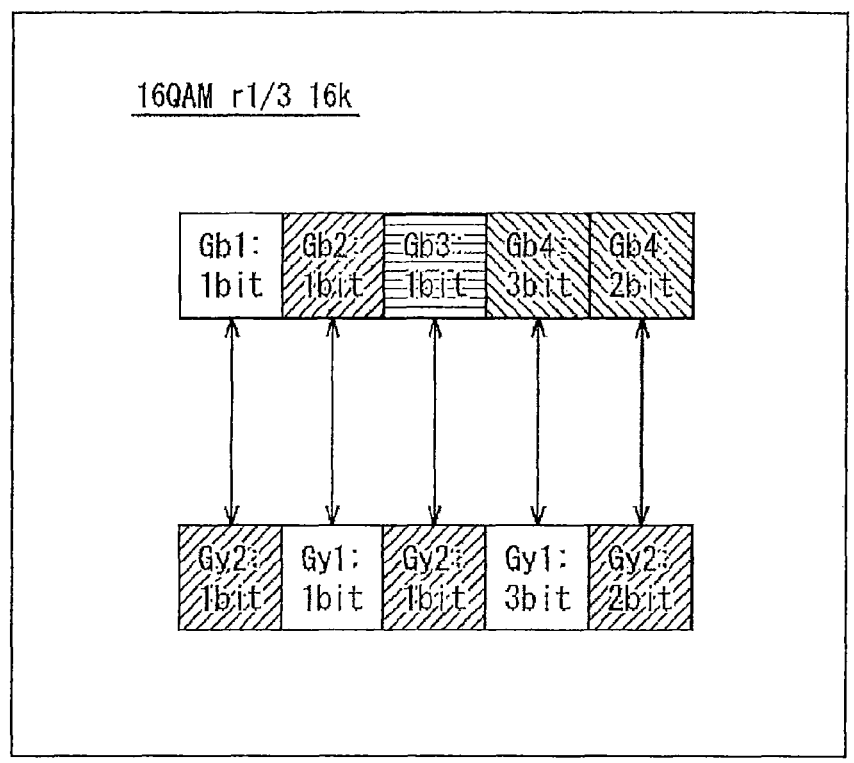

FIG. 167 is an illustration of an allocation rule when an LDPC code having a code length of 16 k and an encoding rate of 1/3 is modulated by 16 QAM and a multiple b is 2.

Figure 168:
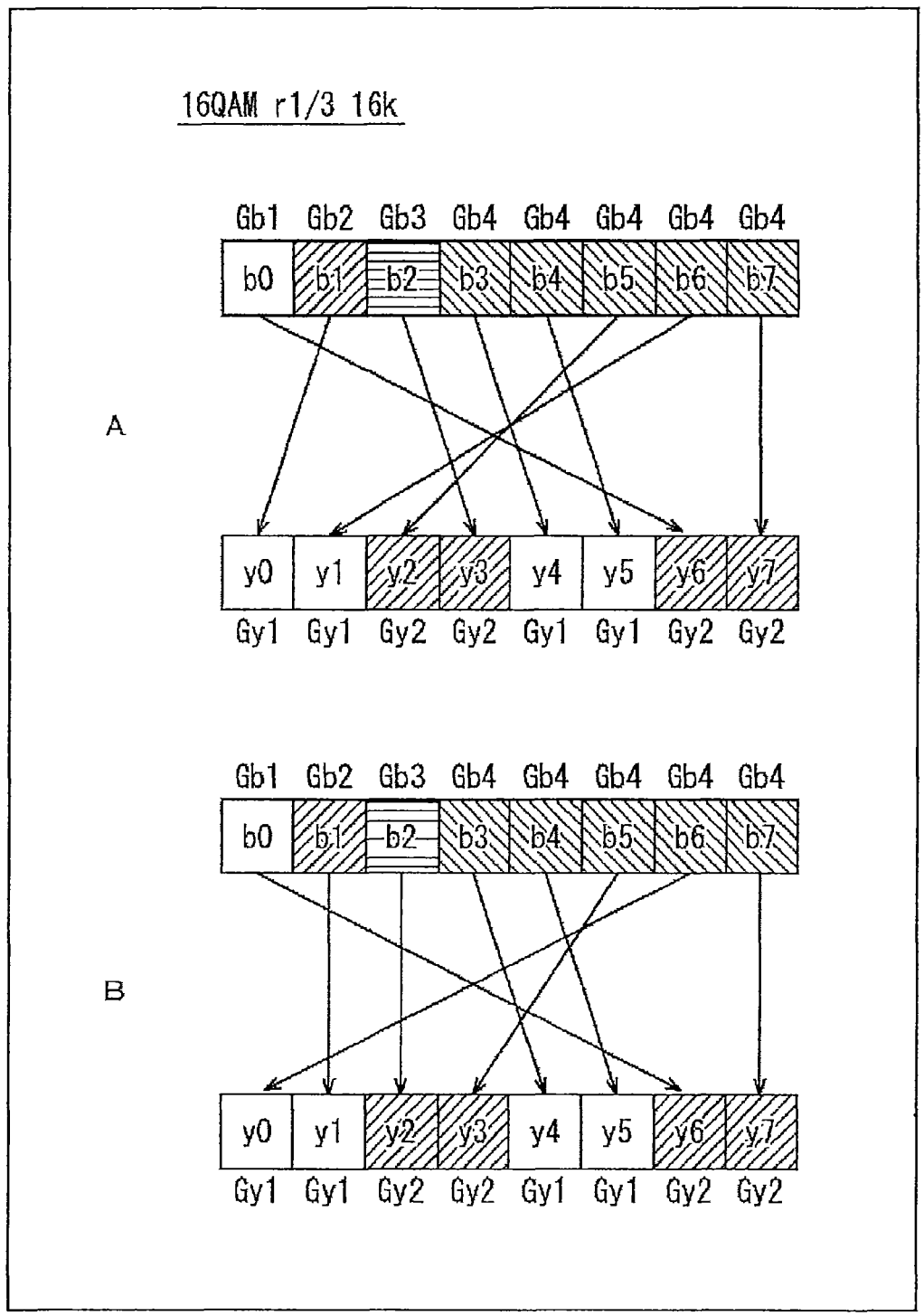

FIG. 168 is an illustration, of interchange of code bits according to an allocation rule when an LDPC code having a code length of 16 k and an encoding rate of 1/3 is modulated by 16 QAM and a multiple b is 2.

Figure 169:
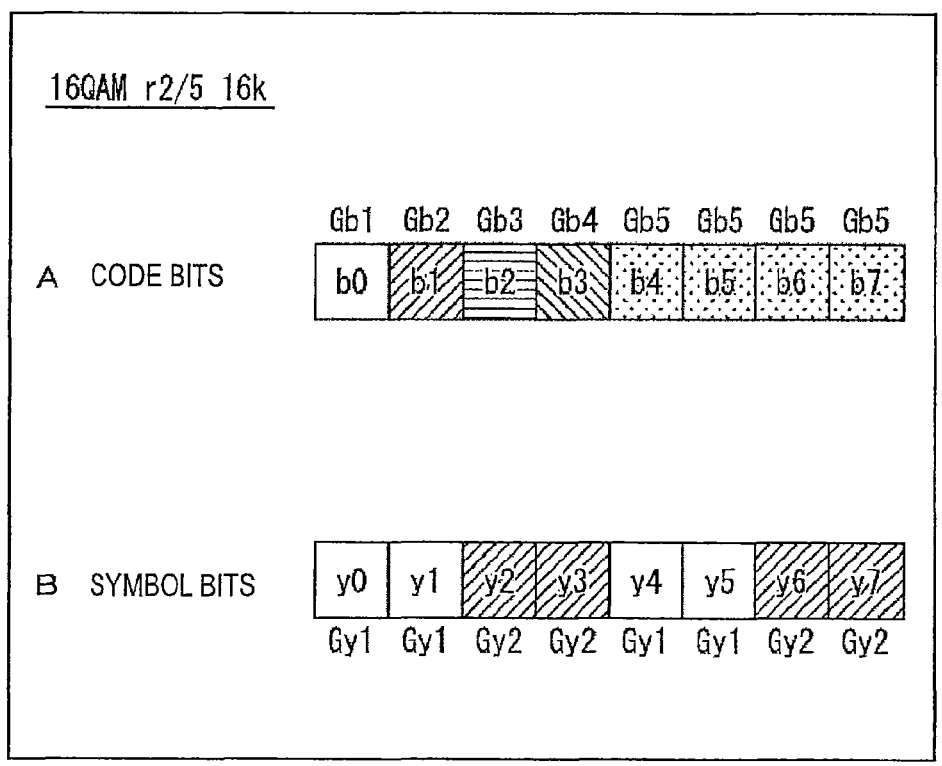

FIG. 169 is an illustration of a code bit group and a symbol bit group when an LDPC code having a code length of 16 k and an encoding rate of 2/5 is modulated by 16 QAM and a multiple b is 2.

Figure 170:
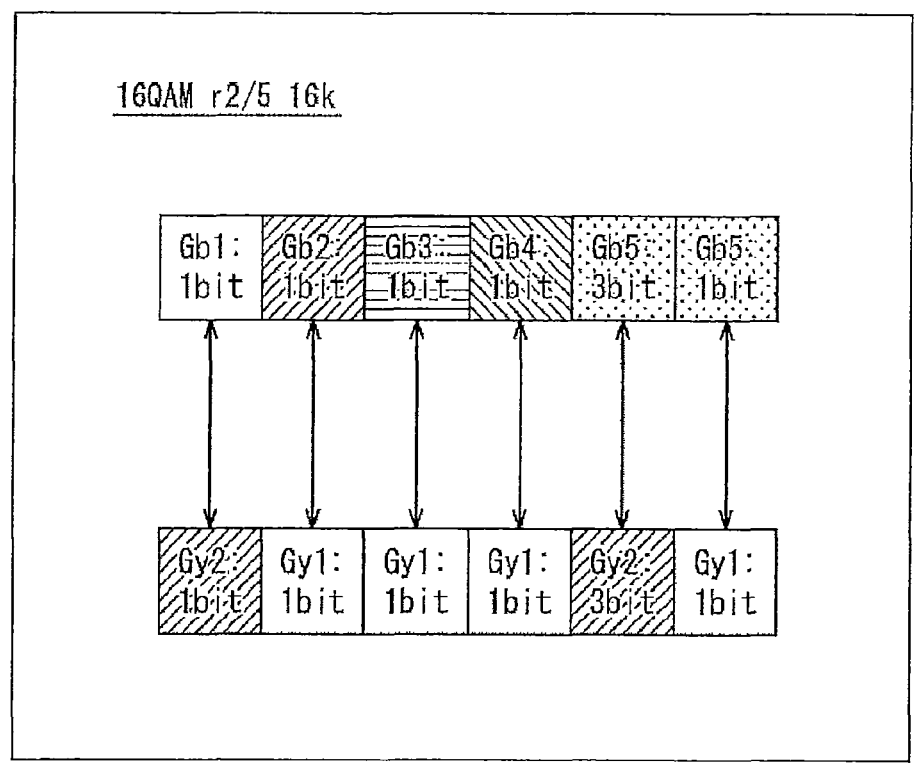

FIG. 170 is an illustration of an allocation rule when an LDPC code having a code length of 16 k and an encoding rate of 2/5 is modulated by 16 QAM and a multiple b is 2.

Figure 171:
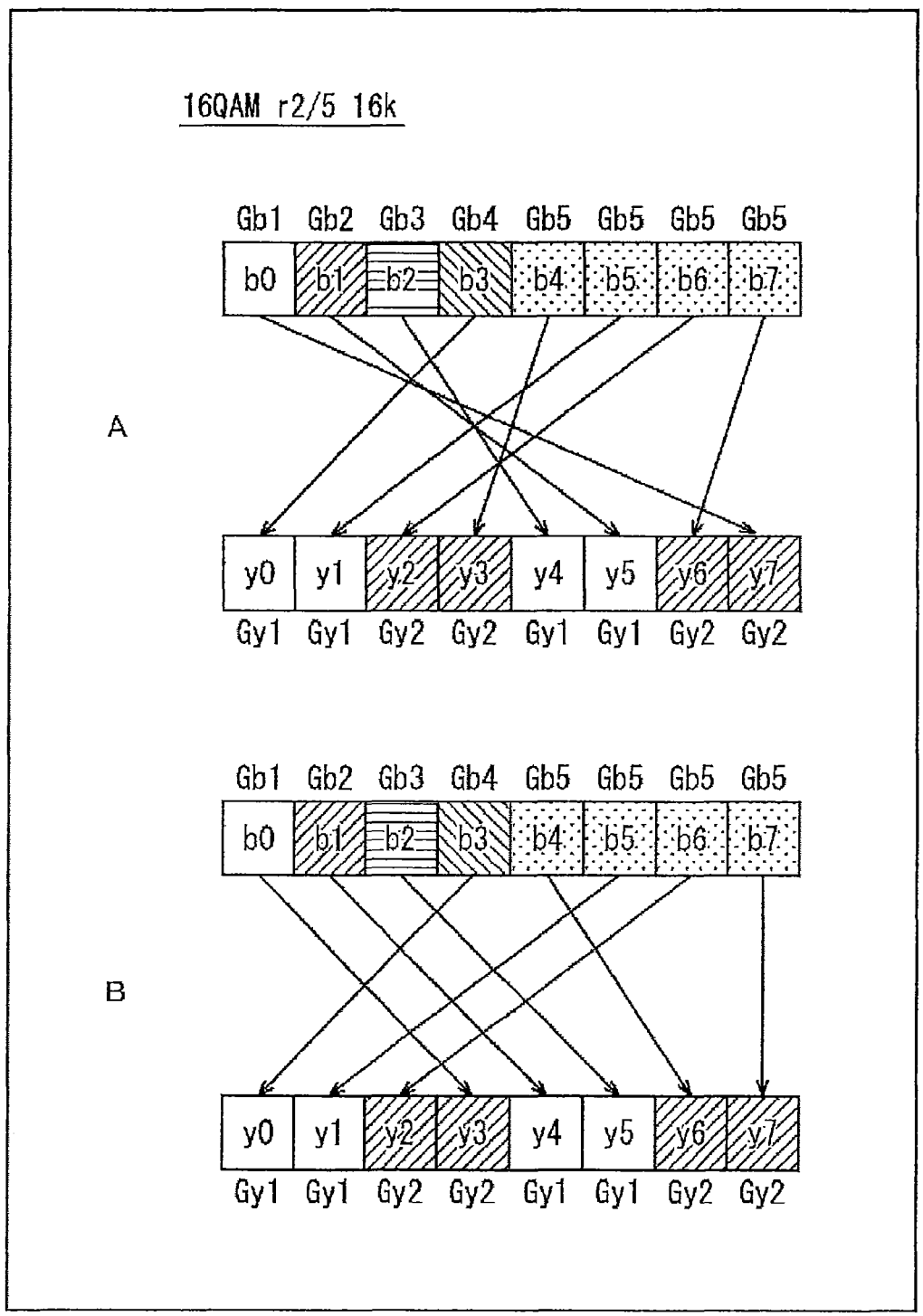

FIG. 171 is an illustration of interchange of code bits according to an allocation rule when an LDPC code having a code length of 16 k and an encoding rate of 2/5 is modulated by 16 QAM and a multiple b is 2.

Figure 172:
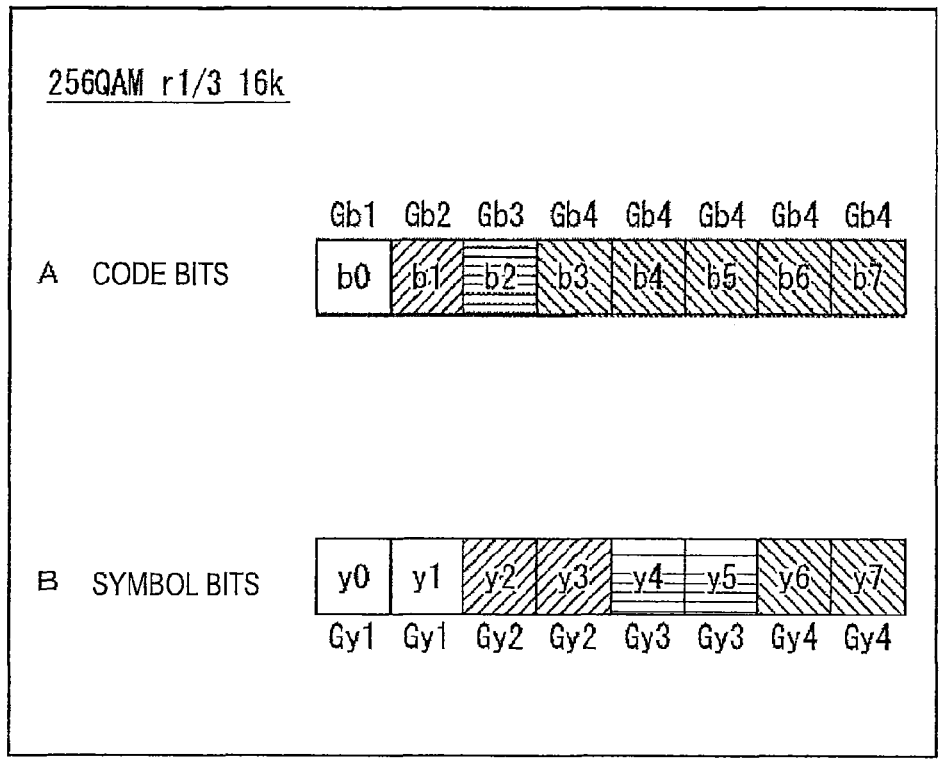

FIG. 172 is an illustration of a code bit group and a symbol bit group when an LDPC code having a code length of 16 k and an encoding rate of 1/3 is modulated by 256 QAM and a multiple b is 2.

Figure 173:
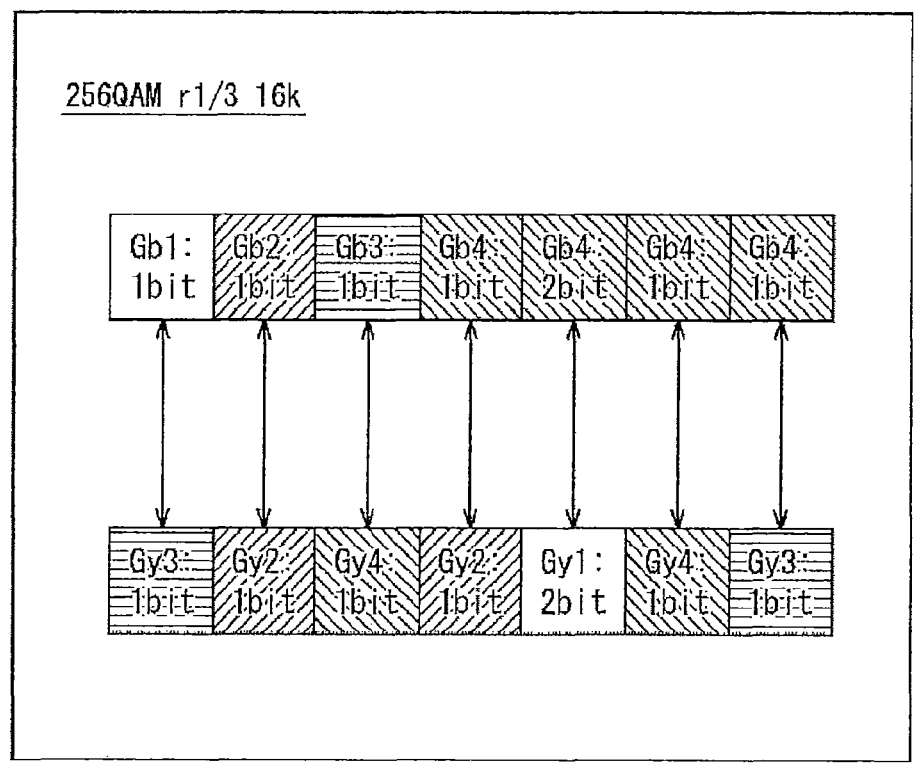

FIG. 173 is an illustration of an allocation rule when an LDPC code having a code length of 16 k and an encoding rate of 1/3 is modulated by 256 QAM and a multiple b is 2.

Figure 174:
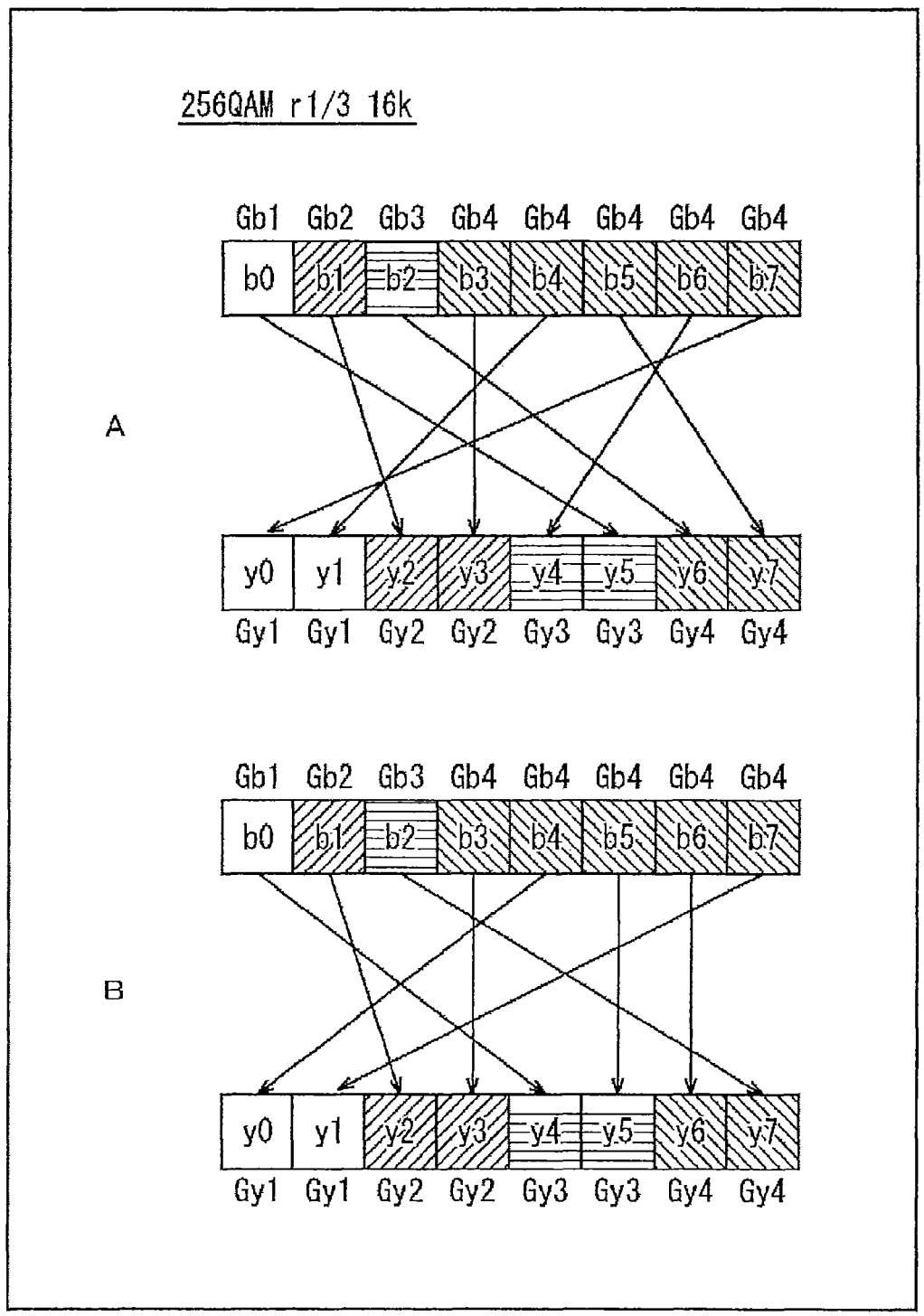

FIG. 174 is an illustration of interchange of code bits according to an allocation rule when an LDPC code having a code length of 16 k and an encoding rate of 1/3 is modulated by 256 QAM and a multiple b is 2.

Figure 175:
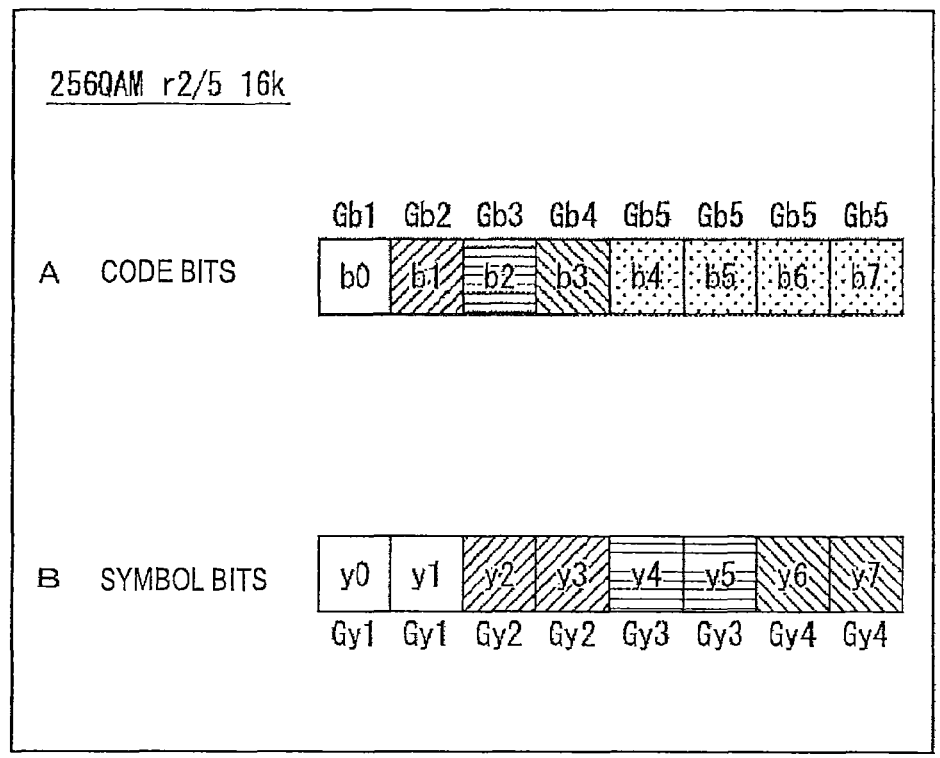

FIG. 175 is an illustration of a code bit group and a symbol bit group when an LDPC code having a code length of 16 k and an encoding rate of 2/5 is modulated by 256 QAM and a multiple b is 2.

Figure 176:
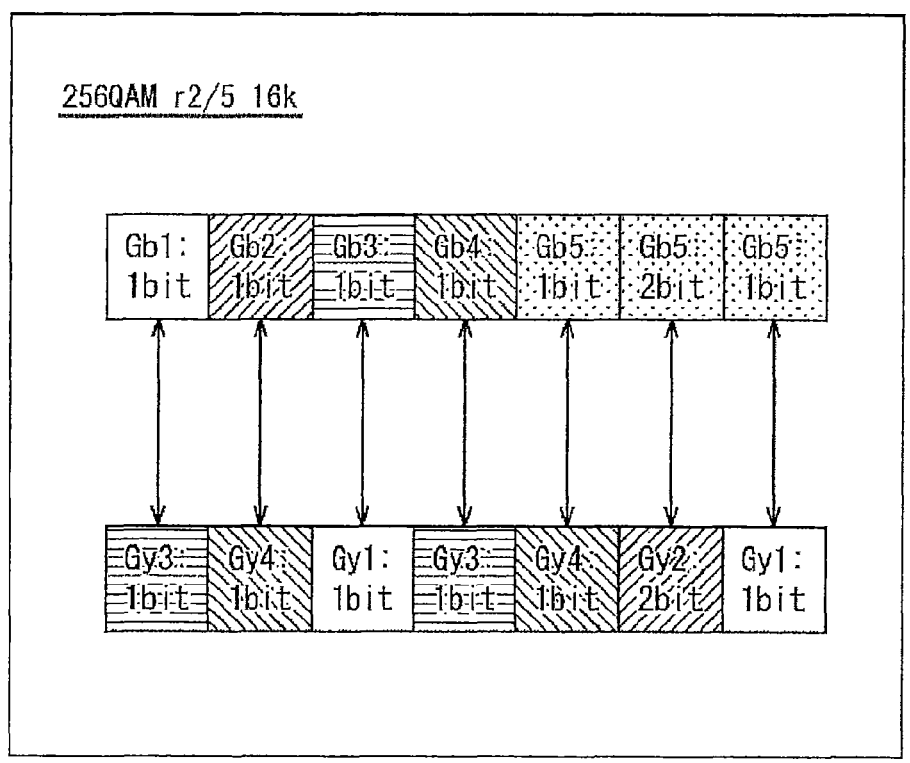

FIG. 176 is an illustration of an allocation rule when an LDPC code having a code length of 16 k and an encoding rate of 2/5 is modulated by 256 QAM and a multiple b is 2.

Figure 177:
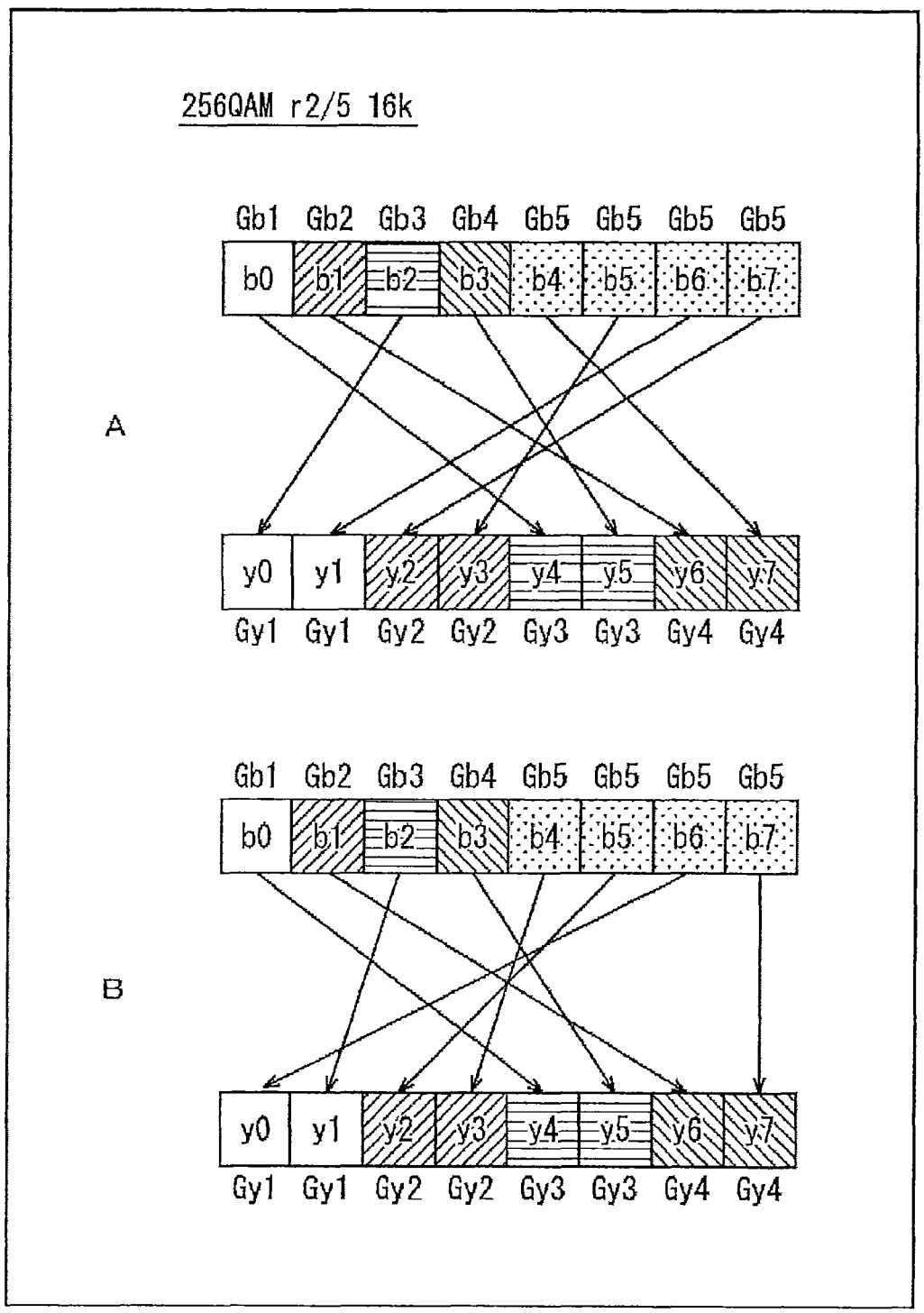

FIG. 177 is an illustration of interchange of code bits according to an allocation rule when an LDPC code having a code length of 16 k and an encoding rate of 2/5 is modulated by 256 QAM and a multiple b is 2.

Figure 178:
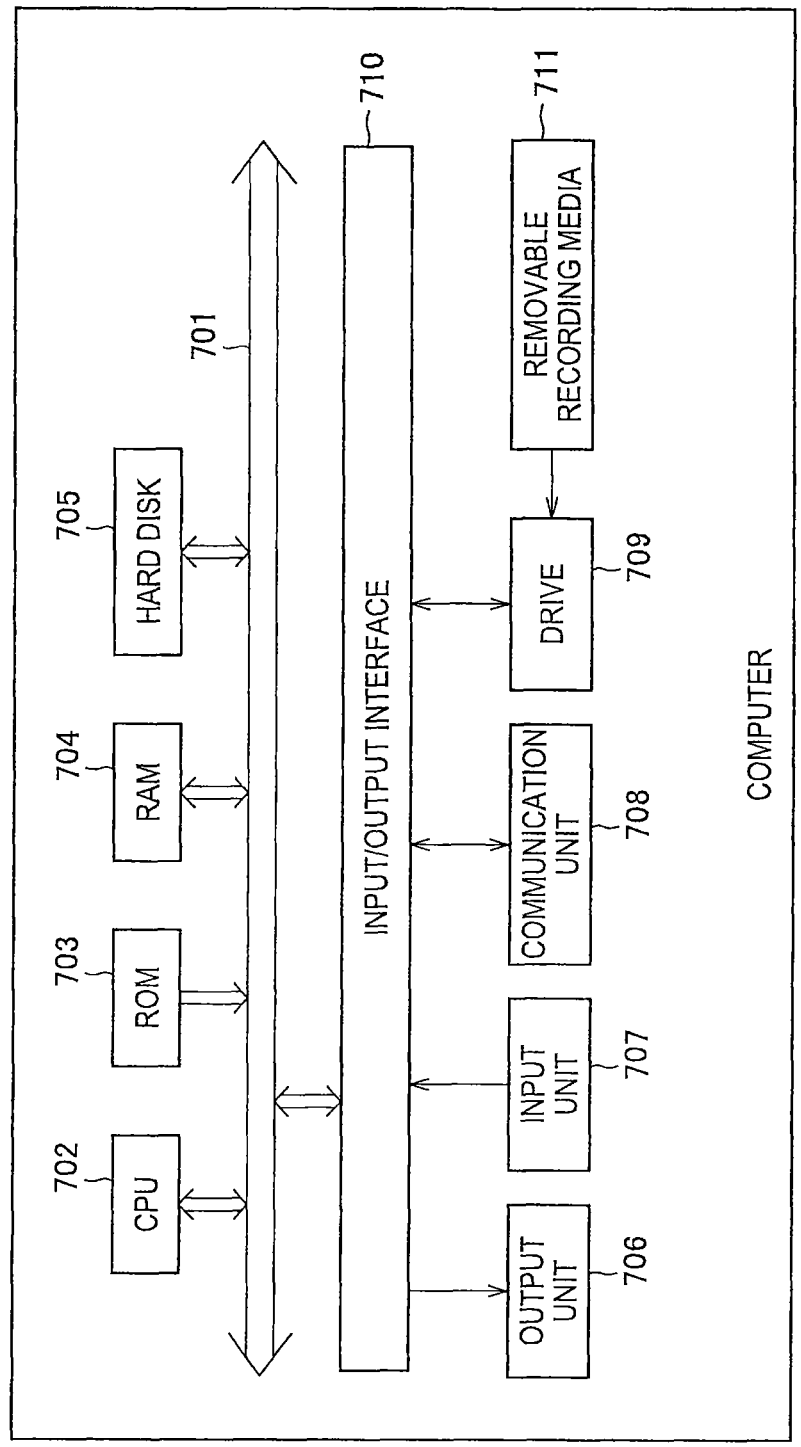

FIG. 178 is a block diagram illustrating a configuration example of an embodiment of a computer to which the present invention is applied.

DESCRIPTION OF EMBODIMENTS

Hereinafter, preferred embodiments of the present invention will be described in detail with reference to the appended drawings. Note that, in this specification and the drawings, elements that have substantially the same function and structure are denoted with the same reference signs, and repeated explanation is omitted.

Figure 7:
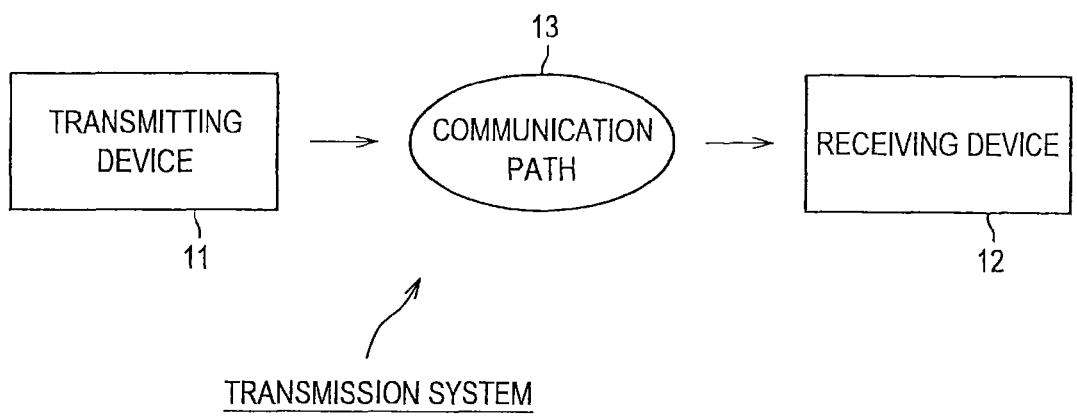
FIG. 7 is an illustration of a configuration example of an embodiment of a transmission system to which the present invention is applied.

FIG. 7 illustrates a configuration example of an embodiment of a transmission system (a system means a logical gathering of a plurality of devices and a device of each configuration may be arranged or may not be arranged in the same casing) to which the present invention is applied.

In FIG. 7, the transmission system includes a transmitting device 11 and a receiving device 12.

The transmitting device 11 transmits (broadcasts) a program that is exclusively used for a fixed terminal or a portable terminal. That is, the transmitting device 11 encodes target data to be a transmission target such as image data or sound data corresponding to the program exclusively used for the fixed terminal or the portable terminal with an LDPC code and transmits the LDPC code through a communication path 13 to be a ground wave.

The receiving device 12 is, for example, a portable terminal and receives the LDPC code transmitted from the transmitting device 11 through the communication path 13, decodes the LDPC code to obtain the target data, and outputs the target data.

In this case, it is known that the LDPC code used by the transmission system of FIG. 7 shows the very high capability in an AWGN (Additive White Gaussian Noise) communication path.

However, in the communication path 13 such as the ground wave, burst error or erasure may be generated. For example, in an OFDM (Orthogonal Frequency Division Multiplexing) system, power of a specific symbol may become 0 (erasure) according to delay of an echo (paths other than a main path), under a multi-path environment in which D/U (Desired to Undesired Ratio) is 0 dB (power of Undesired=echo is equal to power of Desired=main path).

In the flutter (communication path in which delay is 0 and an echo having a Doppler frequency is added), when D/U is 0 dB, entire power of an OFDM symbol at a specific time may become 0 (erasure) by the Doppler frequency.

In addition, the burst error may be generated due to a situation of a wiring line from a receiving unit (not illustrated in the drawings) of the side of the receiving device 12 such as an antenna receiving a signal from the transmitting device 11 to the receiving device 12 or instability of a power supply of the receiving device 12.

Figure 1:
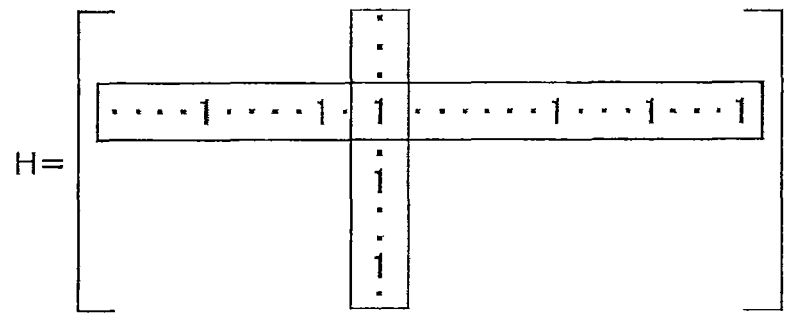
FIG. 1 is an illustration of a parity check matrix H of an LDPC code.
Figure 2:
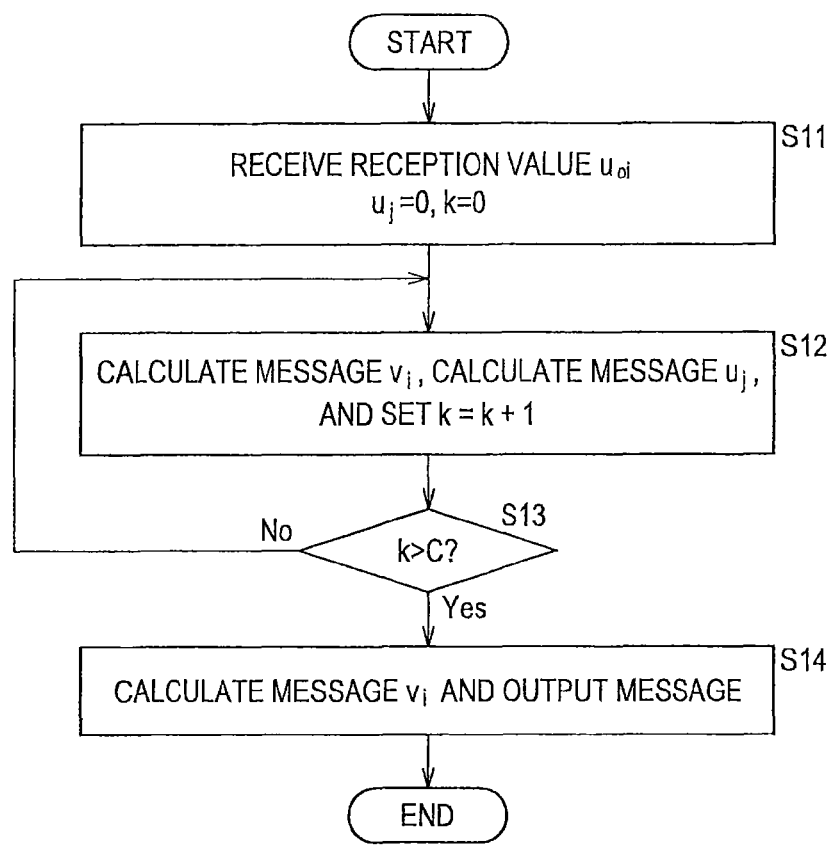
FIG. 2 is a flowchart illustrating a decoding sequence of an LDPC code.
Figure 4:
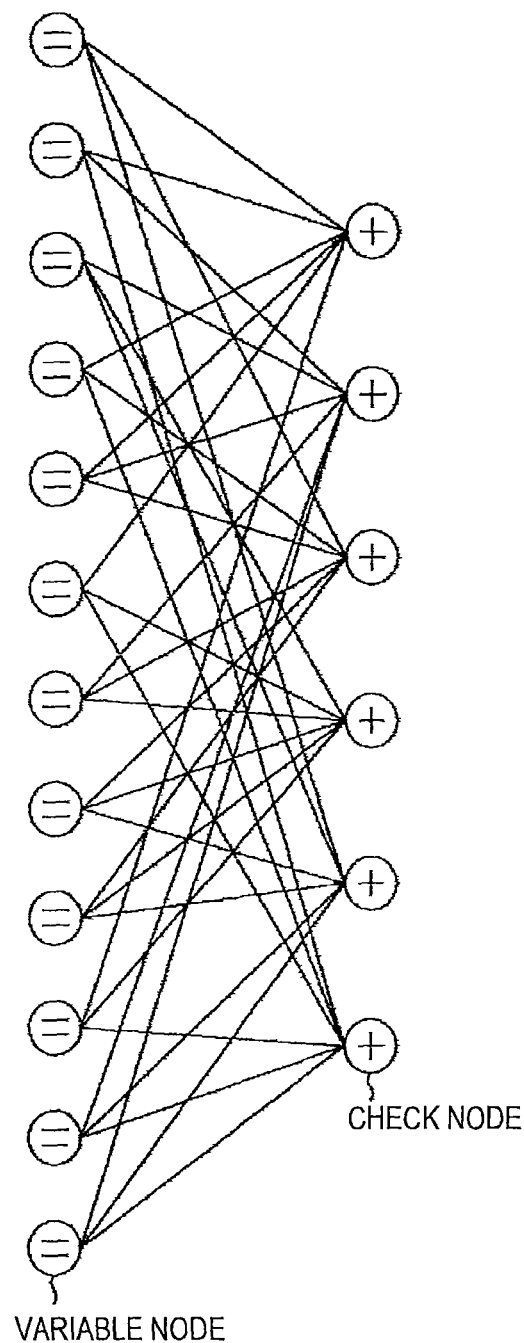
FIG. 4 is an illustration of a Tanner graph of a parity check matrix.
Figure 5:
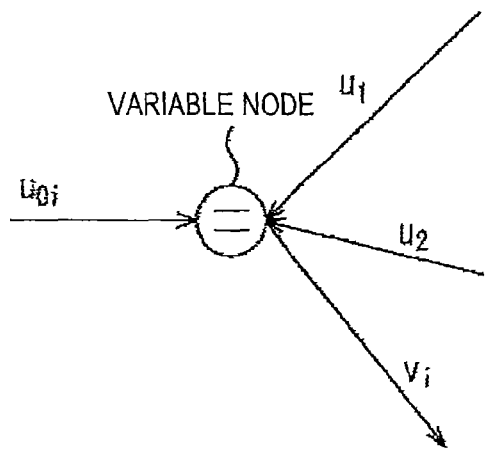
FIG. 5 is an illustration of a variable node.
Figure 6:
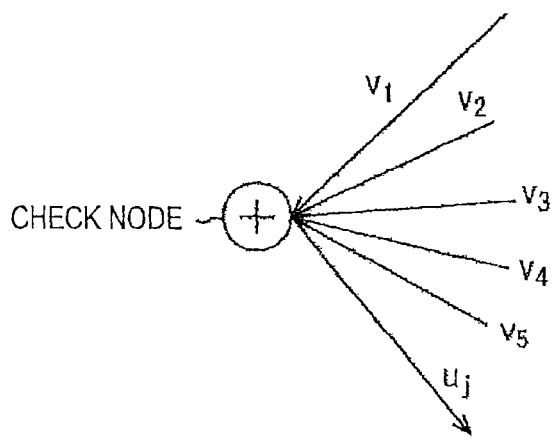
FIG. 6 is an illustration of a check node.

Meanwhile, in decoding of the LDPC code, in the variable node corresponding to the column of the parity check matrix H and the code bit of the LDPC code, as illustrated in FIG. 5 described above, the variable node operation of the expression (1) with the addition of (the reception value $u_{0i}$ of) the code bit of the LDPC code is performed. For this reason, if error is generated in the code bits used for the variable node operation, precision of the calculated message is deteriorated.

In the decoding of the LDPC code, in the check node, the check node operation of the expression (7) is performed using the message calculated by the variable node connected to the check node. For this reason, if the number of check nodes in which error (including erasure) is generated simultaneously in (the code bits of the LDPC codes corresponding to) the plurality of connected variable nodes increases, decoding performance is deteriorated.

That is, if the two or more variable nodes of the variable nodes connected to the check node become simultaneously erasure, the check node returns a message in which the probability of a value being 0 and the probability of a value being 1 are equal to each other, to all the variable nodes. In this case, the check node that returns the message of the equal probabilities does not contribute to one decoding processing (one set of the variable node operation and the check node operation). As a result, it is necessary to increase the repetition number of times of the decoding processing, the decoding performance is deteriorated, and consumption power of the receiving device 12 that performs decoding of the LDPC code increases.

Therefore, in the transmission system of FIG. 7, tolerance against the burst error or the erasure is improved while performance in the AWGN communication path is maintained.

Figure 8:
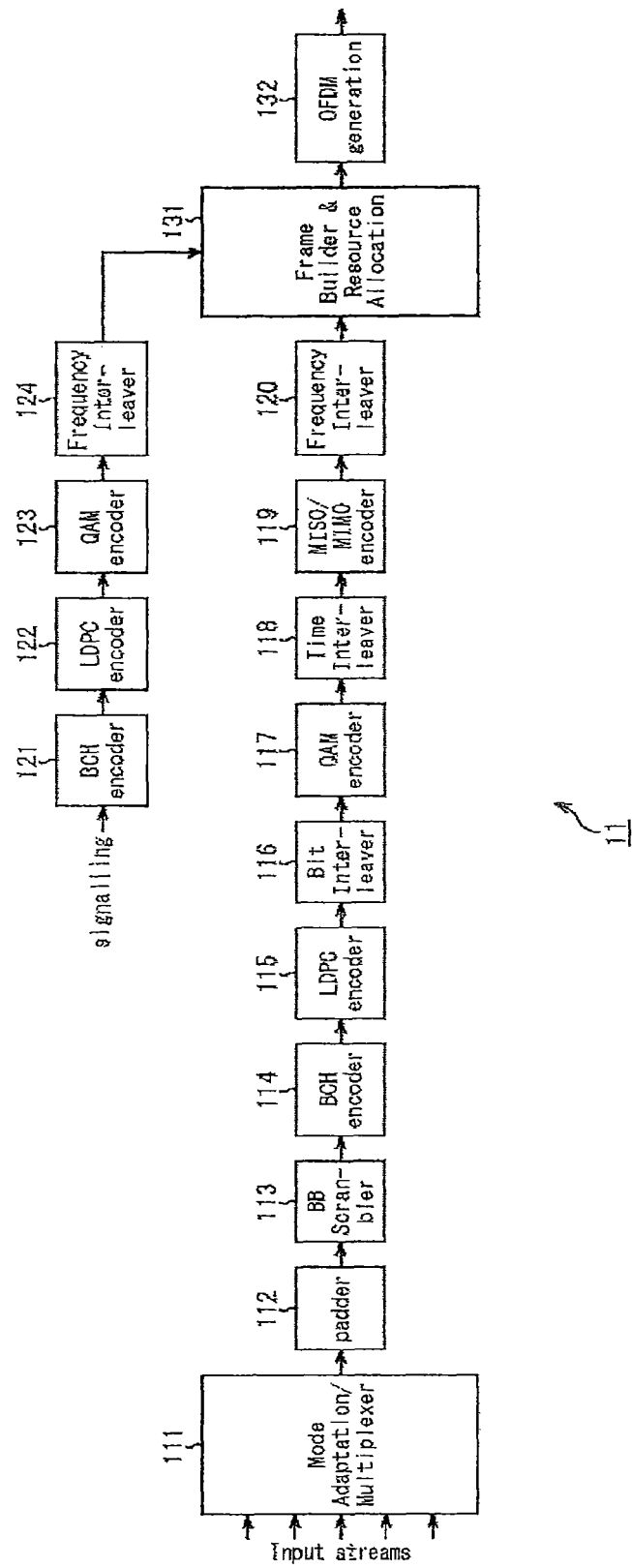
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams corresponding to target data are supplied to a mode adaption/multiplexer 111.

The mode adaption/multiplexer 111 performs mode selection and multiplexing of one or more input streams supplied thereto and supplies data obtained as a result to a padder 112.

The padder 112 performs necessary zero padding (insertion of Null) with respect to the data supplied from the mode adaptation/multiplexer 111 and supplies data obtained as a result to a BB scrambler 113.

The BB scrambler 113 performs energy diffusion with respect to the data supplied from the padder 112 and supplies data obtained as a result to a BCH encoder 114.

The BCH encoder 114 performs BCH encoding with respect to the data supplied from the BB scrambler 113 and supplies data obtained as a result as LDPC target data to be an LDPC encoding target to an LDPC encoder 115.

The LDPC encoder 115 performs LDPC encoding according to a parity check matrix in which a parity matrix to be a portion corresponding to a parity bit of an LDPC code becomes a staircase structure, as the LDPC encoding with respect to the LDPC target data supplied from the BCH encoder 114, and outputs an LDPC code in which the LDPC target data is information bits.

That is, the LDPC encoder 115 performs the LDPC encoding to encode the LDPC target data with an LDPC such as the LDPC code defined in the standard of the DVB-T.2 and outputs the LDPC code obtained as a result.

In this case, in the standard of the DVB-T.2, the LDPC code defined in the standard of the DVB-S.2 is adopted, except for the case in which a code length is 16200 bits and an encoding ratio is 3/5. The LDPC code defined in the standard of the DVB-T.2 is an IRA (Irregular Repeat Accumulate) code and a parity matrix of the parity check matrix of the LDPC code becomes a staircase structure. The parity matrix and the staircase structure will be described later. The IRA code is described in "Irregular Repeat-Accumulate Codes", H. Jin, A. Khandekar, and R. J. McEliece, in Proceedings of 2nd International Symposium on Turbo codes and Related Topics, pp. 1-8, September 2000, for example.

The LDPC code that is output by the LDPC encoder 115 is supplied to the bit interleaver 116.

The bit interleaver 116 is a data processing device that interleaves data and performs bit interleave to be described later with respect to the LDPC code supplied from the LDPC encoder 115 and supplies the LDPC code after the bit interleave to a QAM encoder 117.

The QAM encoder 117 maps the LDPC code supplied from the bit interleaver 116 to a signal point representing one symbol of orthogonal modulation in a unit (symbol unit) of code bits of one or more bits of the LDPC code and performs the orthogonal modulation (multilevel modulation).

That is, the QAM encoder 117 performs maps the LDPC code supplied from the bit interleaver 116 to a signal point determined by a modulation method performing the orthogonal modulation of the LDPC code, on an IQ plane (IQ constellation) defined by an I axis representing an I component of the same phase as a carrier and a Q axis representing a Q component orthogonal to the carrier, and performs the orthogonal modulation.

In this case, as the modulation method of the orthogonal modulation performed by the QAM encoder 117, for example, modulation methods including the modulation method defined in the standard of the DVB-T, that is, QPSK (Quadrature Phase Shift Keying), 16 QAM (Quadrature Amplitude Modulation), 64 QAM, 256 QAM, 1024 QAM, and 4096 QAM exist. In the QAM encoder 117, to perform the orthogonal modulation based on which modulation method is previously set according to an operation of an operator of the transmitting device 11. In the QAM encoder 117, for example, 4 PAM (Pulse Amplitude Modulation) and other orthogonal modulations can be performed.

Data (symbol mapped to the signal point) that is obtained by processing in the QAM encoder 117 is supplied to a time interleaver 118.

The time interleaver 118 performs time interleave for each symbol with respect to the data (symbol) supplied from the QAM encoder 117 and supplies data obtained as a result to an MISO/MIMO encoder (MISO/MIMO encoder) 119.

The MISO/MIMO encoder 119 performs spatiotemporal encoding with respect to the data (symbol) supplied from the time interleaver 118 and supplies the data to a frequency interleaver 120.

The frequency interleaver 120 performs frequency interleave for each symbol with respect to the data (symbol) supplied from the MISO/MIMO encoder 119 and supplies the data to a frame builder/resource allocation unit 131.

Meanwhile, signaling for control such as a preamble called L1 is supplied to the BCH encoder 121.

The BCH encoder 121 performs the BCH encoding with respect to the signaling supplied thereto and supplies data obtained as a result to an LDPC encoder 122, similar to the BCH encoder 114.

The LDPC encoder 122 sets the data supplied from the BCH encoder 121 as LDPC target data, performs the LDPC encoding with respect to the data, and supplies an LDPC code obtained as a result to a QAM encoder 123, similar to the LDPC encoder 115.

The QAM encoder 123 maps the LDPC code supplied from the LDPC encoder 122 to a signal point representing one symbol of orthogonal modulation in a unit (symbol unit) of code bits of one or more bits of the LDPC code, performs the orthogonal modulation, and supplies data (symbol) obtained as a result to a frequency interleaver 124, similar to the QAM encoder 117.

The frequency interleaver 124 performs the frequency interleave for each symbol with respect to the data (symbol) supplied from the QAM encoder 123 and supplies the data to the frame builder/resource allocation unit 131, similar to the frequency interleaver 120.

The frame builder/resource allocation unit 131 inserts symbols of pilots into necessary positions of the data (symbols) supplied from the frequency interleavers 120 and 124, configures a frame including symbols of a predetermined number from data (symbols) obtained as a result, and supplies the frame to an OFDM generating unit 132.

The OFDM generating unit 132 generates an OFDM signal corresponding to the frame from the frame supplied from the frame builder/resource allocation unit 131 and transmits the OFDM signal through the communication path 13 (FIG. 7).

Figure 9:
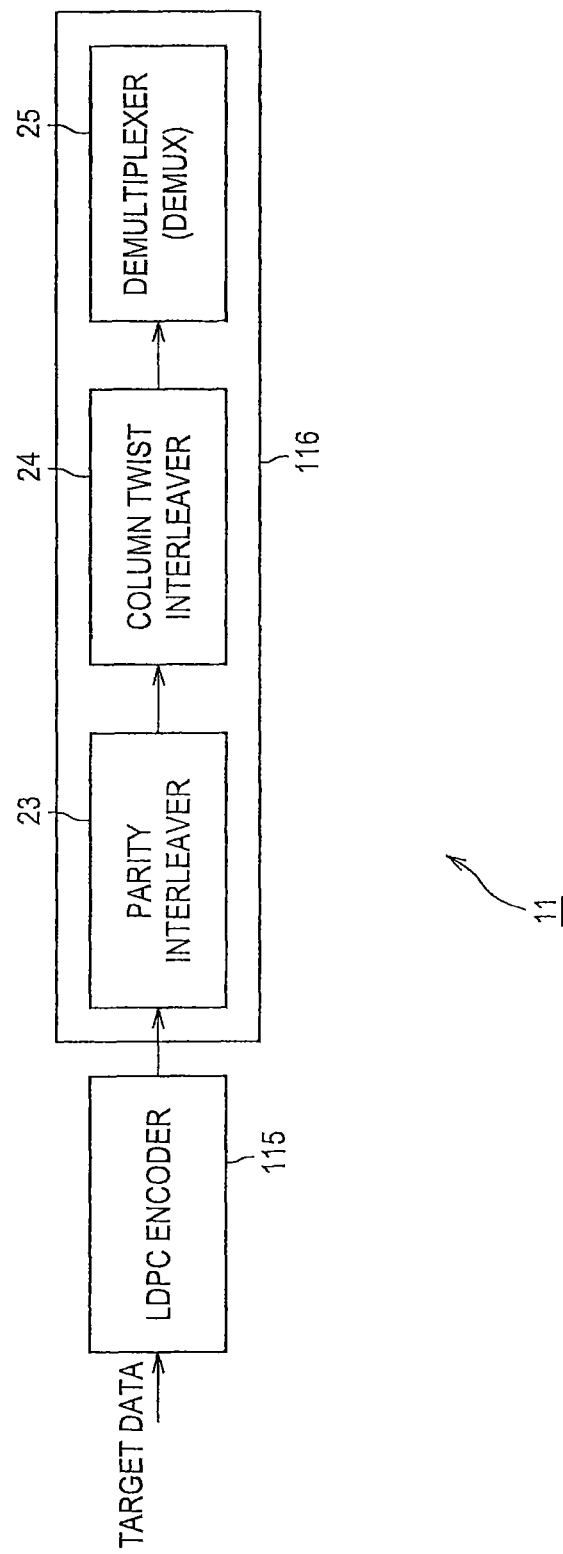
FIG. 9 is a block diagram illustrating a configuration example of a bit interleaver 116.

FIG. 9 illustrates a configuration example of the bit interleaver 116 of FIG. 8.

The bit interleaver 116 is a data processing device that interleaves data and includes a parity interleaver 23, a column twist interleaver 24, and a demultiplexer (DEMUX) 25.

The parity interleaver 23 performs parity interleave for interleaving the parity bits of the LDPC code supplied from the LDPC encoder 115 into positions of other parity bits and supplies the LDPC code after the parity interleave to the column twist interleaver 24.

The column twist interleaver 24 performs the column twist interleave with respect to the LDPC code supplied from the parity interleaver 23 and supplies the LDPC code after the column twist interleave to the demultiplexer 25.

That is, in the QAM encoder 117 of FIG. 8, the code bits of one or more bits of the LDPC code are mapped to the signal point representing one symbol of the orthogonal modulation and are transmitted.

In the column twist interleaver 24, the column twist interleave to be described later is performed as rearrangement processing for rearranging the code bits of the LDPC code supplied from the parity interleaver 23, such that a plurality of code bits of the LDPC code corresponding to 1 in any one row of the parity check matrix used by the LDPC encoder 115 are not included in one symbol.

The demultiplexer 25 executes interchange processing for interchanging positions of two or more code bits of the LDPC code becoming the symbol, with respect to the LDPC code supplied from the column twist interleaver 24, and obtains an LDPC code in which tolerance against the AWGN is reinforced. In addition, the demultiplexer 25 supplies two or more code bits of the LDPC code obtained by the interchange processing as the symbol to the QAM encoder 117 (FIG. 8).

Figure 10:
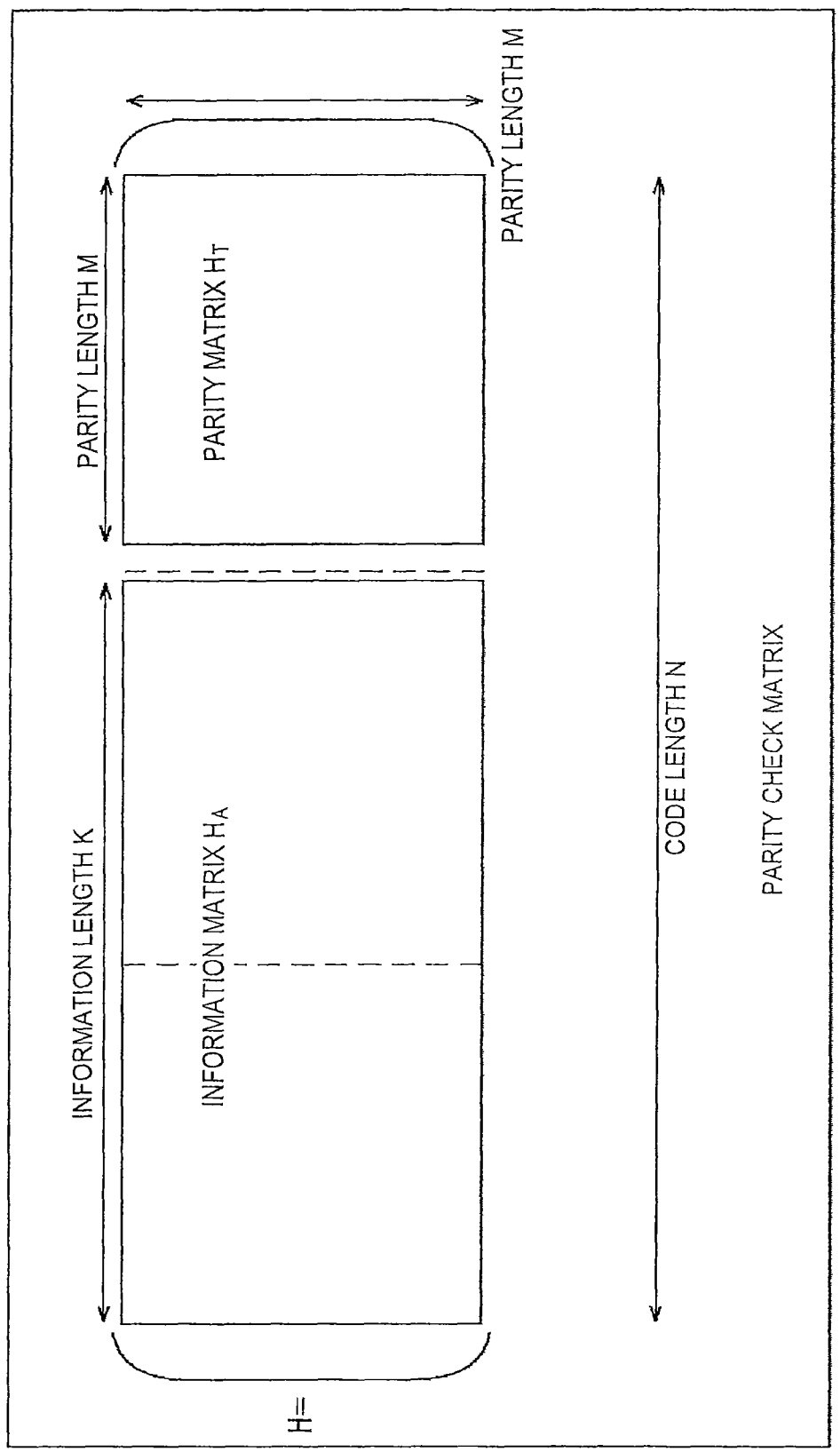
FIG. 10 is an illustration of a parity check matrix.

Next, FIG. 10 illustrates the parity check matrix H that is used for LDPC encoding by the LDPC encoder 115 of FIG. 8.

The parity check matrix H becomes an LDGM (Low-Density Generation Matrix) structure and can be represented by an expression $H=[H_A|H_T]$ (a matrix in which elements of the information matrix $H_A$ are set to left elements and elements of the parity matrix $H_T$ are set to right elements), using an information matrix $H_A$ of a portion corresponding to information bits among the code bits of the LDPC code and a parity matrix $H_T$ corresponding to the parity bits.

In this case, a bit number of the information bits among the code bits of one LDPC code (one code word) and a bit number of the parity bits are referred to as an information length K and a parity length M, respectively, and a bit number of the code bits of one LDPC code is referred to as a code length N (=K+M).

The information length K and the parity length M of the LDPC code having the certain code length N are determined by an encoding rate. The parity check matrix H becomes a matrix in which row×column is M×N. The information matrix $H_A$ becomes a matrix of M×K and the parity matrix $H_T$ becomes a matrix of M×M.

Figure 11:
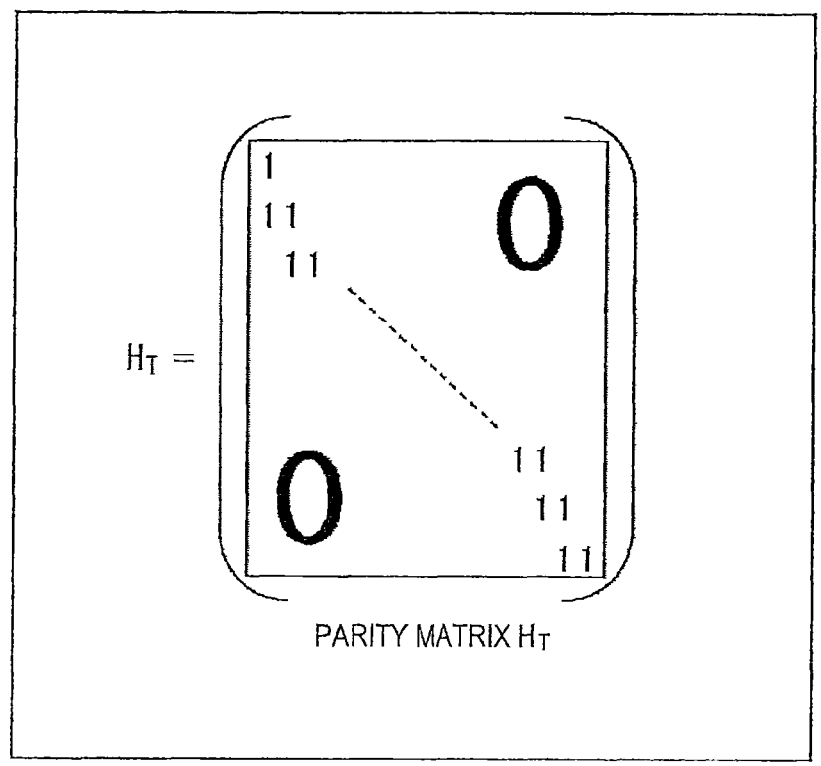
FIG. 11 is an illustration of a parity matrix.

FIG. 11 illustrates the parity matrix $H_T$ of the parity check matrix H of the LDPC code that is defined in the standard of the DVB-T.2 (and the DVB-S.2).

The parity matrix $H_T$ of the parity check matrix H of the LDPC code that is defined in the standard of the DVB-T.2 becomes a staircase structure in which elements of 1 are arranged in a staircase shape, as illustrated in FIG. 11. The row weight of the parity matrix $H_T$ becomes 1 with respect to the first row and becomes 2 with respect to the remaining rows. The column weight becomes 1 with respect to the final column and becomes 2 with respect to the remaining columns.

As described above, the LDPC code of the parity check matrix H in which the parity matrix $H_T$ becomes the staircase structure can be easily generated using the parity check matrix H.

That is, the LDPC code (one code word) is represented by a row vector c and a column vector obtained by transposing the row vector is represented by $C^T$. In addition, a portion of information bits of the row vector c to be the LDPC code is represented by a row vector A and a portion of the parity bits is represented by a row vector T.

In this case, the row vector c can be represented by an expression c=[A|T] (a row vector in which elements of the row vector A are set to left elements and elements of the row vector T are set to right elements), using the row vector A corresponding to the information bits and the row vector T corresponding to the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be sequentially calculated by setting elements of each row to 0, sequentially from elements of a first row of the column vector $Hc^T$ in the expression $Hc^T=0$, when the parity matrix $H_T$ of the parity check matrix H [$H_A$|$H_T$] becomes the staircase structure illustrated in FIG. 11.

Figure 12:
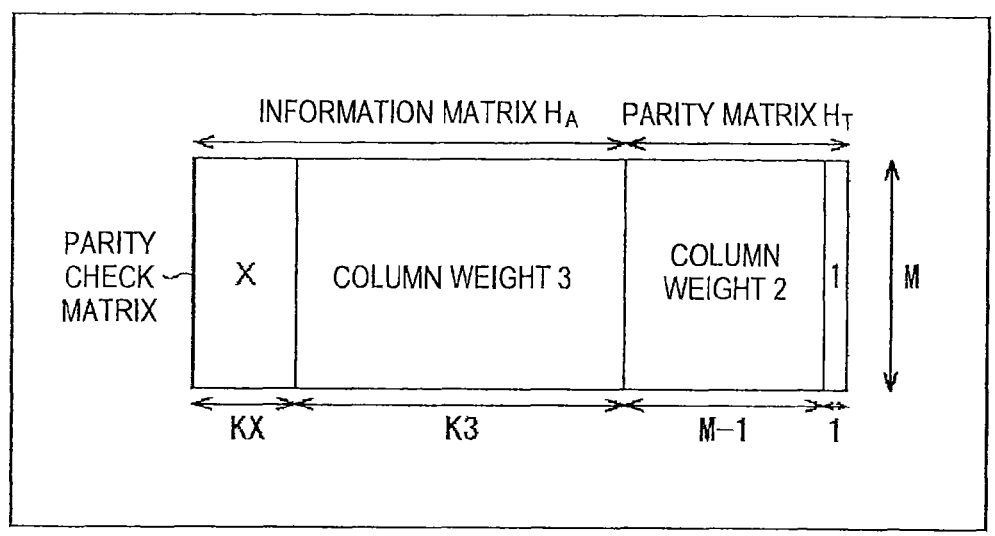
FIG. 12 is an illustration of a parity check matrix of an LDPC code defined in a standard of DVB-S.2.

FIG. 12 is an illustration of the parity check matrix H of the LDPC code that is defined in the standard of the DVB-T.2.

The column weight becomes X with respect KX columns from a first column of the parity check matrix H of the LDPC code defined in the standard of the DVB-T.2, becomes 3 with respect to the following K3 columns, becomes 2 with respect to the following (M−1) columns, and becomes 1 with respect to a final column.

In this case, KX+K3+M−1+1 is equal to the code length N.

FIG. 13 is an illustration of column numbers KX, K3, and M and a column weight X, with respect to each encoding rate r of the LDPC code defined in the standard of the DVB-T.2.

In the standard of the DVB-T.2, LDPC codes that have code lengths N of 64800 bits and 16200 bits are defined.

With respect to the LDPC code having the code length N of 64800 bits, 11 encoding rates (nominal rates) of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined.

Hereinafter, the code length N of the 64800 bits is referred to as 64 kbits and the code length N of the 16200 is referred to as 16 kbits.

With respect to the LDPC code, it is known that an error rate is low in a code bit corresponding to a column of which a column weight of the parity check matrix H is large.

In the parity check matrix H that is illustrated in FIGS. 12 and 13 and is defined in the standard of the DVB-T.2, a column weight of a column of a head side (left side) tends to be large. Therefore, with respect to the LDPC code corresponding to the parity check matrix H, a code bit of a head side tends to be strong for error (there is tolerance against the error) and a code bit of an ending side tends to be weak for the error.

Figure 14:
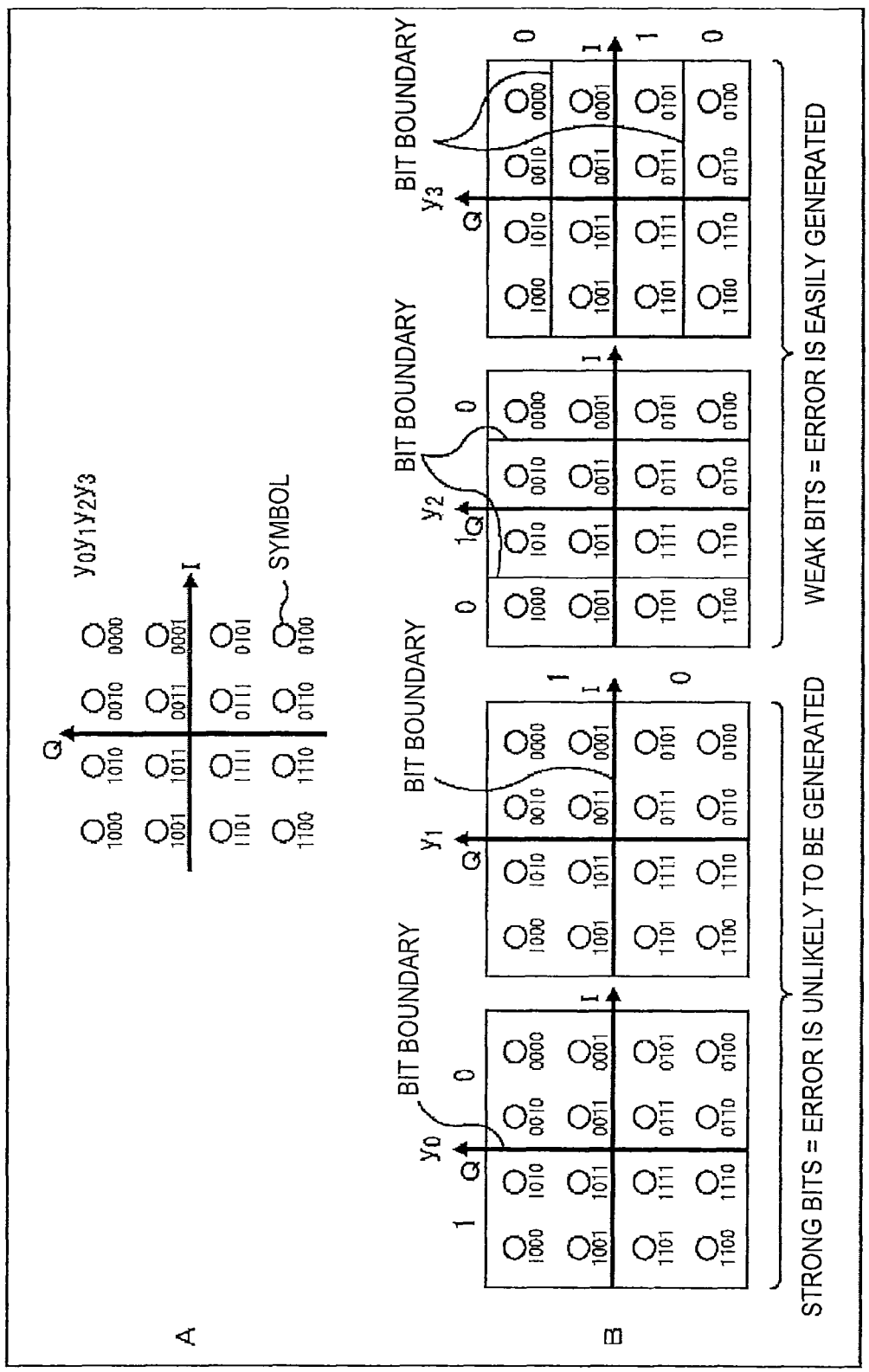
FIG. 14 is an illustration of signal point arrangement of 16 QAM.

Next, FIG. 14 illustrates an arrangement of (signal points corresponding to) 16 symbols on an IQ plane, when 16 QAM is performed by the QAM encoder 117 of FIG. 8.

That is, A of FIG. 14 illustrates symbols of the 16 QAM of the DVB-T.2.

In the 16 QAM, one symbol is represented by 4 bits and 16 symbols (=$2^4$) exist. The 16 symbols are arranged such that an I direction×a Q direction becomes a 4×4 square shape, on the basis of an original point of the IQ plane.

If an (i+1)-th bit from a most significant bit of a bit string represented by one symbol is represented as a bit $y_i$, the 4 bits represented by one symbol of the 16 QAM are can be represented as bits $y_0$, $y_1$, $y_2$, and $y_3$, respectively, sequentially from the most significant bit. When a modulation method is the 16 QAM, 4 bits of code bits of the LDPC code become a symbol (symbol value) of 4 bits $y_o$ to $y_3$ (symbolized).

B of FIG. 14 illustrates a bit boundary with respect to each of the 4 bits (hereinafter, referred to as symbol bits) $y_0$ to $y_3$ represented by the symbol of the 16 QAM.

In this case, a bit boundary with respect to the symbol bit $y_i$ (in FIG. 14, i=0, 1, 2, and 3) means a boundary of a symbol of which a symbol bit $y_i$ becomes 0 and a symbol of which a symbol bit $y_i$ becomes 1.

As illustrated by B of FIG. 14, only one place of the Q axis of the IQ plane becomes a bit boundary with respect to the most significant symbol bit $y_0$ of the 4 symbol bits $y_0$ to $y_3$ represented by the symbol of the 16 QAM and only one place of the I axis of the IQ plane becomes a bit boundary with respect to the second (second from the most significant bit) symbol bit $y_1$.

With respect to the third symbol bit $y_2$, two places of a place between first and second columns from the left side and a place between third and four columns, among the 4×4 symbols, become bit boundaries.

With respect to the fourth symbol bit $y_3$, two places of a place between first and second rows from the upper side and a place between third and four rows, among the 4×4 symbols, become bit boundaries.

In the symbol bits $y_i$ that are represented by the symbols, when the number of symbols apart from the bit boundaries is large, the error is difficult to be generated (the error probability is low) and when the number of symbols close to the bit boundaries is large, the error is easily generated (the error probability is high).

If the bits (strong for the error) in which the error is difficult to be generated are referred to as "strong bits" and the bits (weak for the error) in which the error is easily generated are referred to as "weak bits", with respect to the 4 symbol bits $y_0$ to y3 of the symbol of the 16 QAM, the most significant symbol bit $y_0$ and the second symbol bit $y_1$ become the strong bits and the third symbol bit $y_2$ and the fourth symbol bit $y_3$ become the weak bits.

Figure 15:
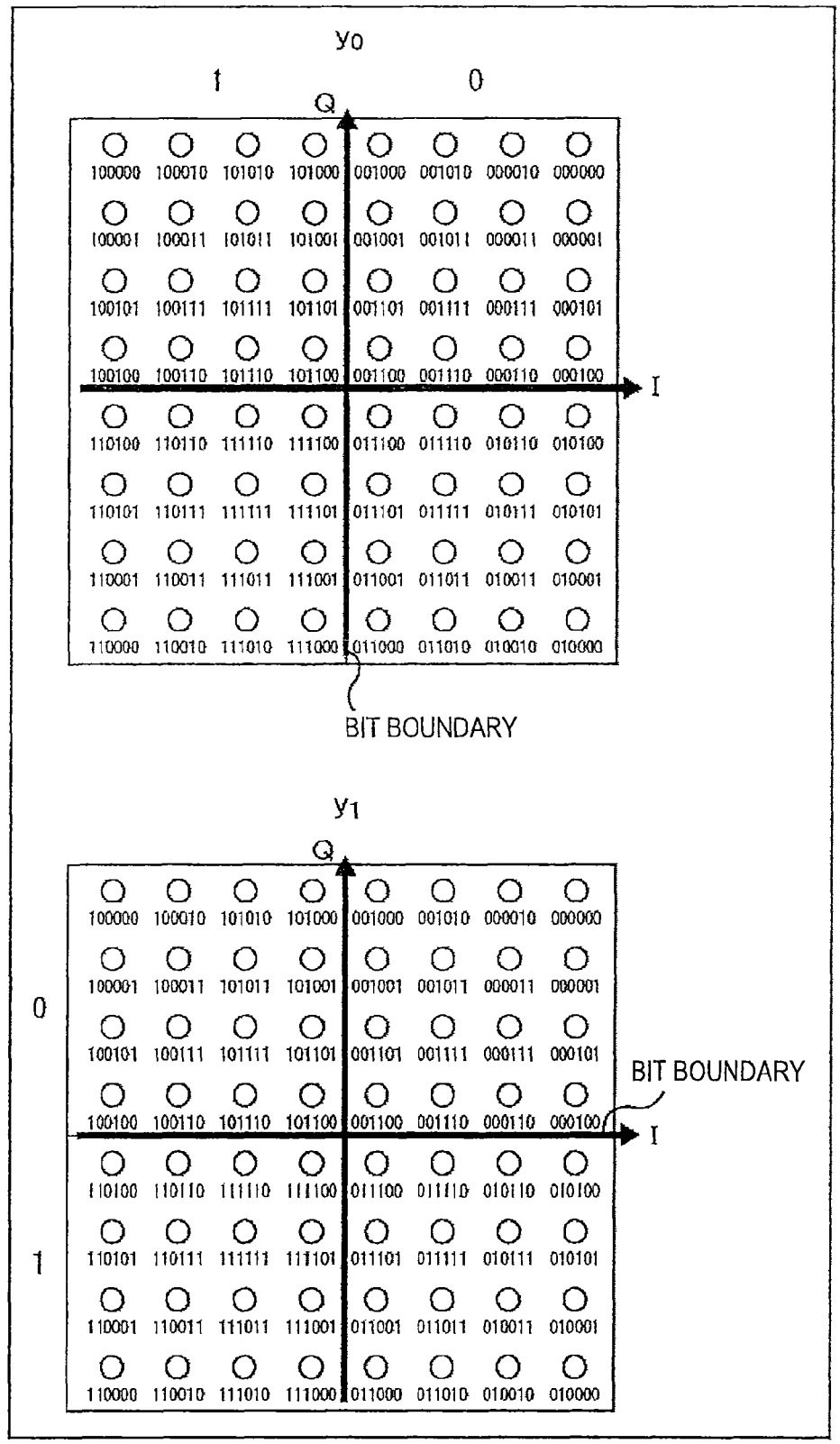
FIG. 15 is an illustration of signal point arrangement of 64 QAM.
Figure 16:
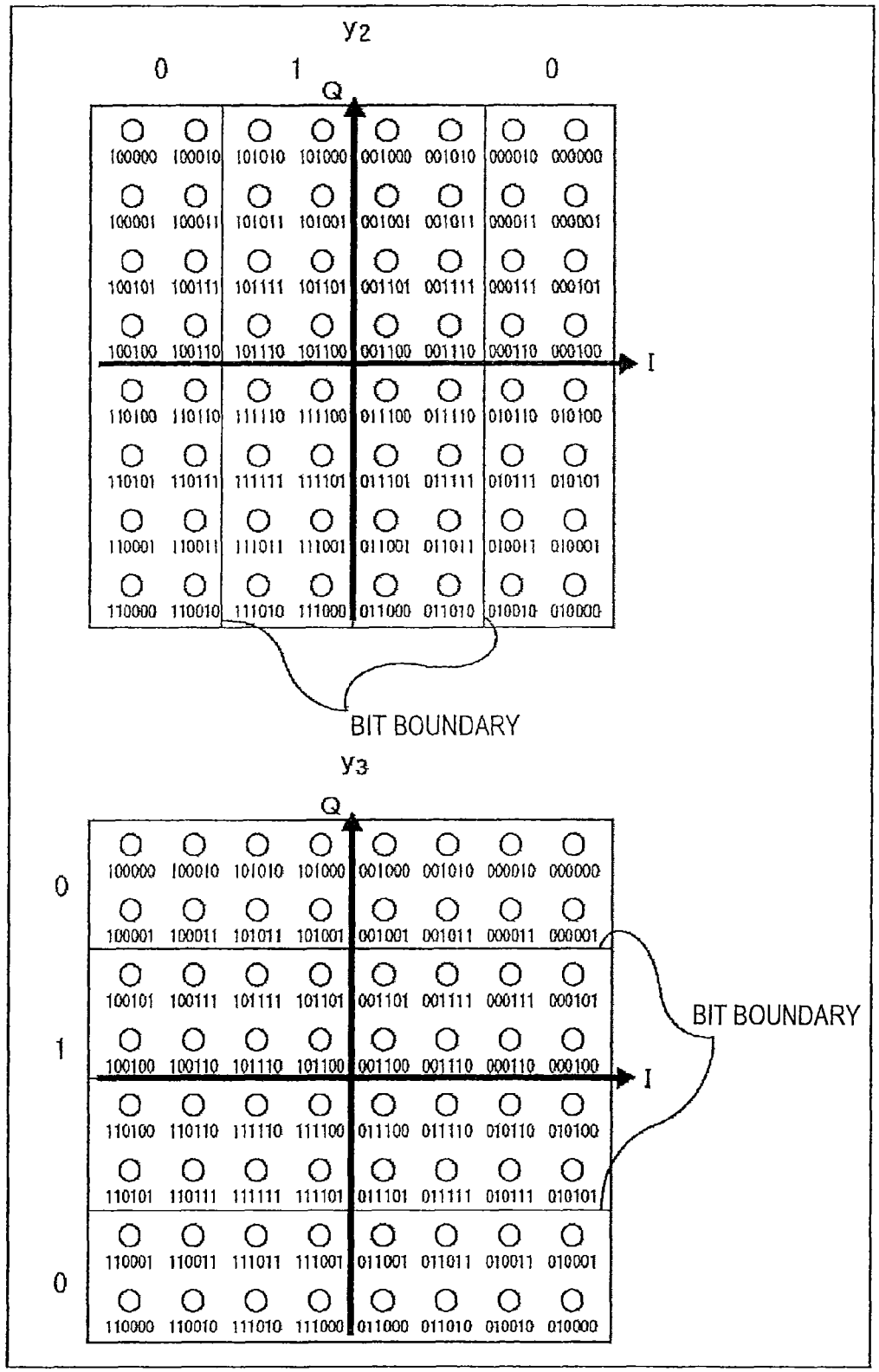
FIG. 16 is an illustration of signal point arrangement of 64 QAM.
Figure 17:
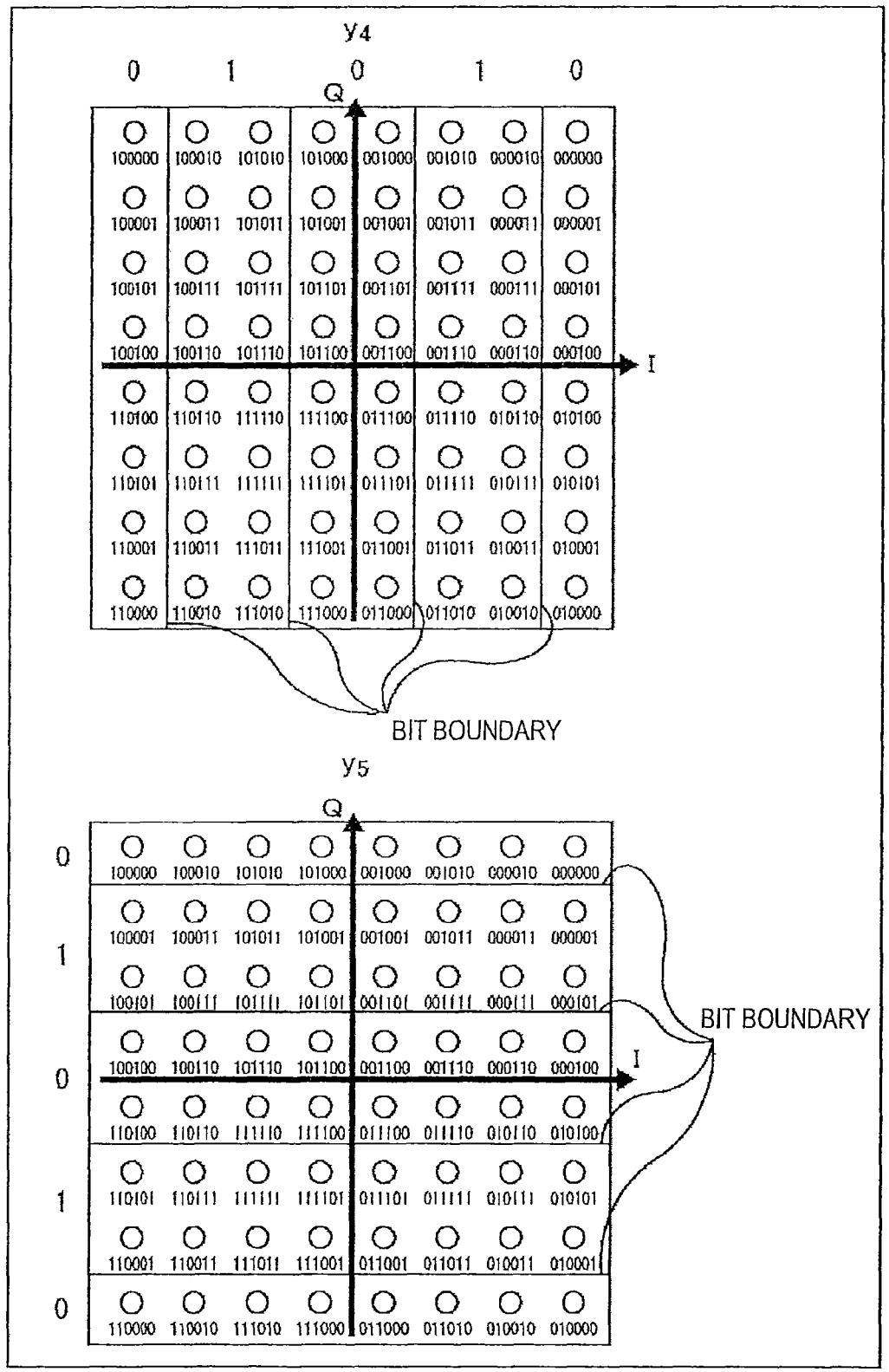
FIG. 17 is an illustration of signal point arrangement of 64 QAM.

FIGS. 15 to 17 illustrate an arrangement of (signal points corresponding to) 64 symbols on an IQ plane, that is, symbols of the 16 QAM of the DVB-T.2, when the 64 QAM is performed by the QAM encoder 117 of FIG. 8.

In the 64 QAM, one symbol represents 6 bits and 64 symbols ($=2^6$) exist.

The 64 symbols are arranged such that an I direction×a Q direction becomes an 8×8 square shape, on the basis of an original point of the IQ plane.

The symbol bits of one symbol of the 64 QAM can be represented as $y_0$, $y_1$, $y_2$, $y_3$, $y_4$, and $y_5$, sequentially from the most significant bit. When the modulation method is the 64 QAM, 6 bits of code bits of the LDPC code become a symbol of symbol bits $y_0$ to $y_5$ of 6 bits.

In this case, FIG. 15 illustrates a bit boundary with respect to each of the most significant symbol bit $y_0$ and the second symbol bit $y_1$ among the symbol bits $y_0$ to $y_5$ of the symbol of the 64 QAM, FIG. 16 illustrates a bit boundary with respect to each of the third symbol bit $y_2$ and the fourth symbol bit $y_3$, and FIG. 17 illustrates a bit boundary with respect to each of the fifth symbol bit $y_4$ and the sixth symbol bit $y_5$.

As illustrated in FIG. 15, the bit boundary with respect to each of the most significant symbol bit $y_0$ and the second symbol bit $y_1$ becomes one place. As illustrated in FIG. 16, the bit boundaries with respect to each of the third symbol bit $y_2$ and the fourth symbol bit $y_3$ become two places. As illustrated in FIG. 17, the bit boundaries with respect to each of the fifth symbol bit $y_4$ and the sixth symbol bit $y_5$ become four places.

Therefore, with respect to the symbol bits $y_0$ to $y_5$ of the symbol of the 64 QAM, the most significant symbol bit $y_0$ and the second symbol bit $y_1$ become strong bits and the third symbol bit $y_2$ and the fourth symbol bit $y_3$ become next strong bits. In addition, the fifth symbol bit $y_4$ and the sixth symbol bit $y_5$ become weak bits.

From FIGS. 14 and 15 to 17, it can be known that, with respect to the symbol bits of the symbol of the orthogonal modulation, the upper bits tend to become the strong bits and the lower bits tend to become the weak bits.

As described in FIGS. 12 and 13, with respect to the LDPC code output by the LDPC encoder 115 (FIG. 8), code bits strong for the error and code bits weak for the error exist.

As described in FIGS. 14 to 17, with respect to the symbol bits of the symbol of the orthogonal modulation performed by the QAM encoder 117, the strong bits and the weak bits exist.

Therefore, if the code bits of the LDPC code strong for the error are allocated to the weak symbol bits of the symbol of the orthogonal modulation, tolerance against the error is lowered as a whole.

Therefore, an interleaver that interleaves the code bits of the LDPC code in such a manner that the code bits of the LDPC code weak for the error are allocated to the strong bits (symbol bits) of the symbol of the orthogonal modulation is suggested.

The demultiplexer 25 of FIG. 9 can execute processing of the interleaver.

Figure 18:
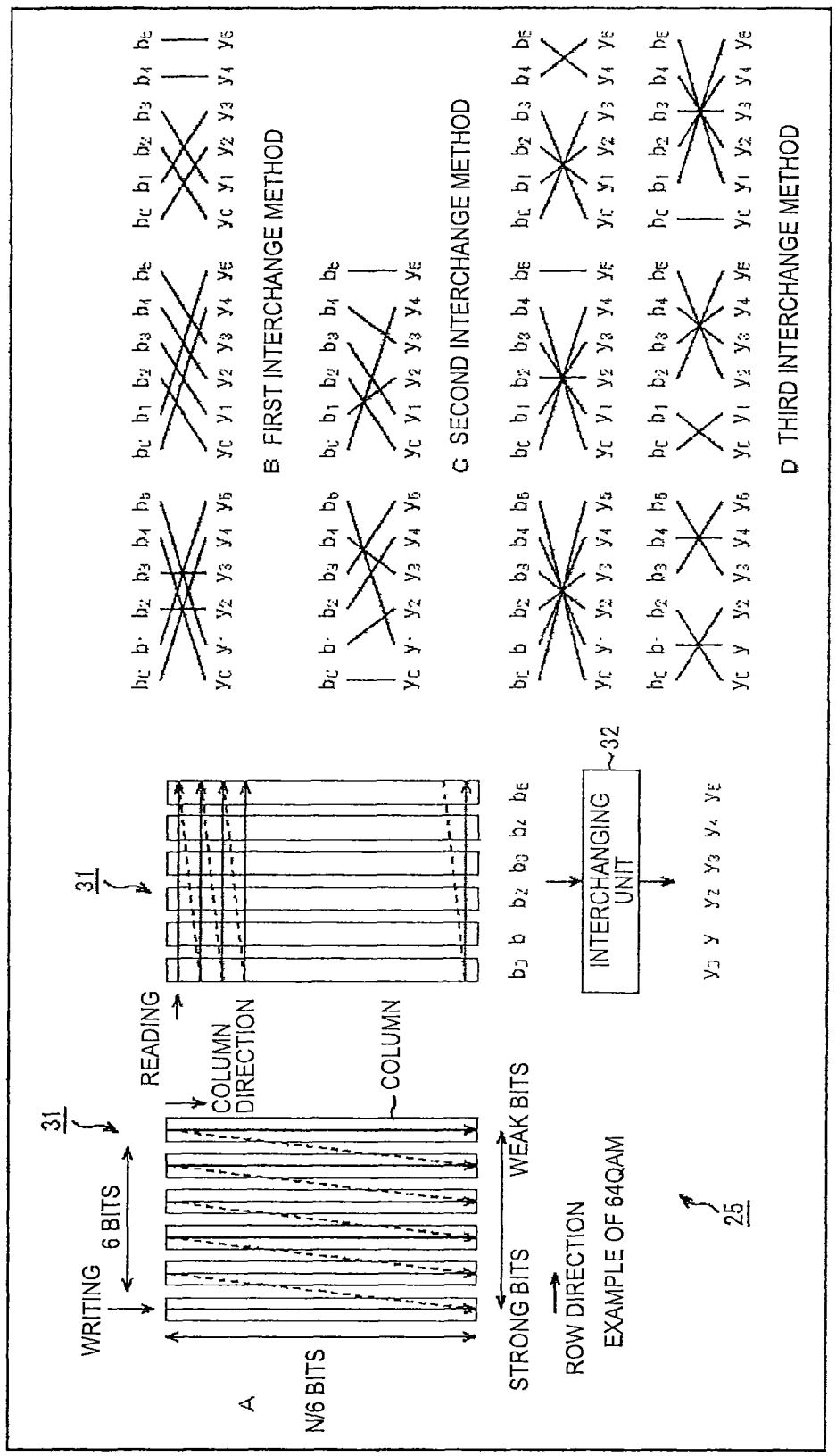
FIG. 18 is an illustration of processing of a demultiplexer 25.

FIG. 18 is an illustration of processing of the demultiplexer 25 of FIG. 9.

That is, A of FIG. 18 illustrates a functional configuration example of the demultiplexer 25.

The demultiplexer 25 includes a memory 31 and an interchanging unit 32.

An LDPC code is supplied from the LDPC encoder 115 to the memory 31.

The memory 31 has a storage capacity to store mb bits in a row (transverse) direction and store N/(mb) bits in a column (longitudinal) direction. The memory 31 writes code bits of the LDPC code supplied thereto in the column direction, reads the code bits in the row direction, and supplies the code bits to the interchanging unit 32.

In this case, N (=information length K+parity length M) represents a code length of the LDPC code, as described above.

In addition, m represents a bit number of the code bits of the LDPC code that becomes one symbol and b represents a multiple that is a predetermined positive integer and is used to perform integral multiplication of m. As described above, the demultiplexer 25 symbolizes the code bits of the LDPC code. However, the multiple b represents the number of symbols obtained by one-time symbolization of the demultiplexer 25.

A of FIG. 18 illustrates a configuration example of the demultiplexer 25 when the modulation method is the 64 QAM. Therefore, a bit number m of the code bits of the LDPC code becoming one symbol is 6 bits.

In A of FIG. 18, the multiple b becomes 1. Therefore, the memory 31 has a storage capacity in which a column direction×a row direction is N/(6×1)×(6×1) bits.

In this case, a storage region of the memory 31 in which the row direction is 1 bit and which extends in the column direction is appropriately referred to as a column hereinafter. In A of FIG. 18, the memory 31 includes 6 (=6×1) columns.

In the demultiplexer 25, writing of the code bits of the LDPC code in a downward direction (column direction) from the upper side of the columns constituting the memory 31 is performed toward the columns of a rightward direction from the left side.

If writing of the code bits ends to the bottom of the rightmost column, the code bits are read in a unit of 6 bits (mb bits) in the row direction from a first row of all the columns constituting the memory 31 and are supplied to the interchanging unit 32.

The interchanging unit 32 executes interchange processing for interchanging positions of the code bits of the 6 bits from the memory 31 and outputs 6 bits obtained as a result as 6 symbol bits $y_0$, $y_1$, $y_2$, $y_3$, $y_4$, and $y_5$ representing one symbol of the 64 QAM.

That is, the code bits of the mb bits (in this case, 6 bits) are read from the memory 31 in the row direction. However, if the i-th (i=0, 1, . . . , and mb−1) bit from the most significant bit, of the code bits of the mb bits read from the memory 31, is represented as a bit $b_i$, the code bits of the 6 bits that are read from the memory 31 in the row direction can be represented as bits $b_0$, $b_1$, $b_2$, $b_3$, $b_4$, and $b_5$, sequentially from the most significant bit.

With the relation of the column weights described in FIGS. 12 and 13, the code bit in a direction of the bit $b_0$ becomes a code bit strong for the error and the code bit in a direction of the bit $b_5$ becomes a code bit weak for the error.

In the interchanging unit 32, interchange processing for interchanging the positions of the code bits $b_0$ to $b_5$ of the 6 bits from the memory 31, such that the code bits weak for the error among the code bits $b_0$ to $b_5$ of the 6 bits from the memory 31 are allocated to the strong bits among the symbol bits $y_0$ to $y_5$ of one symbol of the 64 QAM, can be executed.

In this case, as interchange methods for interchanging the code bits $b_0$ to $b_5$ of the 6 bits from the memory 31 and allocating the code bits $b_0$ to $b_5$ of the 6 bits to the 6 symbol bits $y_0$ to $y_5$ representing one symbol of the 64 QAM, various methods are suggested from individual companies.

B of FIG. 18 illustrates a first interchange method, C of FIG. 18 illustrates a second interchange method, and D of FIG. 18 illustrates a third interchange method.

In B of FIG. 18 to D of FIG. 18 (and FIG. 19 to be described later), a line segment coupling the bits $b_i$ and $y_j$ means that the code bit $b_i$ is allocated to the symbol bit $y_j$ of the symbol (interchanged with a position of the symbol bit $y_j$).

As the first interchange method of B of FIG. 18, to adopt any one of three kinds of interchange methods is suggested. As the second interchange method of C of FIG. 18, to adopt any one of two kinds of interchange methods is suggested.

As the third interchange method of D of FIG. 18, to sequentially select six kinds of interchange methods and use the interchange method is suggested.

Figure 19:
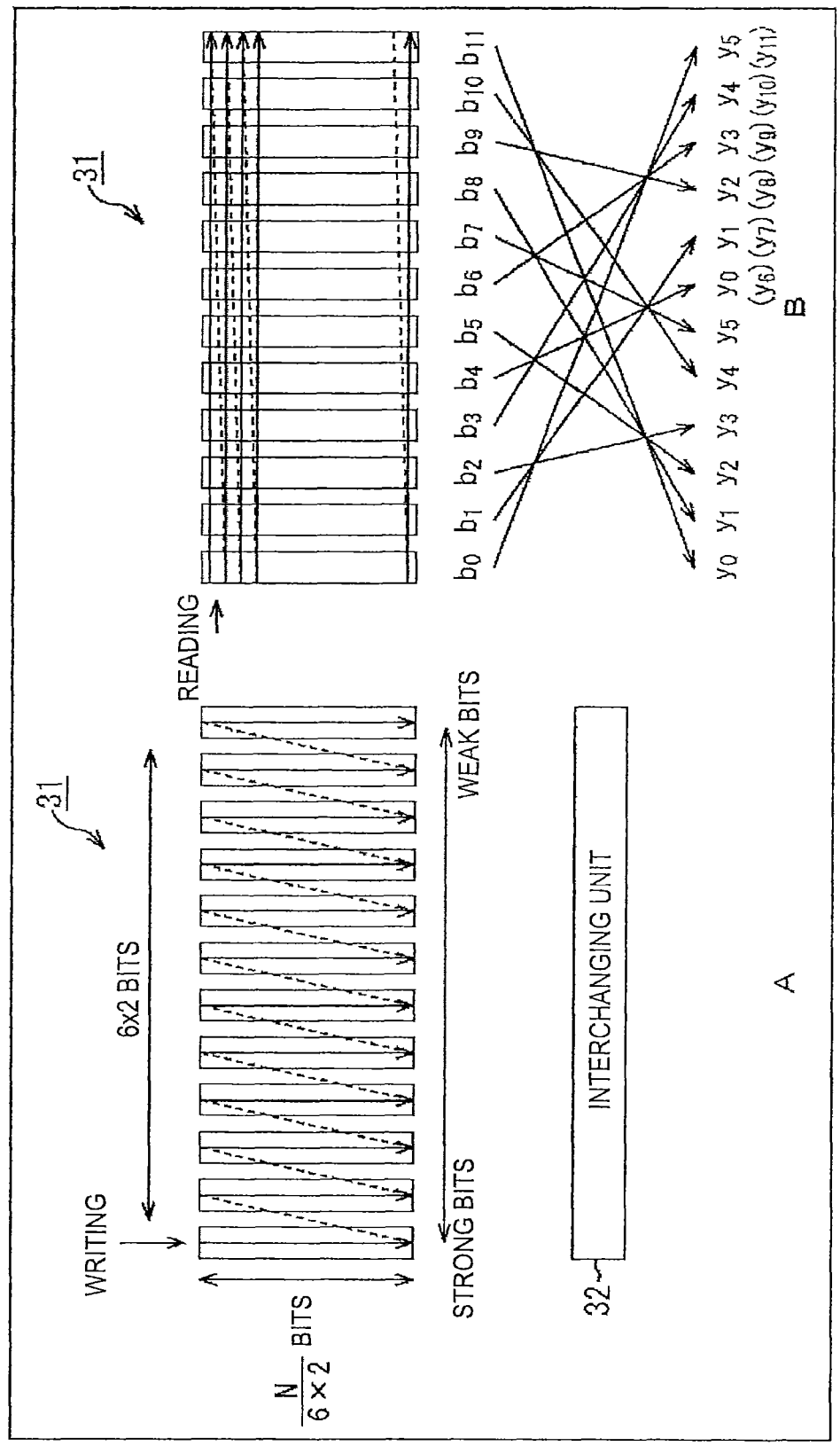

FIG. 19 illustrates a configuration example of the demultiplexer 25 when the modulation method is the 64 QAM (therefore, a bit number m of the code bits of the LDPC code mapped to one symbol is 6 bits, similar to FIG. 18) and the multiple b is 2 and a fourth interchange method.

When the multiple b is 2, the memory 31 has a storage capacity in which a column direction×a row direction is N/(6×2)×(6×2) bits and includes 12 (=6×2) columns.

A of FIG. 19 illustrates a sequence of writing the LDPC code to the memory 31.

In the demultiplexer 25, as described in FIG. 18, writing of the code bits of the LDPC code in a downward direction (column direction) from the upper side of the columns constituting the memory 31 is performed toward the columns of a rightward direction from the left side.

If writing of the code bits ends to the bottom of the rightmost column, the code bits are read in a unit of 12 bits (mb bits) in the row direction from a first row of all the columns constituting the memory 31 and are supplied to the interchanging unit 32.

The interchanging unit 32 executes interchange processing for interchanging positions of the code bits of the 12 bits from the memory 31 using the fourth interchange method and outputs 12 bits obtained as a result as 12 bits representing two symbols (b symbols) of the 64 QAM, that is, six symbol bits $y_0, y_1, y_2, y_3, y_4,$ and $y_5$ representing one symbol of the 64 QAM and six symbol bits $y_0, y_1, y_2, y_3, y_4,$ and $y_5$ representing a next one symbol.

In this case, B of FIG. 19 illustrates the fourth interchange method of the interchange processing by the interchanging unit 32 of A of FIG. 19.

When the multiple b is 2 (or 3 or more), in the interchange processing, the code bits of the mb bits are allocated to the symbol bits of the mb bits of the b consecutive symbols. In the following explanation including the explanation of FIG. 19, the (i+1)-th bit from the most significant bit of the symbol bits of the mb bits of the b consecutive symbols is represented as a bit (symbol bit) $y_i$, for the convenience of explanation.

The appropriate interchange method, that is, the improvement of the error rate in the AWGN communication path is different according to the encoding rate or the code length of the LDPC code and the modulation method.

Next, the parity interleave by the parity interleaver 23 of FIG. 9 will be described with reference to FIGS. 20 to 22.

Figure 20:
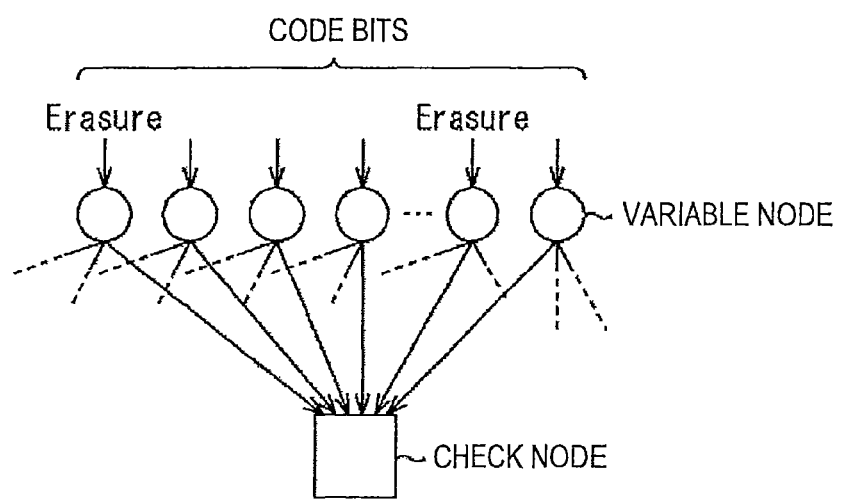
FIG. 20 is an illustration of a Tanner graph for decoding of an LDPC code.

FIG. 20 illustrates (a part of) a Tanner graph of the parity check matrix of the LDPC code.

As illustrated in FIG. 20, if a plurality of, for example, two variable nodes among (the code bits corresponding to) the variable nodes connected to the check node simultaneously become the error such as the erasure, the check node returns a message in which the probability of a value being 0 and the probability of a value being 1 are equal to each other, to all the variable nodes connected to the check node. For this reason, if the plurality of variable nodes connected to the same check node simultaneously become the erasure, decoding performance is deteriorated.

Meanwhile, the LDPC code that is output by the LDPC encoder 115 of FIG. 8 and is defined in the standard of the DVB-T.2 is an IRA code and the parity matrix $H_T$ of the parity check matrix H becomes a staircase structure, as illustrated in FIG. 11.

Figure 21:
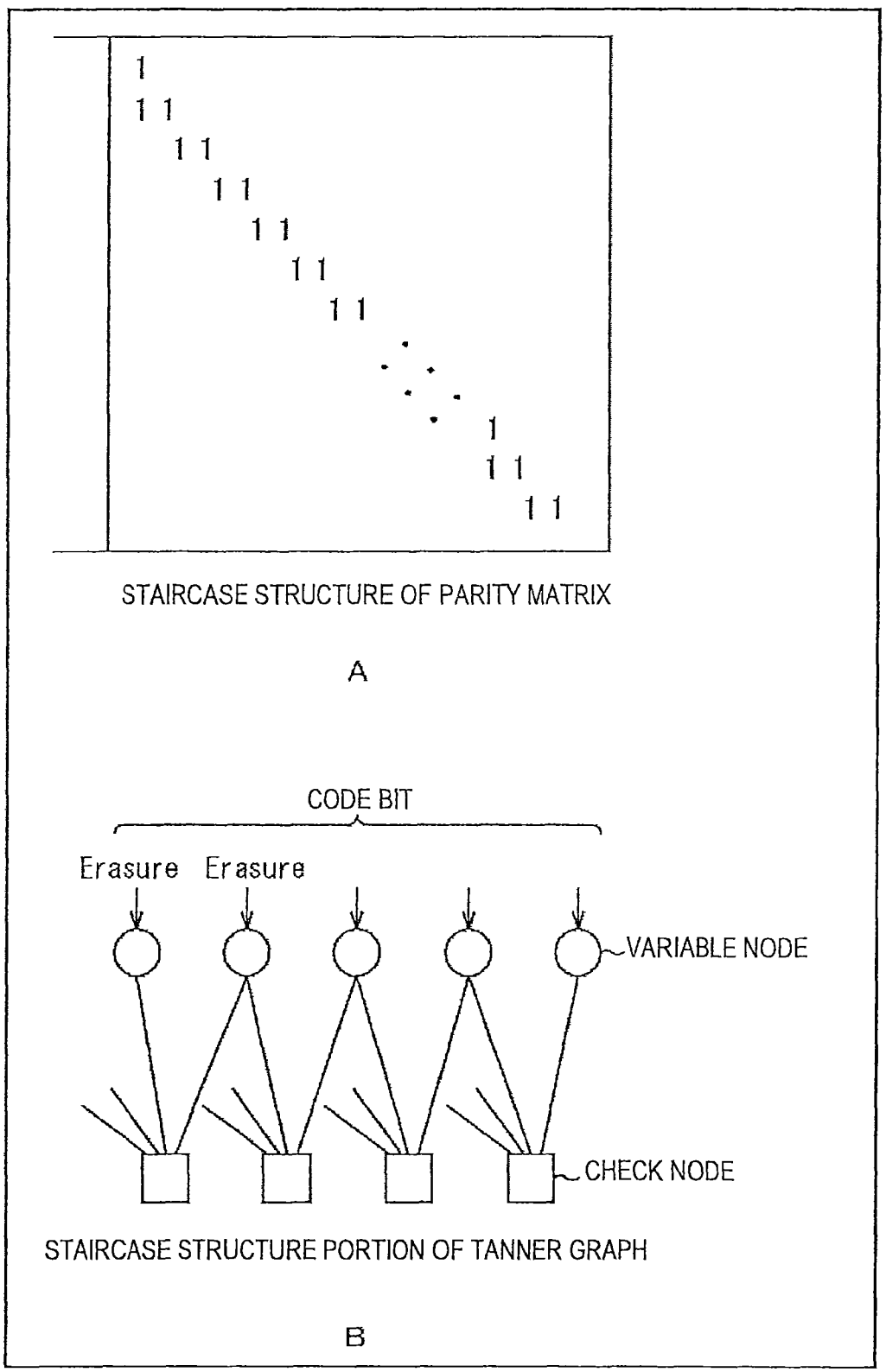
FIG. 21 is an illustration of a parity matrix $H_T$ becoming a staircase structure and a Tanner graph corresponding to the parity matrix $H_T$.

FIG. 21 illustrates the parity matrix $H_T$ becoming the staircase structure and a Tanner graph corresponding to the parity matrix $H_T$.

That is, A of FIG. 21 illustrates the parity matrix $H_T$ becoming the staircase structure and B of FIG. 21 illustrates the Tanner graph corresponding to the parity matrix $H_T$ of A of FIG. 21.

When the parity matrix $H_T$ becomes the staircase structure, in the Tanner graph of the parity matrix $H_T$, the variable nodes from which the messages are calculated using the adjacent code bits (parity bits) of the LDPC code, corresponding to the columns of the elements of which the values of the parity matrix $H_T$ become 1, are connected to the same check node.

Therefore, if the adjacent parity bits simultaneously become the error due to the burst error or the erasure, the check node that is connected to the plurality of variable nodes (variable nodes from which the messages are calculated using the parity bits) corresponding to the plurality of parity bits becoming the error returns a message in which the probability of a value being 0 and the probability of a value being 1 are equal to each other, to the variable nodes connected to the check node. For this reason, the decoding performance is deteriorated. When the burst length (the number of bits that become the error by the burst) is large, the decoding performance is further deteriorated.

Therefore, the parity interleaver 23 (FIG. 9) performs the parity interleave for interleaving the parity bits of the LDPC code from the LDPC encoder 115 into positions of other parity bits, to prevent the decoding performance from being deteriorated.

Figure 22:
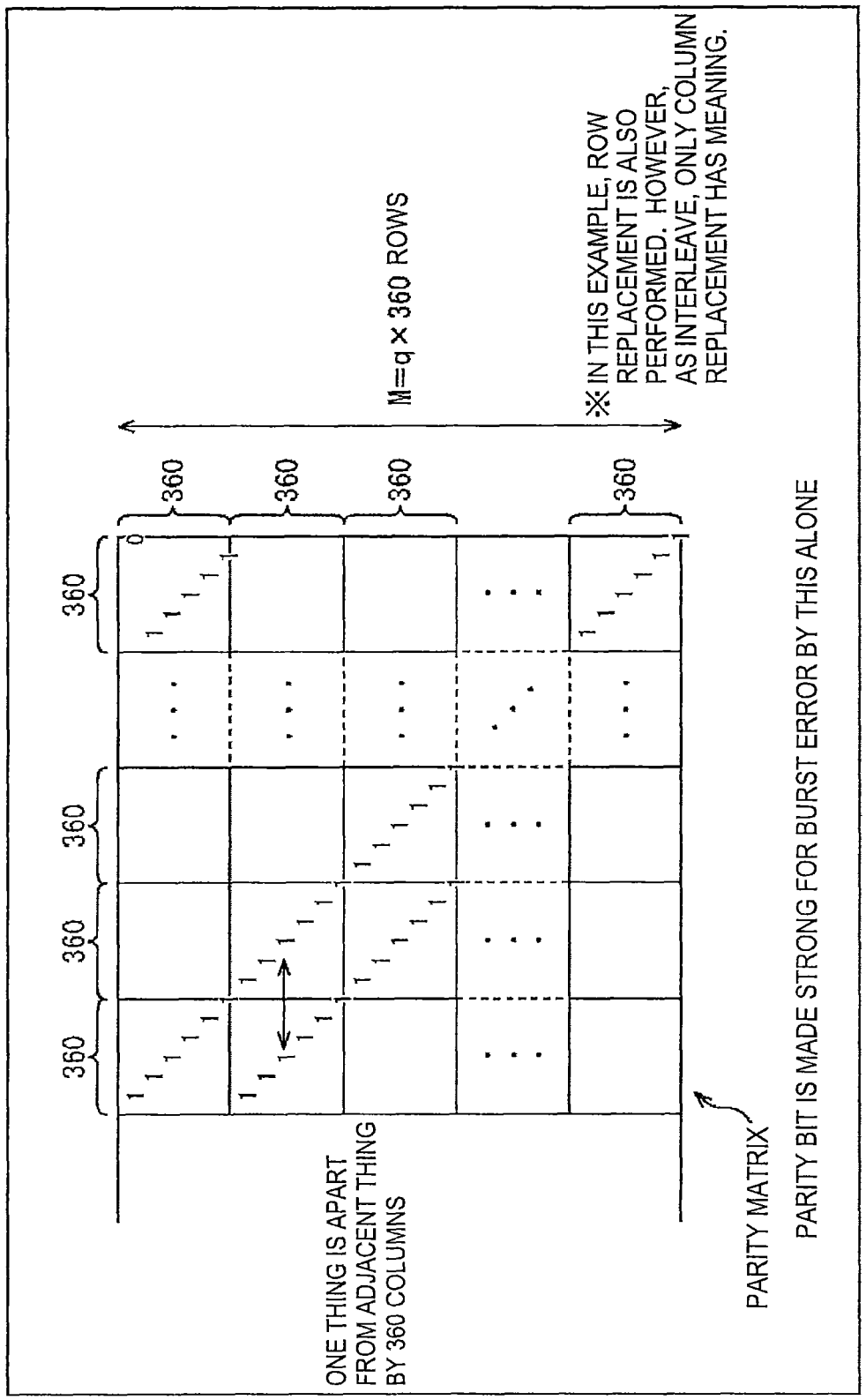
FIG. 22 is an illustration of a parity matrix $H_T$ of a parity check matrix H corresponding to an LDPC code after parity interleave.

FIG. 22 illustrates the parity matrix $H_T$ of the parity check matrix H corresponding to the LDPC code after the parity interleave performed by the parity interleaver 23 of FIG. 9.

In this case, the information matrix $H_A$ of the parity check matrix H corresponding to the LDPC code that is output by the LDPC encoder 115 and is defined in the standard of the DVB-T.2 becomes a cyclic structure.

The cyclic structure means a structure in which a certain column is matched with a column obtained by cycling another column. For example, the cyclic structure includes a structure in which a position of 1 of each row of P columns becomes a position obtained by cyclically shifting a first column of the P columns in a column direction by a value proportional to a value q obtained by dividing a parity length M, for every P columns. Hereinafter, the P columns in the cyclic structure are appropriately referred to as a column number of a unit of the cyclic structure.

As the LDPC code that is output by the LDPC encoder 115 and is defined in the standard of the DVB-T.2, the two kinds of LDPC codes that have the code lengths N of 64800 bits and 16200 bits exist, as illustrated in FIGS. 12 and 13.

If attention is paid to the LDPC code having the code length N of 64800 bits in the two kinds of LDPC codes having the code lengths N of 64800 bits and 16200 bits, the encoding rates of the LDPC code that has the code length N of 64800 bits are 11, as described in FIGS. 12 and 13.

With respect to the LDPC codes that have the eleven encoding rates and have the code length N of 64800 bits, in the standard of the DVB.T.2, a column number P of a unit of the cyclic structure is defined as 360 to be one of divisors of the parity length M other than 1 and M.

With respect to the LDPC codes that have the eleven encoding rates and have the code length N of 64800 bits, the parity length M becomes a value other than primes represented by an expression $M=q \times P=q \times 360$, using a value q different according to the encoding rate. Therefore, similar to the column number P of the unit of the cyclic structure, the value q is one other than 1 and M among the divisors of the parity length M and is obtained by dividing the parity length M by the column number P of the unit of the cyclic structure (the product of P and q to be the divisors of the parity length M becomes the parity length M).

As described above, if the information length is set to K, an integer equal to or more than 0 and less than P is set to x, and an integer equal to or more than 0 and less than q is set to y, the parity interleaver 23 interleaves a (K+qx+y+1)-th code bit among parity bits to be (K+1)-th to (K+M (=N))-th code bits of the LDPC code from the LDPC encoder 115 into a position of a (K+Py+x+1)-th code bit, as the parity interleave.

According to the parity interleave, (the parity bits corresponding to) the variable nodes connected to the same check node are separated by the column number P of the unit of the cyclic structure, that is, 360 bits in this case. For this reason, when the burst length is less than 360 bits, the plurality of variable nodes connected to the same check node can be prevented from simultaneously becoming the error. As a result, tolerance against the burst error can be improved.

The LDPC code after the interleave for interleaving the (K+qx+y+1)-th code bit into the position of the (K+Py+x+1)-th code bit is matched with an LDPC code of a parity check matrix (hereinafter, referred to as a transformed parity check matrix) obtained by performing column replacement for replacing the (K+qx+y+1)-th column of the original parity check matrix H with the (K+Py+x+1)-th column.

In the parity matrix of the transformed parity check matrix, as illustrated in FIG. 22, a pseudo cyclic structure that uses the P columns (in FIG. 22, 360 columns) as a unit appears.

In this case, the pseudo cyclic structure means a structure in which a cyclic structure is formed except for a part thereof. The transformed parity check matrix that is obtained by performing the column replacement corresponding to the parity interleave with respect to the parity check matrix of the LDPC code defined in the standard of the DVB-T.2 becomes the pseudo cyclic structure, not the (perfect) cyclic structure, because the number of elements of 1 is less than 1 (elements of 0 exist) in a portion (shifted matrix to be described later) of 360 rows×360 columns of a right corner portion thereof.

The transformed parity check matrix of FIG. 22 becomes a matrix that is obtained by performing the column replacement corresponding to the parity interleave and replacement (row replacement) of a row to configure the transformed parity check matrix with a constitutive matrix to be described later, with respect to the original parity check matrix H.

Next, column twist interleave corresponding to rearrangement processing by the column twist interleaver 24 of FIG. 9 will be described with reference to FIGS. 23 to 26.

In the transmitting device 11 of FIG. 8, one or more bits of the code bits of the LDPC code are transmitted as one symbol. That is, when two bits of the code bits are set as one symbol, the QPSK is used as the modulation method and when four bits of the code bits are set as one symbol, the 16 QAM is used as the modulation method.

As such, when the two or more bits of the code bits are transmitted as one symbol, if the erasure is generated in a certain symbol, all of the code bits of the symbol become the error (erasure).

Therefore, it is necessary to prevent the variable nodes corresponding to the code bits of one symbol from being connected to the same check node, in order to decrease the probability of (the code bits corresponding to) the plurality of variable nodes connected to the same check node simultaneously becoming the erasure to improve the decoding performance.

Meanwhile, as described above, in the parity check matrix H of the LDPC code that is output by the LDPC encoder 115 and is defined in the standard of the DVB-T.2, the information matrix $H_A$ has the cyclic structure and the parity matrix $H_T$ has the staircase structure. As described in FIG. 22, in the transformed parity check matrix to be the parity check matrix of the LDPC code after the parity interleave, the cyclic structure (in fact, the pseudo cyclic structure as described above) appears in the parity matrix.

Figure 23:
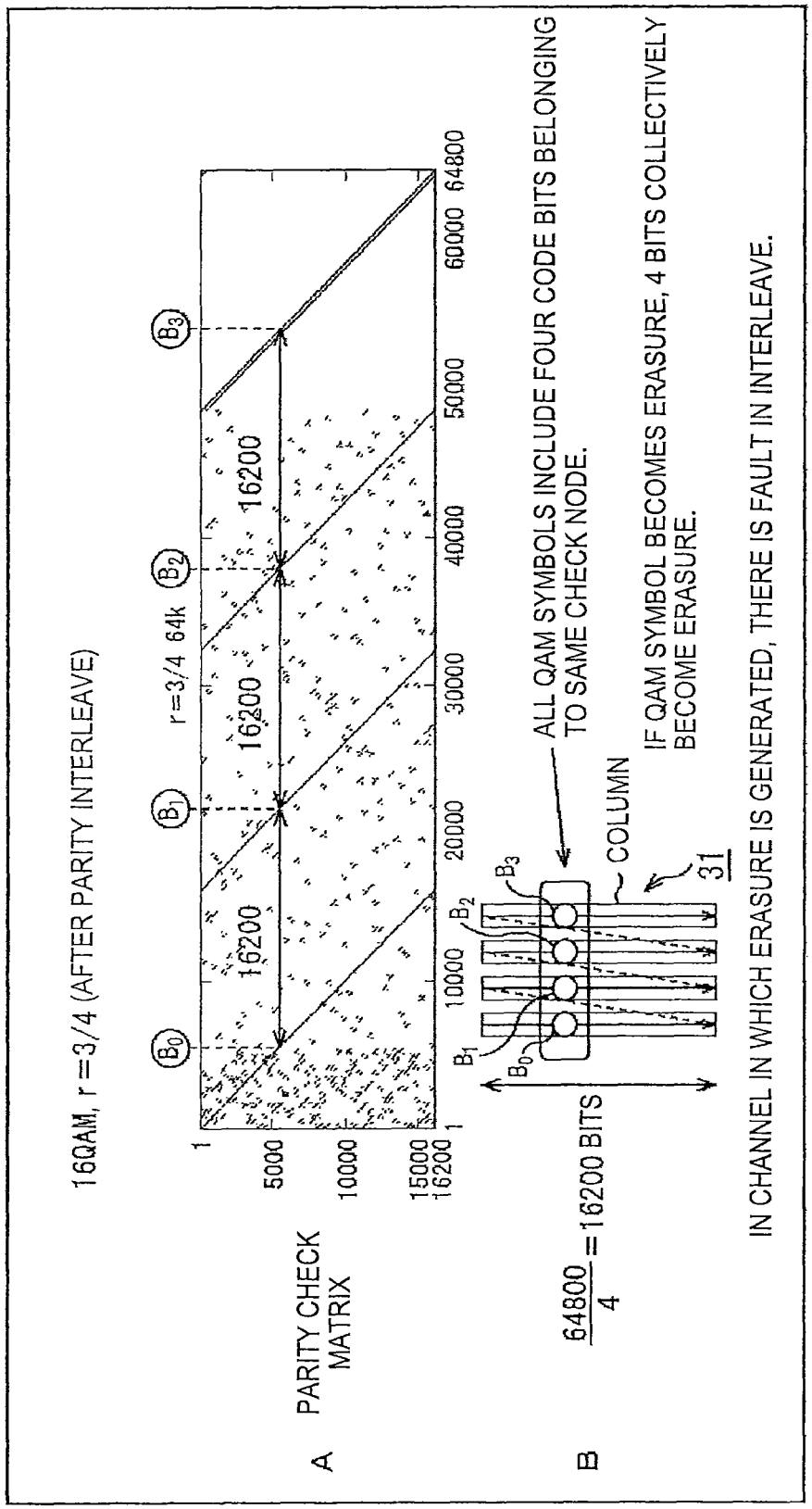
FIG. 23 is an illustration of a transformed parity check matrix.

FIG. 23 illustrates a transformed parity check matrix.

That is, A of FIG. 23 illustrates a transformed parity check matrix of a parity check matrix H of an LDPC code in which a code length N is 64800 bits and an encoding rate (r) is 3/4.

In A of FIG. 23, in the transformed parity check matrix, a position of an element of which a value becomes 1 is shown by a point (•).

B of FIG. 23 illustrates processing executed by the demultiplexer 25 (FIG. 9), with respect to the LDPC code of the transformed parity check matrix of A of FIG. 23, that is, the LDPC code after the parity interleave.

In B of FIG. 23, the modulation method is set to the 16 QAM and the code bits of the LDPC code after the parity interleave are written in the column direction in the four columns constituting the memory 31 of the demultiplexer 25.

The code bits that are written in the column direction in the four columns constituting the memory 31 are read in a unit of four bits in the row direction and become one symbol.

In this case, code bits $B_0$, $B_1$, $B_2$, and $B_3$ of the four bits that become one symbol may become code bits corresponding to 1 in any one row of the transformed parity check matrix of A of FIG. 23. In this case, the variable nodes that correspond to the code bits $B_0$, $B_1$, $B_2$, and $B_3$ are connected to the same check node.

Therefore, when the code bits $B_0$, $B_1$, $B_2$, and $B_3$ of the four bits of one symbol become the code bits corresponding to 1 in any one row of the transformed parity check matrix, if the erasure is generated in the symbol, an appropriate message may not be calculated in the same check node to which the variable nodes corresponding to the code bits $B_0$, $B_1$, $B_2$, and $B_3$ are connected. As a result, the decoding performance is deteriorated.

With respect to the encoding rates other than 3/4, the plurality of code bits corresponding to the plurality of variable nodes connected to the same check node may become one symbol of the 16 QAM, similar to the above case.

Therefore, the column twist interleaver 24 performs the column twist interleave for interleaving the code bits of the LDPC code after the parity interleave from the parity interleaver 23, such that the plurality of code bits corresponding to 1 in any one row of the transformed parity check matrix are not included in one symbol.

Figure 24:
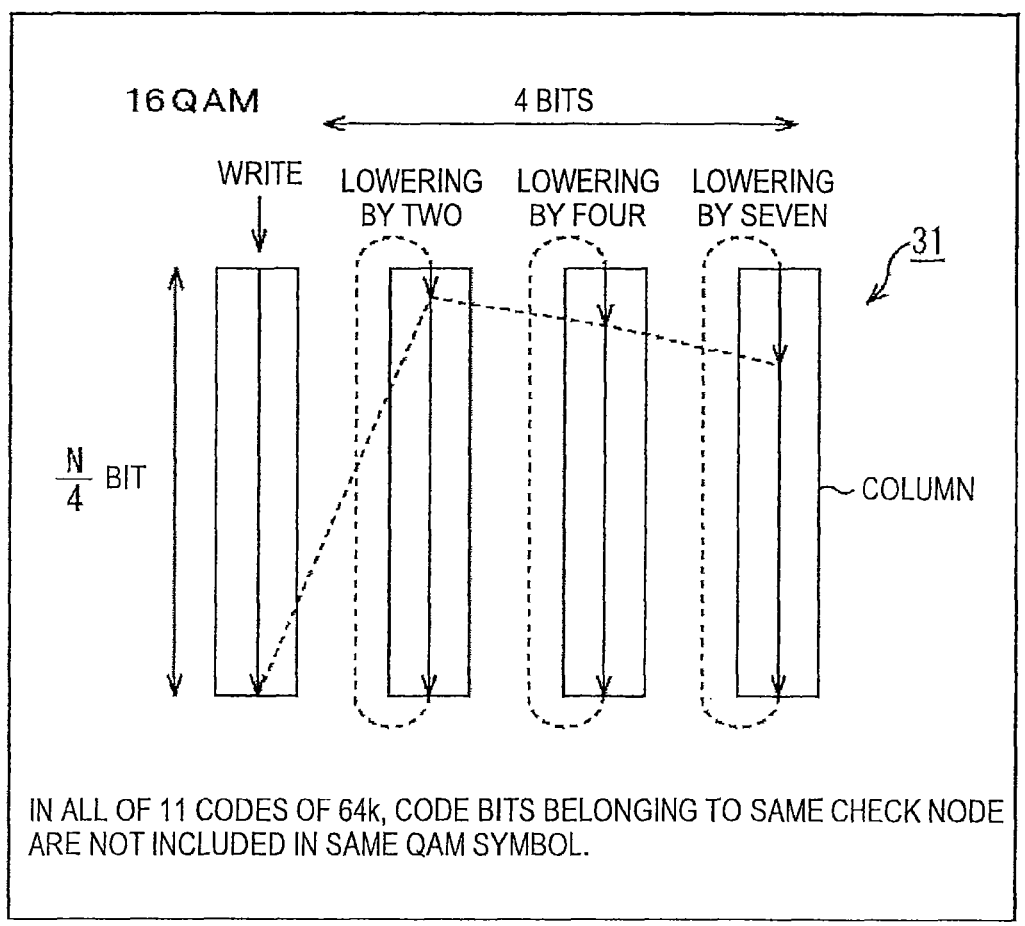
FIG. 24 is an illustration of processing of a column twist interleaver 24.

FIG. 24 is an illustration of the column twist interleave.

That is, FIG. 24 illustrates the memory 31 (FIGS. 18 and 19) of the demultiplexer 25.

As described in FIG. 18, the memory 31 has a storage capacity to store mb bits in the column (longitudinal) direction and store N/(mb) bits in the row (transverse) direction and includes mb columns. The column twist interleaver 24 writes the code bits of the LDPC code in the column direction with respect to the memory 31, controls a write start position when the code bits are read in the row direction, and performs the column twist interleave.

That is, in the column twist interleaver 24, the write start position to start writing of the code bits is appropriately changed with respect to each of the plurality of columns, such that the plurality of code bits read in the row direction and becoming one symbol do not become the code bits corresponding to 1 in any one row of the transformed parity check matrix (the code bits of the LDPC code are rearranged such that the plurality of code bits corresponding to 1 in any one row of the parity check matrix are not included in the same symbol).

In this case, FIG. 24 illustrates a configuration example of the memory 31 when the modulation method is the 16 QAM and the multiple b described in FIG. 18 is 1. Therefore, the bit number m of the code bits of the LDPC code becoming one symbol is 4 bits and the memory 31 includes 4 (=mb) columns.

The column twist interleaver 24 performs writing of the code bits of the LDPC code (instead of the demultiplexer 25 of FIG. 18) in the downward direction (column direction) from the upper side of the four columns constituting the memory 31, toward the columns of the rightward direction from the left side.

If writing of the code bits ends to the rightmost column, the column twist interleaver 24 reads the code bits in a unit of four bits (mb bits) in the row direction from the first row of all the columns constituting the memory 31 and outputs the code bits as the LDPC code after the column twist interleave to the interchanging unit 32 (FIGS. 18 and 19) of the demultiplexer 25.

However, in the column twist interleaver 24, if an address of a position of a head (top) of each column is set to 0 and an address of each position of the column direction is represented by art ascending integer, a write start position is set to a position of which an address is 0, with respect to a leftmost column. A write start position is set to a position of which an address is 2, with respect to a second (from the left side) column. A write start position is set to a position of which an address is 4, with respect to a third column. A write start position is set to a position of which an address is 7, with respect to a fourth column.

With respect to the columns in which the write start positions are the positions other than the position of which the address is 0, after the code bits are written to a lowermost position, the position returns to the head (the position of which the address is 0) and writing is performed to the position immediately before the write start position. Then, writing with respect to a next (right) column is performed.

By performing the column twist interleave described above, with respect to the LDPC codes of all encoding rates that are defined in the standard of the DVB-T.2 and have the code length N of 64800, the plurality of code bits corresponding to the plurality of variable nodes connected to the same check node can be prevented from becoming one symbol of the 16 QAM (being included in the same symbol). As a result, decoding performance in a communication path in which the erasure exists can be improved.

FIG. 25 illustrates a column number of the memory 31 necessary for the column twist interleave and an address of a write start position for each modulation method, with respect to LDPC codes of 11 encoding rates defined in the standard of the DVB-T.2 and having a code length N of 64800.

When the multiple b is 1, the QPSK is adopted as the modulation method, and a bit number m of one symbol is 2 bits, according to FIG. 25, the memory 31 has two columns to store 2×1 (=mb) bits in the row direction and stores 64800/(2×1) bits in the column direction.

A write start position of a first column of the two columns of the memory 31 becomes a position of which an address is 0 and a write start position of a second column becomes a position of which an address is 2.

For example, when any one of the first to third interchange methods of FIG. 18 is adopted as the interchange method of the interchange processing of the demultiplexer 25 (FIG. 9), the multiple b becomes 1.

When the multiple b is 2, the QPSK is adopted as the modulation method, and a bit number m of one symbol is 2 bits, according to FIG. 25, the memory 31 has four columns to store 2×2 bits in the row direction and stores 64800/(2×2) bits in the column direction.

A write start position of a first column of the four columns of the memory 31 becomes a position of which an address is 0, a write start position of a second column becomes a position of which an address is 2, a write start position of a third column becomes a position of which an address is 4, and a write start position of a fourth column becomes a position of which an address is 7.

For example, when the fourth interchange method of FIG. 19 is adopted as the interchange method of the interchange processing of the demultiplexer 25 (FIG. 9), the multiple b becomes 2.

When the multiple b is 1, the 16 QAM is adopted as the modulation method, and a bit number m of one symbol is 4 bits, according to FIG. 25, the memory 31 has four columns to store 4×1 bits in the row direction and stores 64800/(4×1) bits in the column direction.

A write start position of a first column of the four columns of the memory 31 becomes a position of which an address is 0, a write start position of a second column becomes a position of which an address is 2, a write start position of a third column becomes a position of which an address is 4, and a write start position of a fourth column becomes a position of which an address is 7.

When the multiple b is 2, the 16 QAM is adopted as the modulation method, and a bit number m of one symbol is 4 bits, according to FIG. 25, the memory 31 has eight columns to store 4×2 bits in the row direction and stores 64800/(4×2) bits in the column direction.

A write start position of a first column of the eight columns of the memory 31 becomes a position of which an address is 0, a write start position of a second column becomes a position of which an address is 0, a write start position of a third column becomes a position of which an address is 2, a write start position of a fourth column becomes a position of which an address is 4, a write start position of a fifth column becomes a position of which an address is 4, a write start position of a sixth column becomes a position of which an address is 5, a write start position of a seventh column becomes a position of which an address is 7, and a write start position of an eighth column becomes a position of which an address is 7.

When the multiple b is 1, the 64 QAM is adopted as the modulation method, and a bit number m of one symbol is 6 bits, according to FIG. 25, the memory 31 has six columns to store 6×1 bits in the row direction and stores 64800/(6×1) bits in the column direction.

A write start position of a first column of the six columns of the memory 31 becomes a position of which an address is 0, a write start position of a second column becomes a position of which an address is 2, a write start position of a third column becomes a position of which an address is 5, a write start position of a fourth column becomes a position of which an address is 9, a write start position of a fifth column becomes a position of which an address is 10, and a write start position of a sixth column becomes a position of which an address is 13.

When the multiple b is 2, the 64 QAM is adopted as the modulation method, and a bit number m of one symbol is 6 bits, according to FIG. 25, the memory 31 has twelve columns to store 6×2 bits in the row direction and stores 64800/(6×2) bits in the column direction.

A write start position of a first column of the twelve columns of the memory 31 becomes a position of which an address is 0, a write start position of a second column becomes a position of which an address is 0, a write start position of a third column becomes a position of which an address is 2, a write start position of a fourth column becomes a position of which an address is 2, a write start position of a fifth column becomes a position of which an address is 3, a write start position of a sixth column becomes a position of which an address is 4, a write start position of a seventh column becomes a position of which an address is 4, a write start position of an eighth column becomes a position of which an address is 5, a write start position of a ninth column becomes a position of which an address is 5, a write start position of a tenth column becomes a position of which an address is 7, a write start position of an eleventh column becomes a position of which an address is 8, and a write start position of a twelfth column becomes a position of which an address is 9.

When the multiple b is 1, the 256 QAM is adopted as the modulation method, and a bit number m of one symbol is 8 bits, according to FIG. 25, the memory 31 has eight columns to store 8×1 bits in the row direction and stores 64800/(8×1) bits in the column direction.

A write start position of a first column of the eight columns of the memory 31 becomes a position of which an address is 0, a write start position of a second column becomes a position of which an address is 0, a write start position of a third column becomes a position of which an address is 2, a write start position of a fourth column becomes a position of which an address is 4, a write start position of a fifth column becomes a position of which an address is 4, a write start position of a sixth column becomes a position of which an address is 5, a write start position of a seventh column becomes a position of which an address is 7, and a write start position of an eighth column becomes a position of which an address is 7.

When the multiple b is 2, the 256 QAM is adopted as the modulation method, and a bit number m of one symbol is 8 bits, according to FIG. 25, the memory 31 has sixteen columns to store 8×2 bits in the row direction and stores 64800/(8×2) bits in the column direction.

A write start position of a first column of the sixteen columns of the memory 31 becomes a position of which an address is 0, a write start position of a second column becomes a position of which an address is 2, a write start position of a third column becomes a position of which an address is 2, a write start position of a fourth column becomes a position of which an address is 2, a write start position of a fifth column becomes a position of which an address is 2, a write start position of a sixth column becomes a position of which an address is 3, a write start position of a seventh column becomes a position of which an address is 7, a write start position of an eighth column becomes a position of which an address is 15, a write start position of a ninth column becomes a position of which an address is 16, a write start position of a tenth column becomes a position of which an address is 20, a write start position of an eleventh column becomes a position of which an address is 22, a write start position of a twelfth column becomes a position of which an address is 22, a write start position of a thirteenth column becomes a position of which an address is 27, a write start position of a fourteenth column becomes a position of which an address is 27, a write start position of a fifteenth column becomes a position of which an address is 28, and a write start position of a sixteenth column becomes a position of which an address is 32.

When the multiple b is 1, the 256 QAM is adopted as the modulation method, and a bit number m of one symbol is 10 bits, according to FIG. 25, the memory 31 has ten columns to store 10×1 bits in the row direction and stores 64800/(10×1) bits in the column direction.

A write start position of a first column of the ten columns of the memory 31 becomes a position of which an address is 0, a write start position of a second column becomes a position of which an address is 3, a write start position of a third column becomes a position of which an address is 6, a write start position of a fourth column becomes a position of which an address is 8, a write start position of a fifth column becomes a position of which an address is 11, a write start position of a sixth column becomes a position of which an address is 13, a write start position of a seventh column becomes a position of which an address is 15, a write start position of an eighth column becomes a position of which an address is 17, a write start position of a ninth column becomes a position of which an address is 18, and a write start position of a tenth column becomes a position of which an address is 20.

When the multiple b is 2, the 1024 QAM is adopted as the modulation method, and a bit number m of one symbol is 10 bits, according to FIG. 25, the memory 31 has twenty columns to store 10×2 bits in the row direction and stores 64800/(10×2) bits in the column direction.

A write start position of a first column of the twenty columns of the memory 31 becomes a position of which an address is 0, a write start position of a second column becomes a position of which an address is 1, a write start position of a third column becomes a position of which an address is 3, a write start position of a fourth column becomes a position of which an address is 4, a write start position of a fifth column becomes a position of which an address is 5, a write start position of a sixth column becomes a position of which an address is 6, a write start position of a seventh column becomes a position of which an address is 6, a write start position of an eighth column becomes a position of which an address is 9, a write start position of a ninth column becomes a position of which an address is 13, a write start position of a tenth column becomes a position of which an address is 14, a write start position of an eleventh column becomes a position of which an address is 14, a write start position of a twelfth column becomes a position of which an address is 16, a write start position of a thirteenth column becomes a position of which an address is 21, a write start position of a fourteenth column becomes a position of which an address is 21, a write start position of a fifteenth column becomes a position of which an address is 23, a write start position of a sixteenth column becomes a position of which an address is 25, a write start position of a seventeenth column becomes a position of which an address is 25, a write start position of an eighteenth column becomes a position of which an address is 26, a write start position of a nineteenth column becomes a position of which an address is 28, and a write start position of a twentieth column becomes a position of which an address is 30.

When the multiple b is 1, the 4096 QAM is adopted as the modulation method, and a bit number m of one symbol is 12 bits, according to FIG. 25, the memory 31 has twelve columns to store 12×1 bits in the row direction and stores 64800/(12× 1) bits in the column direction.

A write start position of a first column of the twelve columns of the memory 31 becomes a position of which an address is 0, a write start position of a second column becomes a position of which an address is 0, a write start position of a third column becomes a position of which an address is 2, a write start position of a fourth column becomes a position of which an address is 2, a write start position of a fifth column becomes a position of which an address is 3, a write start position of a sixth column becomes a position of which an address is 4, a write start position of a seventh column becomes a position of which an address is 4, a write start position of an eighth column becomes a position of which an address is 5, a write start position of a ninth column becomes a position of which an address is 5, a write start position of a tenth column becomes a position of which an address is 7, a write start position of an eleventh column becomes a position of which an address is 8, and a write start position of a twelfth column becomes a position of which an address is 9.

When the multiple b is 2, the 4096 QAM is adopted as the modulation method, and a bit number m of one symbol is 12 bits, according to FIG. 25, the memory 31 has twenty-four columns to store 12×2 bits in the row direction and stores 64800/(12×2) bits in the column direction.

A write start position of a first column of the twenty-four columns of the memory 31 becomes a position of which an address is 0, a write start position of a second column becomes a position of which an address is 5, a write start position of a third column becomes a position of which an address is 8, a write start position of a fourth column becomes a position of which an address is 8, a write start position of a fifth column becomes a position of which an address is 8, a write start position of a sixth column becomes a position of which an address is 8, a write start position of a seventh column becomes a position of which an address is 10, a write start position of an eighth column becomes a position of which an address is 10, a write start position of a ninth column becomes a position of which an address is 10, a write start position of a tenth column becomes a position of which an address is 12, a write start position of an eleventh column becomes a position of which an address is 13, a write start position of a twelfth column becomes a position of which an address is 16, a write start position of a thirteenth column becomes a position of which an address is 17, a write start position of a fourteenth column becomes a position of which an address is 19, a write start position of a fifteenth column becomes a position of which an address is 21, a write start position of a sixteenth column becomes a position of which an address is 22, a write start position of a seventeenth column becomes a position of which an address is 23, a write start position of an eighteenth column becomes a position of which an address is 26, a write start position of a nineteenth column becomes a position of which an address is 37, a write start position of a twentieth column becomes a position of which an address is 39, a write start position of a twentieth column becomes a position of which an address is 40, a write start position of a twentieth column becomes a position of which an address is 41, a write start position of a twentieth column becomes a position of which an address is 41, and a write start position of a twentieth column becomes a position of which an address is 41.

FIG. 26 illustrates a column number of the memory 31 necessary for the column twist interleave and an address of a write start position for each modulation method, with respect to LDPC codes of 10 encoding rates defined in the standard of the DVB-T.2 and having a code length N of 16200.

When the multiple b is 1, the QPSK is adopted as the modulation method, and a bit number m of one symbol is 2 bits, according to FIG. 26, the memory 31 has two columns to store 2×1 bits in the row direction and stores 16200/(2×1) bits in the column direction.

A write start position of a first column of the two columns of the memory 31 becomes a position of which an address is 0 and a write start position of a second column becomes a position of which an address is 0.

When the multiple b is 2, the QPSK is adopted as the modulation method, and a bit number m of one symbol is 2 bits, according to FIG. 26, the memory 31 has four columns to store 2×2 bits in the row direction and stores 16200/(2×1) bits in the column direction.

A write start position of a first column of the four columns of the memory 31 becomes a position of which an address is 0, a write start position of a second column becomes a position of which an address is 2, a write start position of a third column becomes a position of which an address is 3, and a write start position of a fourth column becomes a position of which an address is 3.

When the multiple b is 1, the 16 QAM is adopted as the modulation method, and a bit number m of one symbol is 4 bits, according to FIG. 26, the memory 31 has four columns to store 4×1 bits in the row direction and stores 16200/(4×1) bits in the column direction.

A write start position of a first column of the four columns of the memory 31 becomes a position of which an address is 0, a write start position of a second column becomes a position of which an address is 2, a write start position of a third column becomes a position of which an address is 3, and a write start position of a fourth column becomes a position of which an address is 3.

When the multiple b is 2, the 16 QAM is adopted as the modulation method, and a bit number m of one symbol is 4 bits, according to FIG. 26, the memory 31 has eight columns to store 4×2 bits in the row direction and stores 16200/(4×2) bits in the column direction.

A write start position of a first column of the eight columns of the memory 31 becomes a position of which an address is 0, a write start position of a second column becomes a position of which an address is 0, a write start position of a third column becomes a position of which an address is 0, a write start position of a fourth column becomes a position of which an address is 1, a write start position of a fifth column becomes a position of which an address is 7, a write start position of a sixth column becomes a position of which an address is 20, a write start position of a seventh column becomes a position of which an address is 20, and a write start position of an eighth column becomes a position of which an address is 21.

When the multiple b is 1, the 64 QAM is adopted as the modulation method, and a bit number m of one symbol is 6 bits, according to FIG. 26, the memory 31 has six columns to store 6×1 bits in the row direction and stores 16200/(6×1) bits in the column direction.

A write start position of a first column of the six columns of the memory 31 becomes a position of which an address is 0, a write start position of a second column becomes a position of which an address is 0, a write start position of a third column becomes a position of which an address is 2, a write start position of a fourth column becomes a position of which an address is 3, a write start position of a fifth column becomes a position of which an address is 7, and a write start position of a sixth column becomes a position of which an address is 7.

When the multiple b is 2, the 64 QAM is adopted as the modulation method, and a bit number m of one symbol is 6 bits, according to FIG. 26, the memory 31 has twelve columns to store 6×2 bits in the row direction and stores 16200/(6×2) bits in the column direction.

A write start position of a first column of the twelve columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 3, a write start position of an eighth column becomes a position of which an address is 3, a write start position of a ninth column becomes a position of which an address is 3, a write start position of a tenth column becomes a position of which an address is 6, a write start position of an eleventh column becomes a position of which an address is 7, and a write start position of a twelfth column becomes a position of which an address is 7.

When the multiple b is 1, the 256 QAM is adopted as the modulation method, and a bit number m of one symbol is 8 bits, according to FIG. 26, the memory 31 has eight columns to store 8×1 bits in the row direction and stores 16200/(8×1) bits in the column direction.

A write start position of a first column of the eight columns of the memory 31 becomes a position of which an address is 0, a write start position of a second column becomes a position of which an address is 0, a write start position of a third column becomes a position of which an address is 0, a write start position of a fourth column becomes a position of which an address is 1, a write start position of a fifth column becomes a position of which an address is 7, a write start position of a sixth column becomes a position of which an address is 20, a write start position of a seventh column becomes a position of which an address is 20, and a write start position of an eighth column becomes a position of which an address is 21.

When the multiple b is 1, the 1024 QAM is adopted as the modulation method, and a bit number m of one symbol is 10 bits, according to FIG. 26, the memory 31 has ten columns to store 10×1 bits in the row direction and stores 16200/(10×1) bits in the column direction.

A write start position of a first column of the ten columns of the memory 31 becomes a position of which an address is 0, a write start position of a second column becomes a position of which an address is 1, a write start position of a third column becomes a position of which an address is 2, a write start position of a fourth column becomes a position of which an address is 2, a write start position of a fifth column becomes a position of which an address is 3, a write start position of a sixth column becomes a position of which an address is 3, a write start position of a seventh column becomes a position of which an address is 4, a write start position of an eighth column becomes a position of which an address is 4, a write start position of a ninth column becomes a position of which an address is 5, and a write start position of a tenth column becomes a position of which an address is 7.

When the multiple b is 2, the 1024 QAM is adopted as the modulation method, and a bit number m of one symbol is 10 bits, according to FIG. 26, the memory 31 has twenty columns to store 10×2 bits in the row direction and stores 16200/(10×2) bits in the column direction.

A write start position of a first column of the twenty columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 2, a write start position of an eighth column becomes a position of which an address is 2, a write start position of a ninth column becomes a position of which an address is 5, a write start position of a tenth column becomes a position of which an address is 5, a write start position of an eleventh column becomes a position of which an address is 5, a write start position of a twelfth column becomes a position of which an address is 5, a write start position of a thirteenth column becomes a position of which an address is 5, a write start position of a fourteenth column becomes a position of which an address is 7, a write start position of a fifteenth column becomes a position of which an address is 7, a write start position of a sixteenth column becomes a position of which an address is 7, a write start position of a seventeenth column becomes a position of which an address is 7, a write start position of an eighteenth column becomes a position of which an address is 8, a write start position of a nineteenth column becomes a position of which an address is 8, and a write start position of a twentieth column becomes a position of which an address is 10.

When the multiple b is 1, the 4096 QAM is adopted as the modulation method, and a bit number m of one symbol is 12 bits, according to FIG. 26, the memory 31 has twelve columns to store 12×1 bits in the row direction and stores 16200/(12×1) bits in the column direction.

A write start position of a first column of the twelve columns of the memory 31 becomes a position of which an address is 0, a write start position of a second column becomes a position of which an address is 0, a write start position of a third column becomes a position of which an address is 0, a write start position of a fourth column becomes a position of which an address is 2, a write start position of a fifth column becomes a position of which an address is 2, a write start position of a sixth column becomes a position of which an address is 2, a write start position of a seventh column becomes a position of which an address is 3, a write start position of an eighth column becomes a position of which an address is 3, a write start position of a ninth column becomes a position of which an address is 3, a write start position of a tenth column becomes a position of which an address is 6, a write start position of an eleventh column becomes a position of which an address is 7, and a write start position of a twelfth column becomes a position of which an address is 7.

When the multiple b is 2, the 4096 QAM is adopted as the modulation method, and a bit number m of one symbol is 12 bits, according to FIG. 26, the memory 31 has twenty-four columns to store 12×2 bits in the row direction and stores 16200/(12×2) bits in the column direction.

A write start position of a first column of the twenty-four columns of the memory 31 becomes a position of which an address is 0, a write start position of a second column becomes a position of which an address is 0, a write start position of a third column becomes a position of which an address is 0, a write start position of a fourth column becomes a position of which an address is 0, a write start position of a fifth column becomes a position of which an address is 0, a write start position of a sixth column becomes a position of which an address is 0, a write start position of a seventh column becomes a position of which an address is 0, a write start position of an eighth column becomes a position of which an address is 1, a write start position of a ninth column becomes a position of which an address is 1, a write start position of a tenth column becomes a position of which an address is 1, a write start position of an eleventh column becomes a position of which an address is 2, a write start position of a twelfth column becomes a position of which an address is 2, a write start position of a thirteenth column becomes a position of which an address is 2, a write start position of a fourteenth column becomes a position of which an address is 3, a write start position of a fifteenth column becomes a position of which an address is 7, a write start position of a sixteenth column becomes a position of which an address is 9, a write start position of a seventeenth column becomes a position of which an address is 9, a write start position of an eighteenth column becomes a position of which an address is 9, a write start position of a nineteenth column becomes a position of which an address is 10, a write start position of a twentieth column becomes a position of which an address is 10, a write start position of a twentieth column becomes a position of which an address is 10, a write start position of a twentieth column becomes a position of which an address is 10, a write start position of a twentieth column becomes a position of which an address is 10, and a write start position of a twentieth column becomes a position of which an address is 11.

Figure 27:
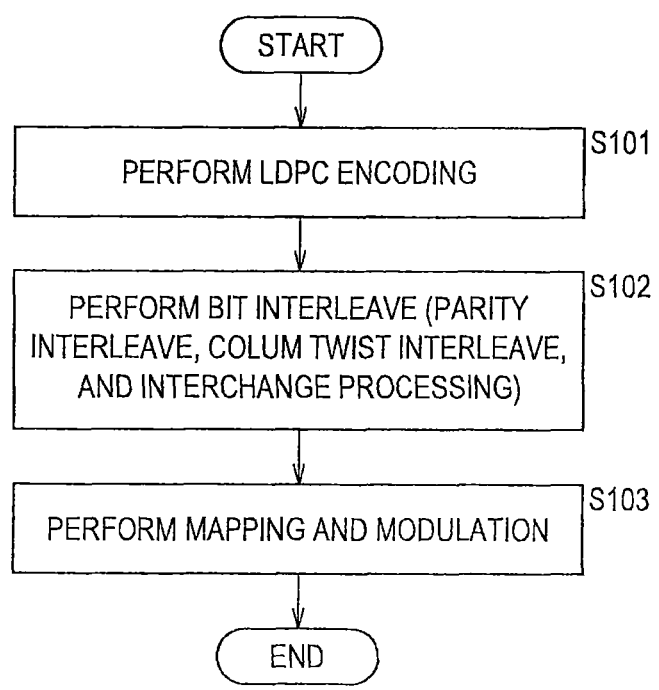
FIG. 27 is a flowchart illustrating processing executed by a bit interleaver 116 and a QAM encoder 117.

FIG. 27 is a flowchart illustrating processing executed by the LDPC encoder 115, the bit interleaver 116, and the QAM encoder 117 of FIG. 8.

The LDPC encoder 115 awaits supply of the LDPC target data from the BCH encoder 114. In step S101, the LDPC encoder 115 encodes the LDPC target data with the LDPC code and supplies the LDPC code to the bit interleaver 116. The processing proceeds to step S102.

In step S102, the bit interleaver 116 performs bit interleave with respect to the LDPC code supplied from the LDPC encoder 115 and supplies a symbol obtained by symbolizing the LDPC code after the bit interleave to the QAM encoder 117. The processing proceeds to step S103.

That is, in step S102, in the bit interleaver 116 (FIG. 9), the parity interleaver 23 performs parity interleave with respect to the LDPC code supplied from the LDPC encoder 115 and supplies the LDPC code after the parity interleave to the column twist interleaver 24.

The column twist interleaver 24 performs column twist interleave with respect to the LDPC code supplied from the parity interleaver 23 and supplies the LDPC code to the demultiplexer 25.

The demultiplexer 25 executes interchange processing for interchanging the code bits of the LDPC code after the column twist interleave by the column twist interleaver 24 and making the code bits after the interchange become symbol bits (bits representing a symbol) of the symbol.

In this case, the interchange processing by the demultiplexer 25 can be executed according to the first to fourth interchange methods illustrated in FIGS. 18 and 19 and can be executed according to an allocation rule. The allocation rule is a rule to allocate the code bits of the LDPC code to the symbol bits representing the symbol and is described in detail later.

The symbol that is obtained by the interchange processing by the demultiplexer 25 is supplied from the demultiplexer 25 to the QAM encoder 117.

In step S103, the QAM encoder 117 maps the symbol supplied from the demultiplexer 25 to a signal point determined by the modulation method of the orthogonal modulation performed by the QAM encoder 117, performs the orthogonal modulation, and supplies data obtained as a result to the time interleaver 118.

As described above, the parity interleave or the column twist interleave is performed, so that tolerance against the erasure or the burst error when the plurality of code bits of the LDPC code are transmitted as one symbol can be improved.

In FIG. 9, the parity interleaver 23 to be a block to perform the parity interleave and the column twist interleaver 24 to be a block to perform the column twist interleave are individually configured for the convenience of explanation. However, the parity interleaver 23 and the column twist interleaver 24 can be integrally configured.

That is, both the parity interleave and the column twist interleave can be performed by writing and reading of the code bits with respect to the memory and can be represented by a matrix to convert an address (write address) to perform writing of the code bits into an address (read address) to perform reading of the code bits.

Therefore, if a matrix obtained by multiplying a matrix representing the parity interleave and a matrix representing the column twist interleave is calculated, the code bits are converted by the matrix, the parity interleave is performed, and a column twist interleave result of the LDPC code after the parity interleave can be obtained.

In addition to the parity interleaver 23 and the column twist interleaver 24, the demultiplexer 25 can be integrally configured.

That is, the interchange processing executed by the demultiplexer 25 can be represented by the matrix to convert the write address of the memory 31 storing the LDPC code into the read address.

Therefore, if a matrix obtained by multiplying the matrix representing the parity interleave, the matrix representing the column twist interleave, and the matrix representing the interchange processing is calculated, the parity interleave, the column twist interleave, and the interchange processing can be collectively executed by the matrix.

Only one of the parity interleave and the column twist interleave may be performed or both the parity interleave and the column twist interleave may not be performed.

Next, simulation to measure an error rate (bit error rate) that is performed with respect to the transmitting device 11 of FIG. 8 will be described with reference to FIGS. 28 to 30.

The simulation is performed by adopting a communication path in which a flutter having D/U of 0 dB exists.

FIG. 28 illustrates a model of a communication path that is adopted by the simulation.

That is, A of FIG. 28 illustrates a model of a flutter that is adopted by the simulation.

In addition, B of FIG. 28 illustrates a model of a communication path in which the flutter represented by the model of A of FIG. 28 exists.

In B of FIG. 28, H represents the model of the flutter of A of FIG. 28. In B of FIG. 28, N represents ICI (Inter Carrier Interference). In the simulation, an expectation value $E[N^2]$ of power is approximated by the AWGN.

Figure 29:
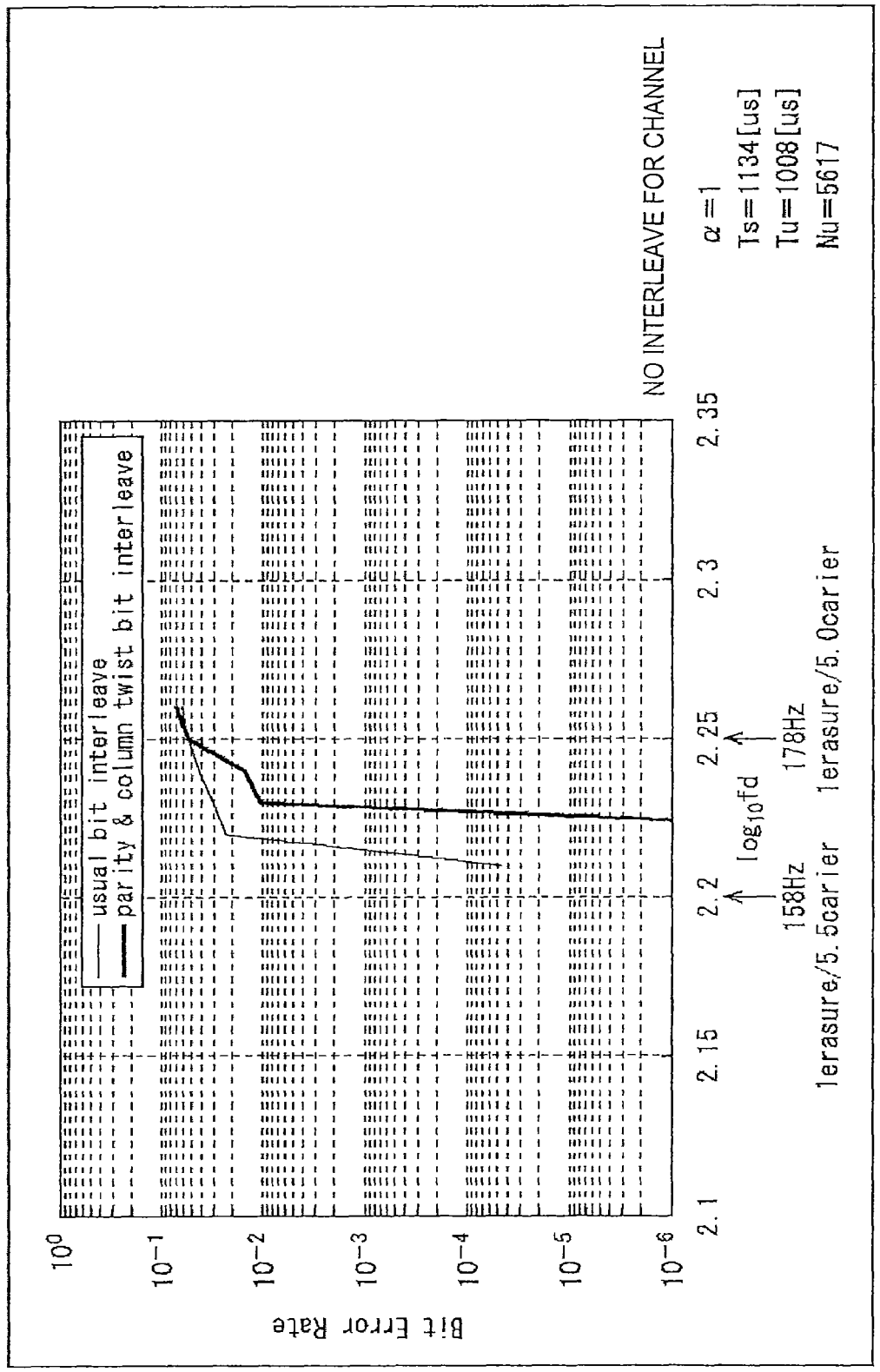
FIG. 29 is an illustration of a relation of an error rate obtained by simulation and a Doppler frequency $f_d$ of a flutter.
Figure 30:
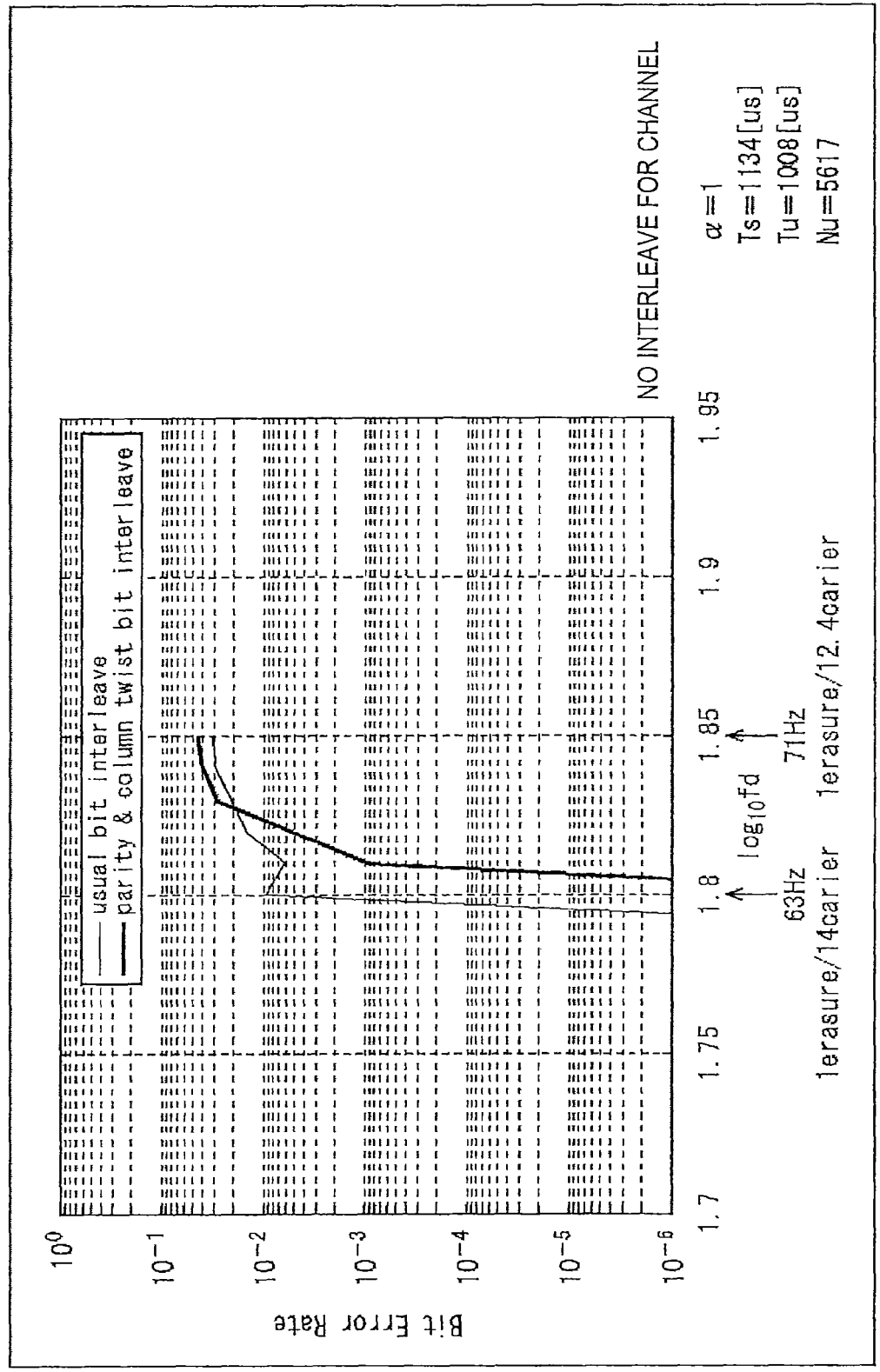
FIG. 30 is an illustration of a relation of an error rate obtained by simulation and a Doppler frequency $f_d$ of a flutter.

FIGS. 29 and 30 illustrate a relation of an error rate obtained by the simulation and a Doppler frequency $f_d$ of the flutter.

FIG. 29 illustrates a relation of the error rate and the Doppler frequency $f_d$ when a modulation method is the 16 QAM, an encoding rate (r) is (3/4), and an interchange method is the first interchange method. FIG. 30 illustrates a relation of the error rate and the Doppler frequency $f_d$ when the modulation method is the 64 QAM, the encoding rate (r) is (5/6), and the interchange method is the first interchange method.

In FIGS. 29 and 30, a thick line shows a relation of the error rate and the Doppler frequency $f_d$ when all of the parity interleave, the column twist interleave, and the interchange processing are performed and a thin line shows a relation of the error rate and the Doppler frequency $f_d$ when only the interchange processing among the parity interleave, the column twist interleave, and the interchange processing is performed.

In both FIGS. 29 and 30, it can be known that the error rate is further improved (decreased) when all of the parity interleave, the column twist interleave, and the interchange processing are performed, as compared with when only the interchange processing is executed.

FIG. 31 is a block diagram illustrating a configuration example of the LDPC encoder 115 of FIG. 8.

The LDPC encoder 122 of FIG. 8 is also configured in the same manner.

As described in FIGS. 12 and 13, in the standard of the DVB-T.2, the LDPC codes that have the two code lengths N of 64800 bits and 16200 bits are defined.

With respect to the LDPC code having the code length N of 64800 bits, 11 encoding rates of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined (FIGS. 12 and 13).

For example, the LDPC encoder 115 can perform encoding (error correction encoding) using the LDPC code of each encoding rate having the code length N of 64800 bits or 16200 bits, according to the parity check matrix H prepared for each code length N and each encoding rate.

The LDPC encoder 115 includes an encoding processing unit 601 and a storage unit 602.

The encoding processing unit 601 includes an encoding rate setting unit 611, an initial value table reading unit 612, a parity check matrix generating unit 613, an information bit reading unit 614, an encoding parity operation unit 615, an a control unit 616. The encoding processing unit 601 performs the LDPC encoding of LDPC target data supplied to the LDPC encoder 115 and supplies an LDPC code obtained as a result to the bit interleaver 116 (FIG. 9).

That is, the encoding rate setting unit 611 sets the code length N and the encoding rate of the LDPC code, according to an operation of an operator.

The initial value table reading unit 612 reads a parity check matrix initial value table to be described later, which corresponds to the code length N and the encoding rate set by the encoding rate setting unit 611, from the storage unit 602.

The parity check matrix generating unit 613 generates a parity check matrix H by arranging elements of 1 of an information matrix $H_A$ corresponding to an information length K (=information length N−parity length M) according to the code length N and the encoding rate set by the encoding rate setting unit 611 in the column direction with a period of 360 columns (column number P of a unit of the cyclic structure), on the basis of the parity check matrix initial value table read by the initial value table reading unit 612, and stores the parity check matrix H in the storage unit 602.

The information bit reading unit 614 reads (extracts) information bits corresponding to the information length K, from the LDPC target data supplied to the LDPC encoder 115.

The encoding parity operation unit 615 reads the parity check matrix H generated by the parity check matrix generating unit 613 from the storage unit 602, calculates parity bits for the information bits read by the information bit reading unit 614, on the basis of a predetermined expression, and generates a code word (LDPC code).

The control unit 616 controls each block constituting the encoding processing unit 601.

In the storage unit 602, a plurality of parity check matrix initial value tables that correspond to the plurality of encoding rates illustrated in FIGS. 12 and 13, with respect to the code lengths N such as the 64800 bits and 16200 bits, are stored. In addition, the storage unit 602 temporarily stores data that is necessary for processing of the encoding processing unit 601.

FIG. 32 is a flowchart illustrating processing of the LDPC encoder 115 of FIG. 31.

In step S201, the encoding rate setting unit 611 determines (sets) the code length N and the encoding rate r to perform the LDPC encoding.

In step S202, the initial value table reading unit 612 reads the previously determined parity check matrix initial value table corresponding to the code length N and the encoding rate r determined by the encoding rate setting unit 611, from the storage unit 602.

In step S203, the parity check matrix generating unit 613 calculates (generates) the parity check matrix H of the LDPC code of the code length N and the encoding rate r determined by the encoding rate setting unit 611, using the parity check matrix initial value table read from the storage unit 602 by the initial value table reading unit 612, supplies the parity check matrix to the storage unit 602, and stores the parity check matrix in the storage unit.

In step S204, the information bit reading unit 614 reads the information bits of the information length K (=N×r) corresponding to the code length N and the encoding rate r determined by the encoding rate setting unit 611, from the LDPC target data supplied to the LDPC encoder 115, reads the parity check matrix H calculated by the parity check matrix generating unit 613 from the storage unit 602, and supplies the information bits and the parity check matrix to the encoding parity operation unit 615.

In step S205, the encoding parity operation unit 615 sequentially operates parity bits of a code word c that satisfies an expression (8).

$$Hc^T = 0 \qquad (8)$$

In the expression (8), c represents a row vector as the code word (LDPC code) and $c^T$ represents transposition of the row vector c.

As described above, when a portion of the information bits of the row vector c as the LDPC code (one code word) is represented by a row vector A and a portion of the parity bits is represented by a row vector T, the row vector c can be represented by an expression c=[A/T], using the row vector A as the information bits and the row vector T as the parity bits.

In the parity check matrix H and the row vector c=[A|T] corresponding to the LDPC code, it is necessary to satisfy an expression $Hc^T=0$. The row vector T that corresponds to the parity bits constituting the row vector c=[A|T] satisfying the expression $Hc^T=0$ can be sequentially calculated by setting elements of each row to 0, sequentially from elements of a first row of the column vector $Hc^T$ in the expression $Hc^T=0$, when the parity matrix $H_T$ of the parity check matrix $H=[H_A|H_T]$ becomes the staircase structure illustrated in FIG. 11.

If the encoding parity operation unit 615 calculates the parity bits T with respect to the information bits A, the encoding parity operation unit 615 outputs the code word c=[A/T] represented by the information bits A and the parity bits T as an LDPC encoding result of the information bits A.

Then, in step S206, the control unit 616 determines whether the LDPC encoding ends. When it is determined in step S206 that the LDPC encoding does not end, that is, when there is LDPC target data to perform the LDPC encoding, the processing returns to step S201. Hereinafter, the processing of steps S201 to S206 is repeated.

When it is determined in step S206 that the LDPC encoding ends, that is, there is no LDPC target data to perform the LDPC encoding, the LDPC encoder 115 ends the processing.

As described above, the parity check matrix initial value table corresponding to each code length N and each encoding rate r is prepared and the LDPC encoder 115 performs the LDPC encoding of the predetermined code length N and the predetermined encoding rate r, using the parity check matrix H generated from the parity check matrix initial value table corresponding to the predetermined code length N and the predetermined encoding rate r.

The parity check matrix initial value table is a table that represents positions of elements of 1 of the information matrix $H_A$ (FIG. 10) of the parity check matrix H corresponding to the information length K according to the code length N and the encoding rate r of the LDPC code (LDPC code defined by the parity check matrix H) for every 360 columns (column number P of a unit of the cyclic structure) and is previously made for each parity check matrix H of each code length N and each encoding rate r.

FIGS. 33 to 77 are illustrations of an example of the parity check matrix initial value table.

That is, FIG. 33 illustrates a parity check matrix initial value table with respect to the parity check matrix H that is defined in the standard of the DVB-T.2 and has the code length N of 16200 bits and the encoding rate r of 1/4.

FIG. 34 illustrates a parity check matrix initial value table with respect to the parity check matrix H that is defined in the standard of the DVB-T.2 and has the code length N of 16200 bits and the encoding rate r of 1/3.

FIG. 35 illustrates a parity check matrix initial value table with respect to the parity check matrix H that is defined in the standard of the DVB-T.2 and has the code length N of 16200 bits and the encoding rate r of 2/5.

FIG. 36 illustrates a parity check matrix initial value table with respect to the parity check matrix H that is defined in the standard of the DVB-T.2 and has the code length N of 16200 bits and the encoding rate r of 1/2.

FIG. 37 illustrates a parity check matrix initial value table with respect to the parity check matrix H that is defined in the standard of the DVB-T.2 and has the code length N of 16200 bits and the encoding rate r of 3/5.

FIG. 38 illustrates a parity check matrix initial value table with respect to the parity check matrix H that is defined in the standard of the DVB-T.2 and has the code length N of 16200 bits and the encoding rate r of 2/3.

Figure 39:
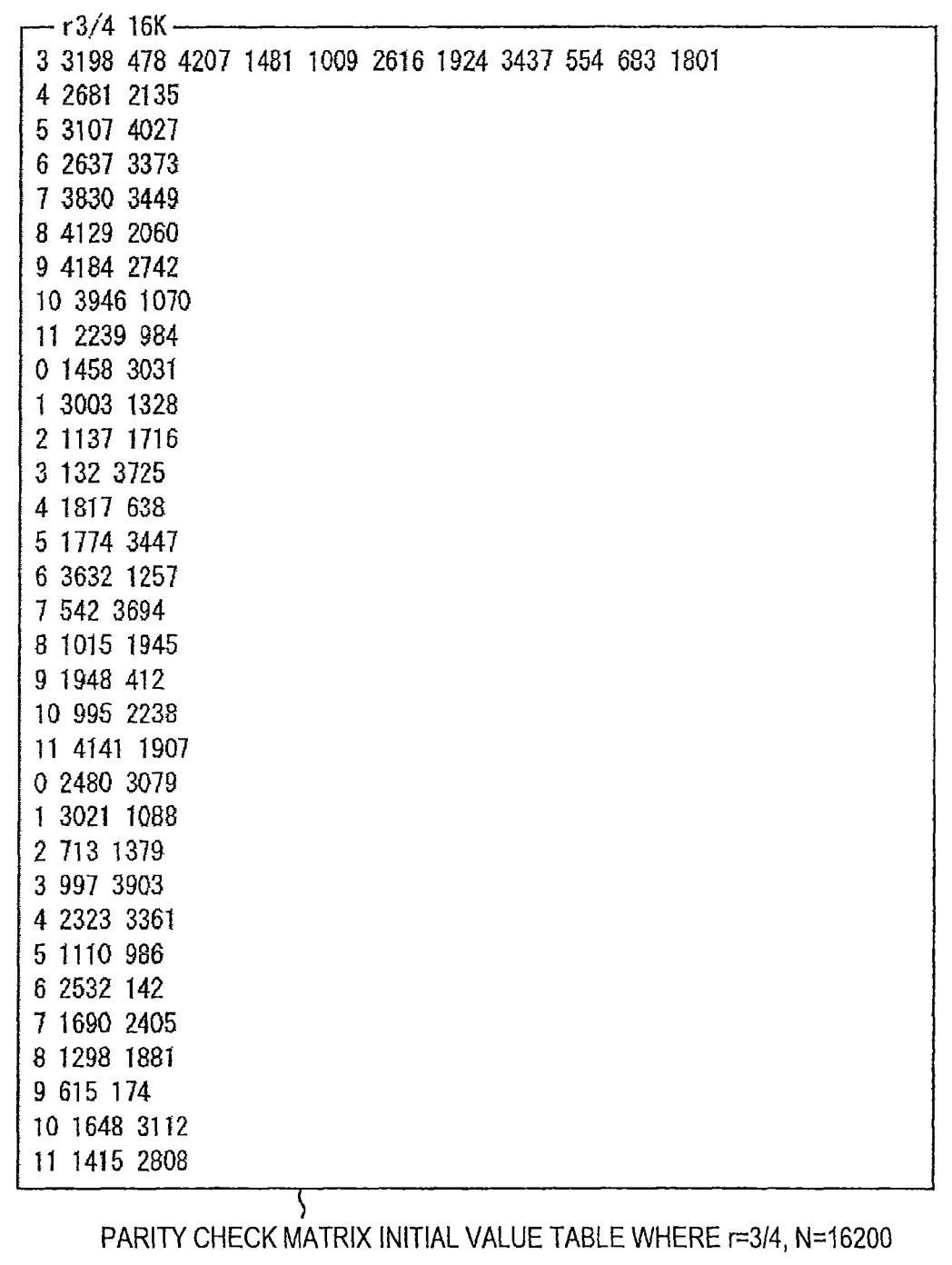

FIG. 39 illustrates a parity check matrix initial value table with respect to the parity check matrix H that is defined in the standard of the DVB-T.2 and has the code length N of 16200 bits and the encoding rate r of 3/4.

Figure 40:
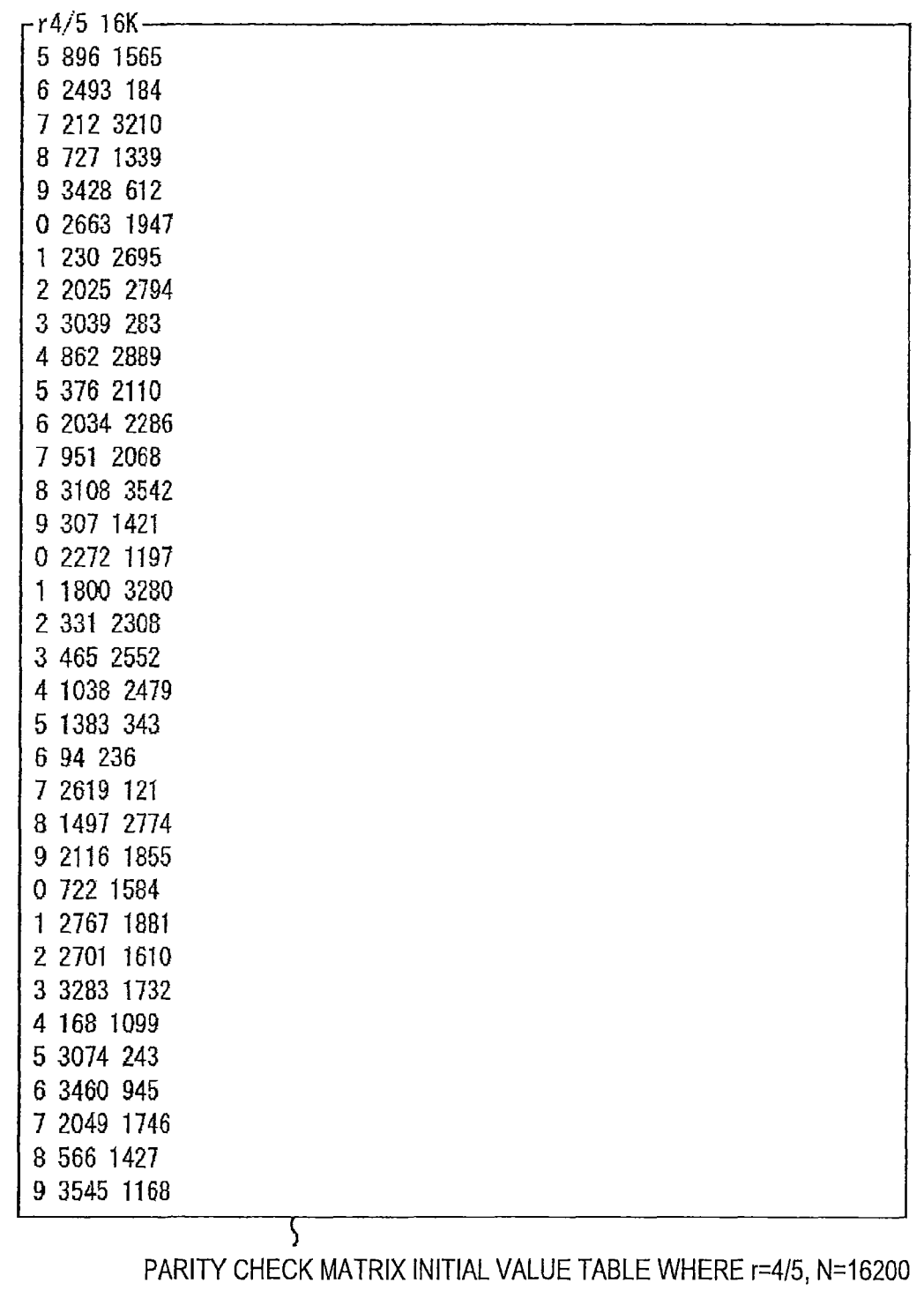

FIG. 40 illustrates a parity check matrix initial value table with respect to the parity check matrix H that is defined in the standard of the DVB-T.2 and has the code length N of 16200 bits and the encoding rate r of 4/5.

Figure 41:
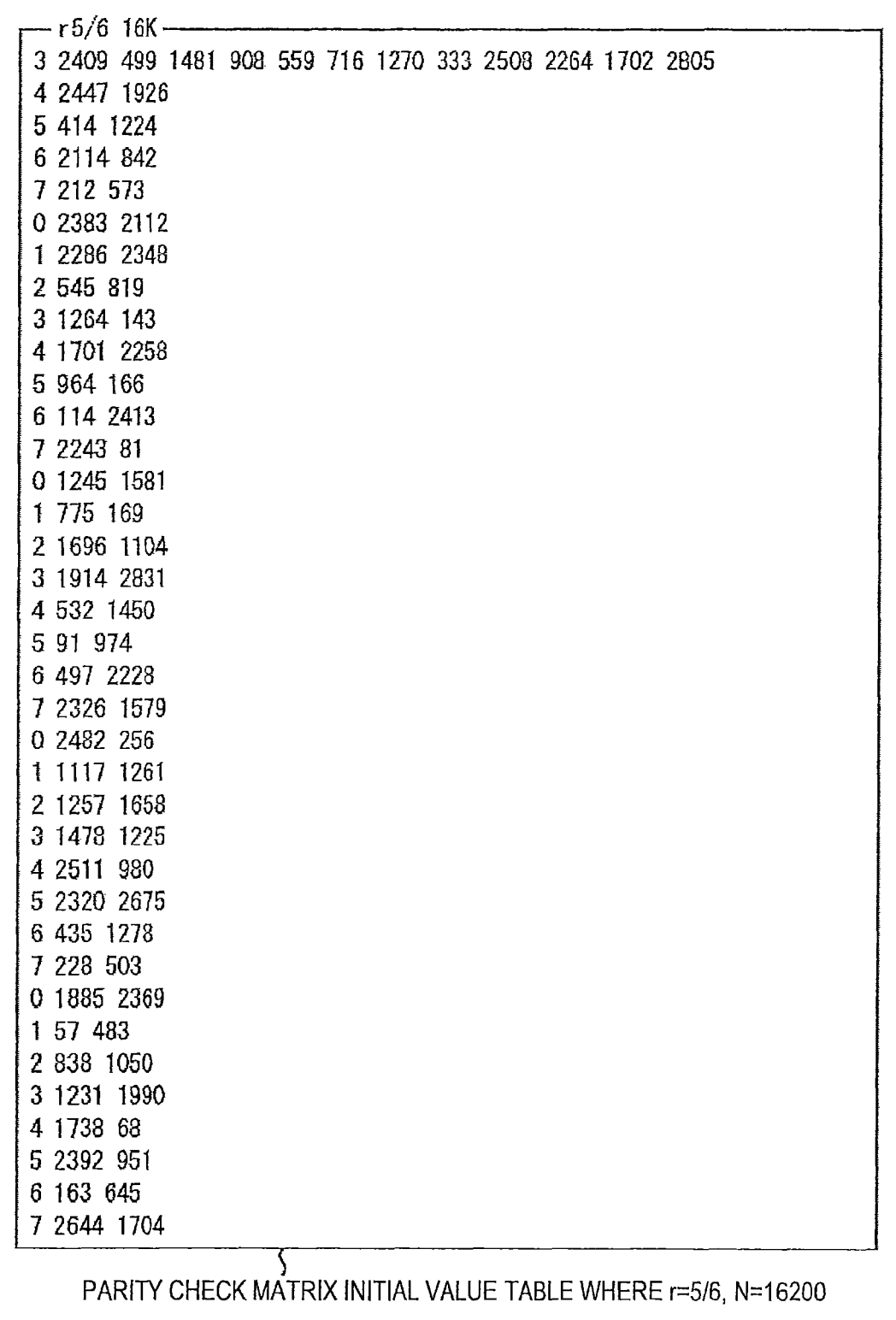

FIG. 41 illustrates a parity check matrix initial value table with respect to the parity check matrix H that is defined in the standard of the DVB-T.2 and has the code length N of 16200 bits and the encoding rate r of 5/6.

Figure 42:
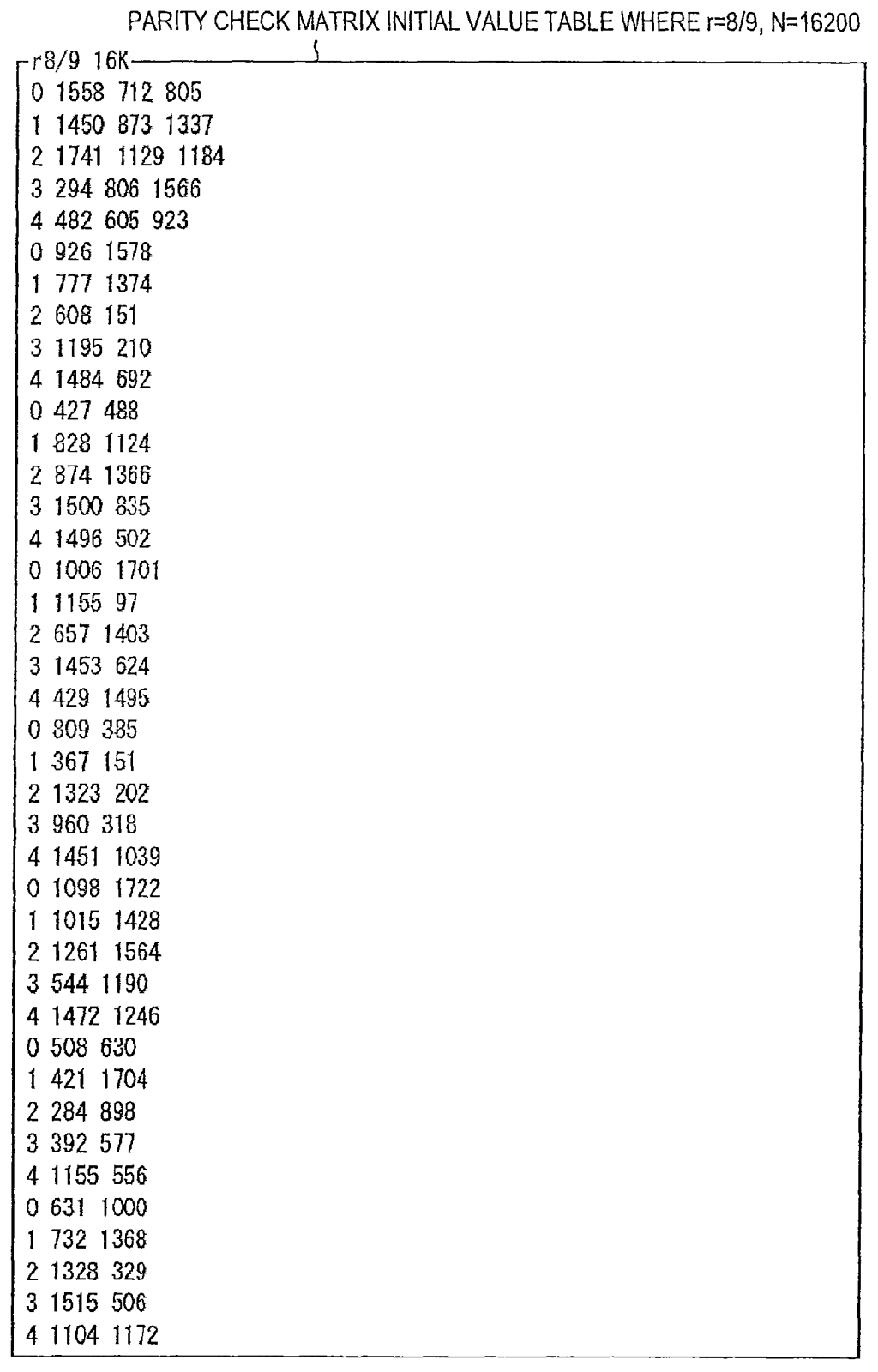

FIG. 42 illustrates a parity check matrix initial value table with respect to the parity check matrix H that is defined in the standard of the DVB-T.2 and has the code length N of 16200 bits and the encoding rate r of 8/9.

Figure 43:
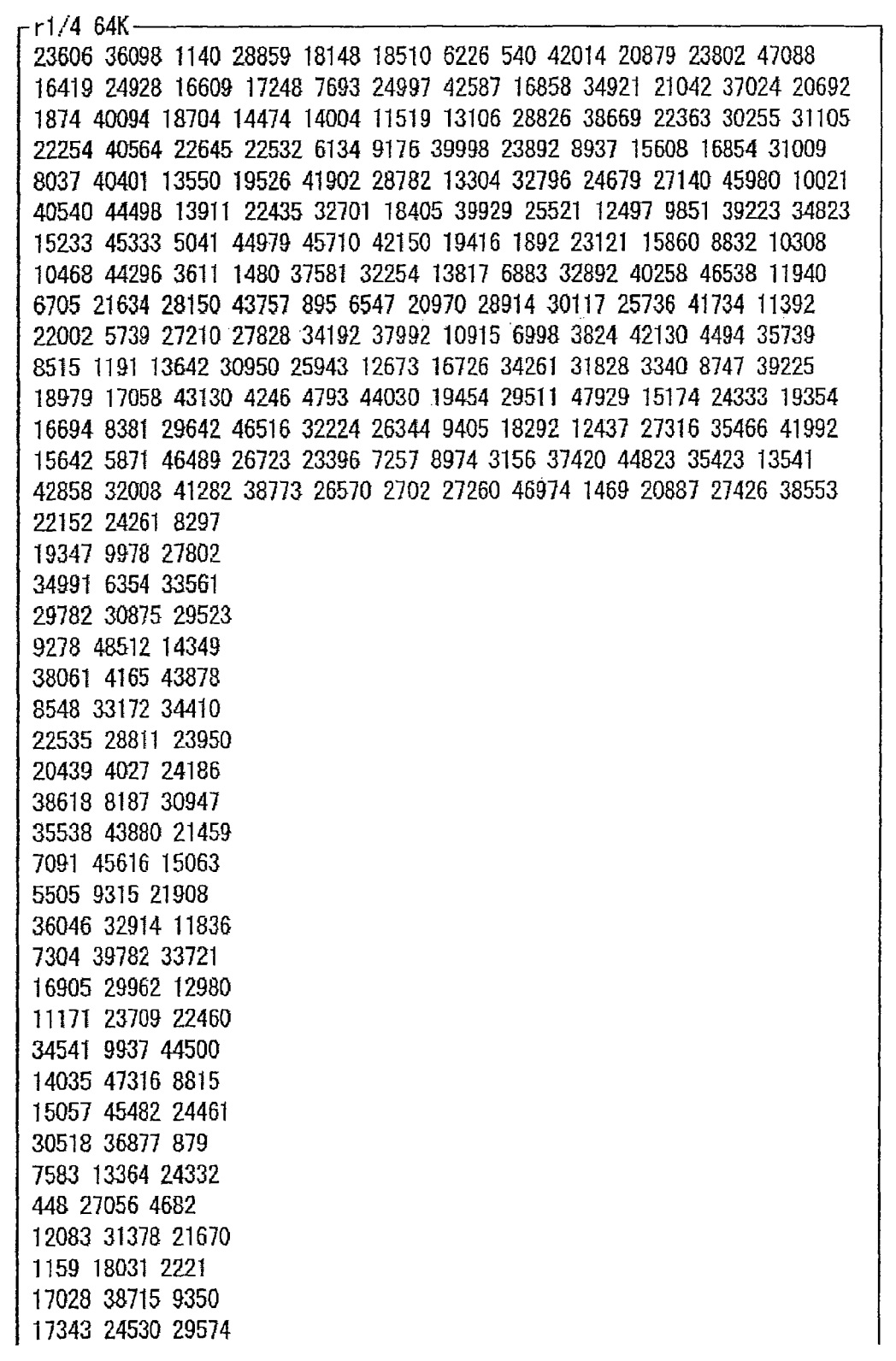

FIG. 43 and FIG. 44 each illustrate a parity check matrix initial value table with respect to the parity check matrix H that is defined in the standard of the DVB-T.2 and has the code length N of 64800 bits and the encoding rate r of 1/4.

FIG. 44 is a diagram continuous to FIG. 43.

Figure 45:
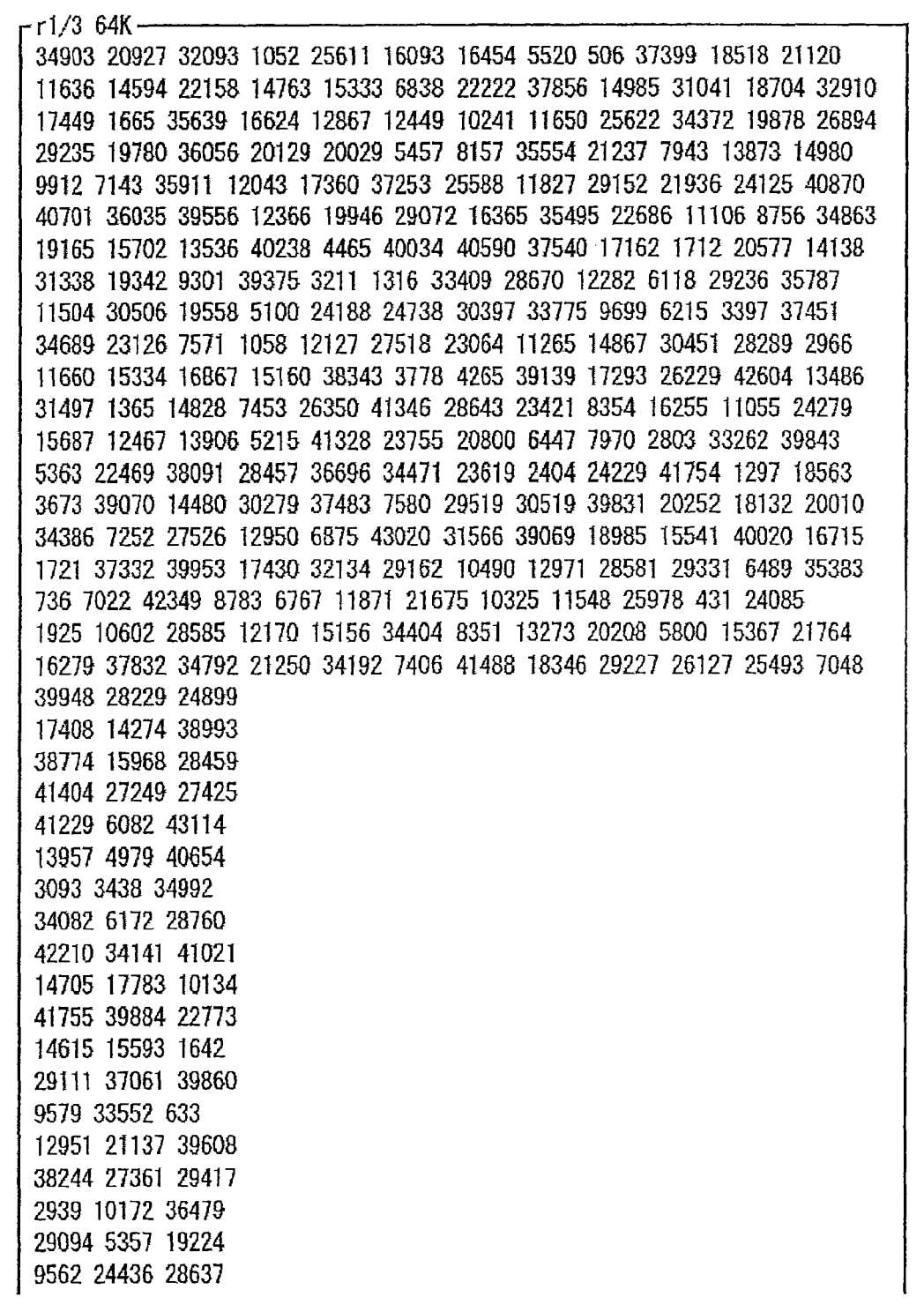
Figure 46:
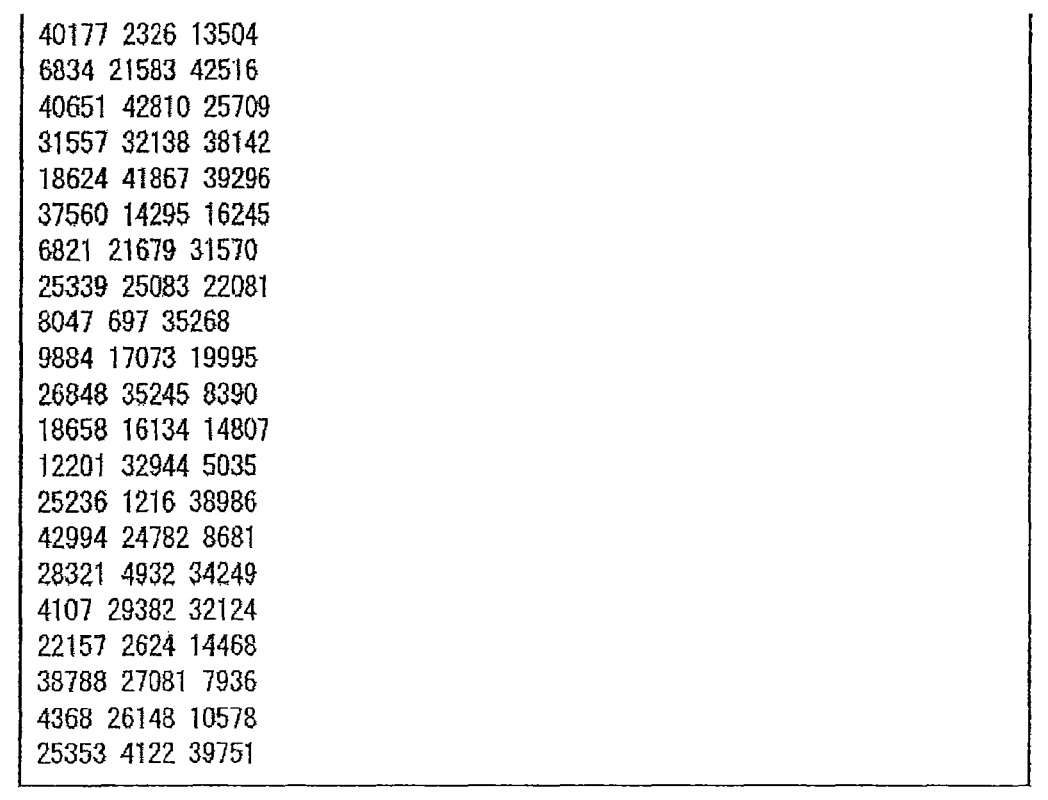

FIG. 45 and FIG. 46 each illustrate a parity check matrix initial value table with respect to the parity check matrix H that is defined in the standard of the DVB-T.2 and has the code length N of 64800 bits and the encoding rate r of 1/3.

FIG. 46 is a diagram continuous to FIG. 45.

Figure 47:
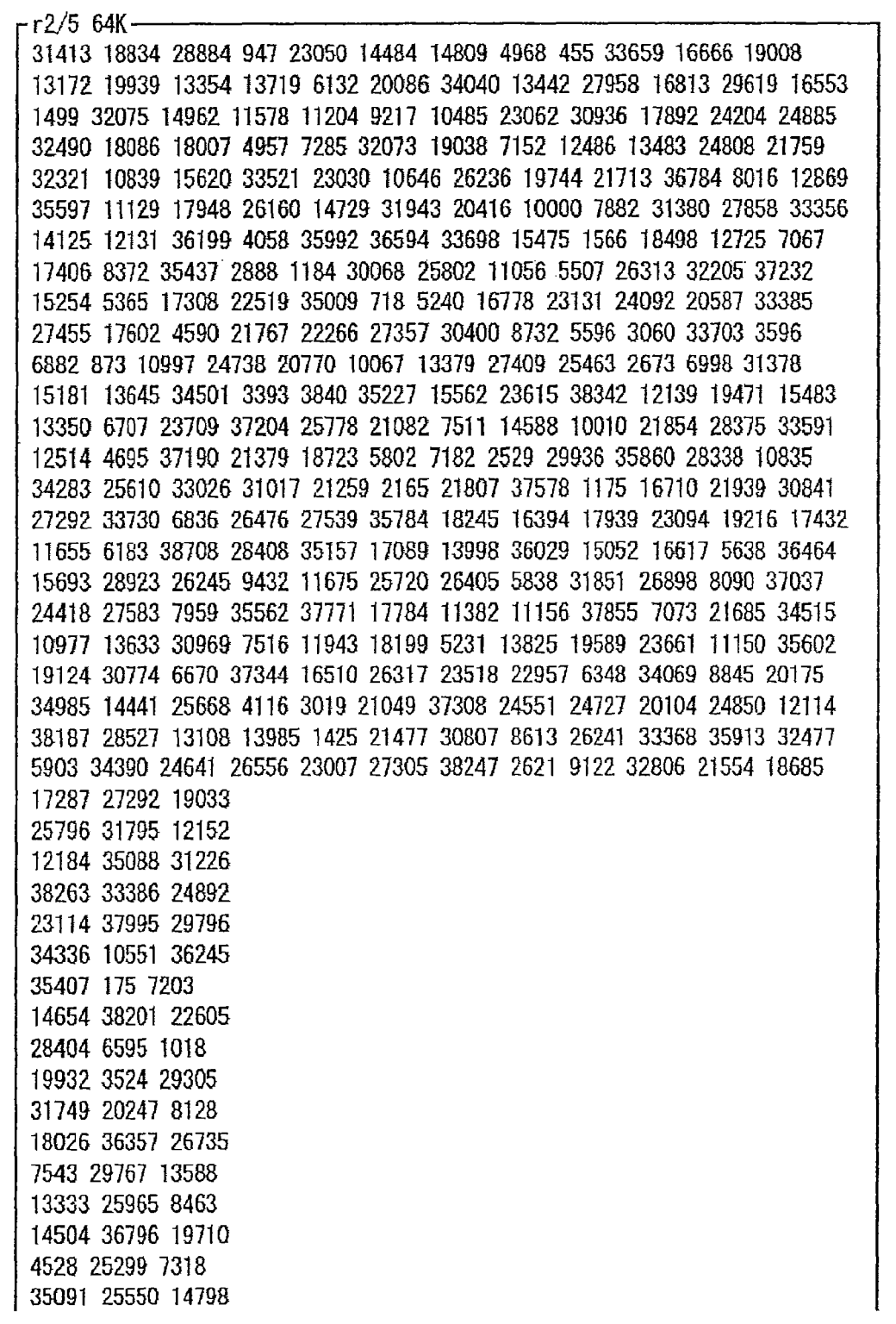
Figure 48:
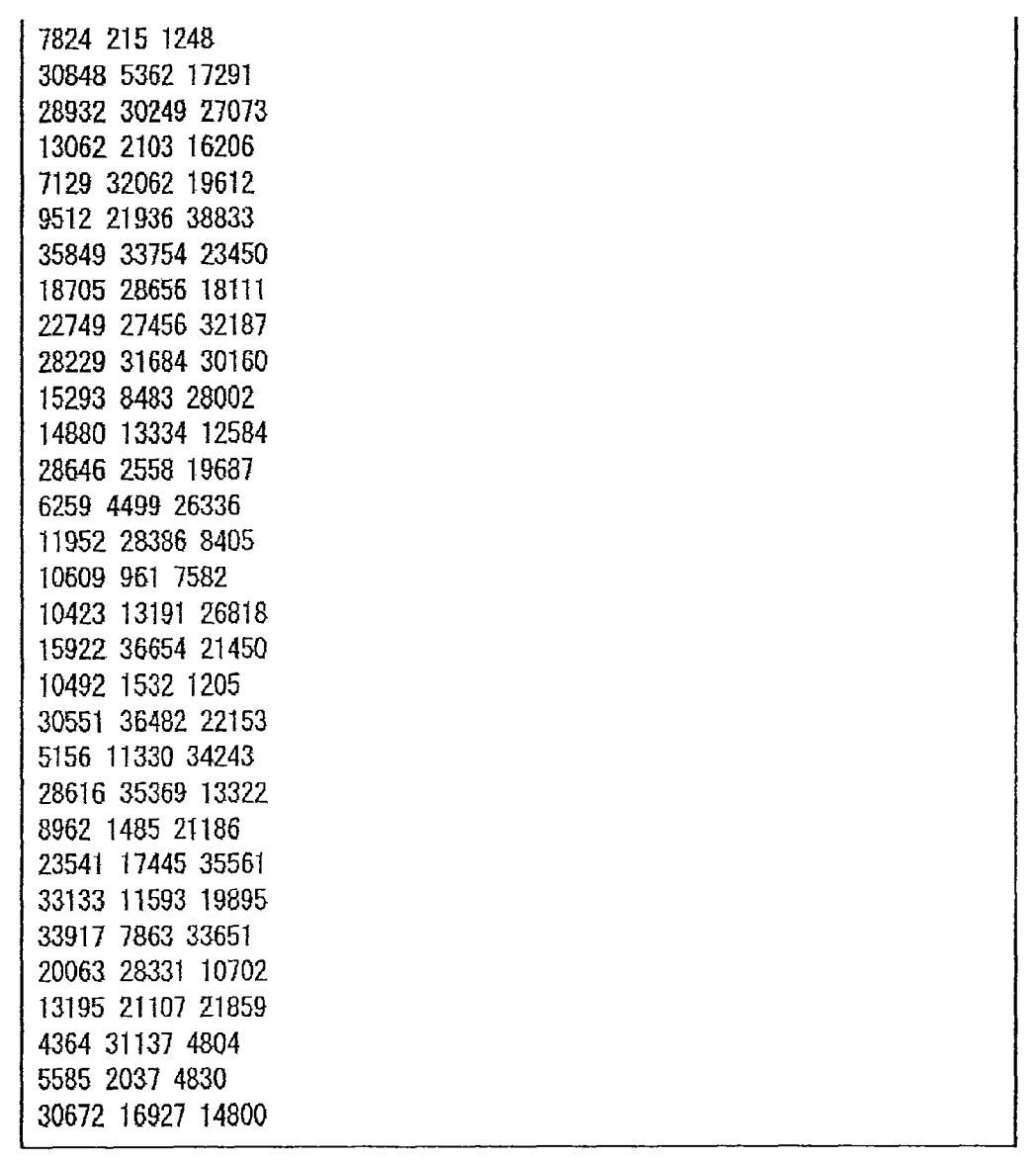

FIG. 47 and FIG. 48 each illustrate a parity check matrix initial value table with respect to the parity check matrix H that is defined in the standard of the DVB-T.2 and has the code length N of 64800 bits and the encoding rate r of 2/5.

FIG. 48 is a diagram continuous to FIG. 47.

Figure 49:
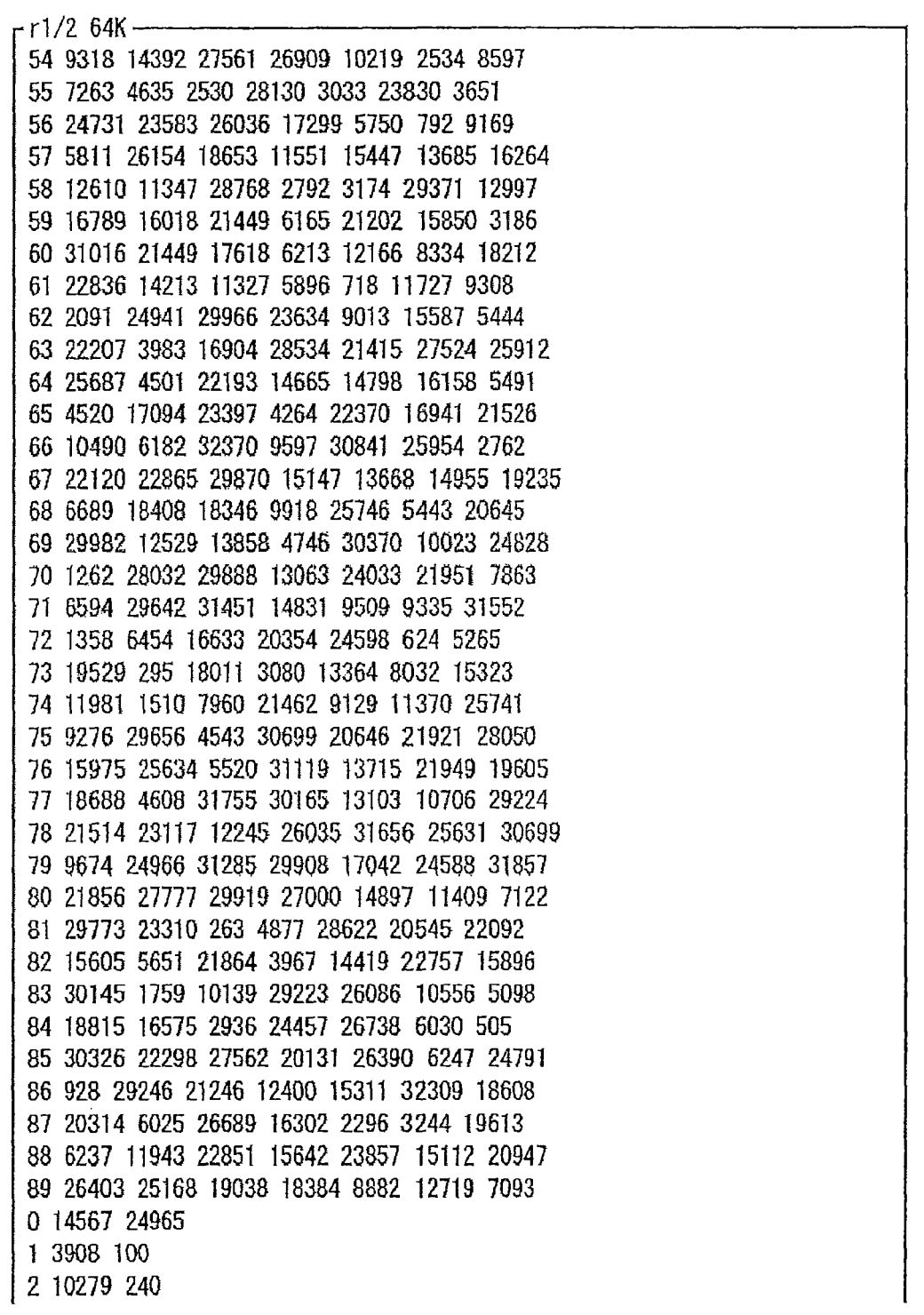
Figure 50:
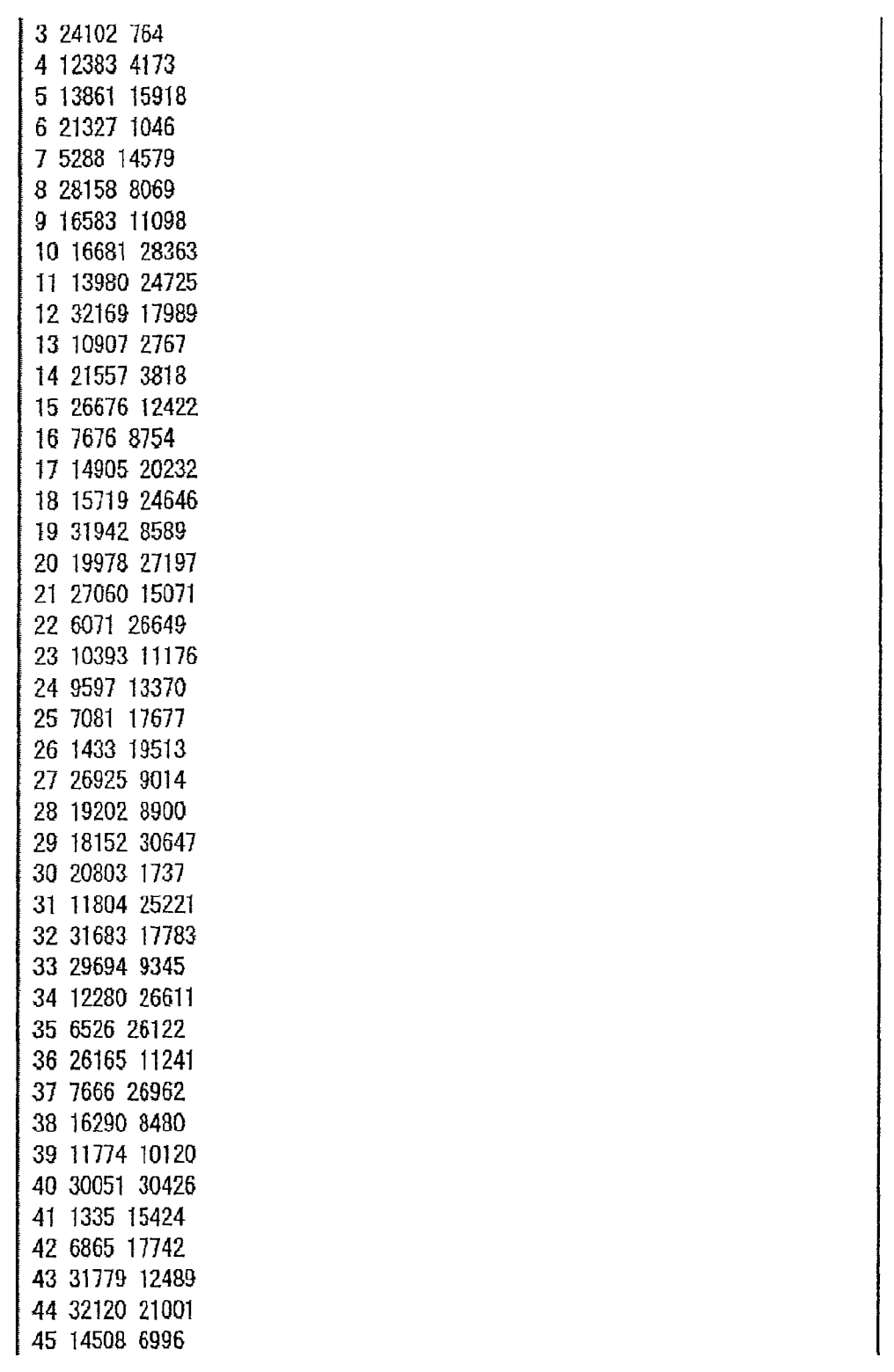

FIG. 49 to FIG. 51 each illustrate a parity check matrix initial value table with respect to the parity check matrix H that is defined in the standard of the DVB-T.2 and has the code length N of 64800 bits and the encoding rate r of 1/2.

FIG. 50 is a diagram continuous to FIG. 49, and FIG. 51 is a diagram continuous to FIG. 50.

Figure 52:
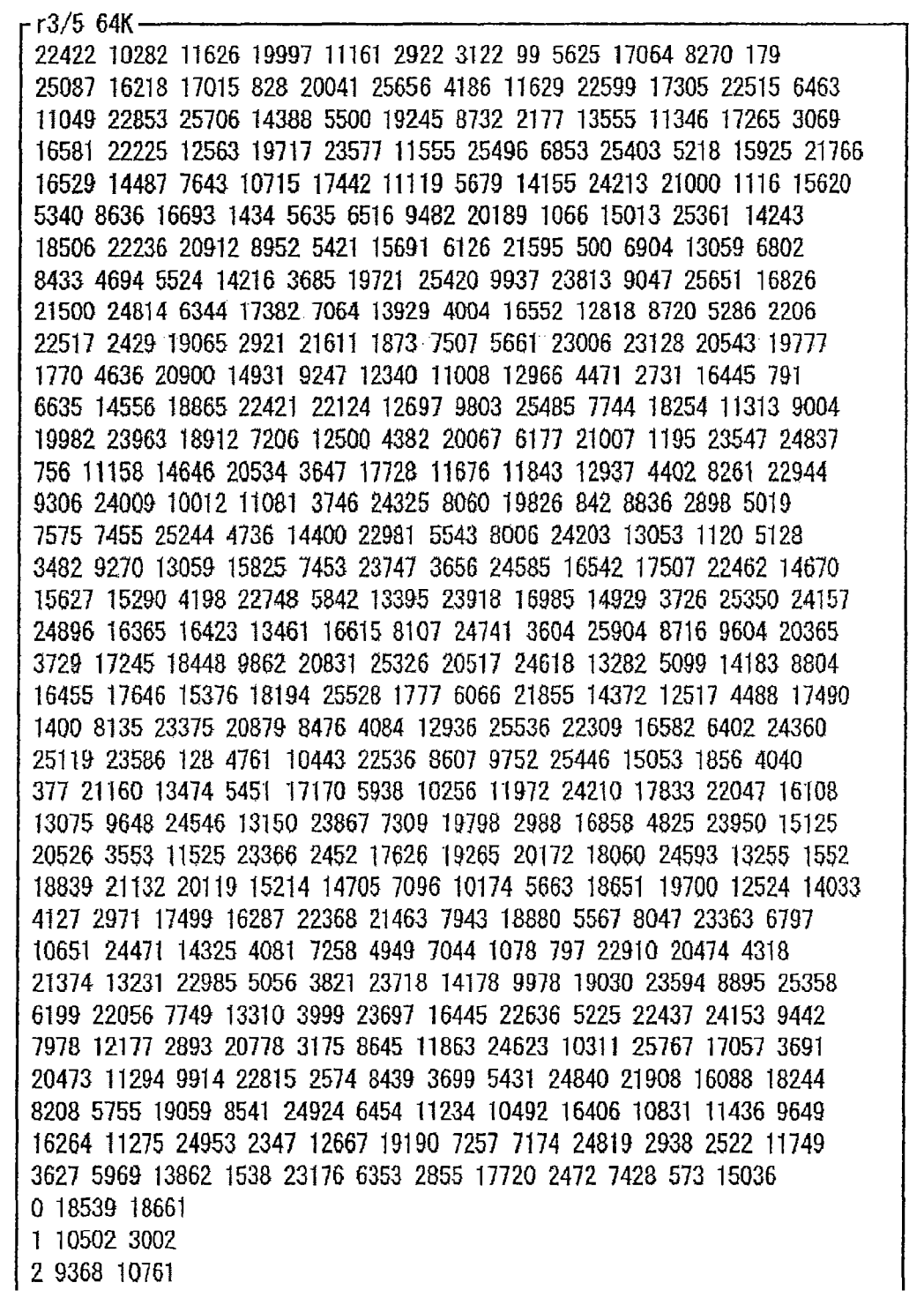
Figure 53:
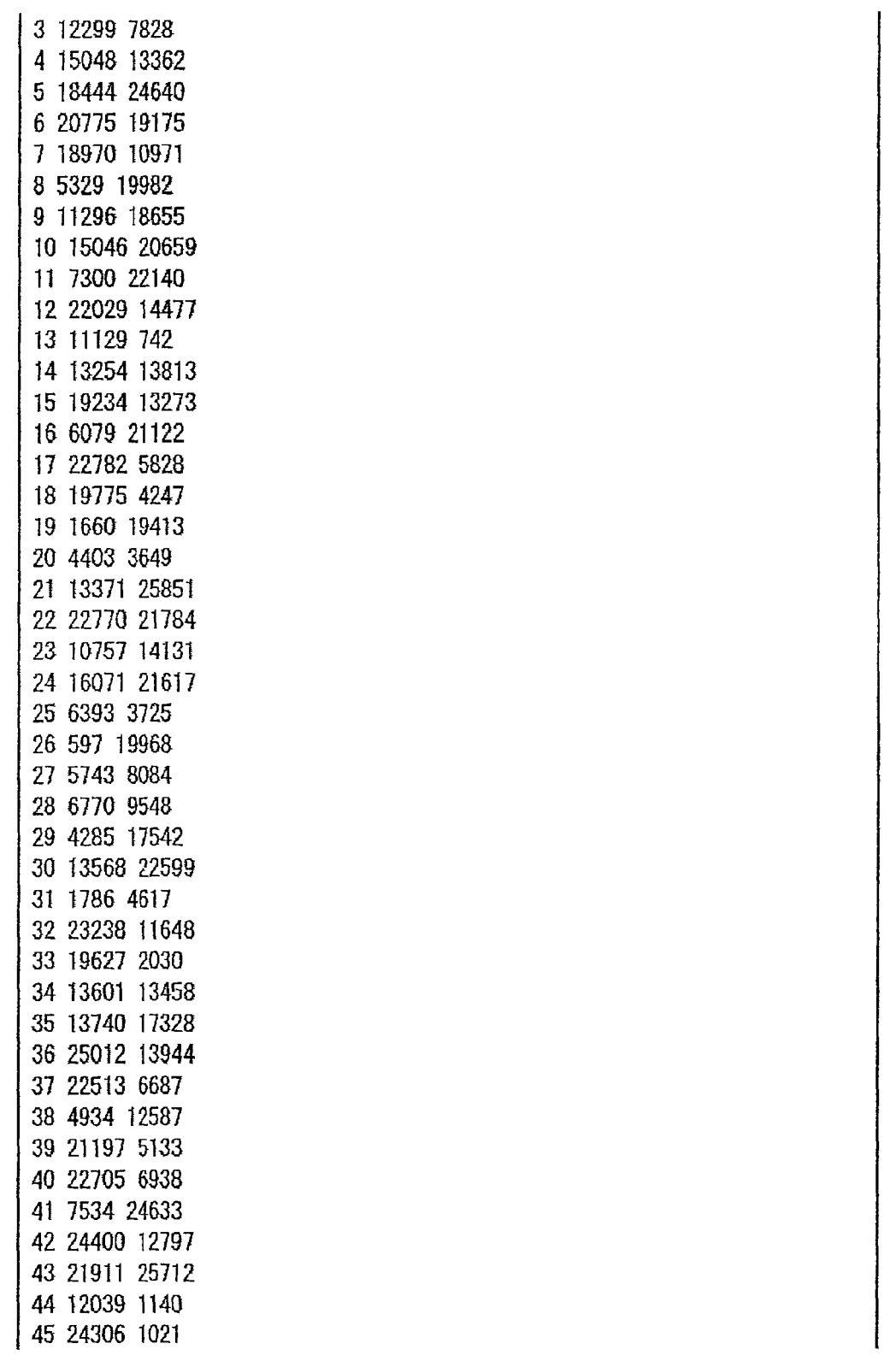
Figure 54:
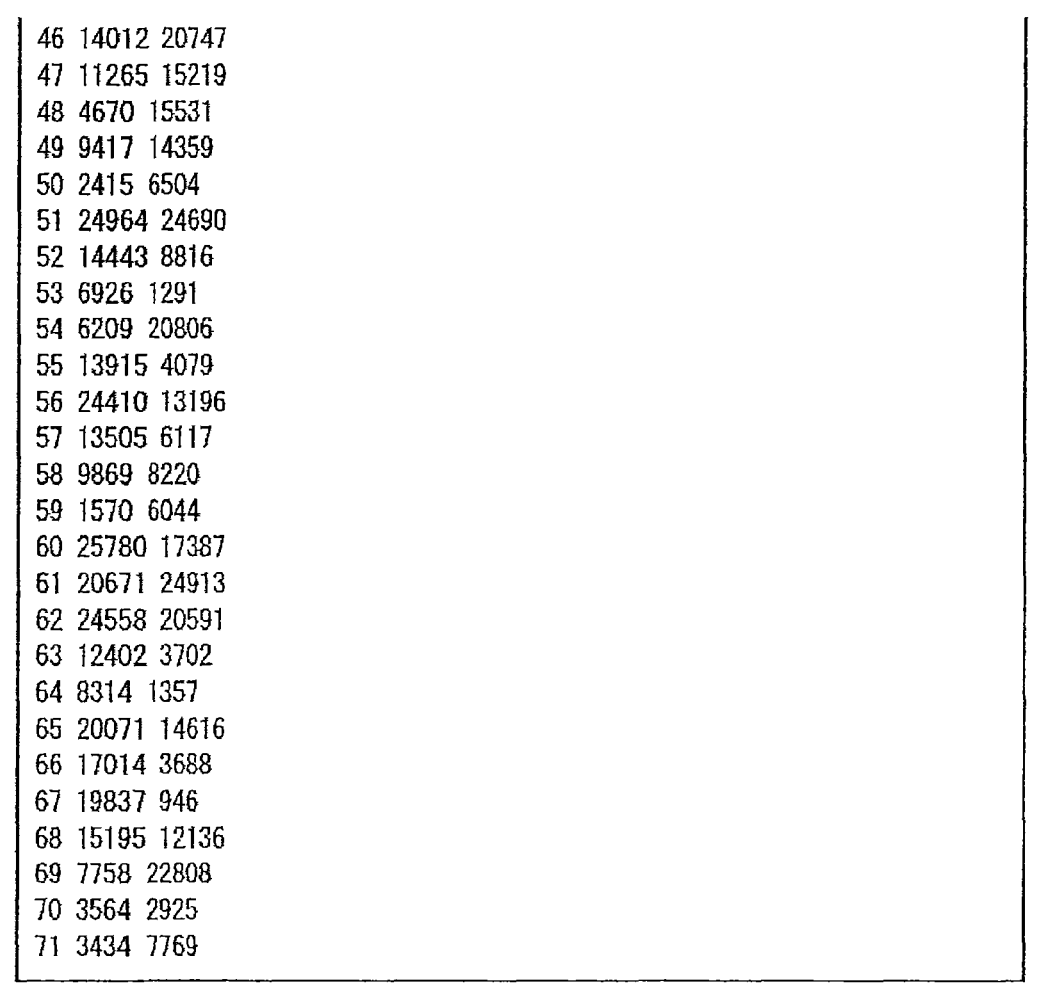

FIG. 52 to FIG. 54 each illustrate a parity check matrix initial value table with respect to the parity check matrix H that is defined in the standard of the DVB-T.2 and has the code length N of 64800 bits and the encoding rate r of 3/5.

FIG. 53 is a diagram continuous to FIG. 52, and FIG. 54 is a diagram continuous to FIG. 53.

Figure 55:
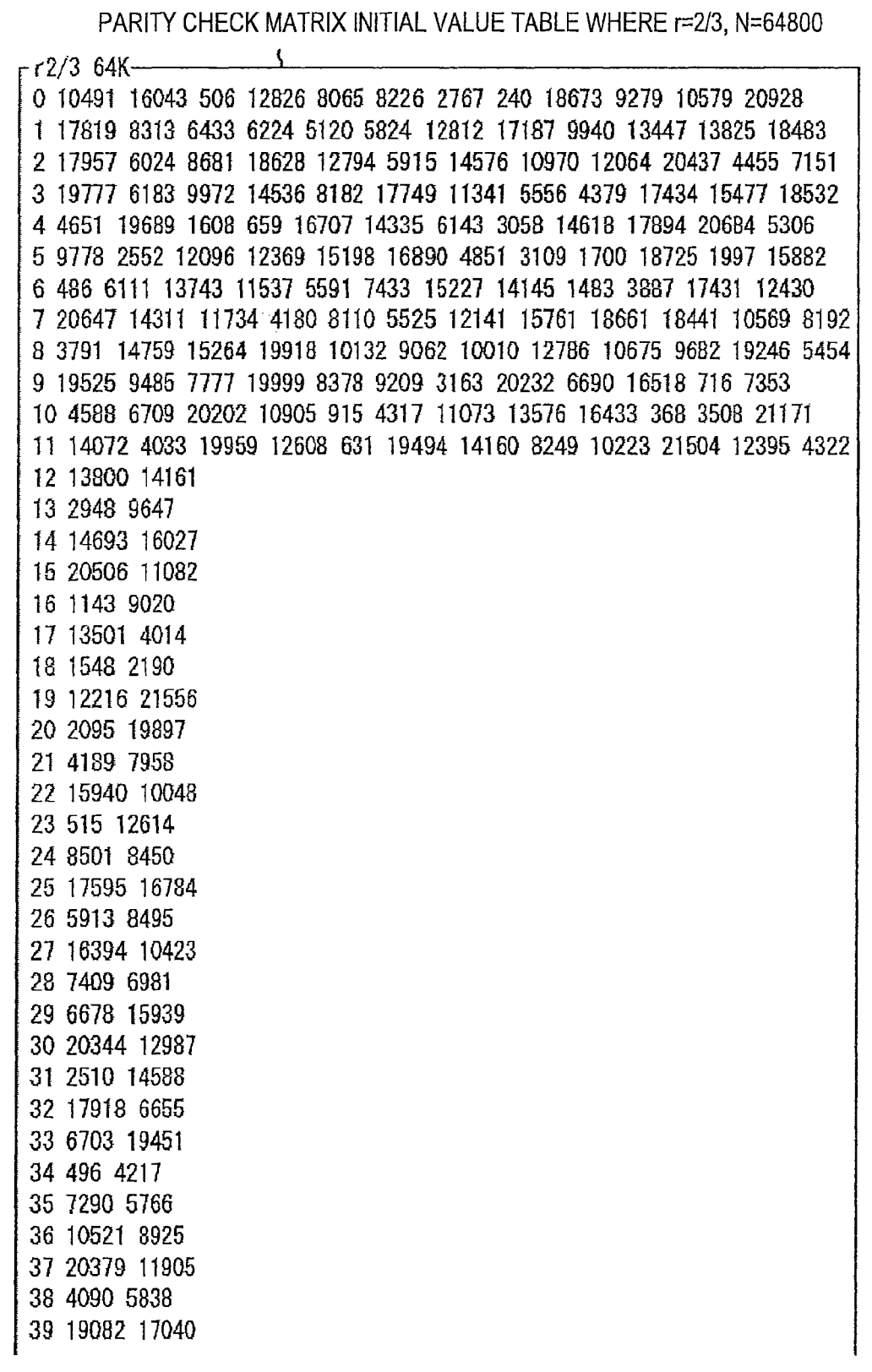
Figure 56:
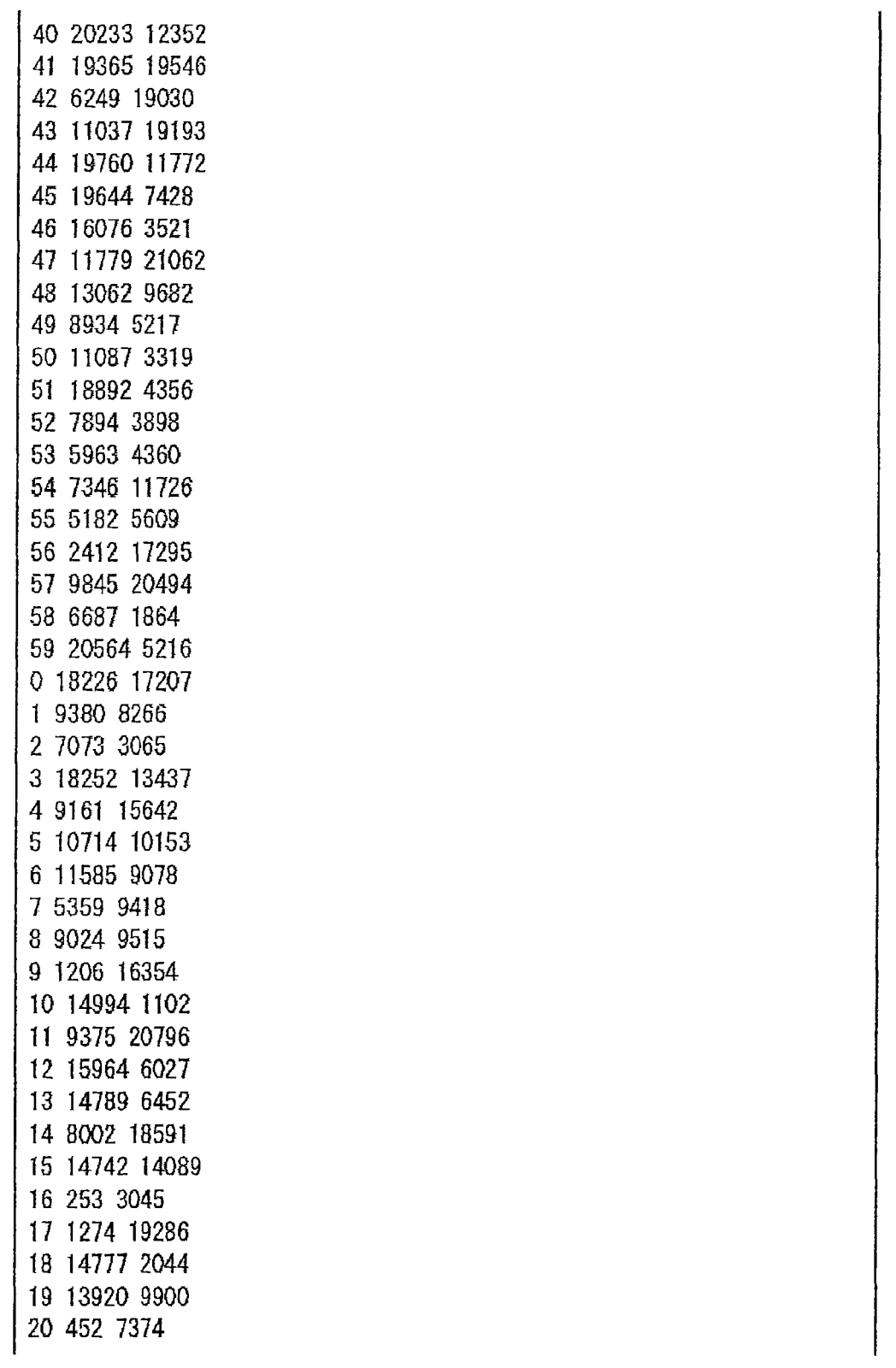
Figure 57:
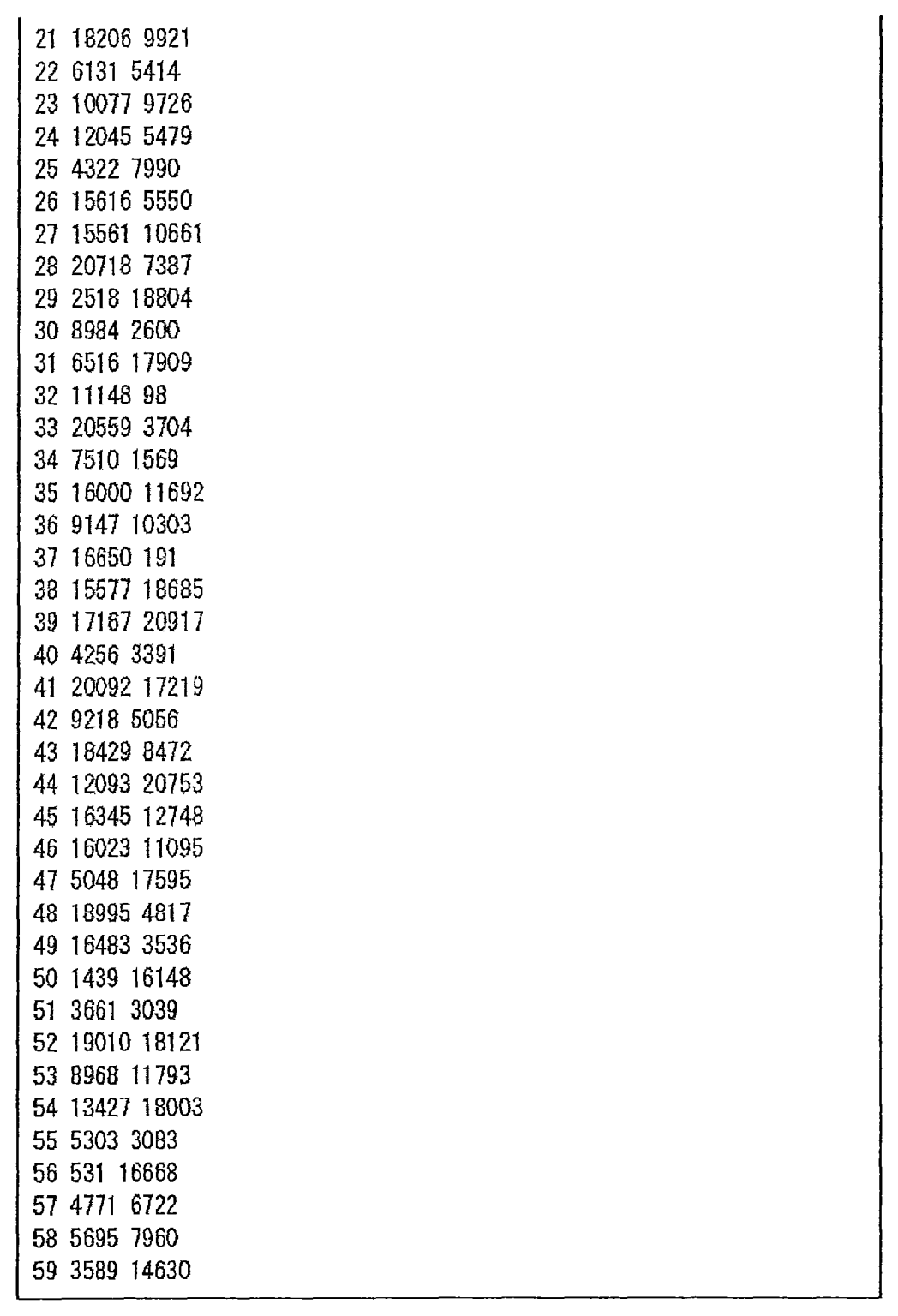

FIG. 55 to FIG. 57 each illustrate a parity check matrix initial value table with respect to the parity check matrix H that is defined in the standard of the DVB-T.2 and has the code length N of 64800 bits and the encoding rate r of 2/3.

FIG. 56 is a diagram continuous to FIG. 55, and FIG. 57 is a diagram continuous to FIG. 56.

FIG. 58 to FIG. 61 each illustrate a parity check matrix initial value table with respect to the parity check matrix H that is defined in the standard of the DVB-T.2 and has the code length N of 64800 bits and the encoding rate r of 3/4.

Figure 58:
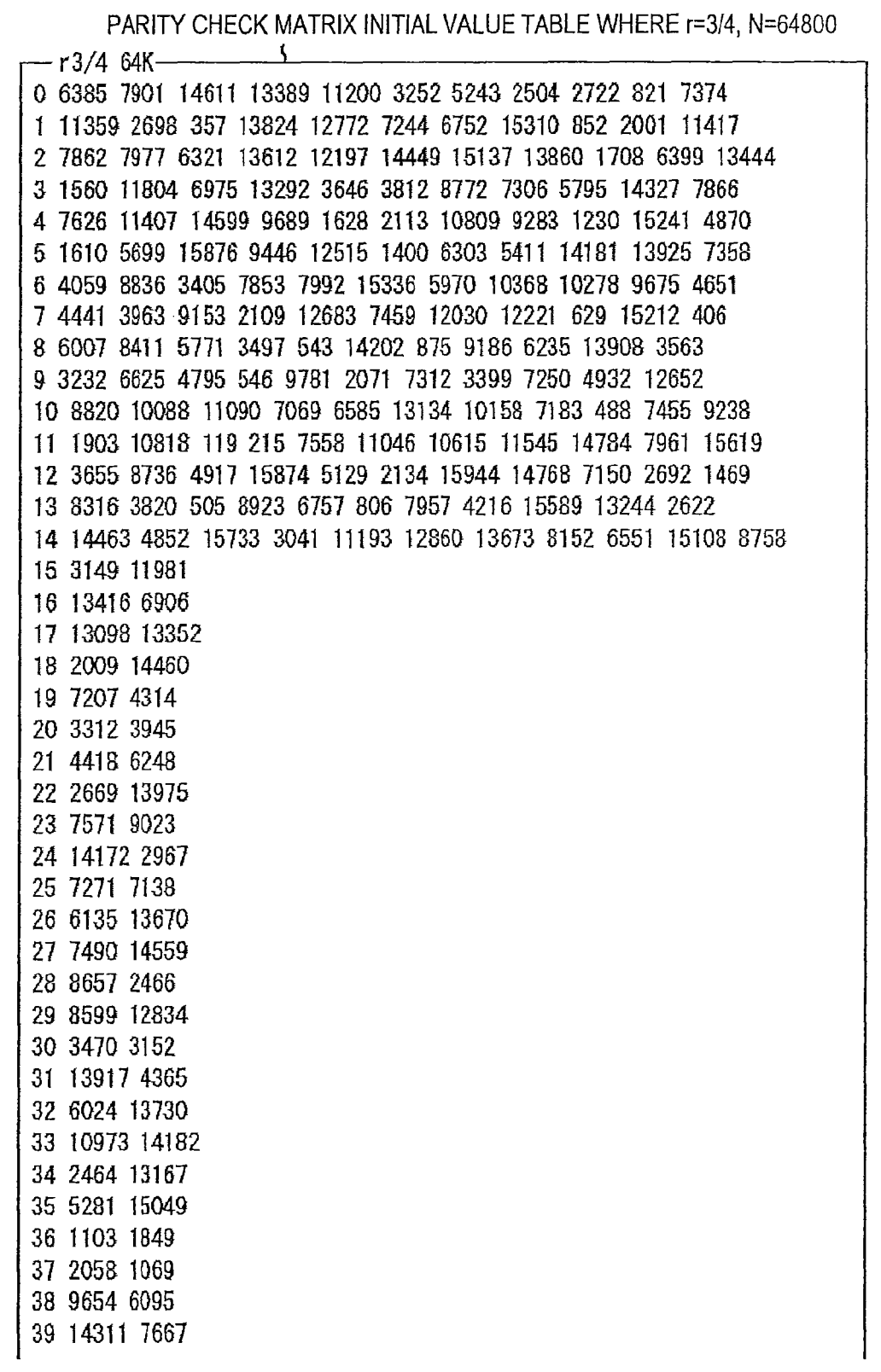
Figure 59:
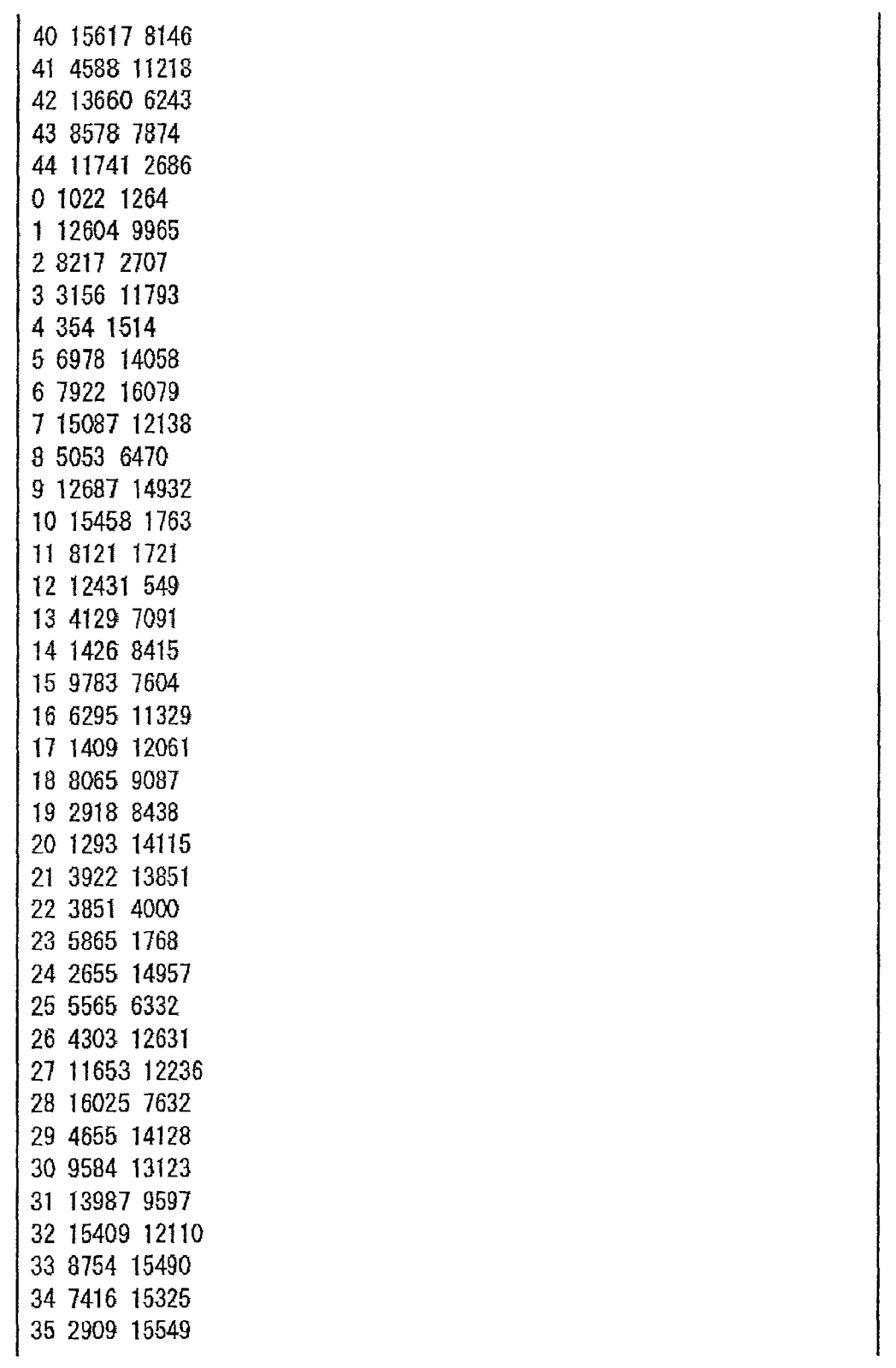
Figure 60:
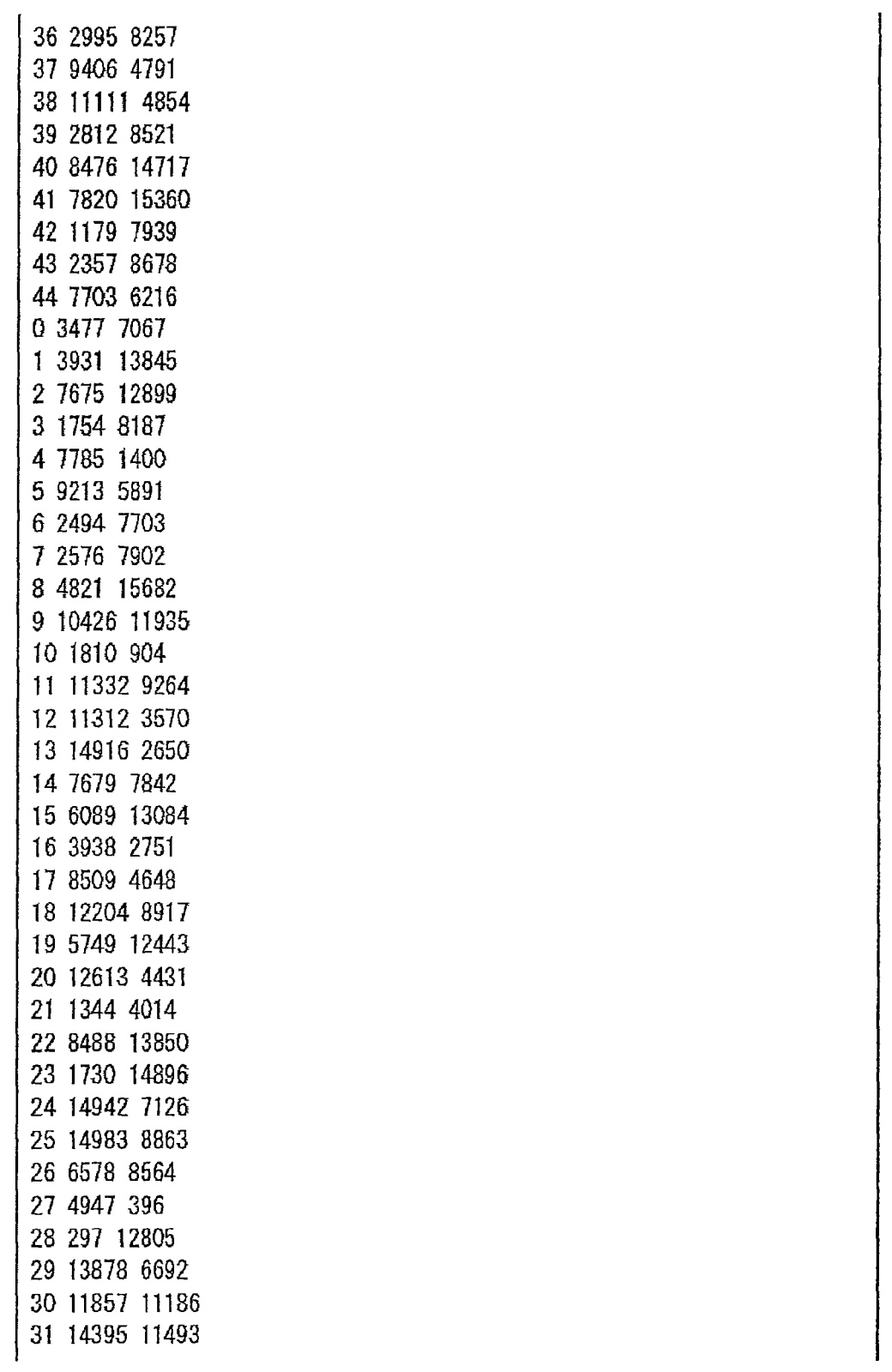
Figure 61:
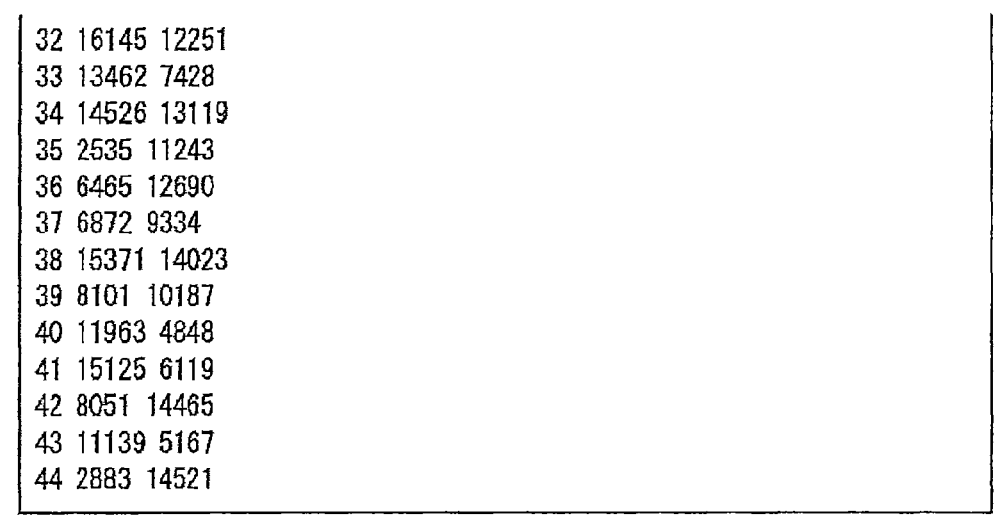

FIG. 59 is a diagram continuous to FIG. 58, FIG. 60 is a diagram continuous to FIG. 59, and FIG. 61 is a diagram continuous to FIG. 60.

FIG. 62 to FIG. 65 each illustrate a parity check matrix initial value table with respect to the parity check matrix H that is defined in the standard of the DVB-T.2 and has the code length N of 64800 bits and the encoding rate r of 4/5.

Figure 62:
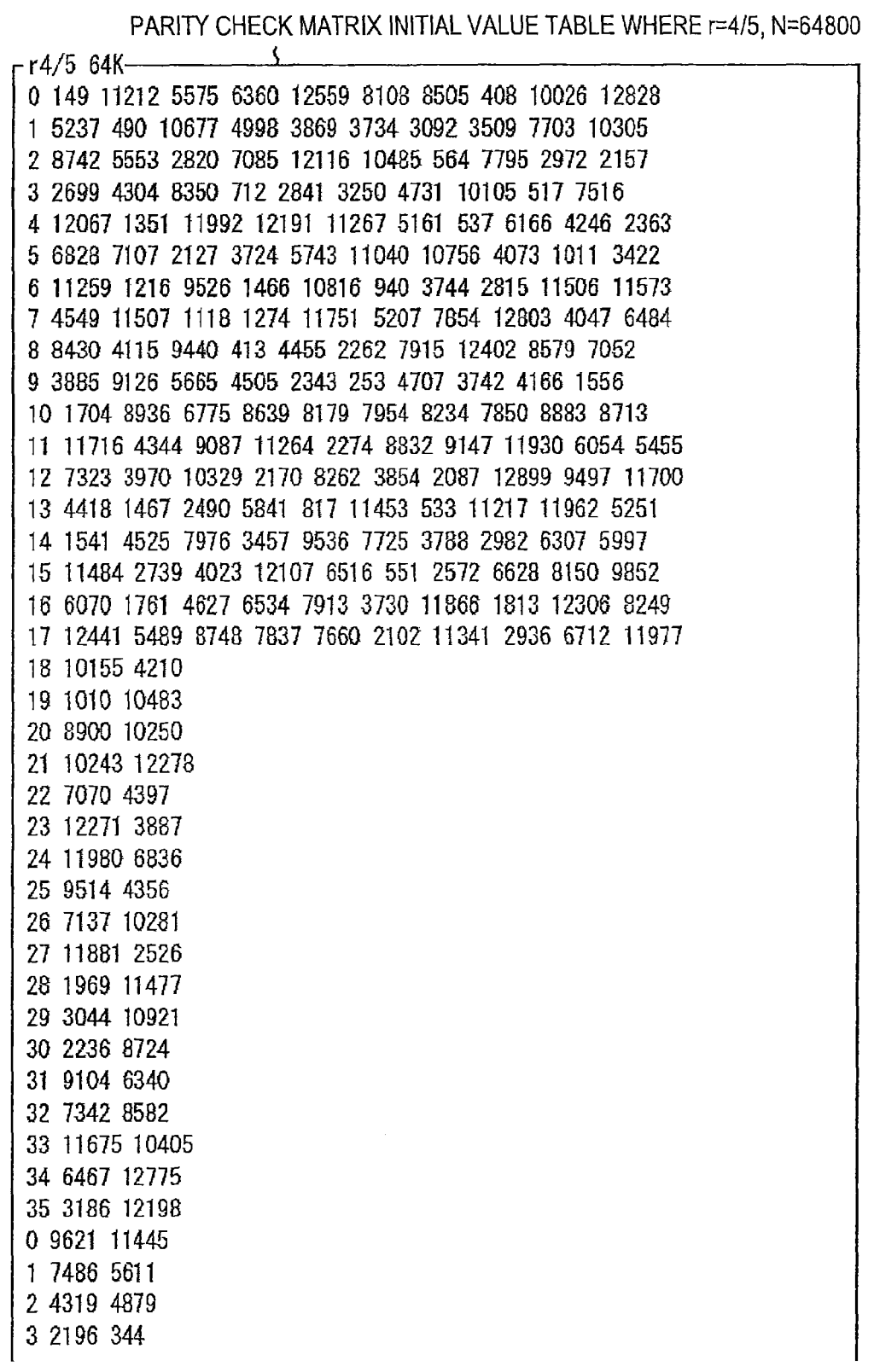
Figure 63:
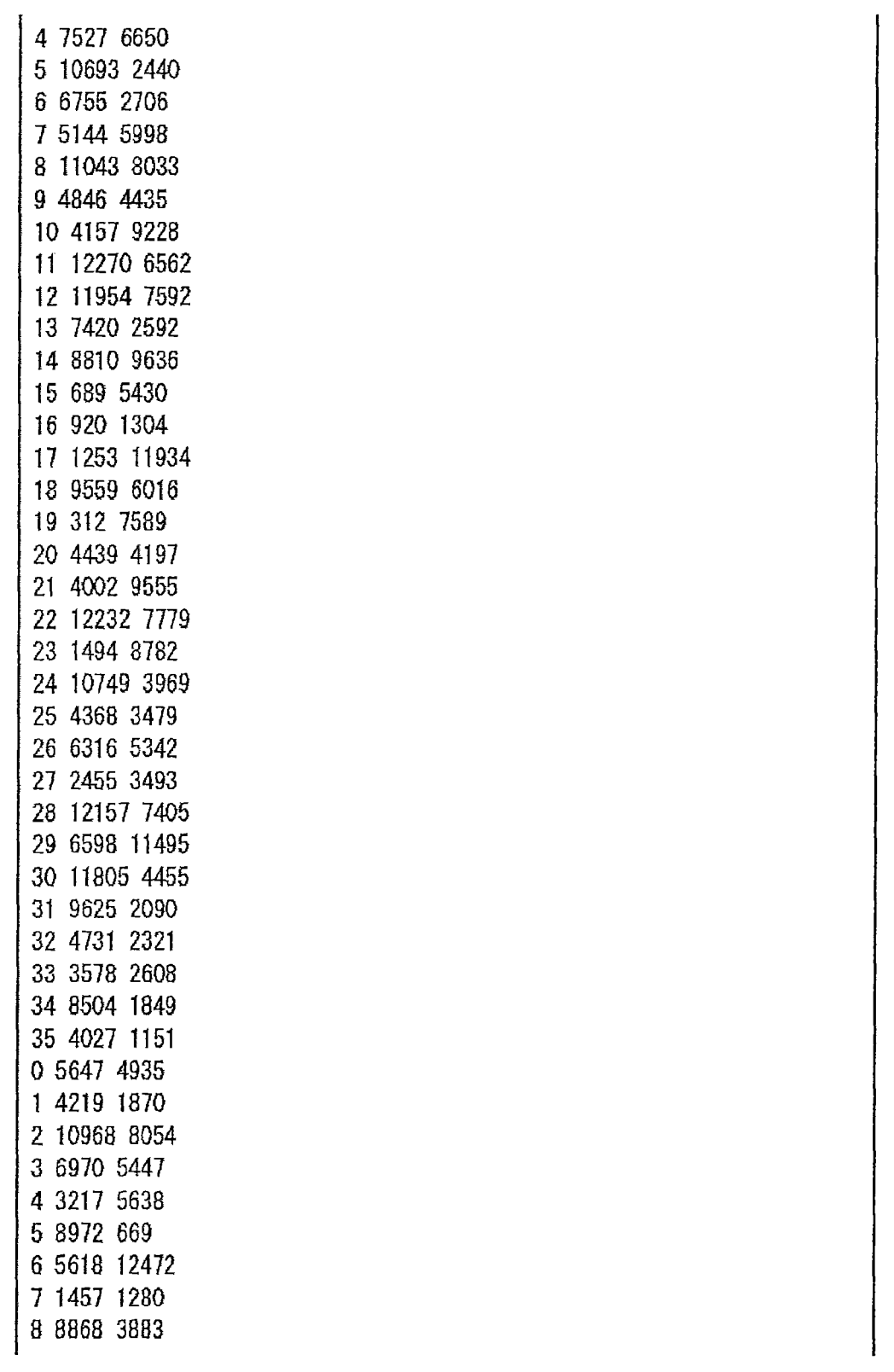
Figure 64:
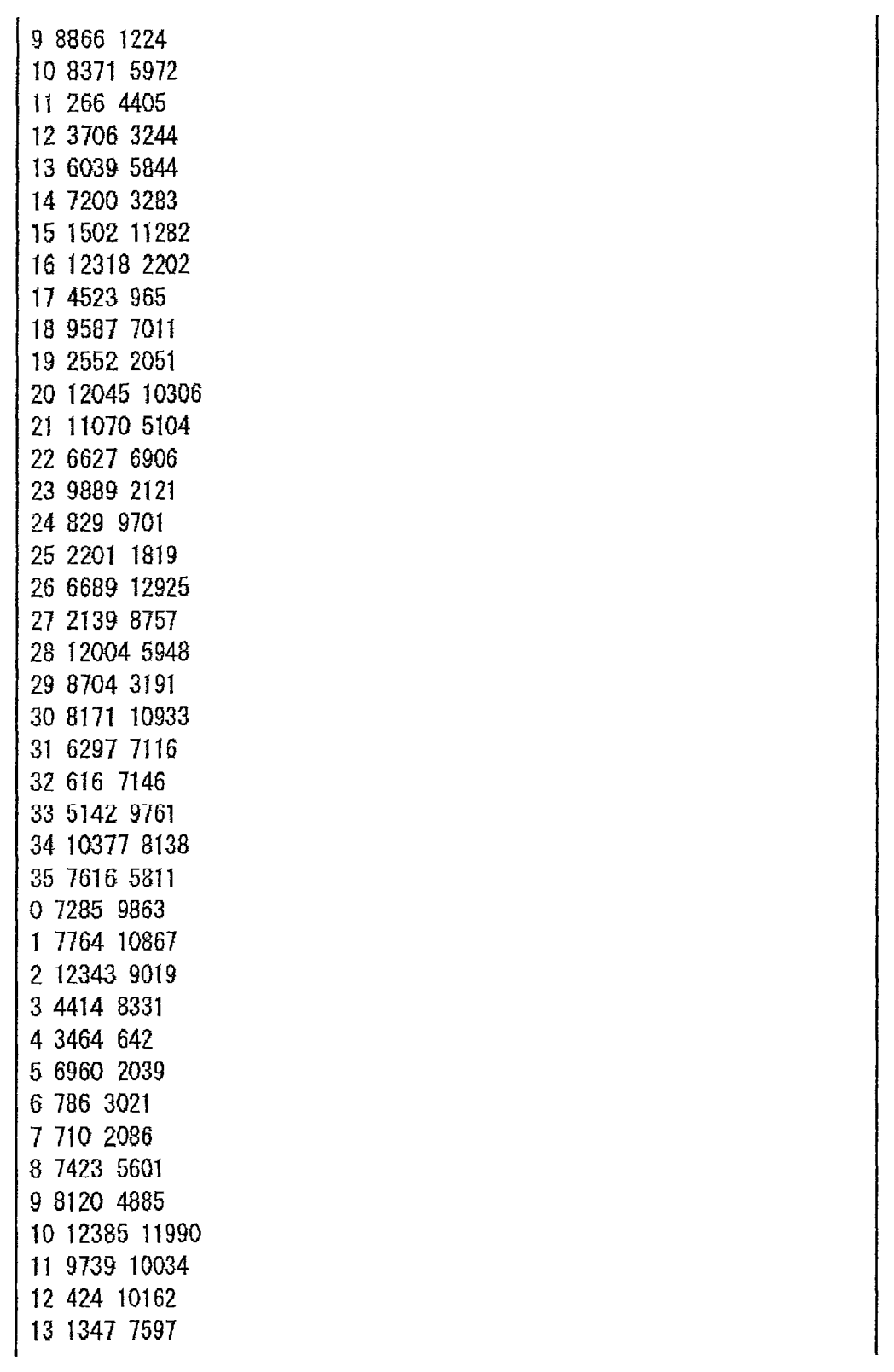
Figure 65:
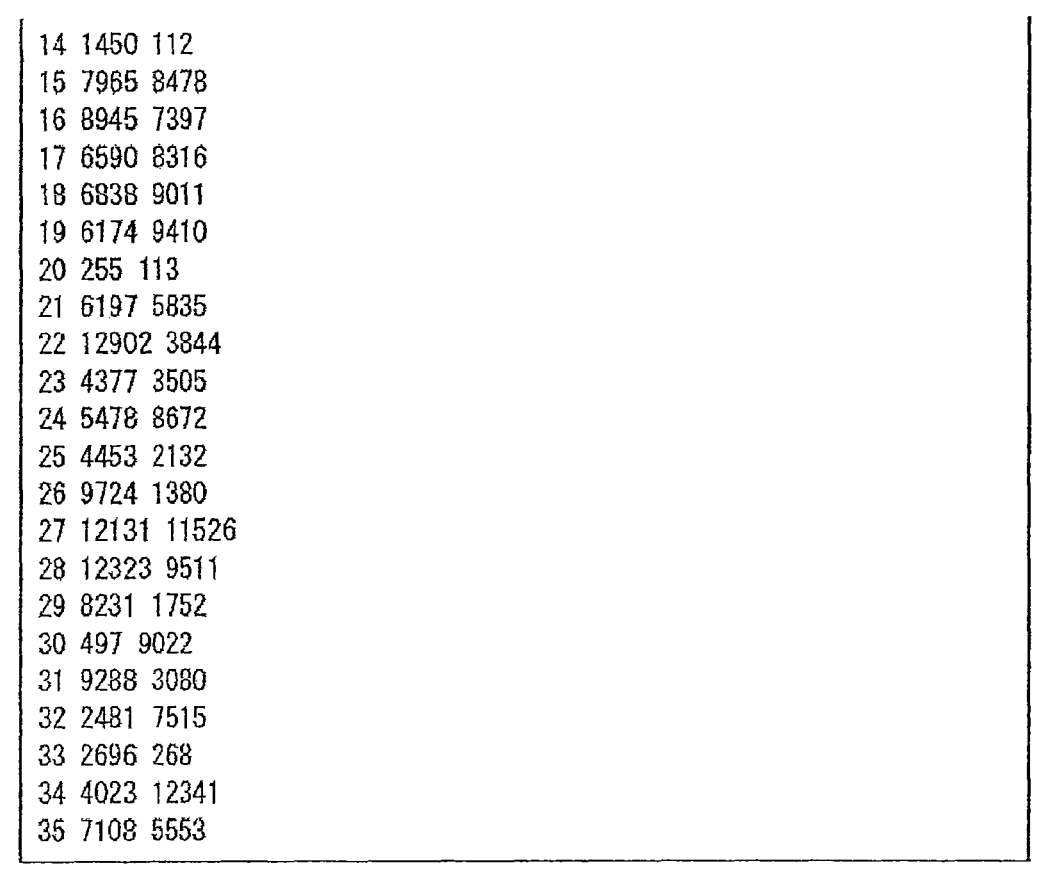

FIG. 63 is a diagram continuous to FIG. 62, FIG. 64 is a diagram continuous to FIG. 63, and FIG. 65 is a diagram continuous to FIG. 64.

FIG. 66 to FIG. 69 each illustrate a parity check matrix initial value table with respect to the parity check matrix H that is defined in the standard of the DVB-T.2 and has the code length N of 64800 bits and the encoding rate r of 5/6.

Figure 66:
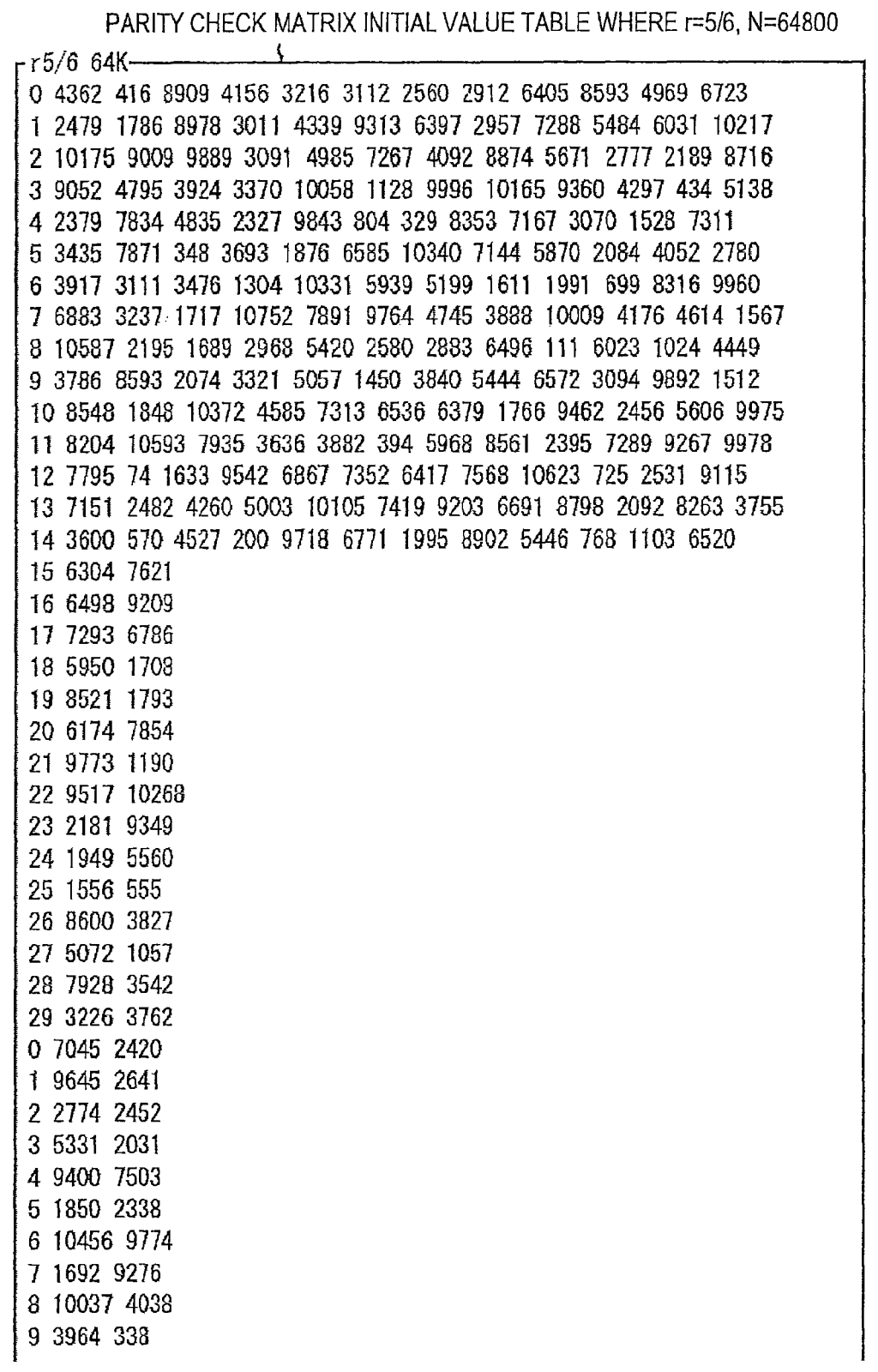
Figure 67:
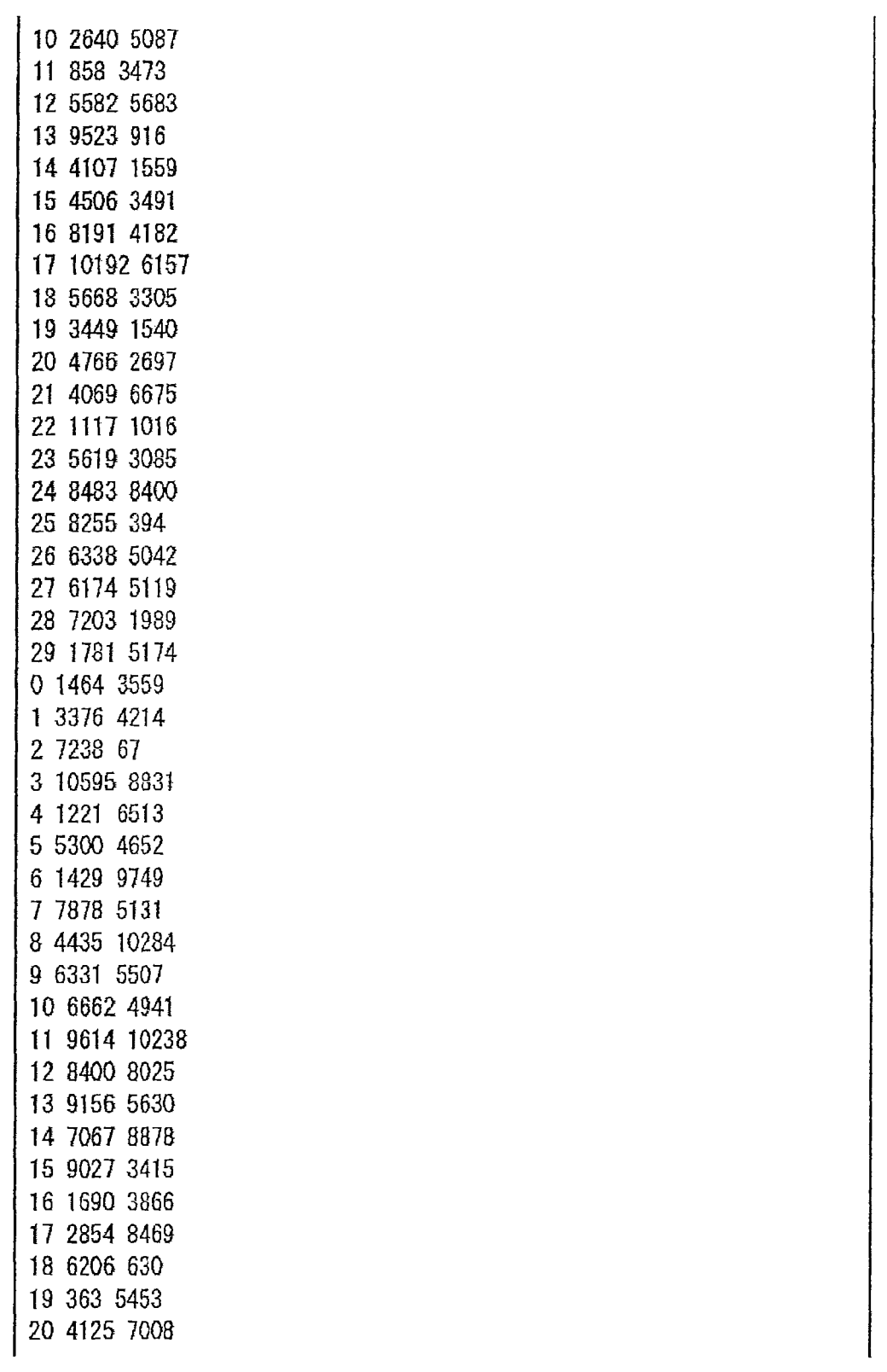
Figure 68:
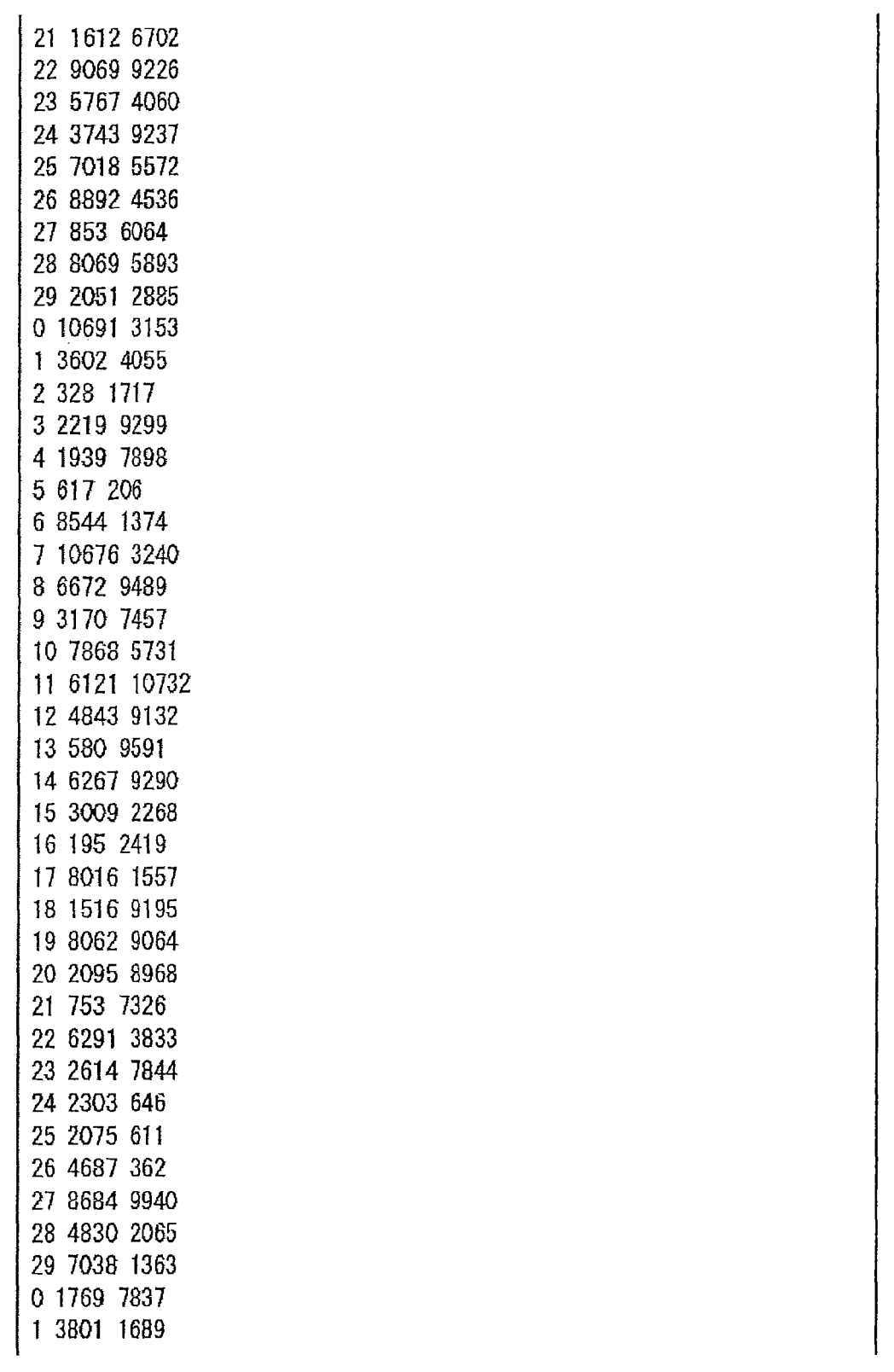
Figure 69:
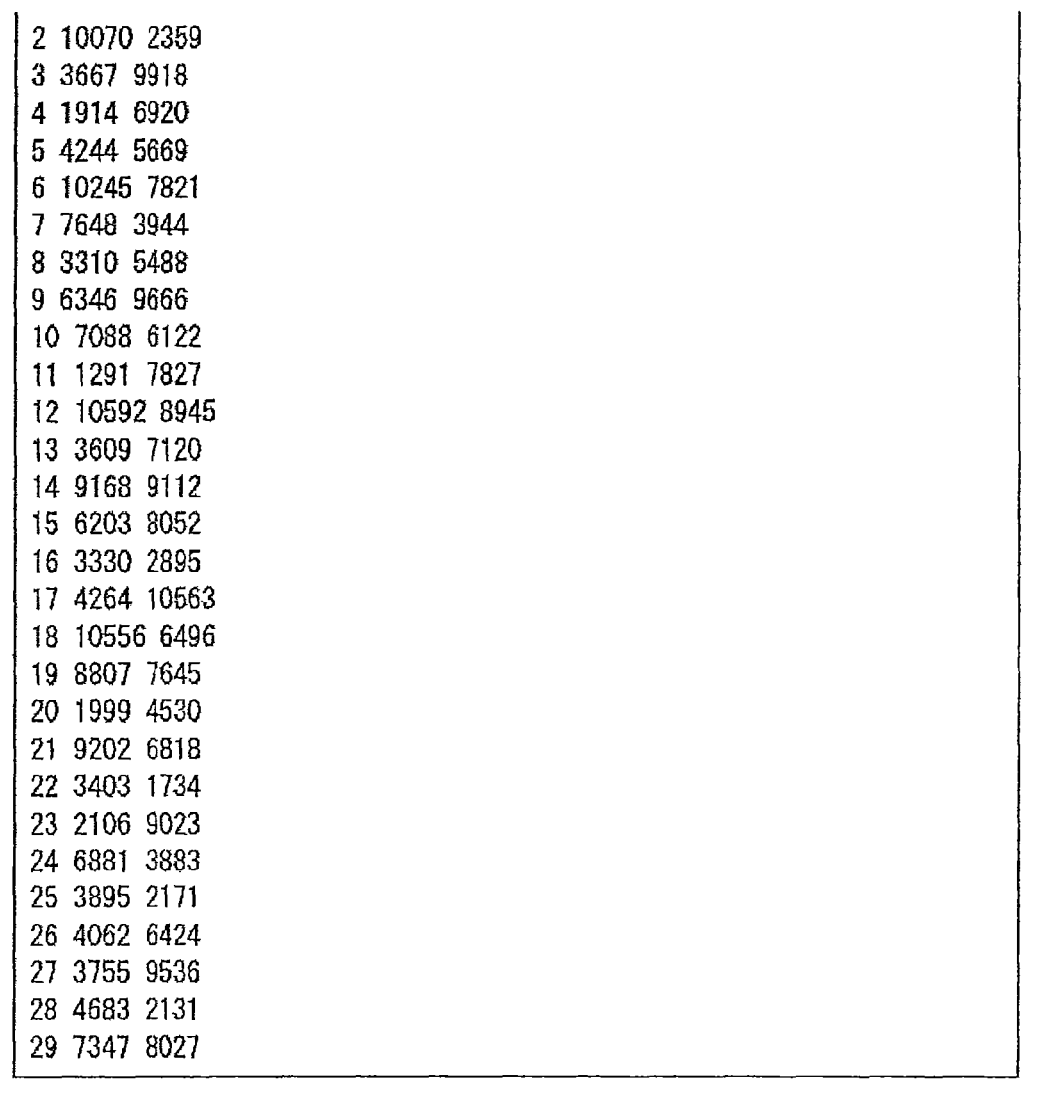

FIG. 67 is a diagram continuous to FIG. 66, FIG. 68 is a diagram continuous to FIG. 67, and FIG. 69 is a diagram continuous to FIG. 68.

FIG. 70 to FIG. 73 each illustrate a parity check matrix initial value table with respect to the parity check matrix H that is defined in the standard of the DVB-T.2 and has the code length N of 64800 bits and the encoding rate r of 8/9.

Figure 70:
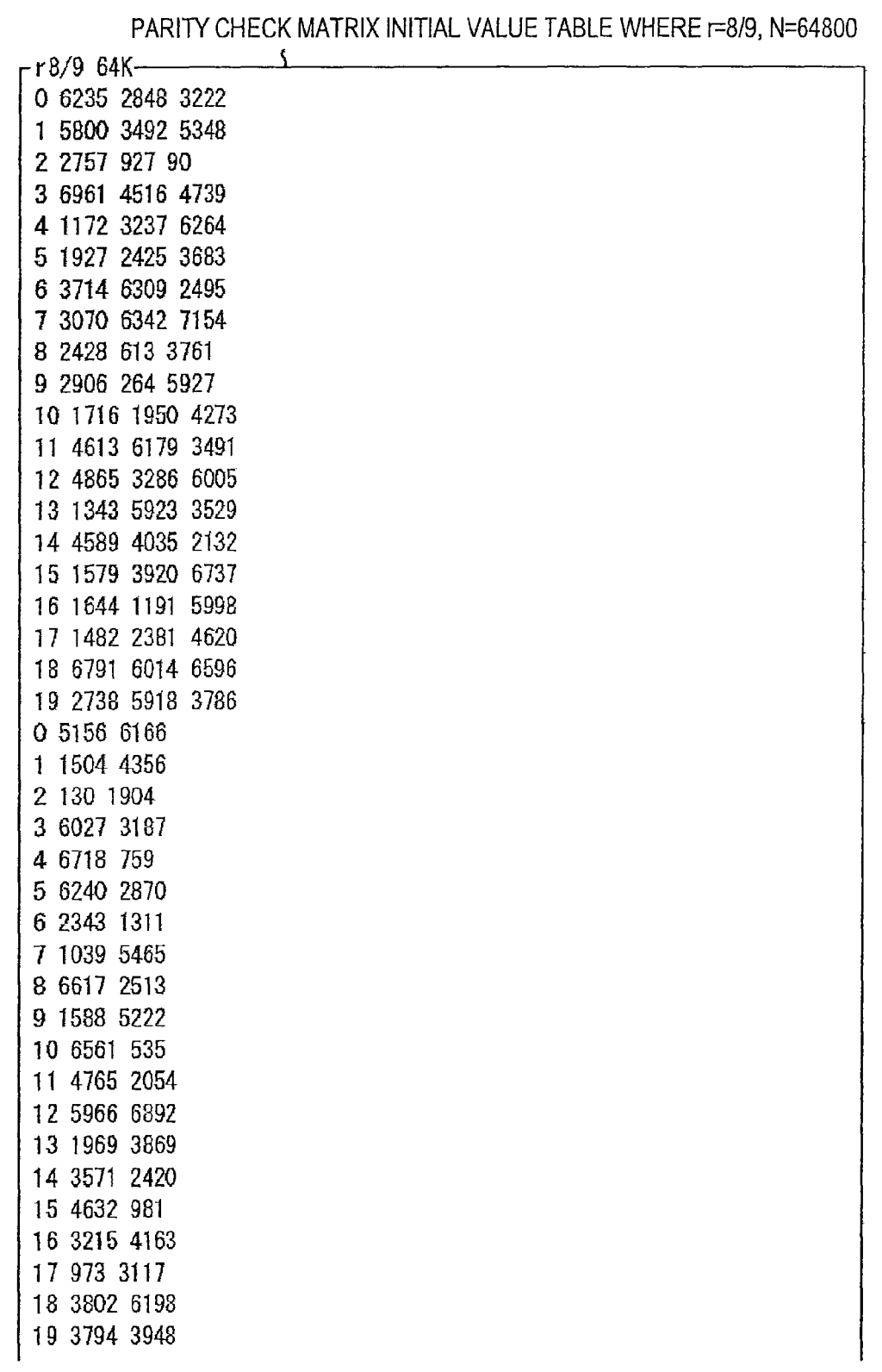
Figure 71:
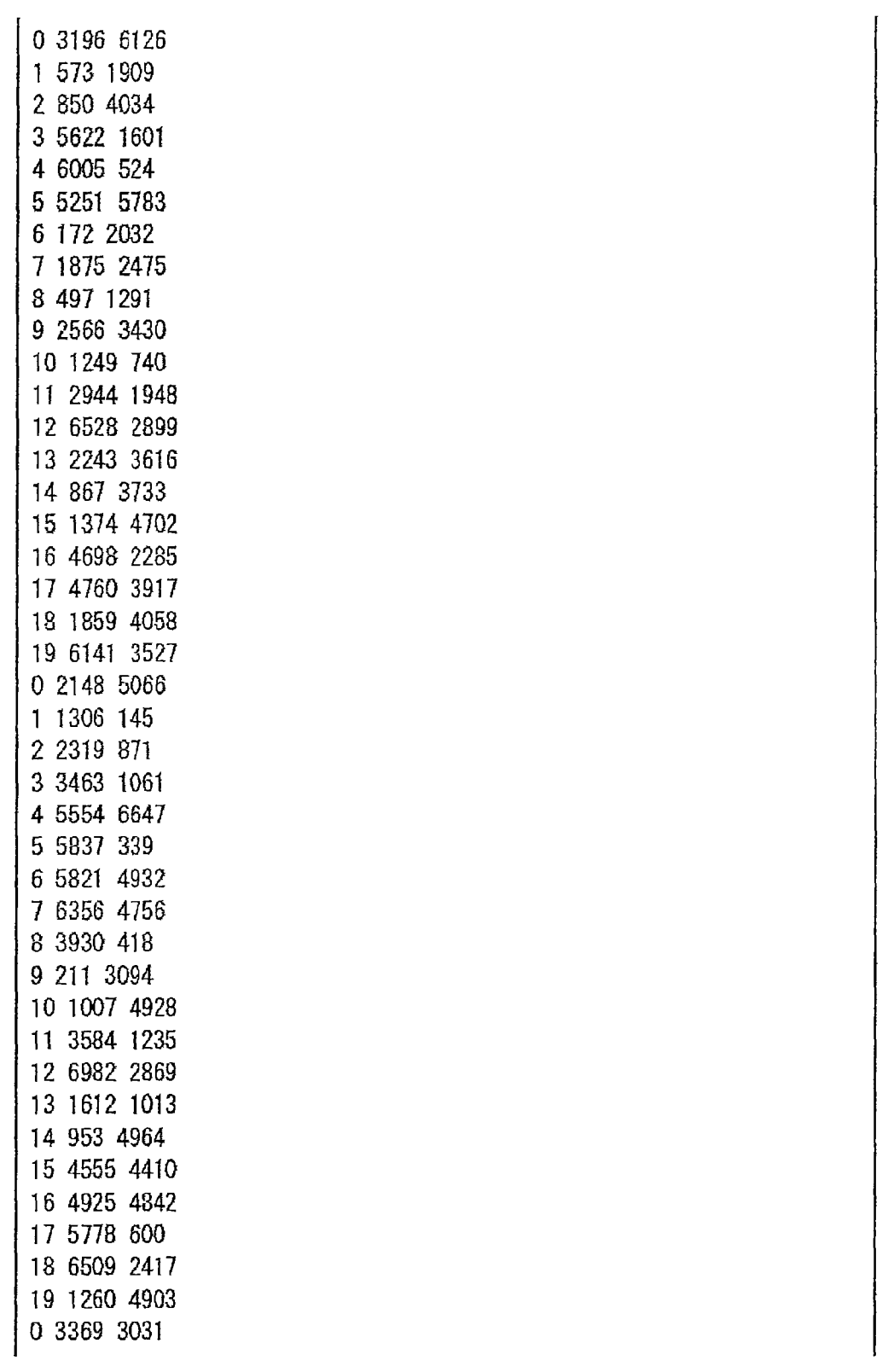
Figure 72:
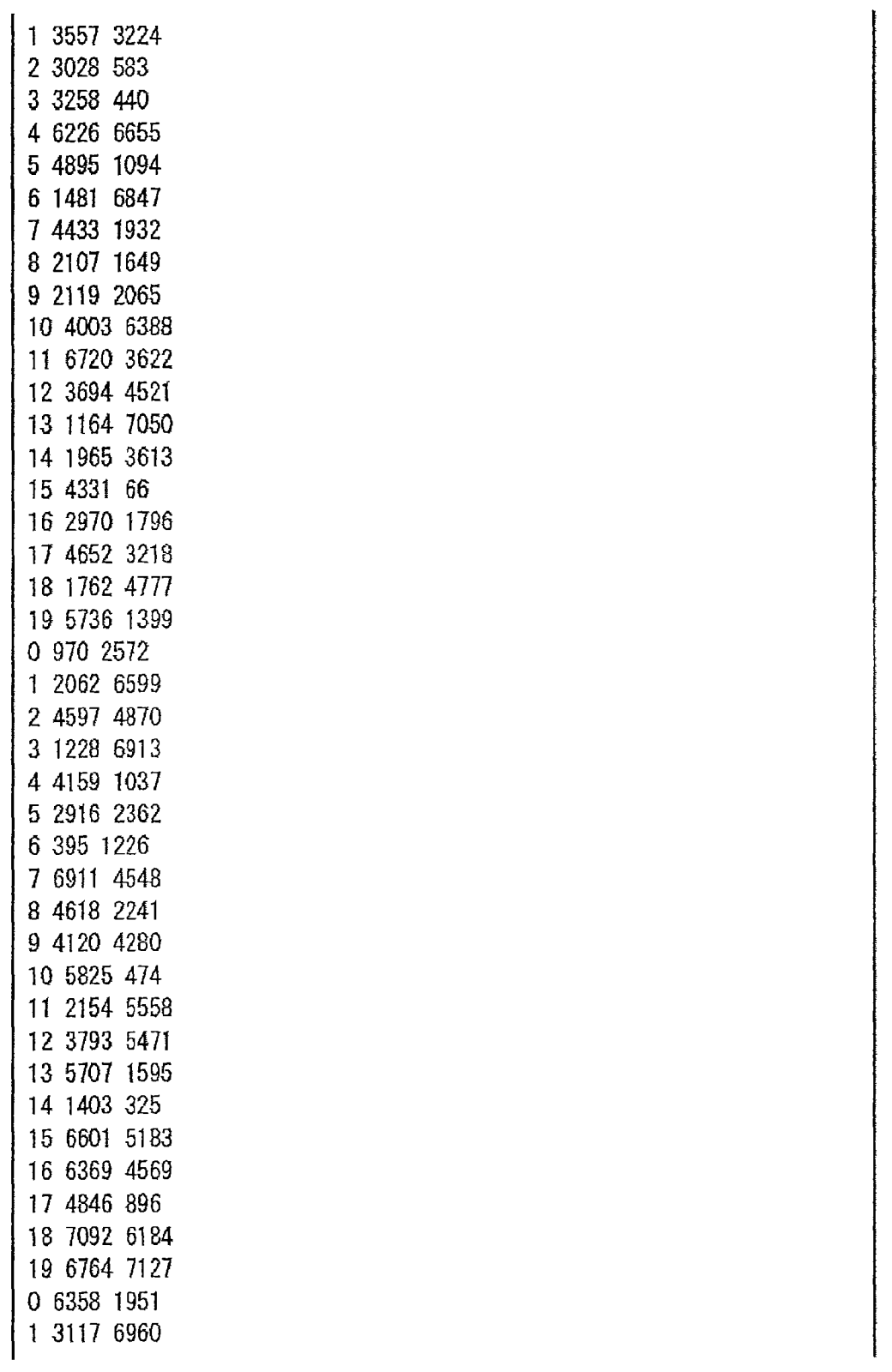
Figure 73:
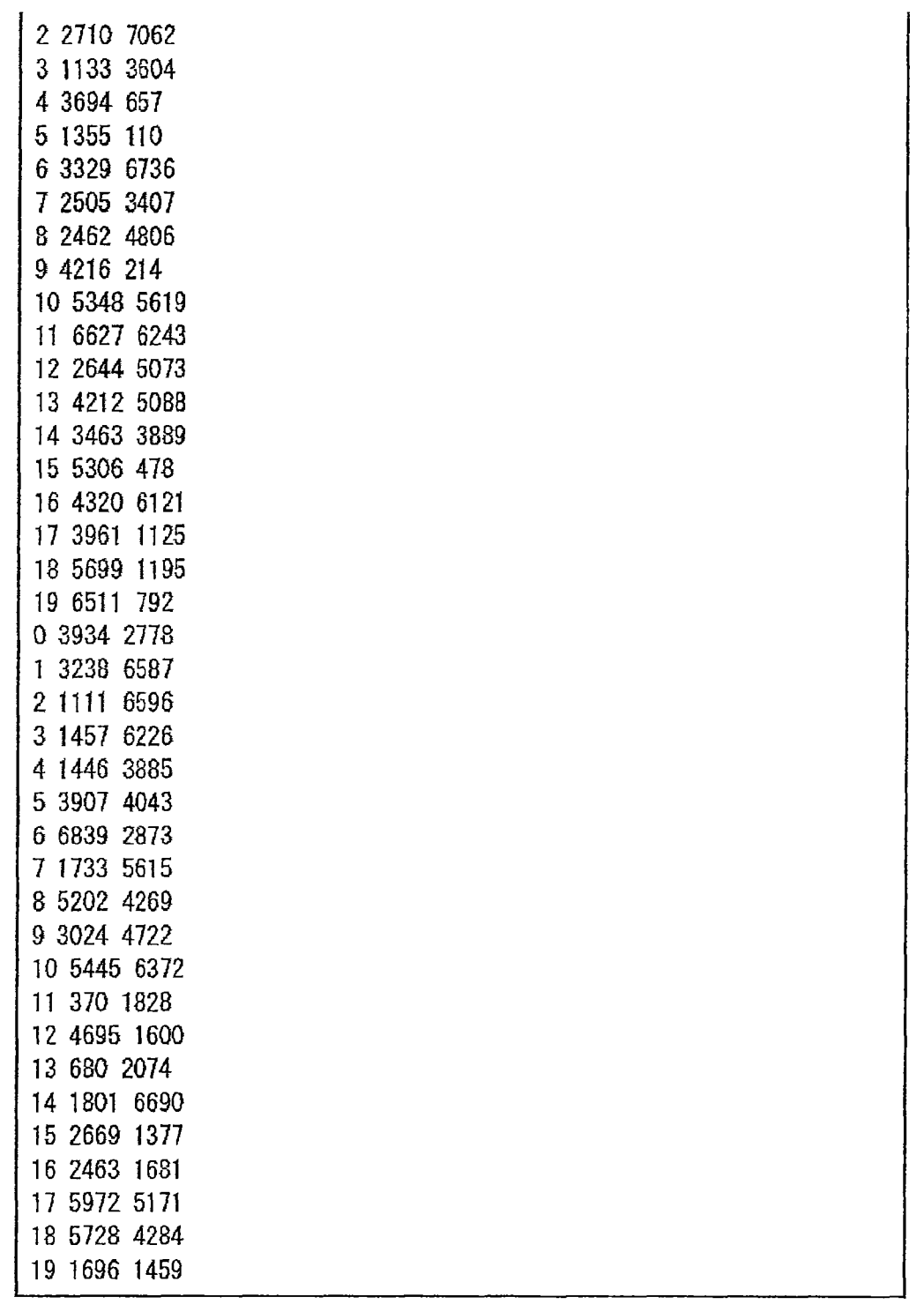

FIG. 71 is a diagram continuous to FIG. 70, FIG. 72 is a diagram continuous to FIG. 71, and FIG. 73 is a diagram continuous to FIG. 72.

FIG. 74 to FIG. 77 each illustrate a parity check matrix initial value table with respect to the parity check matrix H that is defined in the standard of the DVB-T.2 and has the code length N of 64800 bits and the encoding rate r of 9/10.

Figure 74:
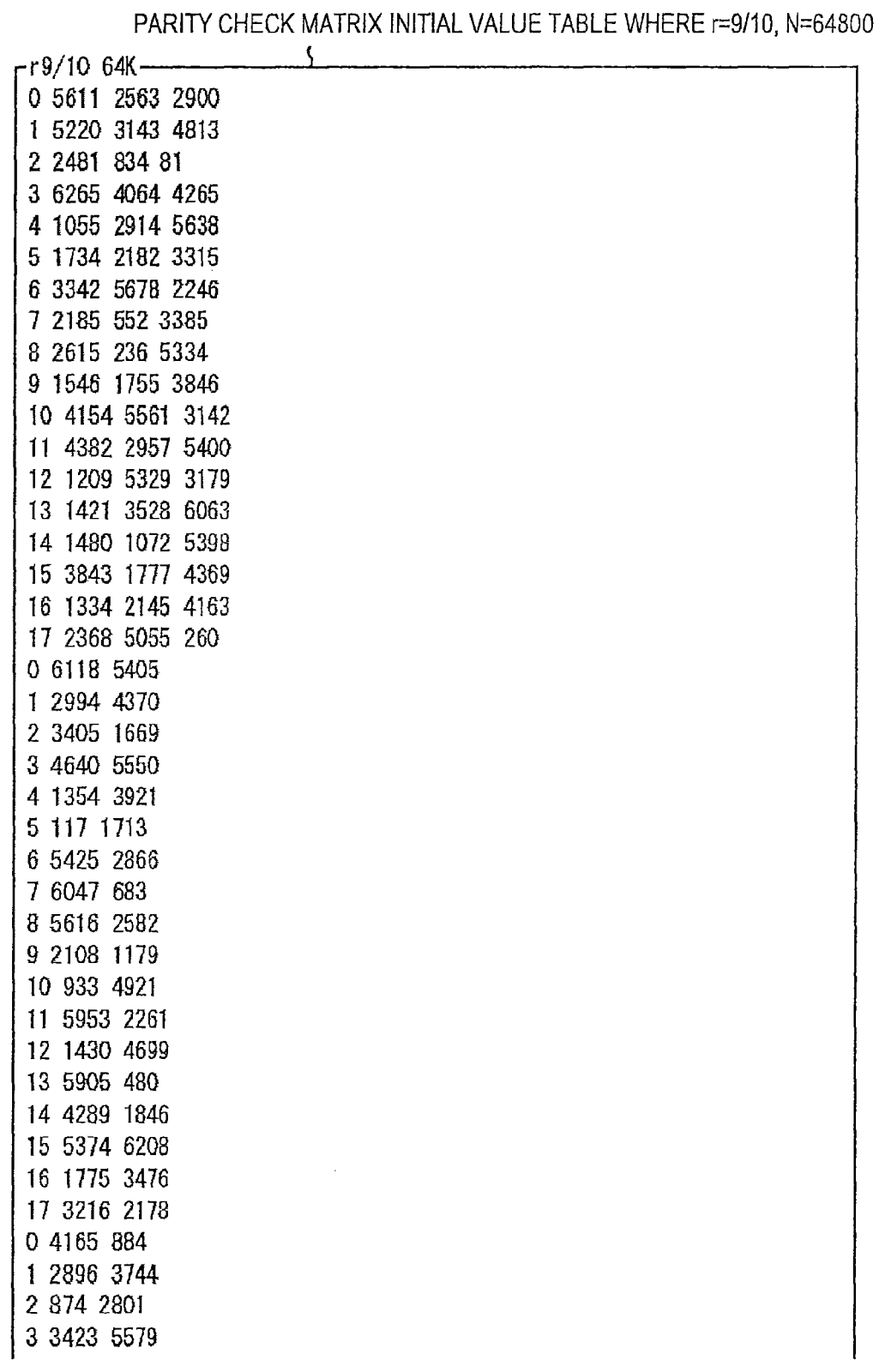
Figure 75:
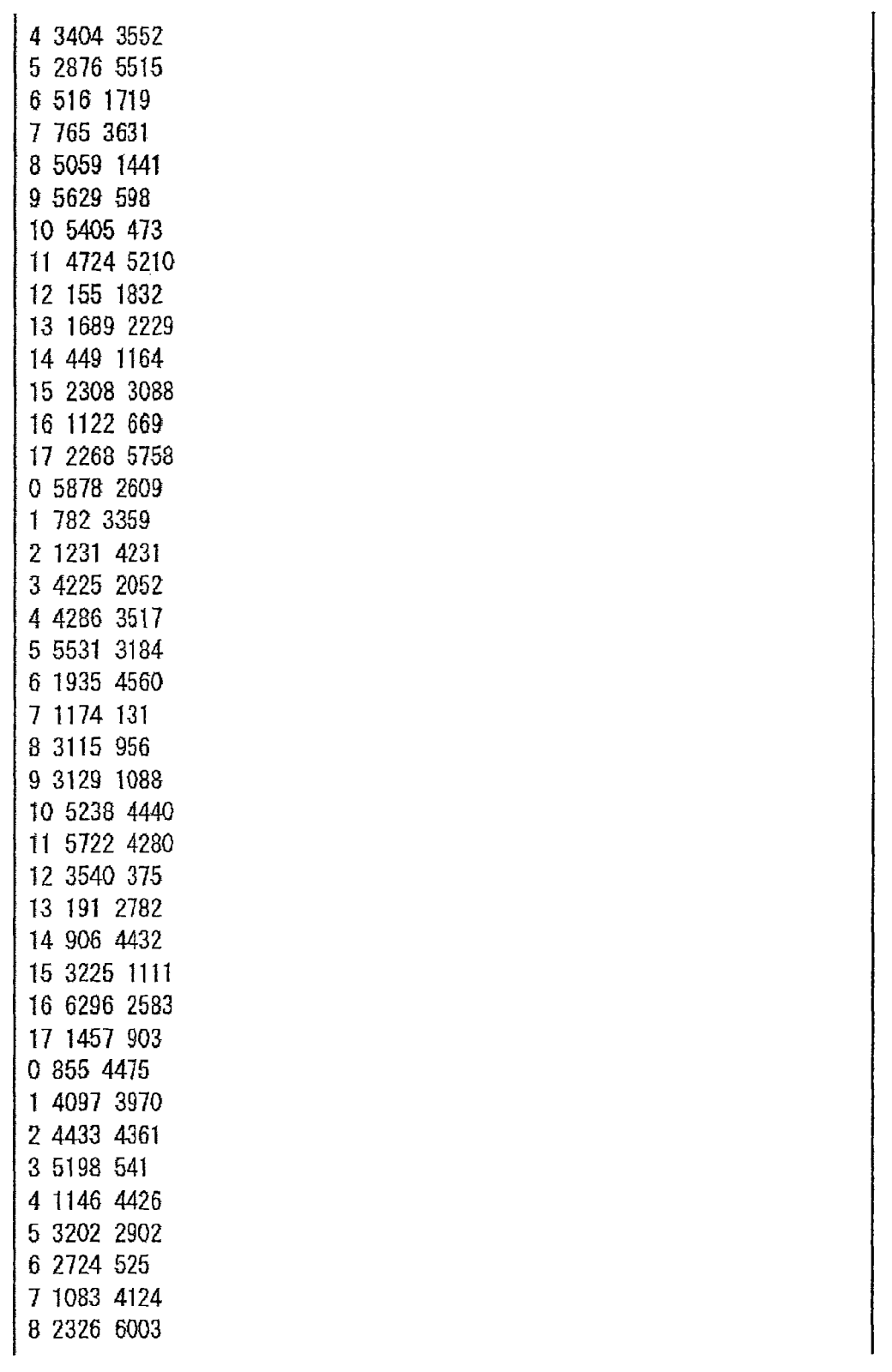
Figure 76:
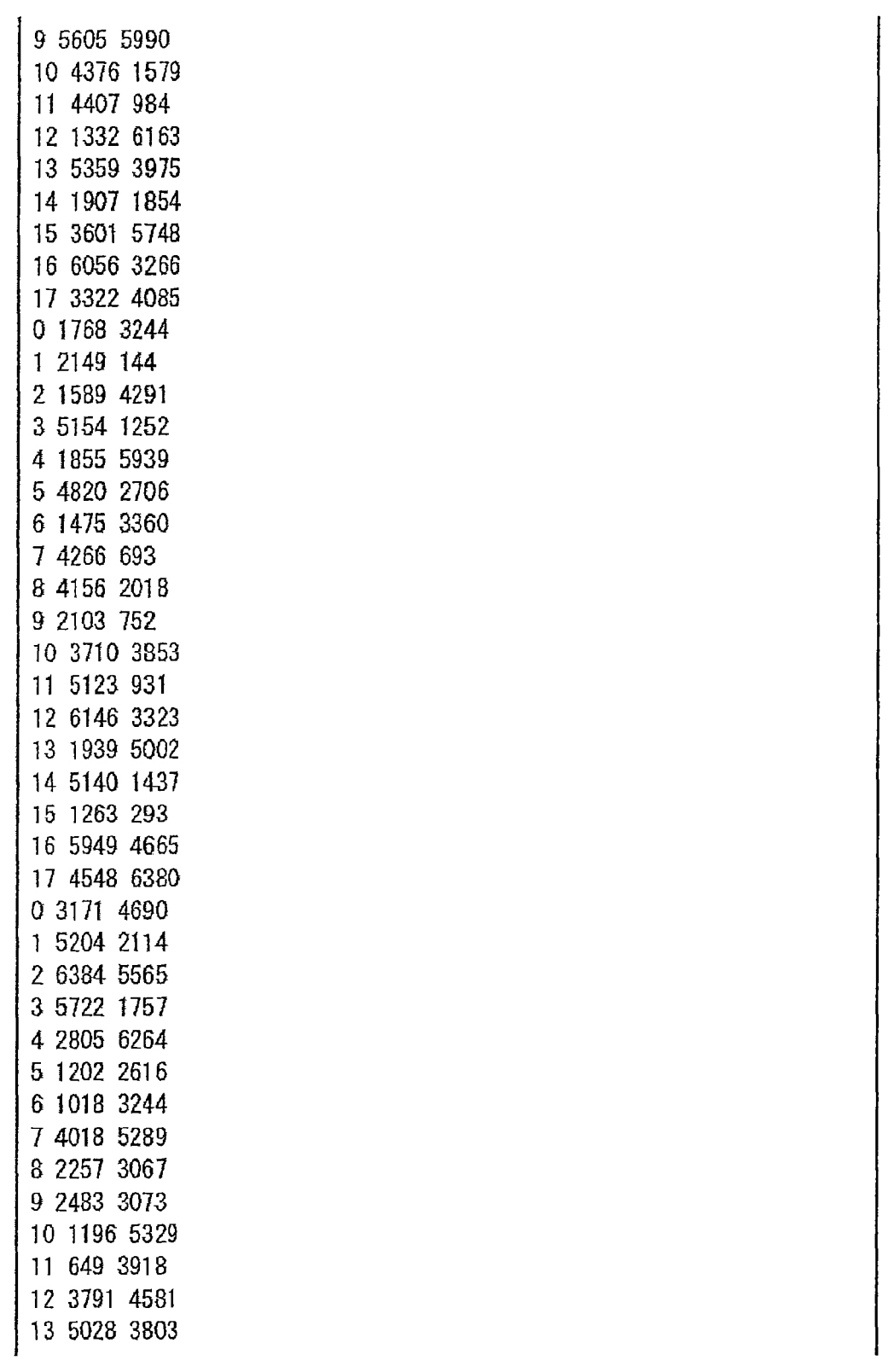
Figure 77:
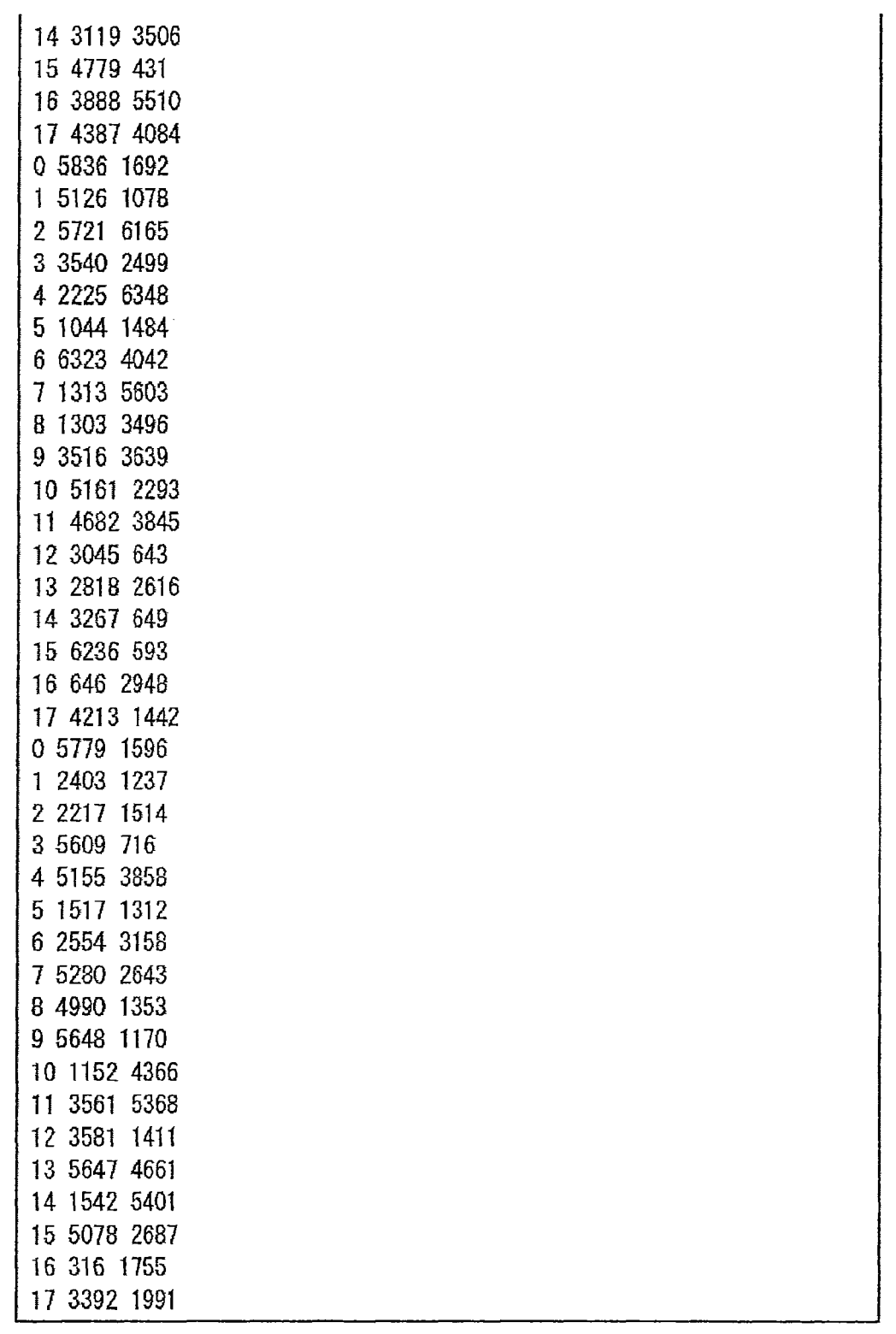

FIG. 75 is a diagram continuous to FIG. 74, FIG. 76 is a diagram continuous to FIG. 75, and FIG. 77 is a diagram continuous to FIG. 76.

The parity check matrix generating unit 613 (FIG. 31) calculates the parity check matrix H using the parity check matrix initial value table, as follows.

That is, FIG. 78 illustrates a method of calculating the parity check matrix H from the parity check matrix initial value table.

Note that the parity check matrix initial value table in FIG. 78 illustrates a parity check matrix initial value table with respect to the parity check matrix H that is defined in the standard of the DVB-T.2 and has the code length N of 16200 bits and the encoding rate r of 2/3, shown in FIG. 38.

As described above, the parity check matrix initial value table is the table that represents the positions of the elements of 1 of the information matrix $H_A$ (FIG. 10) corresponding to the information length K according to the code length N and the encoding rate r of the LDPC code for every 360 columns (column number P of a unit of the cyclic structure). In the i-th row thereof, row numbers (row numbers when a row number of a first row of the parity check matrix H is set to 0) of elements of 1 of a (1+360×(i−1)-th column of the parity check matrix H are arranged by a number of column weights of the (1+360×(i−1)-th column.

In this case, because the parity matrix $H_T$ (FIG. 10) of the parity check matrix H corresponding to the parity length M is determined as illustrated in FIG. 21, according to the parity check matrix initial value table, the information matrix $H_A$ (FIG. 10) of the parity check matrix H corresponding to the information length K is calculated.

A row number k+1 of the parity check matrix initial value table is different according to the information length K.

A relation of an expression (9) is realized between the information length K and the row number k+1 of the parity check matrix initial value table.

$$K=(k+1)\times 360 \qquad (9)$$

In this case, 360 of the expression (9) is the column umber P of the unit of the cyclic structure described in FIG. 22.

In the parity check matrix initial value table of FIG. 78, 13 numerical values are arranged from the first row to the third row and 3 numerical values are arranged from the fourth row to the (k+1)-th row (in FIG. 78, the 30th row).

Therefore, the column weights of the parity check matrix H that are calculated from the parity check matrix initial value table of FIG. 78 are 13 from the first column to the (1+360×(3−1)−1)-th column and are 3 from the (1+360×(3−1))-th column to the K-th column.

The first row of the parity check matrix initial value table of FIG. 78 becomes 0, 2084, 1613, 1548, 1286, 1460, 3196, 4297, 2481, 3369, 3451, 4620, and 2622, which shows that elements of rows having row numbers of 0, 2084, 1613, 1548, 1286, 1460, 3196, 4297, 2481, 3369, 3451, 4620, and 2622 are 1 (and the other elements are 0), in the first column of the parity check matrix H.

The second row of the parity check matrix initial value table of FIG. 78 becomes 1, 122, 1516, 3448, 2880, 1407, 1847, 3799, 3529, 373, 971, 4358, and 3108, which shows that elements of rows having row numbers of 1, 122, 1516, 3448, 2880, 1407, 1847, 3799, 3529, 373, 971, 4358, and 3108 are 1, in the 361 (=1+360×(2−1))-th column of the parity check matrix H.

As described above, the parity check matrix initial value table represents positions of elements of 1 of the information matrix $H_A$ of the parity check matrix H for every 360 columns.

The columns other than the (1+360×(i−1))-th column of the parity check matrix H, that is, the individual columns from the (2+360×(i−1))-th column to the (360×i)-th column are arranged by cyclically shifting elements of 1 of the (1+360×(i−1))-th column determined by the parity check matrix initial value table periodically in a downward direction (downward direction of the columns) according to the parity length M.

That is, the (2+360×(i−1))-th column is obtained by cyclically shifting (1+360×(i−1))-th column in the downward direction by M/360 (=q) and the next (3+360×(i−1))-th column is obtained by cyclically shifting (1+360×(i−1))-th column in the downward direction by 2×M/360 (=2×q) (obtained by cyclically shifting (2+360×(i−1))-th column in the downward direction by M/360 (=q)).

If a numerical value of a j-th column (j-th column from the left side) of an i-th row (i-th row from the upper side) of the parity check matrix initial value table is represented as $h_{i,j}$ and a row number of the j-th element of 1 of the w-th column of the parity check matrix H is represented as $h_{w-j}$, the row number $H_{w-j}$ of the element of 1 of the w-th column to be a column other than the (1+360×(i−1))-th column of the parity check matrix H can be calculated by an expression (10).

$$H_{w-j}=\mathrm{mod}\{h_{i,j}+\mathrm{mod}((w-1),P)\times q, M\} \qquad (10)$$

In this case, mod(x, y) means a remainder that is obtained by dividing x by y.

In addition, P is a column number of a unit of the cyclic structure described above. For example, in the standard of the DVB-T.2, P is 360 as described above. In addition, q is a value M/360 that is obtained by dividing the parity length M by the column number P (=360) of the unit of the cyclic structure.

The parity check matrix generating unit 613 (FIG. 31) specifies the row numbers of the elements of 1 of the (1+360×(i−1))-th column of the parity check matrix H by the parity check matrix initial value table.

The parity check matrix generating unit 613 (FIG. 31) calculates the row number $H_{w-j}$ of the element of 1 of the w-th column to be the column other than the (1+360×(i−1))-th column of the parity check matrix H, according to the expression (10), and generates the parity check matrix H in which the element of the obtained row number is set to 1.

Meanwhile, if the digital broadcasting exclusively used for the portable terminal can be performed with the minimum change of the specifications of the transmitting device and the receiving device based on the DVB-T.2 to be the standard of the digital broadcasting exclusively used for the fixed terminal, the digital broadcasting is advantageous in terms of a cost.

Therefore, in the transmitting device 11 (FIG. 7), the LDPC code of 16 kbits to be the short code length N in the code length N of 64 kbits and the code length N of 16 kbits that can decrease the memory or the delay necessary when the LDPC code of the DVB-T.2 is decoded is adopted and the digital broadcasting exclusively used for the portable terminal can be performed.

However, in the digital broadcasting exclusively used for the portable terminal, in order to alleviate load necessary for the processing such as the decoding of the LDPC code in the receiving device 12 (FIG. 7) to be the portable terminal, for example, the repetition number of times (repetition decoding number of times C) of decoding of the LDPC code may be restricted, and tolerance against the error in the communication path 13 (FIG. 7) may be lowered.

Therefore, in the digital broadcasting exclusively used for the portable terminal, it is preferable to take a measure to improve the tolerance against the error.

As the measure to improve the tolerance against the error, for example, there is a method adopting the modulation method such as the 16 QAM or the 64 QAM in which the number of signal points is relatively small.

As the measure to improve the tolerance against the error, for example, there is the interchange processing executed by the demultiplexer 25 (FIG. 9).

In the interchange processing, as an interchange method of interchanging the code bits of the LDPC code, for example, there are the first to fourth interchange methods or the interchange method defined by the DVB-T.2. However, in the digital broadcasting exclusively used for the portable terminal, it is preferable to adopt interchange processing of a method of improving the tolerance against the error more than the previously suggested interchange methods.

Therefore, in the demultiplexer 25 (FIG. 9), the interchange processing can be executed according to the allocation rule, as described in FIG. 27.

Before describing the interchange processing according to the allocation rule, the interchange processing using the previously suggested interchange methods (hereinafter, referred to as a current method) will be described.

The interchange processing when the interchange processing using the current method is executed by the demultiplexer 25 will be described with reference to FIGS. 79 and 80.

Figure 79:
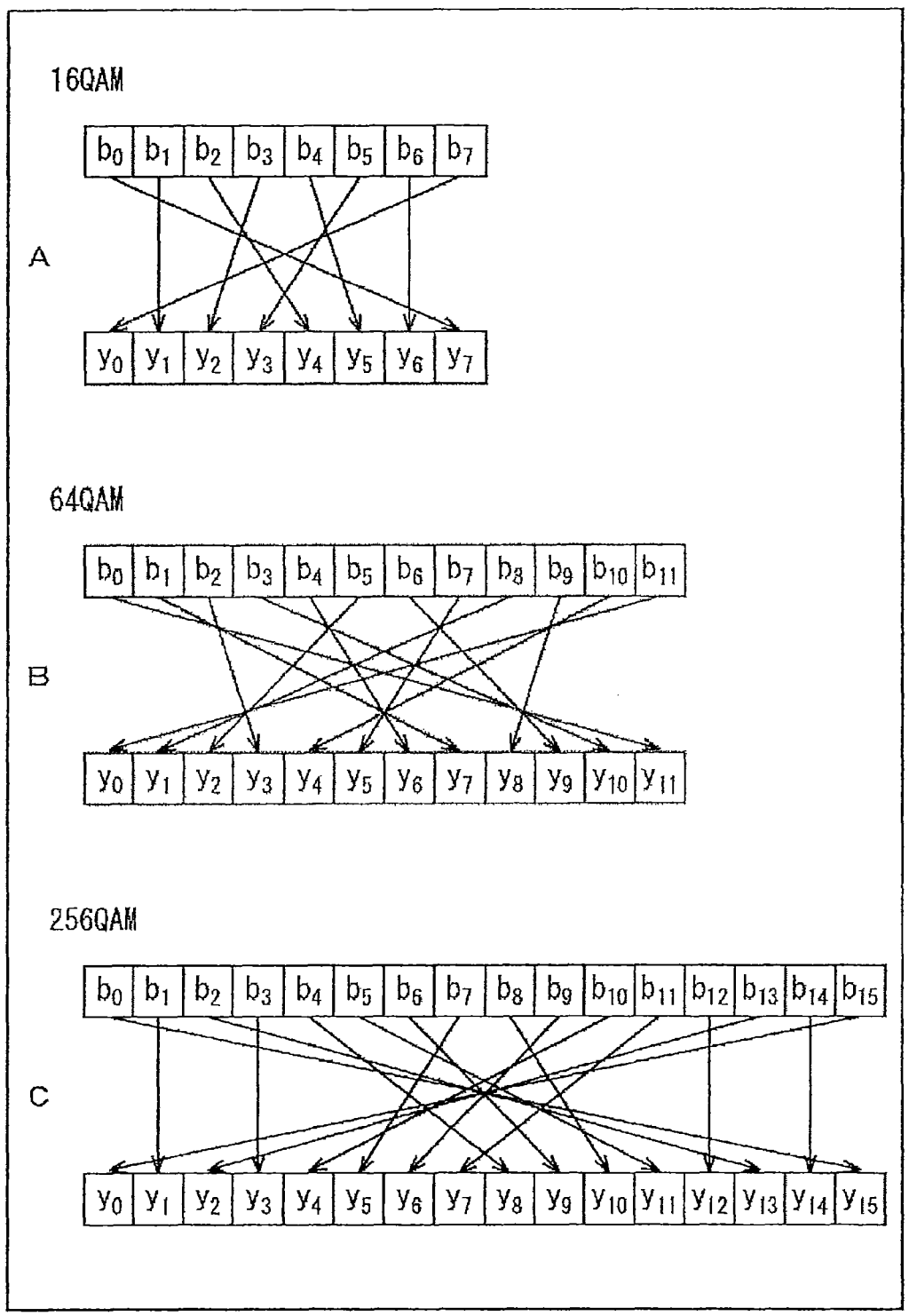
FIG. 79 is an illustration of interchange processing according to a current method.

FIG. 79 illustrates an example of the interchange processing of the current method, when the LDPC code is an LDPC code in which the code length N is 64800 bits and the encoding rate is 3/5.

That is, A of FIG. 79 illustrates an example of the interchange processing of the current method, when the LDPC code is an LDPC code in which the code length N is 64800 bits and the encoding rate is 3/5, the modulation method is the 16 QAM, and the multiple b is 2.

When the modulation method is the 16 QAM, 4 (=m) bits of the code bits are mapped as one symbol to any one of 16 signal points determined by the 16 QAM.

When the code length N is 64800 bits and the multiple b is 2, the memory 31 (FIGS. 18 and 19) of the demultiplexer 25 has 8 columns to store 4×2 (=mb) bits in the row direction and stores 64800/(4×2) bits in the column direction.

In the demultiplexer 25, if the code bits of the LDPC code are written in the column direction of the memory 31 and writing of the code bits (one code word) of 64800 bits ends, the code bits written to the memory 31 are read in a unit of 4×2 (=mb) bits in the row direction and are supplied to the interchanging unit 32 (FIGS. 18 and 19).

The interchanging unit 32 interchanges the code bits $b_0$ to $b_7$ of the 4×2 (=mb) bits, such that the code bits $b_0$, $b_1$, $b_2$, $b_3$, $b_4$, $b_5$, $b_6$, and $b_7$ of the 4×2 (=mb) bits read from the memory 31 are allocated to symbol bits $y_0$, $y_1$, $y_2$, $y_3$, $y_4$, $y_5$, $y_6$, and $y_7$ of 4×2 (=mb) bits of two (=b) consecutive symbols, as illustrated by A of FIG. 79.

That is, the interchanging unit 32 performs interchanging to allocate the code bits $b_0$, $b_1$, $b_2$, $b_3$, $b_5$, $b_6$, and $b_7$ to the symbol bits $y_7$, $y_1$, $y_4$, $y_2$, $y_5$, $y_3$, $y_6$, and $y_0$, respectively.

B of FIG. 79 illustrates an example of the interchange processing of the current method, when the LDPC code is an LDPC code in which the code length N is 64800 bits and the encoding rate is 3/5, the modulation method is the 64 QAM, and the multiple b is 2.

When the modulation method is the 64 QAM, 6 (=m) bits of the code bits are mapped as one symbol to any one of 64 signal points determined by the 64 QAM.

When the code length N is 64800 bits and the multiple b is 2, the memory 31 (FIGS. 18 and 19) of the demultiplexer 25 has 12 columns to store 6×2 (=mb) bits in the row direction and stores 64800/(6×2) bits in the column direction.

In the demultiplexer 25, if the code bits of the LDPC code are written in the column direction of the memory 31 and writing of the code bits (one code word) of 64800 bits ends, the code bits written to the memory 31 are read in a unit of 6×2 (=mb) bits in the row direction and are supplied to the interchanging unit 32 (FIGS. 18 and 19).

The interchanging unit 32 interchanges the code bits $b_0$ to $b_{11}$ of the 6×2 (=mb) bits, such that the code bits $b_0$, $b_1$, $b_2$, $b_3$, $b_4$, $b_5$, $b_6$, $b_7$, $b_8$, $b_9$, $b_{10}$, and $b_{11}$ of the 6×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of two (=b) consecutive symbols, as illustrated by B of FIG. 79.

That is, the interchanging unit 32 performs interchanging to allocate the code bits $b_0$, $b_1$, $b_2$, $b_3$, $b_4$, $b_5$, $b_6$, $b_7$, $b_8$, $b_9$, $b_{10}$, and $b_{11}$ to the symbol bits $y_{11}$, $y_7$, $y_3$, $y_{10}$, $y_6$, $y_2$, $y_9$, $y_5$, $y_1$, $y_8$, $y_4$, and $y_0$, respectively.

C of FIG. 79 illustrates an example of the interchange processing of the current method, when the LDPC code is an LDPC code in which the code length N is 64800 bits and the encoding rate is 3/5, the modulation method is the 256 QAM, and the multiple b is 2.

When the modulation method is the 256 QAM, 8 (=m) bits of the code bits are mapped as one symbol to any one of 256 signal points determined by the 256 QAM.

When the code length N is 64800 bits and the multiple b is 2, the memory 31 (FIGS. 18 and 19) of the demultiplexer 25 has 16 columns to store 8×2 (=mb) bits in the row direction and stores 64800/(8×2) bits in the column direction.

In the demultiplexer 25, if the code bits of the LDPC code are written in the column direction of the memory 31 and writing of the code bits (one code word) of 64800 bits ends, the code bits written to the memory 31 are read in a unit of 8×2 (=mb) bits in the row direction and are supplied to the interchanging unit 32 (FIGS. 18 and 19).

The interchanging unit 32 interchanges the code bits $b_0$ to $b_{15}$ of the 8×2 (=mb) bits, such that the code bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ of the 8×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 8×2 (=mb) bits of two (=b) consecutive symbols, as illustrated by C of FIG. 79.

That is, the interchanging unit 32 performs interchanging to allocate the code bits $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ to the symbol bits $y_{15}$, $y_1$, $y_{13}$, $y_3$, $y_8$, $y_{11}$, $y_9$, $y_5$, $y_{10}$, $y_6$, $y_4$, $y_7$, $y_{12}$, $y_2$, $y_{14}$, and $y_0$, respectively.

Figure 80:
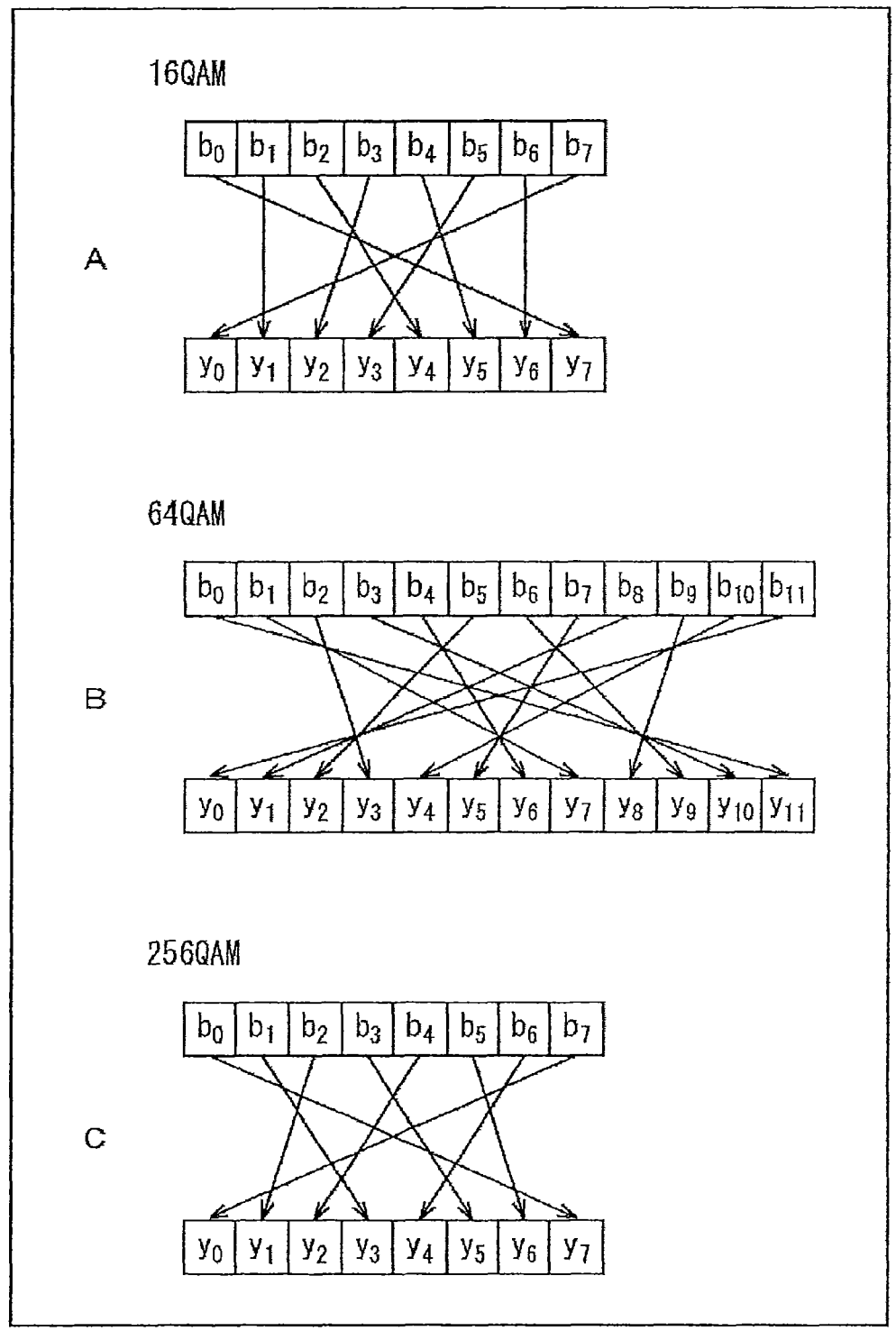
FIG. 80 is an illustration of interchange processing according to a current method.

FIG. 80 illustrates an example of the interchange processing of the current method, when the LDPC code is an LDPC code in which the code length N is 16200 bits and the encoding rate is 3/5.

That is, A of FIG. 80 illustrates an example of the interchange processing of the current method, when the LDPC code is an LDPC code in which the code length N is 16200 bits and the encoding rate is 3/5, the modulation method is the 16 QAM, and the multiple b is 2.

When the modulation method is the 16 QAM, 4 (=m) bits of the code bits are mapped as one symbol to any one of 16 signal points determined by the 16 QAM.

When the code length N is 16200 bits and the multiple b is 2, the memory 31 (FIGS. 18 and 19) of the demultiplexer 25 has 8 columns to store 4×2 (=mb) bits in the row direction and stores 16200/(4×2) bits in the column direction.

In the demultiplexer 25, if the code bits of the LDPC code are written in the column direction of the memory 31 and writing of the code bits (one code word) of 16200 bits ends, the code bits written to the memory 31 are read in a unit of 4×2 (=mb) bits in the row direction and are supplied to the interchanging unit 32 (FIGS. 18 and 19).

The interchanging unit 32 interchanges the code bits $b_0$ to $b_7$ of the 4×2 (=mb) bits, such that the code bits $b_0$, $b_1$, $b_2$, $b_3$, $b_4$, $b_5$, $b_6$, and $b_7$ of the 4×2 (=mb) bits read from the memory 31 are allocated to symbol bits $y_0$, $y_1$, $y_2$, $y_3$, $y_4$, $y_5$, $y_6$, and $y_7$ of 4×2 (=mb) bits of two (=b) consecutive symbols, as illustrated by A of FIG. 80.

That is, the interchanging unit 32 performs interchanging to allocate the code bits $b_0$, $b_1$, $b_2$, $b_3$, $b_4$, $b_5$, $b_6$, and $b_7$ to the symbol bits $y_0$, $y_1$, $y_2$, $y_3$, $y_4$, $y_5$, $y_6$, and $y_7$, similar to the case of A of FIG. 79 described above.

B of FIG. 80 illustrates an example of the interchange processing of the current method, when the LDPC code is an LDPC code in which the code length N is 16200 bits and the encoding rate is 3/5, the modulation method is the 64 QAM, and the multiple b is 2.

When the modulation method is the 64 QAM, 6 (=m) bits of the code bits are mapped as one symbol to any one of 64 signal points determined by the 64 QAM.

When the code length N is 16200 bits and the multiple b is 2, the memory 31 (FIGS. 18 and 19) of the demultiplexer 25 has 12 columns to store 6×2 (=mb) bits in the row direction and stores 16200/(6×2) bits in the column direction.

In the demultiplexer 25, if the code bits of the LDPC code are written in the column direction of the memory 31 and writing of the code bits (one code word) of 16200 bits ends, the code bits written to the memory 31 are read in a unit of 6×2 (=mb) bits in the row direction and are supplied to the interchanging unit 32 (FIGS. 18 and 19).

The interchanging unit 32 interchanges the code bits $b_0$ to $b_{11}$ of the 6×2 (=mb) bits, such that the code bits $b_0$, $b_1$, $b_2$, $b_3$, $b_4$, $b_5$, $b_6$, $b_7$, $b_8$, $b_9$, $b_{10}$, and $b_{11}$ of the 6×2 (=mb) bits read from the memory 31 are allocated to symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of two (=b) consecutive symbols, as illustrated by B of FIG. 80.

That is, the interchanging unit 32 performs interchanging to allocate the code bits $b_0$ to $b_{11}$ to the symbol bits $y_0$ to $y_{11}$, as in the above-described case of B of FIG. 79.

C of FIG. 80 illustrates an example of the interchange processing of the current method, when the LDPC code is an LDPC code in which the code length N is 16200 bits and the encoding rate is 3/5, the modulation method is the 256 QAM, and the multiple b is 1.

When the modulation method is the 256 QAM, 8 (=m) bits of the code bits are mapped as one symbol to any one of 256 signal points determined by the 256 QAM.

When the code length N is 16200 bits and the multiple b is 1, the memory 31 (FIGS. 18 and 19) of the demultiplexer 25 has 8 columns to store 8×1 (=mb) bits in the row direction and stores 16200/(8×1) bits in the column direction.

In the demultiplexer 25, if the code bits of the LDPC code are written in the column direction of the memory 31 and writing of the code bits (one code word) of 16200 bits ends, the code bits written to the memory 31 are read in a unit of 8×1 (=mb) bits in the row direction and are supplied to the interchanging unit 32 (FIGS. 18 and 19).

The interchanging unit 32 interchanges the code bits $b_0$, to $b_7$ of the 8×1 (=mb) bits, such that the code bits $b_0$, $b_1$, $b_2$, $b_3$, $b_4$, $b_5$, $b_6$, and $b_7$ of the 8×1 (=mb) bits read from the memory 31 are allocated to symbol bits $y_0$, $y_1$, $y_2$, $y_3$, $y_4$, $y_5$, $y_6$, and $y_7$ of 8×1 (=mb) bits of two (=b) consecutive symbols, as illustrated by C of FIG. 80.

That is, the interchanging unit 32 performs interchanging to allocate the code bits $b_0$, $b_1$, $b_2$, $b_3$, $b_4$, $b_5$, $b_6$, and $b_7$ to the symbol bits $y_7$, $y_3$, $y_1$, $y_5$, $y_2$, $y_6$, $y_4$, and $y_0$, respectively.

Next, the interchange processing (hereinafter, referred to as interchange processing in a new interchange method) according to the allocation rule will be described.

In the digital broadcasting exclusively used for the portable terminal, because it is preferable to adopt the modulation method such as the 16 QAM or the 64 QAM having the small signal points, the new interchange method will be described with respect to each of when the modulation method is the 16 QAM and when the modulation method is 64 QAM.

Figure 81:
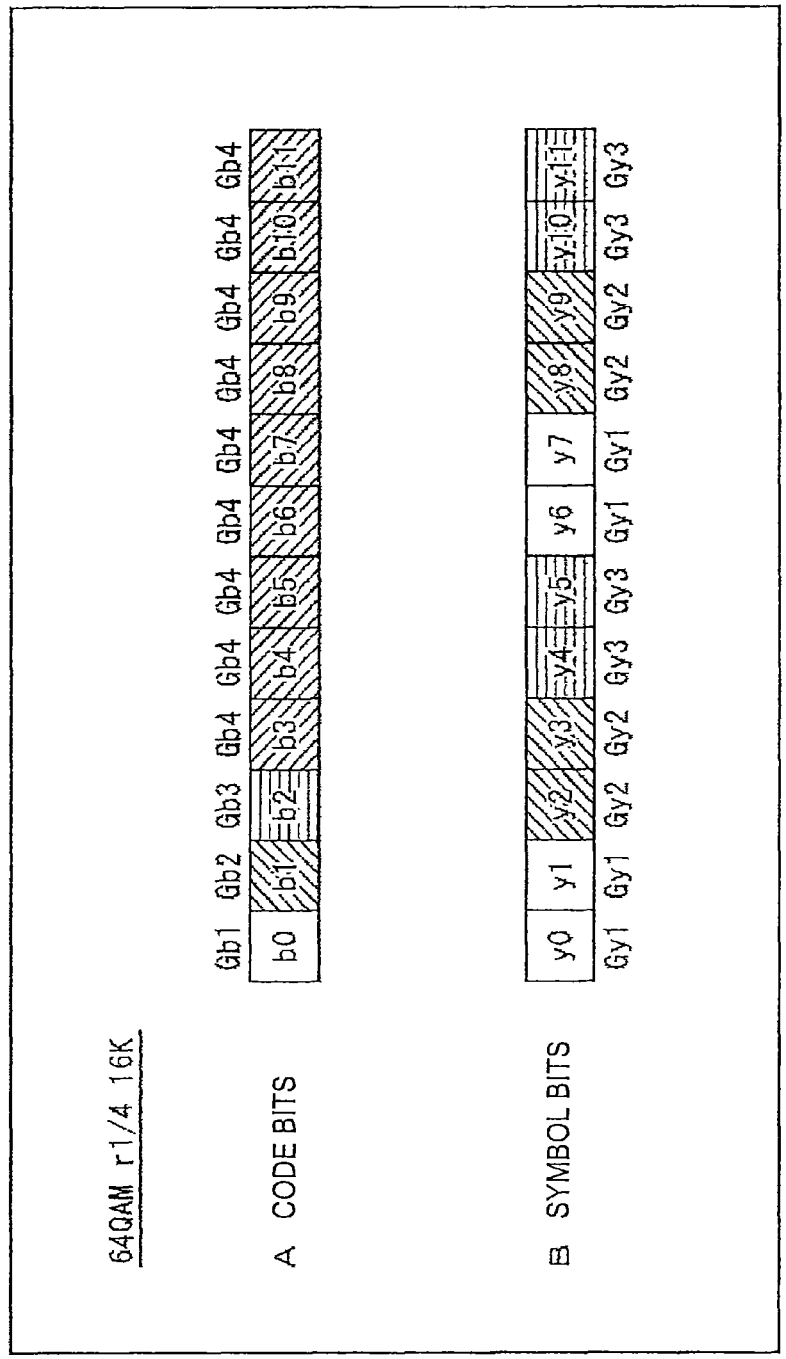
FIG. 81 is an illustration of a code bit group and a symbol bit group when an LDPC code having a code length of 16 k and an encoding rate of 1/4 is modulated by 64 QAM and a multiple b is 2.
Figure 82:
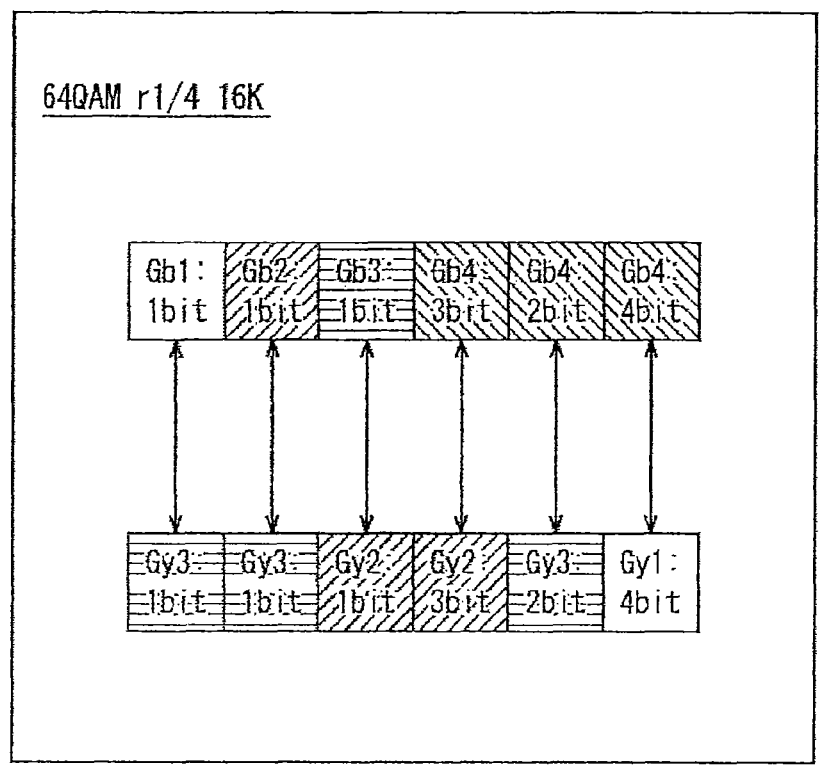
FIG. 82 is an illustration of an allocation rule when an LDPC code having a code length of 16 k and an encoding rate of 1/4 is modulated by 64 QAM and a multiple b is 2.
Figure 83:
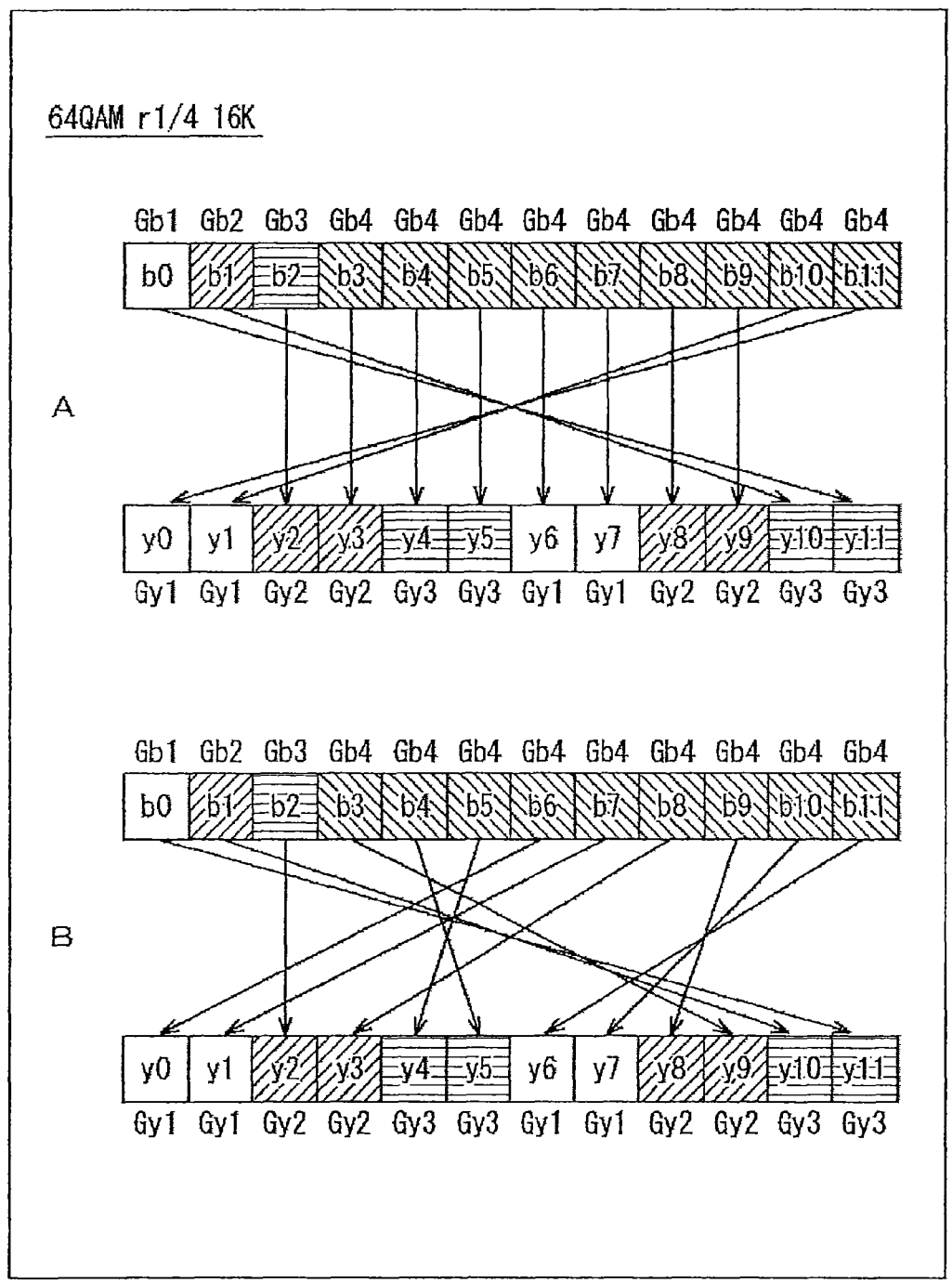
FIG. 83 is an illustration of interchange of code bits according to an allocation rule when an LDPC code having a code length of 16 k and an encoding rate of 1/4 is modulated by 64 QAM and a multiple b is 2.

FIGS. 81 to 83 are illustrations of the new interchange methods.

In the new interchange method, the interchanging unit 32 of the demultiplexer 25 performs interchanging of the code bits of the mb bits according to the previously determined allocation method.

The allocation rule is a rule to allocate the code bits of the LDPC code to the symbol bits. In the allocation rule, a group set to be a combination of a code bit group of the code bits and a symbol bit group of symbol bits to allocate the code bits of the code bit group and bit numbers (hereinafter, referred to as group bit numbers) of the code bits and the symbol bits of the code bit group and the symbol bit group of the group set are defined.

In this case, an error probability difference exists in the code bits and an error probability difference exists in the symbol bits, as described above. The code bit group is a group to group the code bits according to the error probability and the symbol bit group is a group to group the symbol bits according to the error probability.

FIG. 81 illustrates the code bit group and the symbol bit group when the LDPC code is an LDPC code in which the code length is 16200 bits and the encoding rate is 1/4, the modulation method is the 64 QAM, and the multiple b is 2.

In this case, the code bits of the 6×2 (=mb) bits that are read from the memory 31 can be grouped into four code bit groups Gb1, Gb2, Gb3, and Gb4, according to the differences of the error probabilities, as illustrated by A of FIG. 81.

In this case, a code bit group Gb#1 is a group in which the error probability of the code bits belonging to the code bit group Gb#1 is superior (small), when a suffix thereof #1 is small.

Hereinafter, a (#i+1)-th bit from a most significant bit of the code bits of the mb bits that are read from the memory 31 in the row direction is represented as a bit b#i and a (#i+1)-th bit from a most significant bit of symbol bits of mb bits of b consecutive symbols is represented as a bit y#i.

In A of FIG. 81, a code bit b0 belongs to the code bit group Gb1, a code bit b1 belongs to the code bit group Gb2, a code bit b2 belongs to the code bit group Gb3, and code bits b3, b4, b5, b6, b7, b8, b9, b10, and b11 belong to the code bit group Gb4.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 81.

In this case, the symbol bit group Gy#1 is a group in which the error probability of the symbol bits belonging to the symbol bit group Gy#1 is superior, when a suffix #1 thereof is small, similar to the code bit group.

In B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

FIG. 82 illustrates an allocation rule when the LDPC code is an LDPC code in which the code length N is 16200 bits and the encoding rate is 1/4, the modulation method is the 64 QAM, and the multiple b is 2.

In the allocation rule of FIG. 82, a combination of the code bit group Gb1 and the symbol bit group Gy3 is defined as one group set. In addition, a group bit number of the group set is defined to one bit.

Hereinafter, the group set and the group bit number are collectively referred to as group set information. For example, a group set of the code bit group Gb1 and the symbol bit group Gy3 and one bit to be the group bit number of the group set are described as group set information (Gb1, Gy3, 1).

In the allocation rule of FIG. 82, in addition to the group set information (Gb1, Gy3, 1), group set information (Gb2, Gy3, 1), (Gb3, Gy2, 1), (Gb4, Gy2, 3), (Gb4, Gy3, 2), and (Gb4, Gy1, 4) are defined.

For example, the group set information (Gb1, Gy3, 1) means that one bit of the code bits belonging to the code bit group Gb1 is allocated to one bit of the symbol bits belonging to the symbol bit group Gy3.

Therefore, in the allocation rule of FIG. 82, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy3 having the third best error probability is defined by the group set information (Gb2, Gy3, 1), allocation of one bit of the code bits of the code bit group Gb3 having the third best error probability to one bit of the symbol bits of the symbol bit group Gy2 having the second best error probability is defined by the group set information (Gb3, Gy2, 1), allocation of three bits of the code bits of the code bit group Gb4 having the fourth best error probability to three bits of the symbol bits of the symbol bit group Gy2 having the second best error probability is defined by the group set information (Gb4, Gy2, 3), allocation of two bits of the code bits of the code bit group Gb4 having the fourth best error probability to two bits of the symbol bits of the symbol bit group Gy3 having the third best error probability is defined by the group set information (Gb4, Gy3, 2), and allocation of four bits of the code bits of the code bit group Gb4 having the fourth best error probability to four bits of the symbol bits of the symbol bit group Gy1 having the best error probability is defined by the group set information (Gb4, Gy1, 4).

As described above, the code bit group is a group to group the code bits according to the error probabilities and the symbol bit group is a group to group the symbol bits according to the error probabilities. Therefore, it can be said that the allocation rule defines combinations of the error probabilities of the code bits and the error probabilities of the symbol bits to allocate the code bits.

As such, the allocation rule that defines the combinations of the error probabilities of the code bits and the error probabilities of the symbol bits to allocate the code bits is determined to improve tolerance against the error (tolerance against the noise), by the simulation measuring a BER.

Even when allocation destinations of code bits of a certain code bit group are changed in the bits of the same symbol bit group, the tolerance against the error is not (mostly) influenced.

Therefore, in order to improve the tolerance against the error, group set information to minimize a BER (Bit Error Rate), that is, a combination (group set) of a code bit group of code bits and a symbol bit group of symbol bits to allocate the code bits of the code bit group and bit numbers (group bit numbers) of the code bits and the symbol bits of the code bit group and the symbol bit group of the group set may be defined as an allocation rule and interchanging of the code bits may be performed such that the code bits are allocated to the symbol bits, according to the allocation rule.

However, it is necessary to previously determine a specific allocation method of allocating a certain code bit to a certain symbol according to the allocation rule, between the transmitting device 11 and the receiving device 12 (FIG. 7).

FIG. 83 illustrates an example of interchanging of the code bits according to the allocation rule of FIG. 82.

That is, A of FIG. 83 illustrates a first example of interchanging of the code bits according to the allocation rule of FIG. 82, when the LDPC code is an LDPC code in which the code length N is 16200 bits and the encoding rate is 1/4, the modulation method is the 64 QAM, and the multiple b is 2.

When the LDPC code is the LDPC code in which the code length N is 16200 bits and the encoding rate is 1/4, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 83, according to the allocation rule of FIG. 82.

That is, the interchanging unit 32 performs interchanging to allocate the code bits b0, b1, b2, b3, b4, b5, b6, b7, b8, b9, b10, and b11 to the symbol bits y11, y10, y2, y3, y4, y5, y6, y7, y8, y9, y1, and y0, respectively.

B of FIG. 83 illustrates a second example of interchanging of the code bits according to the allocation rule of FIG. 82, when the LDPC code is an LDPC code in which the code length N is 16200 bits and the encoding rate is 1/4, the modulation method is the 64 QAM, and the multiple b is 2.

According to B of FIG. 83, the interchanging unit 32 performs interchanging to allocate the code bits b0, b1, b2, b3, b4, b5, b6, b7, b8, b9, b10, and b11 to the symbol bits y11, y10, y2, y9, y5, y4, y0, y1, y3, y8, y7, and y6, respectively, with respect to the code bits b0 to b11 of the 6×2 (=mb) bits read from the memory 31, according to the allocation rule of FIG. 82.

In this case, both the allocation methods of allocating the code bit b#i to the symbol bit y#i, which are illustrated in A and B of FIG. 83, follow the allocation rule of FIG. 82 (observe the allocation rule).

FIG. 84 illustrates the code bit group and the symbol bit group when the LDPC code is an LDPC code in which the code length is 16200 bits and the encoding rate is 1/3, the modulation method is the 64 QAM, and the multiple b is 2.

In this case, the code bits of the 6×2 (=mb) bits that are read from the memory 31 can be grouped into four code bit groups Gb1, Gb2, Gb3, and Gb4, according to the differences of the error probabilities, as illustrated by A of FIG. 84.

In A of FIG. 84, a code bit b0 belongs to the code bit group Gb1, a code bit b1 belongs to the code bit group Gb2, code bits b2 and b3 belong to the code bit group Gb3, and code bits b4 to b11 belong to the code bit group Gb4.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 84.

In B of FIG. 84, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 85:
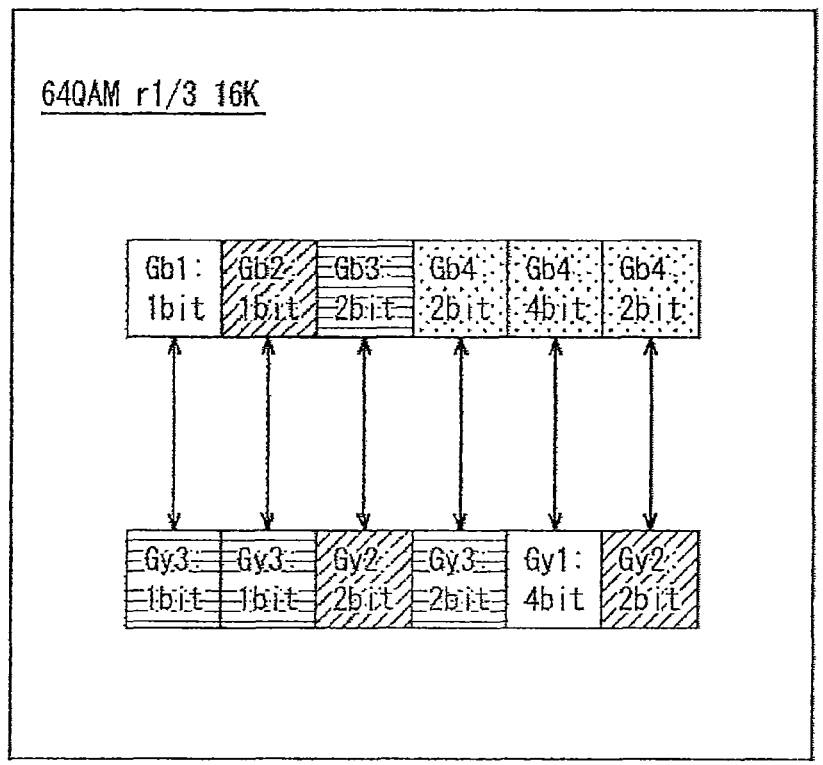
FIG. 85 is an illustration of an allocation rule when an LDPC code having a code length of 16 k and an encoding rate of 1/3 is modulated by 64 QAM and a multiple b is 2.

FIG. 85 illustrates an allocation rule when the LDPC code is an LDPC code in which the code length N is 16200 bits and the encoding rate is 1/3, the modulation method is the 64 QAM, and the multiple b is 2.

In the allocation rule of FIG. 85, the group set information (Gb1, Gy3, 1), (Gb2, Gy3, 1), (Gb3, Gy2, 2), (Gb4, Gy3, 2), (Gb4, Gy1, 4), and (Gb4, Gy2, 2) are defined.

That is, in the allocation rule of FIG. 85, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy3 having the third best error probability is defined by the group set information (Gb2, Gy3, 1), allocation of two bits of the code bits of the code bit group Gb3 having the third best error probability to one bit of the symbol bits of the symbol bit group Gy2 having the second best error probability is defined by the group set information (Gb3, Gy2, 2), allocation of two bits of the code bits of the code bit group Gb4 having the fourth best error probability to two bits of the symbol bits of the symbol bit group Gy3 having the third best error probability is defined by the group set information (Gb4, Gy3, 2), allocation of four bits of the code bits of the code bit group Gb4 having the fourth best error probability to four bits of the symbol bits of the symbol bit group Gy1 having the best error probability is defined by the group set information (Gb4, Gy1, 4), and allocation of two bits of the code bits of the code bit group Gb4 having the fourth best error probability to three bits of the symbol bits of the symbol bit group Gy2 having the second best error probability is defined by the group set information (Gb4, Gy2, 2).

Figure 86:
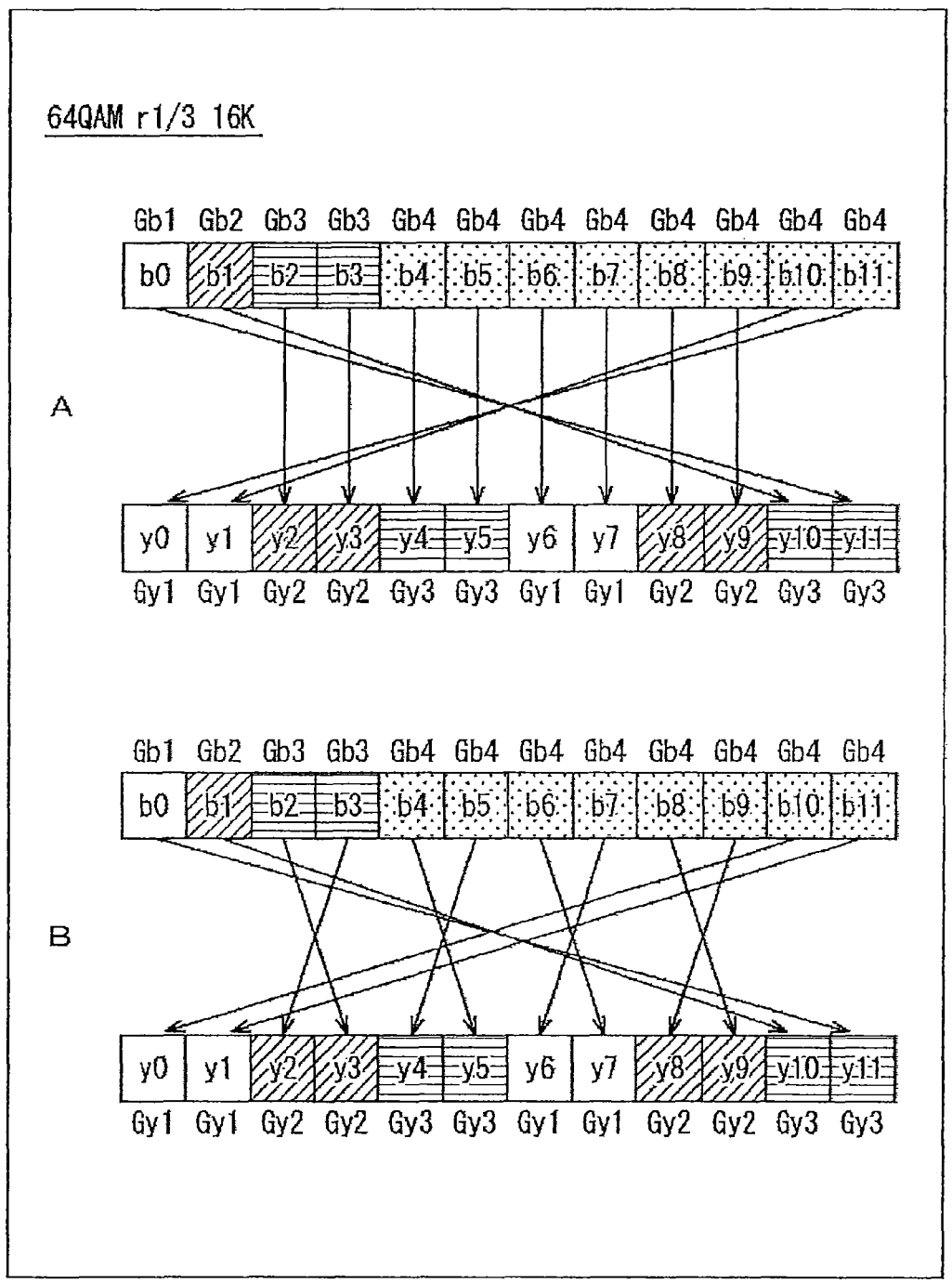
FIG. 86 is an illustration of interchange of code bits according to an allocation rule when an LDPC code having a code length of 16 k and an encoding rate of 1/3 is modulated by 64 QAM and a multiple b is 2.

FIG. 86 illustrates an example of interchanging of the code bits according to the allocation rule of FIG. 85.

That is, A of FIG. 86 illustrates a first example of interchanging of the code bits according to the allocation rule of FIG. 85, when the LDPC code is an LDPC code in which the code length N is 16200 bits and the encoding rate is 1/3, the modulation method is the 64 QAM, and the multiple b is 2.

When the LDPC code is the LDPC code in which the code length N is 16200 bits and the encoding rate is 1/3, the modulation method is the 64 QAM, and the multiple b is 2, in the demultiplexer 25, the code bits written to the memory 31 in which a column direction×a row direction are (16200/(6×2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 86 for example, according to the allocation rule of FIG. 85.

That is, the interchanging unit 32 performs interchanging to allocate the code bits b0, b1, b2, b3, b4, b5, b6, b7, b8, b9, b10, and b11 to the symbol bits y11, y10, y2, y3, y4, y5, y6, y7, y8, y9, y1, and y0, respectively.

B of FIG. 86 illustrates a second example of interchanging of the code bits according to the allocation rule of FIG. 85, when the LDPC code is an LDPC code in which the code length N is 16200 bits and the encoding rate is 1/4, the modulation method is the 64 QAM, and the multiple b is 2.

According to B of FIG. 86, the interchanging unit 32 performs interchanging to allocate the code bits b0, b1, b2, b3, b4, b5, b6, b7, b8, b9, b10, and b11 to the symbol bits y11, y10, y3, y2, y5, y4, y7, y6, y9, y8, y0, and y1, respectively, with respect to the code bits b0 to b11 of the 6×2 (=mb) bits read from the memory 31, according to the allocation rule of FIG. 85.

Figure 87:
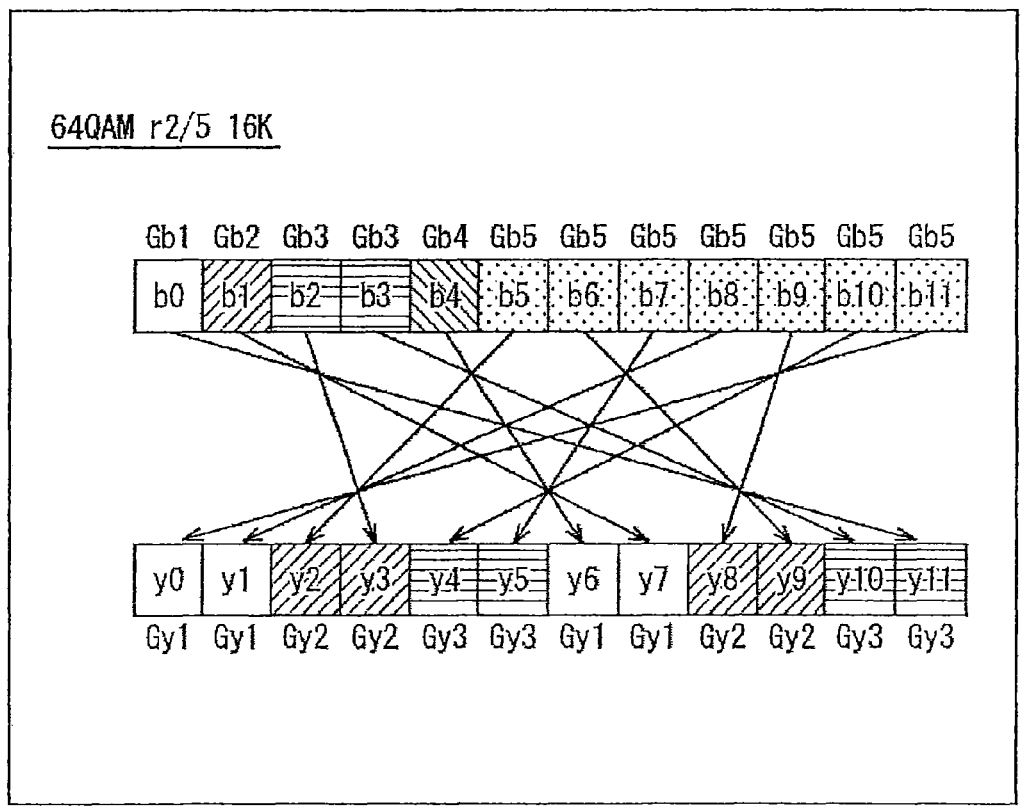
FIG. 87 is an illustration of interchange of code bits when an LDPC code having a code length of 16 k and an encoding rate of 2/5 is modulated by 64 QAM and a multiple b is 2.

FIG. 87 illustrates an example of interchanging of the code bits, when the LDPC code is an LDPC code in which the code length N is 16200 bits and the encoding rate is 2/5, the modulation method is the 64 QAM, and the multiple b is 2.

When the LDPC code is the LDPC code in which the code length N is 16200 bits and the encoding rate is 2/5, the modulation method is the 64 QAM, and the multiple b is 2, in the demultiplexer 25, the code bits written to the memory 31 in which a column direction×a row direction are (16200/(6×2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in FIG. 87.

That is, the interchanging unit 32 performs interchanging to allocate the code bits $b_0$, $b_1$, $b_2$, $b_3$, $b_4$, $b_5$, $b_6$, $b_7$, $b_8$, $b_9$, $b_{10}$, and $b_{11}$ to the symbol bits $y11$, $y_7$, $y_3$, $y_{10}$, $y_6$, $y_2$, $y_9$, $y_5$, $y_1$, $y_8$, $y_4$, and $y_0$, respectively.

In this case, the interchanging of FIG. 87 is matched with interchanging defined in the DVB-T.2, when the LDPC code is an LDPC code in which the code length N is 16200 bits and the encoding rate is 2/5 and the modulation method is the 64 QAM.

Therefore, when the LDPC code is the LDPC code in which the code length N is 16200 bits and the encoding rate is 2/5 and the modulation method is the 64 QAM, in the interchanging unit 32, the same interchanging as the interchanging defined in the DVB-T.2 is performed.

Figure 88:
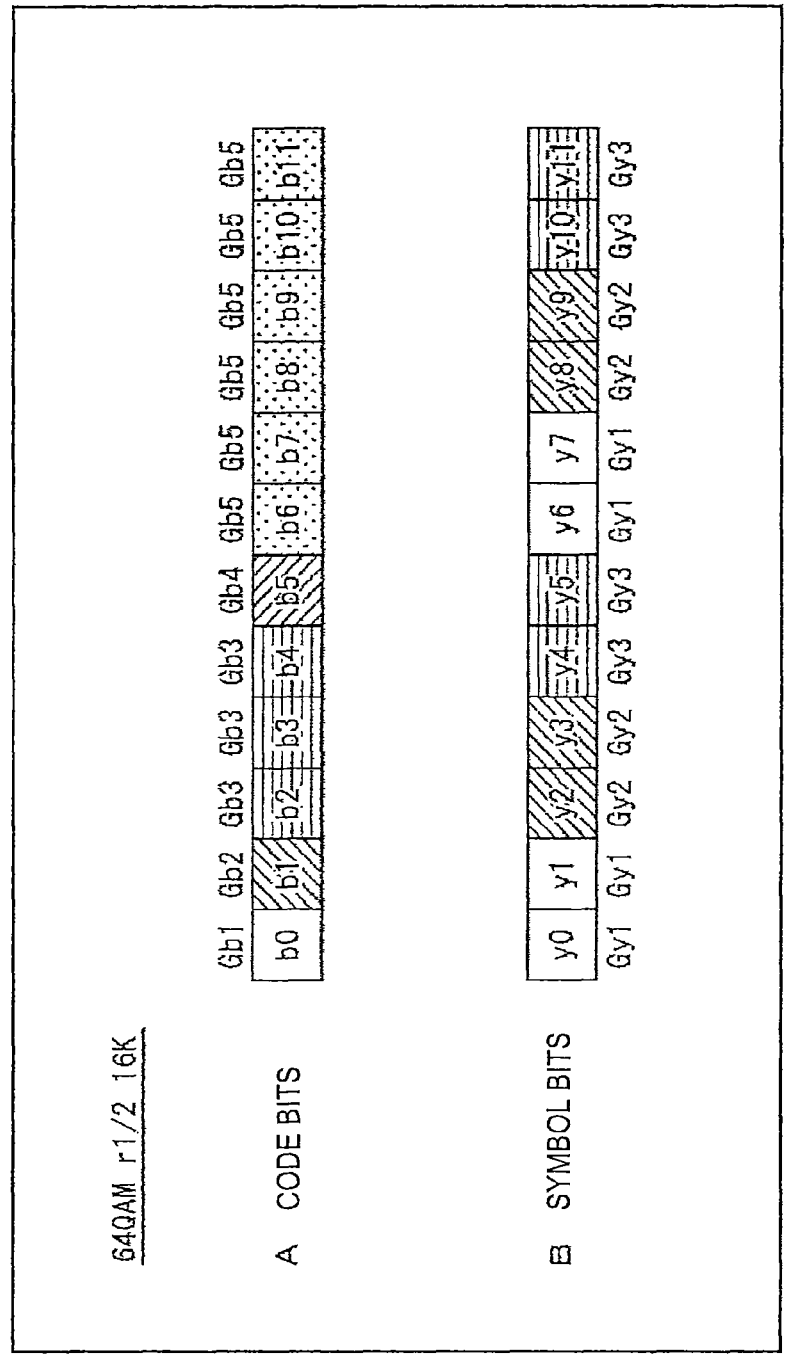
FIG. 88 is an illustration of a code bit group and a symbol bit group when an LDPC code having a code length of 16 k and an encoding rate of 1/2 is modulated by 64 QAM and a multiple b is 2.

FIG. 88 illustrates the code bit group and the symbol bit group when the LDPC code is an LDPC code in which the code length is 16200 bits and the encoding rate is 1/2, the modulation method is the 64 QAM, and the multiple b is 2.

In this case, the code bits of the 6×2 (=mb) bits that are read from the memory 31 can be grouped into five code bit groups Gb1, Gb2, Gb3, Gb4, and Gb5, according to the differences of the error probabilities, as illustrated by A of FIG. 88.

In A of FIG. 88, a code bit b0 belongs to the code bit group Gb1, a code bit b1 belongs to the code bit group Gb2, code bits b2 to b4 belong to the code bit group Gb3, a code bit b5 belongs to the code bit group Gb4, and code bits b6 to b11 belong to the code bit group Gb5.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 88.

In B of FIG. 88, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 89:
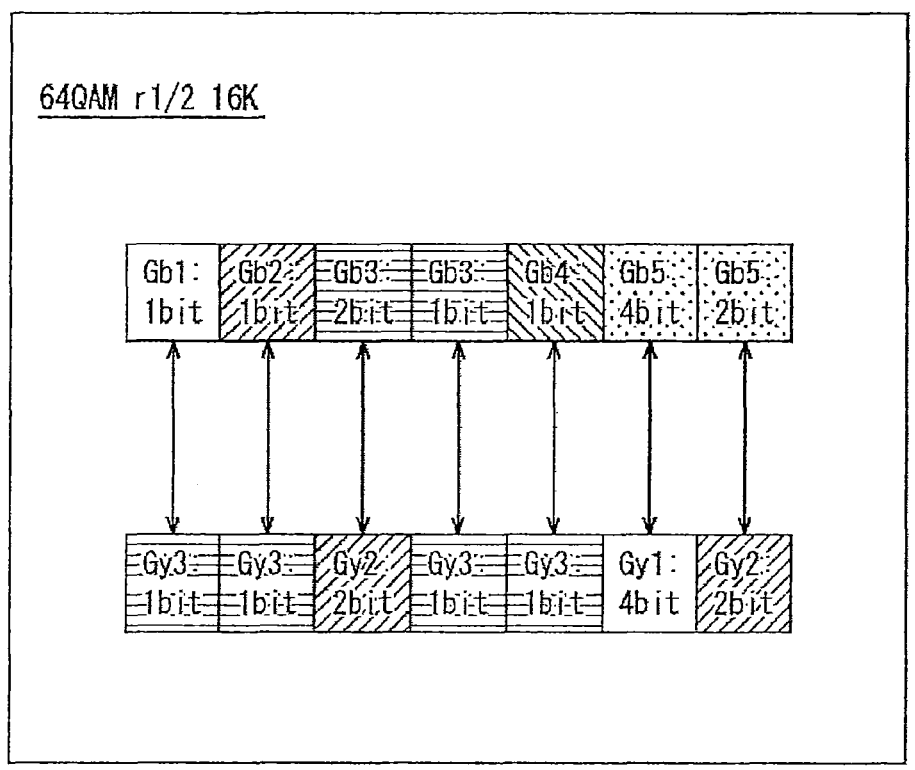
FIG. 89 is an illustration of an allocation rule when an LDPC code having a code length of 16 k and an encoding rate of 1/2 is modulated by 64 QAM and a multiple b is 2.

FIG. 89 illustrates an allocation rule when the LDPC code is an LDPC code in which the code length N is 16200 bits and the encoding rate is 1/2, the modulation method is the 64 QAM, and the multiple b is 2.

In the allocation rule of FIG. 89, the group set information (Gb1, Gy3, 1), (Gb2, Gy3, 1), (Gb3, Gy2, 2), (Gb3, Gy3, 1), (Gb4, Gy3, 1), (Gb5, Gy1, 4), and (Gb5, Gy2, 2) are defined.

That is, in the allocation rule of FIG. 89, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy3 having the third best error probability is defined by the group set information (Gb2, Gy3, 1), allocation of two bits of the code bits of the code bit group Gb3 having the third best error probability to two bits of the symbol bits of the symbol bit group Gy2 having the second best error probability is defined by the group set information (Gb3, Gy2, 2), allocation of one bit of the code bits of the code bit group Gb3 having the third best error probability to one bit of the symbol bits of the symbol bit group Gy3 having the third best error probability is defined by the group set information (Gb3, Gy3, 1), allocation of one bit of the code bits of the code bit group Gb4 having the fourth best error probability to one bit of the symbol bits of the symbol bit group Gy3 having the third best error probability is defined by the group set information (Gb4, Gy3, 1), allocation of four bits of the code bits of the code bit group Gb5 having the fifth best error probability to four bits of the symbol bits of the symbol bit group Gy1 having the best error probability is defined by the group set information (Gb5, Gy1, 4), and allocation of two bits of the code bits of the code bit group Gb5 having the fifth best error probability to two bits of the symbol bits of the symbol bit group Gy2 having the second best error probability is defined by the group set information (Gb5, Gy2, 2).

Figure 90:
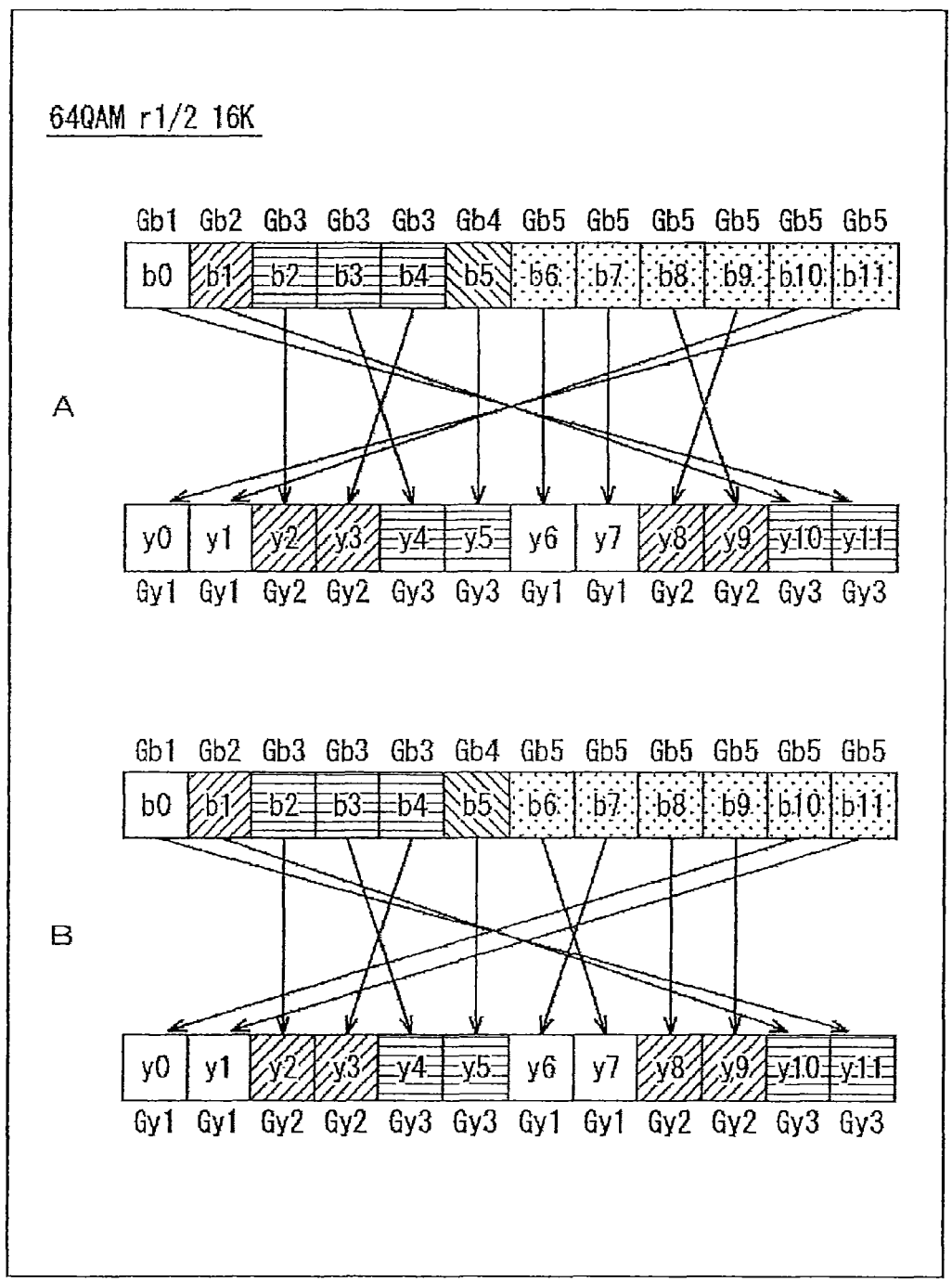
FIG. 90 is an illustration of interchange of code bits according to an allocation rule when an LDPC code having a code length of 16 k and an encoding rate of 1/2 is modulated by 64 QAM and a multiple b is 2.

FIG. 90 illustrates an example of interchanging of the code bits according to the allocation rule of FIG. 89.

That is, A of FIG. 90 illustrates a first example of interchanging of the code bits according to the allocation rule of FIG. 89, when the LDPC code is an LDPC code in which the code length N is 16200 bits and the encoding rate is 1/2, the modulation method is the 64 QAM, and the multiple b is 2.

When the LDPC code is the LDPC code in which the code length N is 16200 bits and the encoding rate is 1/2, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 90 for example, according to the allocation rule of FIG. 89.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 90 illustrates a second example of interchanging of the code bits according to the allocation rule of FIG. 89, when the LDPC code is an LDPC code in which the code length N is 16200 bits and the encoding rate is 1/2, the modulation method is the 64 QAM, and the multiple b is 2.

According to B of FIG. 90, the interchanging unit 32 performs interchanging to allocate the code bits b0, b1, b2, b3, b4, b5, b6, b7, b8, b9, b10, and b11 to the symbol bits y11, y10, y2, y4, y3, y5, y7, y6, y8, y9, y0, and y1, respectively, with respect to the code bits b0 to b11 of the 6×2 (=mb) bits read from the memory 31, according to the allocation rule of FIG. 89.

Figure 91:
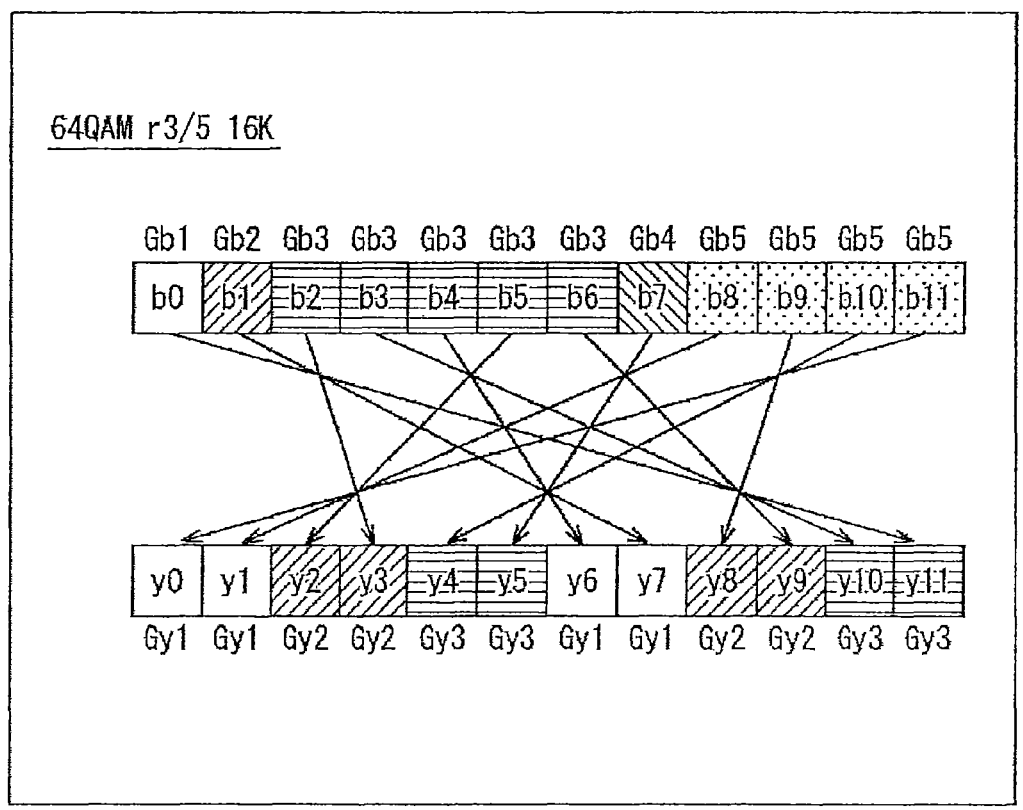
FIG. 91 is an illustration of interchange of code bits when an LDPC code having a code length of 16 k and an encoding rate of 3/5 is modulated by 64 QAM and a multiple b is 2.

FIG. 91 illustrates an example of interchanging of the code bits, when the LDPC code is an LDPC code in which the code length N is 16200 bits and the encoding rate is 3/5, the modulation method is the 64 QAM, and the multiple b is 2.

When the LDPC code is the LDPC code in which the code length N is 16200 bits and the encoding rate is 3/5, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in FIG. 91.

That is, the interchanging unit 32 performs interchanging to allocate the code bits b0, b1, b2, b3, b4, b5, b6, b7, b8, b9, b10, and b11 to the symbol bits y11, y7, y3, y10, y6, y2, y9, y5, y1, y8, y4, and y0, respectively.

In this case, the interchanging of FIG. 91 is matched with interchanging defined in the DVB-T.2, when the LDPC code is an LDPC code in which the code length N is 16200 bits and the encoding rate is 3/5 and the modulation method is the 64 QAM.

Therefore, when the LDPC code is the LDPC code in which the code length N is 16200 bits and the encoding rate is 3/5 and the modulation method is the 64 QAM, in the interchanging unit 32, the same interchanging as the interchanging defined in the DVB-T.2 is performed.

Figure 92:
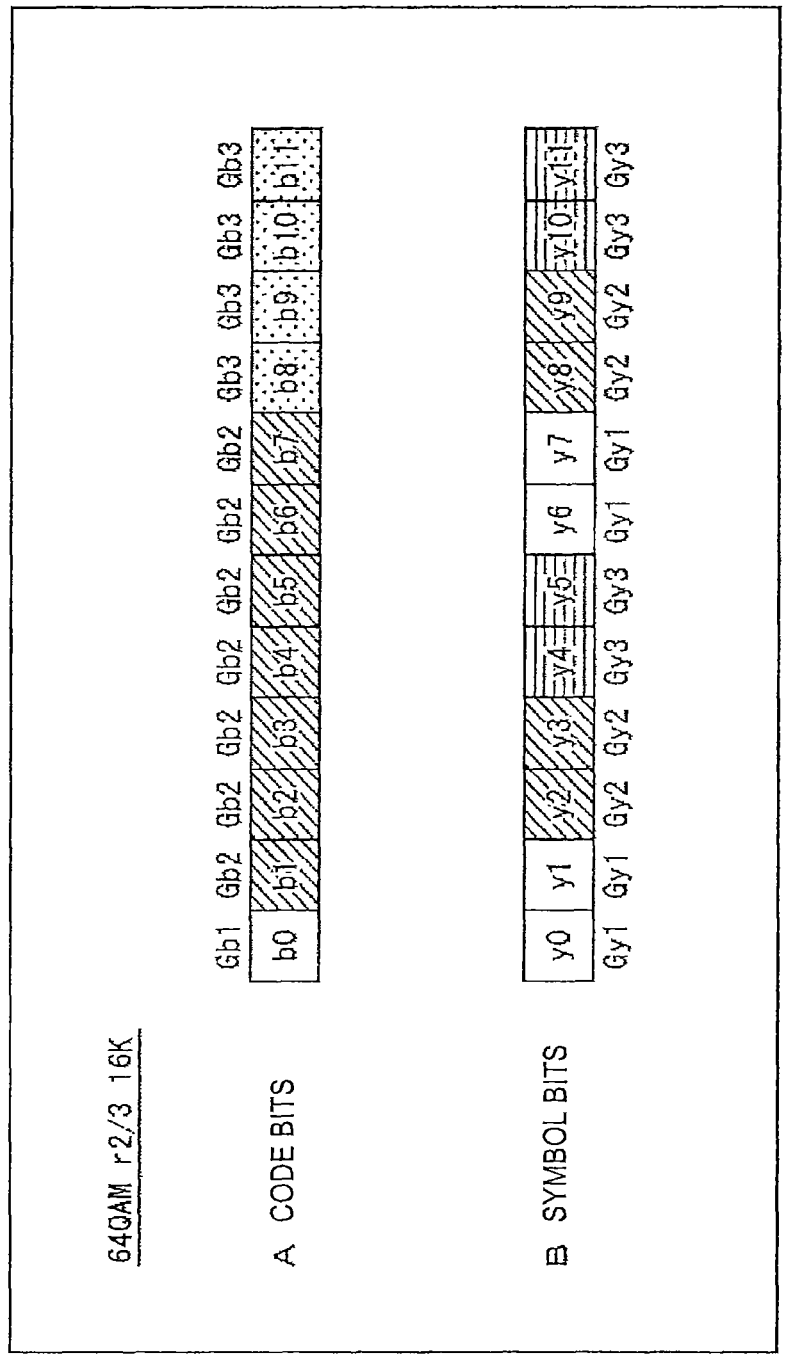
FIG. 92 is an illustration of a code bit group and a symbol bit group when an LDPC code having a code length of 16 k and an encoding rate of 3/5 is modulated by 64 QAM and a multiple b is 2.

FIG. 92 illustrates the code bit group and the symbol bit group when the LDPC code is an LDPC code in which the code length is 16200 bits and the encoding rate is 2/3, the modulation method is the 64 QAM, and the multiple b is 2.

In this case, the code bits of the 6×2 (=mb) bits that are read from the memory 31 can be grouped into three code bit groups Gb1, Gb2, and Gb3, according to the differences of the error probabilities, as illustrated by A of FIG. 92.

In A of FIG. 92, a code bit b0 belongs to the code bit group Gb1, code bits b1 to b7 belong to the code bit group Gb2, and code bits b8 to b11 belong to the code bit group Gb3.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 92.

In B of FIG. 92, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 93:
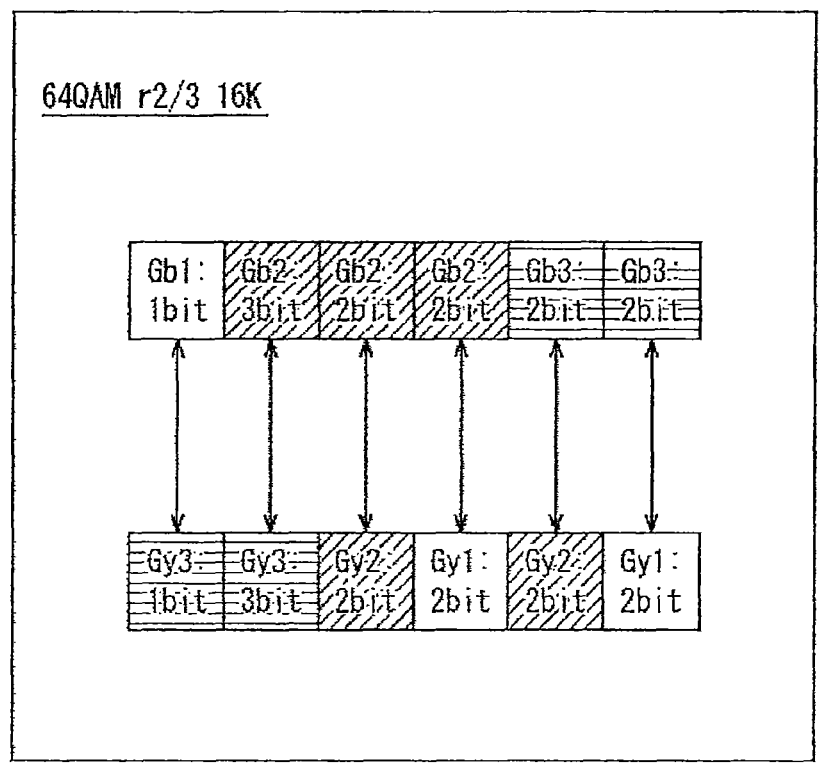
FIG. 93 is an illustration of an allocation rule when an LDPC code having a code length of 16 k and an encoding rate of 2/3 is modulated by 64 QAM and a multiple b is 2.

FIG. 93 illustrates an allocation rule when the LDPC code is an LDPC code in which the code length N is 16200 bits and the encoding rate is 2/3, the modulation method is the 64 QAM, and the multiple b is 2.

In the allocation rule of FIG. 93, the group set information (Gb1, Gy3, 1), (Gb2, Gy3, 3), (Gb2, Gy2, 2), (Gb2, Gy1, 2), (Gb3, Gy2, 2), and (Gb3, Gy1, 2) are defined.

That is, in the allocation rule of FIG. 93, allocation of one bit of the code bits of the code bit group Gb1 having the best error probability to one bit of the symbol bits of the symbol bit group Gy3 having the third best error probability is defined by the group set information (Gb1, Gy3, 1), allocation of three bits of the code bits of the code bit group Gb2 having the second best error probability to three bits of the symbol bits of the symbol bit group Gy3 having the third best error probability is defined by the group set information (Gb2, Gy3, 3), allocation of two bits of the code bits of the code bit group Gb2 having the second best error probability to two bits of the symbol bits of the symbol bit group Gy2 having the second best error probability is defined by the group set information (Gb2, Gy2, 2), allocation of two bits of the code bits of the code bit group Gb2 having the second best error probability to two bits of the symbol bits of the symbol bit group Gy1 having the best error probability is defined by the group set information (Gb2, Gy1, 2), allocation of two bits of the code bits of the code bit group Gb2 having the second best error probability to two bits of the symbol bits of the symbol bit group Gy1 having the best error probability is defined by the group set information (Gb2, Gy1, 2), allocation of two bits of the code bits of the code bit group Gb3 having the third best error probability to two bits of the symbol bits of the symbol bit group Gy2 having the second best error probability is defined by the group set information (Gb3, Gy2, 2), and allocation of two bits of the code bits of the code bit group Gb3 having the third best error probability to two bits of the symbol bits of the symbol bit group Gy1 having the best error probability is defined by the group set information (Gb3, Gy1, 2).

Figure 94:
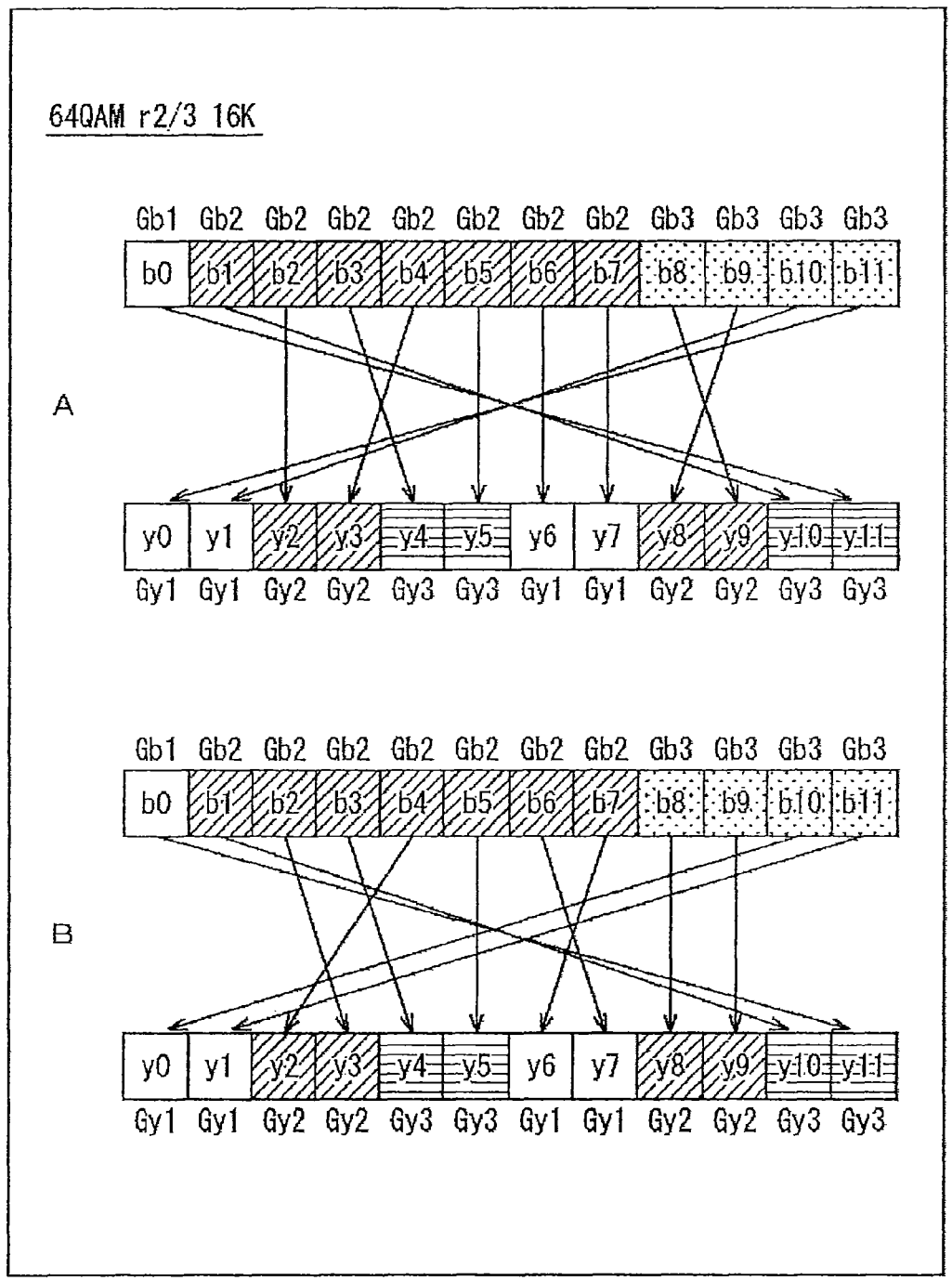
FIG. 94 is an illustration of interchange of code bits according to an allocation rule when an LDPC code having a code length of 16 k and an encoding rate of 2/3 is modulated by 64 QAM and a multiple b is 2.

FIG. 94 illustrates an example of interchanging of the code bits according to the allocation rule of FIG. 93.

That is, A of FIG. 94 illustrates a first example of interchanging of the code bits according to the allocation rule of FIG. 93, when the LDPC code is an LDPC code in which the code length N is 16200 bits and the encoding rate is 2/3, the modulation method is the 64 QAM, and the multiple b is 2.

When the LDPC code is the LDPC code in which the code length N is 16200 bits and the encoding rate is 2/3, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 94 for example, according to the allocation rule of FIG. 93.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 94 illustrates a second example of interchanging of the code bits according to the allocation rule of FIG. 93, when the LDPC code is an LDPC code in which the code length N is 16200 bits and the encoding rate is 2/3, the modulation method is the 64 QAM, and the multiple b is 2.

According to B of FIG. 94, the interchanging unit 32 performs interchanging to allocate the code bits b0, b1, b2, b3, b4, b5, b6, b7, b8, b9, b10, and b11 to the symbol bits y11, y10, y3, y4, y2, y5, y7, y6, y8, y9, y0, and y1, respectively, with respect to the code bits b0 to b11 of the 6×2 (=mb) bits read from the memory 31, according to the allocation rule of FIG. 93.

FIG. 95 illustrates the code bit group and the symbol bit group when the LDPC code is an LDPC code in which the code length is 16200 bits and the encoding rate is 3/4, the modulation method is the 64 QAM, and the multiple b is 2.

In this case, the code bits of the 6×2 (=mb) bits that are read from the memory 31 can be grouped into four code bit groups Gb1, Gb2, Gb3, and Gb4, according to the differences of the error probabilities, as illustrated by A of FIG. 95.

In A of FIG. 95, a code bit b0 belongs to the code bit group Gb1, code bits b1 to b7 belong to the code bit group Gb2, code bits b8 to b11 belong to the code bit group Gb3, and code bits b9 to b11 belong to the code bit group Gb4.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 95.

In B of FIG. 95, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 96:
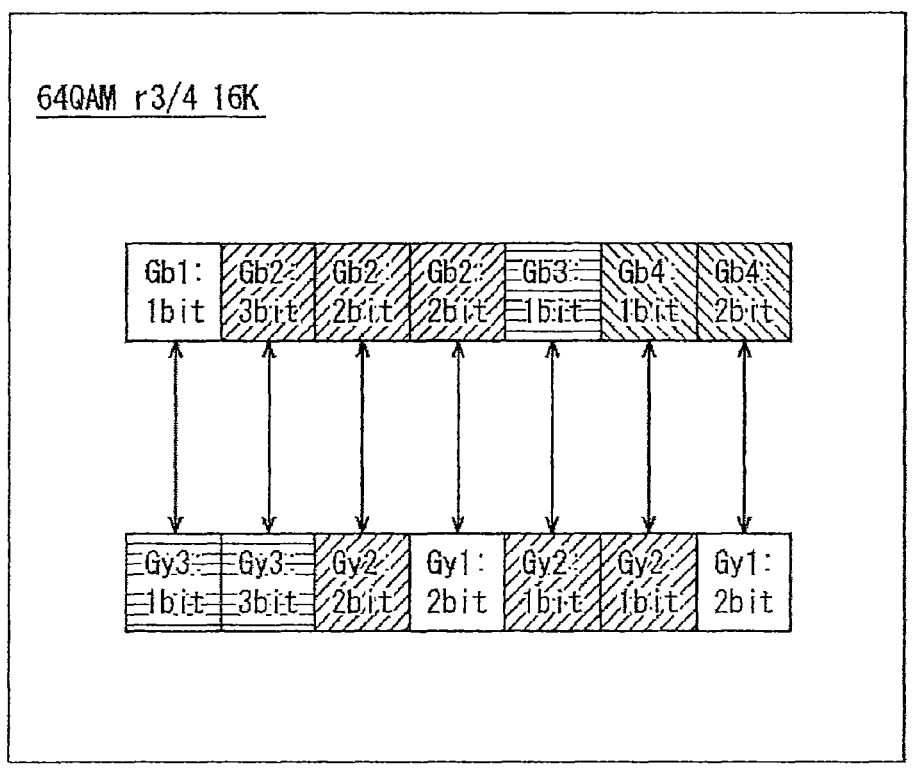
FIG. 96 is an illustration of an allocation rule when an LDPC code having a code length of 16 k and an encoding rate of 3/4 is modulated by 64 QAM and a multiple b is 2.

FIG. 96 illustrates an allocation rule when the LDPC code is an LDPC code in which the code length N is 16200 bits and the encoding rate is 3/4, the modulation method is the 64 QAM, and the multiple b is 2.

In the allocation rule of FIG. 96, the group set information (Gb1, Gy3, 1), (Gb2, Gy3, 3), (Gb2, Gy2, 2), (Gb2, Gy1, 2), (Gb3, Gy2, 1), (Gb4, Gy2, 1), and (Gb4, Gy1, 2) are defined.

That is, in the allocation rule of FIG. 96, allocation of one bit of the code bits of the code bit group Gb1 having the best error probability to one bit of the symbol bits of the symbol bit group Gy3 having the third best error probability is defined by the group set information (Gb1, Gy3, 1), allocation of three bits of the code bits of the code bit group Gb2 having the second best error probability to three bits of the symbol bits of the symbol bit group Gy3 having the third best error probability is defined by the group set information (Gb2, Gy3, 3), allocation of two bits of the code bits of the code bit group Gb2 having the second best error probability to two bits of the symbol bits of the symbol bit group Gy2 having the second best error probability is defined by the group set information (Gb2, Gy2, 2), allocation of two bits of the code bits of the code bit group Gb2 having the second best error probability to two bits of the symbol bits of the symbol bit group Gy1 having the best error probability is defined by the group set information (Gb2, Gy1, 2), allocation of one bit of the code bits of the code bit group Gb3 having the third best error probability to one bit of the symbol bits of the symbol bit group Gy2 having the second best error probability is defined by the group set information (Gb3, Gy2, 1), allocation of one bit of the code bits of the code bit group Gb4 having the fourth best error probability to one bit of the symbol bits of the symbol bit group Gy2 having the second best error probability is defined by the group set information (Gb4, Gy2, 1), and allocation of two bits of the code bits of the code bit group Gb4 having the fourth best error probability to two bits of the symbol bits of the symbol bit group Gy1 having the best error probability is defined by the group set information (Gb4, Gy1, 2).

Figure 97:
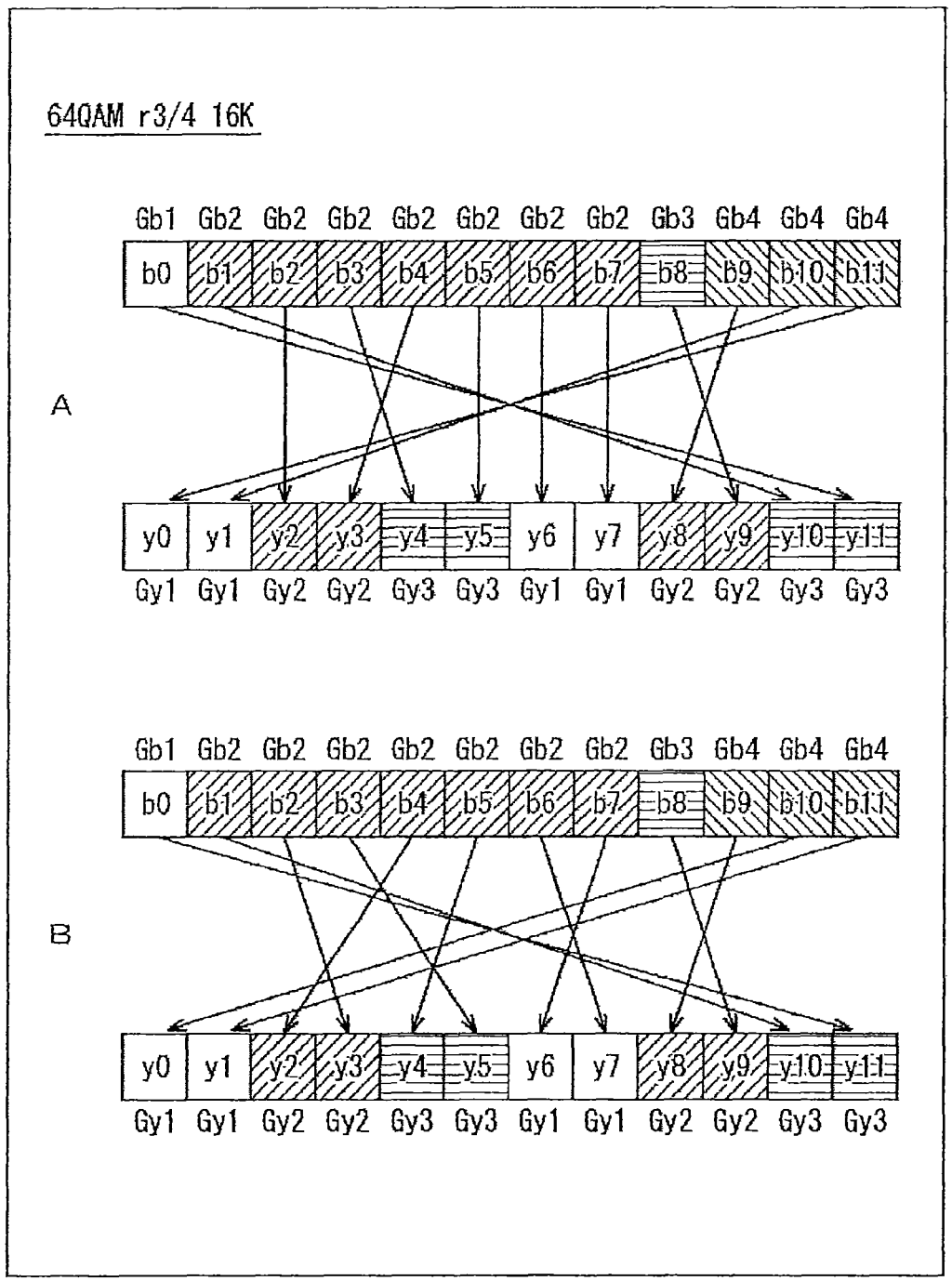
FIG. 97 is an illustration of interchange of code bits according to an allocation rule when an LDPC code having a code length of 16 k and an encoding rate of 3/4 is modulated by 64 QAM and a multiple b is 2.

FIG. 97 illustrates an example of interchanging of the code bits according to the allocation rule of FIG. 96.

That is, A of FIG. 97 illustrates a first example of interchanging of the code bits according to the allocation rule of FIG. 96, when the LDPC code is an LDPC code in which the code length N is 16200 bits and the encoding rate is 3/4, the modulation method is the 64 QAM, and the multiple b is 2.

When the LDPC code is the LDPC code in which the code length N is 16200 bits and the encoding rate is 3/4, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 97 for example, according to the allocation rule of FIG. 96.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 97 illustrates a second example of interchanging of the code bits according to the allocation rule of FIG. 96, when the LDPC code is an LDPC code in which the code length N is 16200 bits and the encoding rate is 3/4, the modulation method is the 64 QAM, and the multiple b is 2.

According to B of FIG. 97, the interchanging unit 32 performs interchanging to allocate the code bits b0, b1, b2, b3, b4, b5, b6, b7, b8, b9, b10, and b11 to the symbol bits y11, y10, y3, y5, y2, y4, y7, y6, y9, y8, y0, and y1, respectively, with respect to the code bits b0 to b11 of the 6×2 (=mb) bits read from the memory 31, according to the allocation rule of FIG. 96.

FIG. 98 illustrates the code bit group and the symbol bit group when the LDPC code is an LDPC code in which the code length is 16200 bits and the encoding rate is 4/5, the modulation method is the 64 QAM, and the multiple b is 2.

In this case, the code bits of the 6×2 (=mb) bits that are read from the memory 31 can be grouped into three code bit groups Gb1, Gb2, and Gb3, according to the differences of the error probabilities, as illustrated by A of FIG. 985.

In A of FIG. 98, code bits b0 to b8 belong to the code bit group Gb1, a code bit b9 belongs to the code bit group Gb2, and code bits b10 and b11 belong to the code bit group Gb3.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 98.

In B of FIG. 98, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 99:
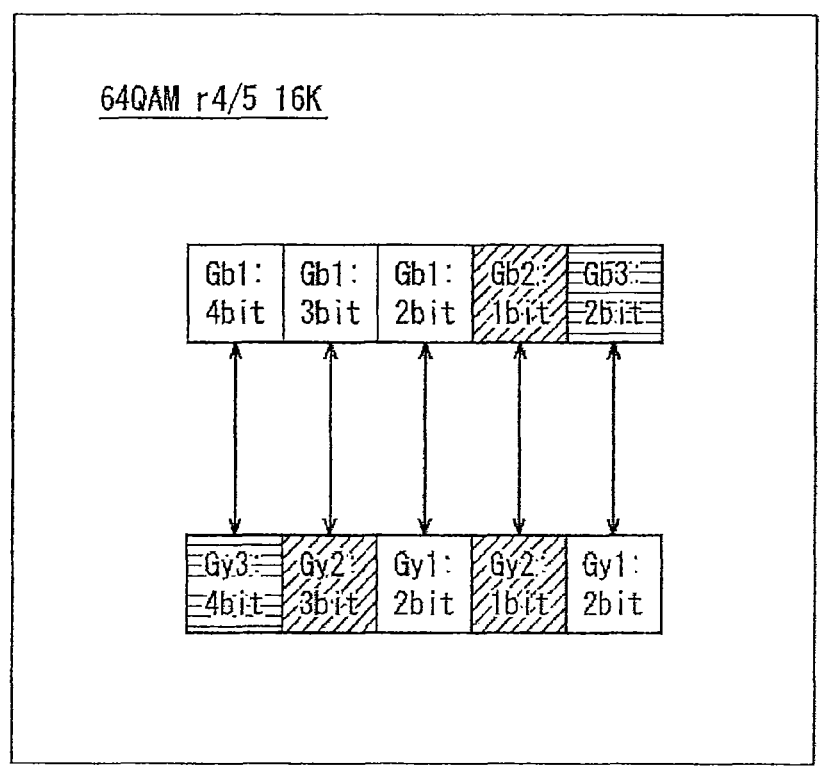
FIG. 99 is an illustration of an allocation rule when an LDPC code having a code length of 16 k and an encoding rate of 4/5 is modulated by 64 QAM and a multiple b is 2.

FIG. 99 illustrates an allocation rule when the LDPC code is an LDPC code in which the code length N is 16200 bits and the encoding rate is 4/5, the modulation method is the 64 QAM, and the multiple b is 2.

In the allocation rule of FIG. 99, the group set information (Gb1, Gy3, 4), (Gb1, Gy2, 3), (Gb1, Gy1, 2), (Gb2, Gy2, 1), and (Gb3, Gy1, 2) are defined.

That is, in the allocation rule of FIG. 99, allocation of four bits of the code bits of the code bit group Gb1 having the best error probability to four bits of the symbol bits of the symbol bit group Gy3 having the third best error probability is defined by the group set information (Gb1, Gy3, 4), allocation of three bits of the code bits of the code bit group Gb1 having the best error probability to three bits of the symbol bits of the symbol bit group Gy2 having the second best error probability is defined by the group set information (Gb1, Gy2, 3), allocation of two bits of the code bits of the code bit group Gb1 having the best error probability to two bits of the symbol bits of the symbol bit group Gy1 having the best error probability is defined by the group set information (Gb1, Gy1, 2), allocation of one bit of the code bits of the code bit group Gb2 having the second best error probability to one bit of the symbol bits of the symbol bit group Gy2 having the second best error probability is defined by the group set information (Gb2, Gy2, 1), and allocation of two bits of the code bits of the code bit group Gb3 having the third best error probability to two bits of the symbol bits of the symbol bit group Gy1 having the best error probability is defined by the group set information (Gb3, Gy1, 2).

Figure 100:
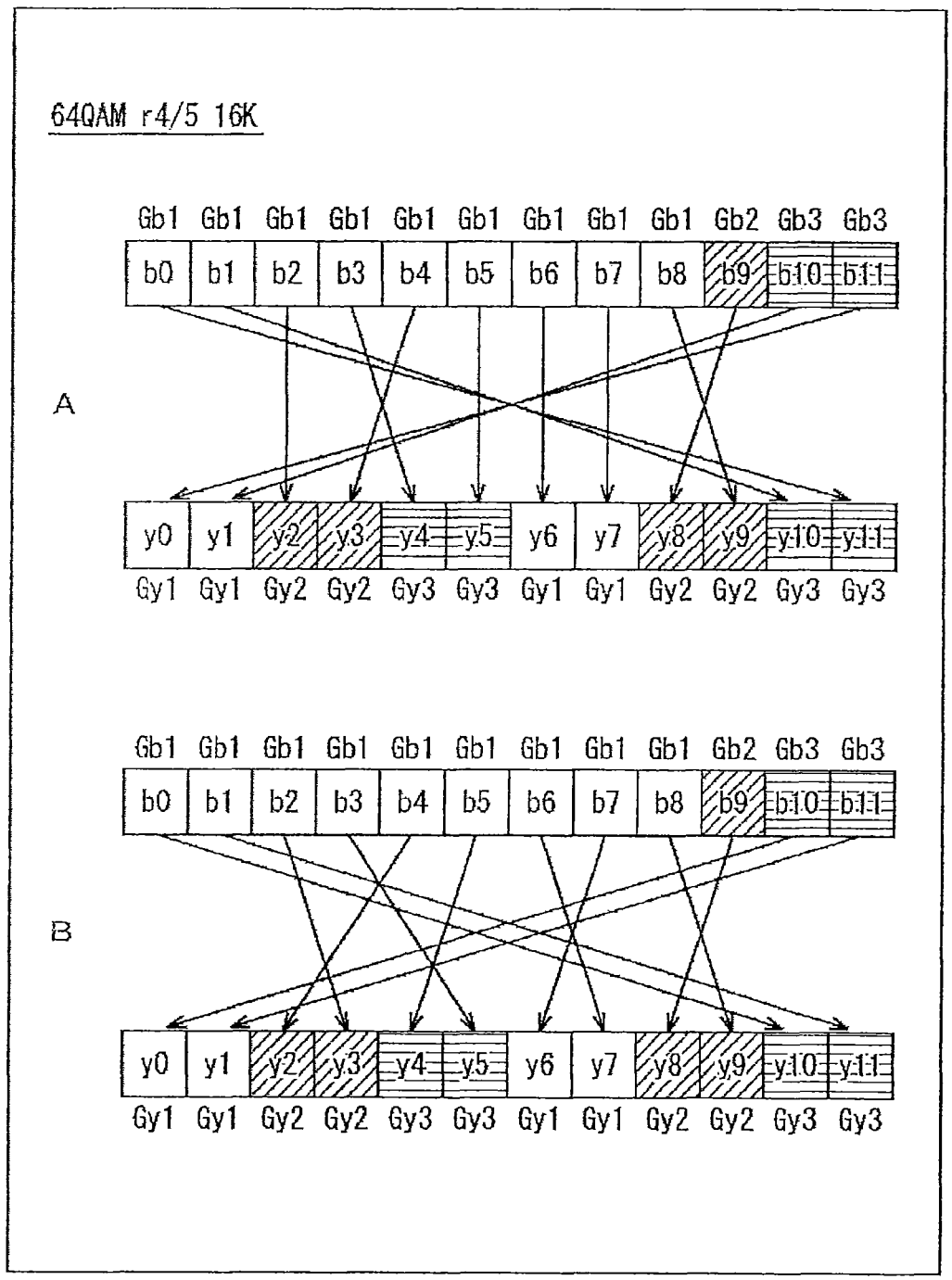
FIG. 100 is an illustration of interchange of code bits according to an allocation rule when an LDPC code having a code length of 16 k and an encoding rate of 4/5 is modulated by 64 QAM and a multiple b is 2.

FIG. 100 illustrates an example of interchanging of the code bits according to the allocation rule of FIG. 99.

That is, A of FIG. 100 illustrates a first example of interchanging of the code bits according to the allocation rule of FIG. 99, when the LDPC code is an LDPC code in which the code length N is 16200 bits and the encoding rate is 4/5, the modulation method is the 64 QAM, and the multiple b is 2.

When the LDPC code is the LDPC code in which the code length N is 16200 bits and the encoding rate is 4/5, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 100 for example, according to the allocation rule of FIG. 99.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 100 illustrates a second example of interchanging of the code bits according to the allocation rule of FIG. 99, when the LDPC code is an LDPC code in which the code length N is 16200 bits and the encoding rate is 4/5, the modulation method is the 64 QAM, and the multiple b is 2.

According to B of FIG. 100, the interchanging unit 32 performs interchanging to allocate the code bits b0, b1, b2, b3, b4, b5, b6, b7, b8, b9, b10, and b11 to the symbol bits y10, y11, y3, y5, y2, y4, y7, y6, y9, y8, y0, and y1, respectively, with respect to the code bits b0 to b11 of the 6×2 (=mb) bits read from the memory 31, according to the allocation rule of FIG. 99.

Figure 101:
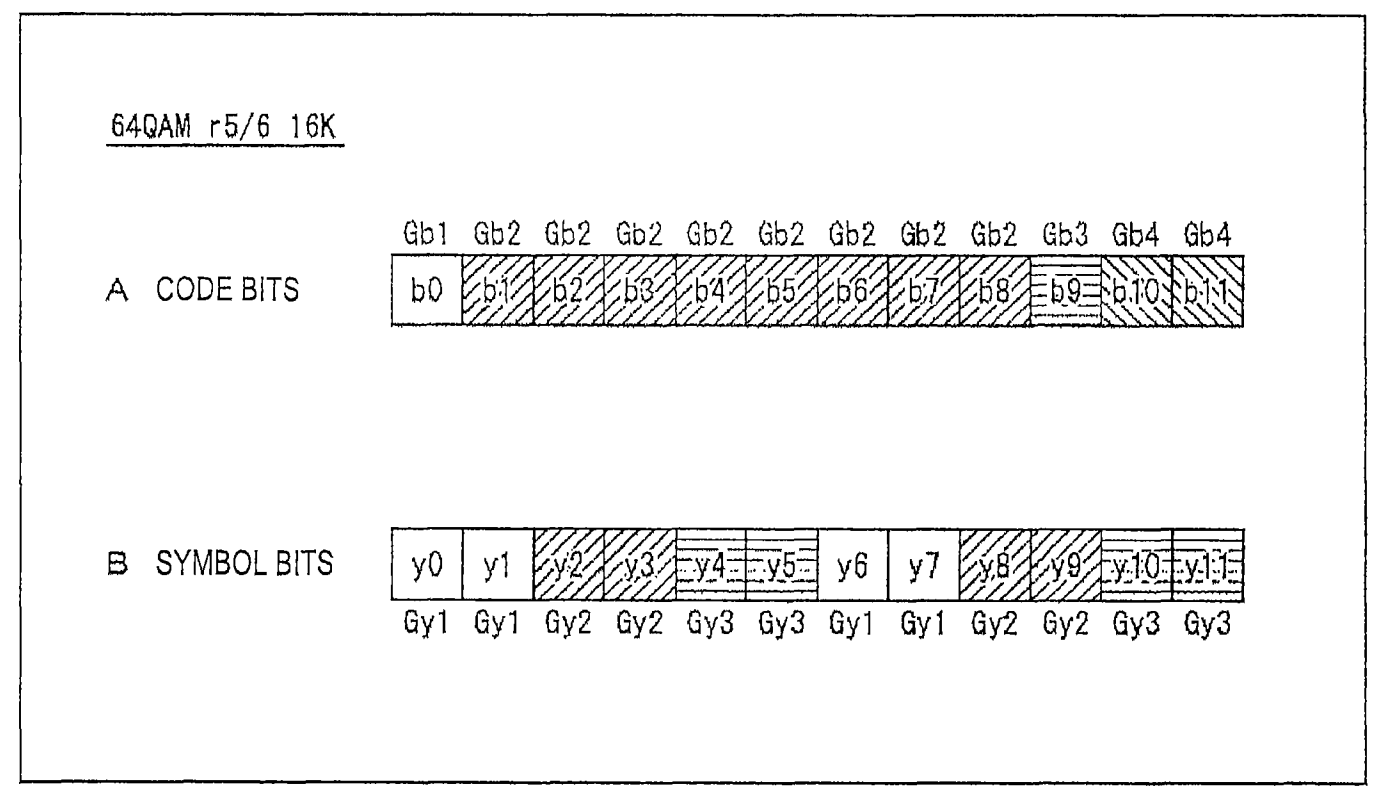

FIG. 101 illustrates the code bit group and the symbol bit group when the LDPC code is an LDPC code in which the code length is 16200 bits and the encoding rate is 5/6, the modulation method is the 64 QAM, and the multiple b is 2.

In this case, the code bits of the 6×2 (=mb) bits that are read from the memory 31 can be grouped into four code bit groups Gb1, Gb2, Gb3, and Gb4, according to the differences of the error probabilities, as illustrated by A of FIG. 101.

In A of FIG. 101, a code bit b0 belongs to the code bit group Gb1, code bits b1 to b8 belong to the code bit group Gb2, a code bit b9 belongs to the code bit group Gb3, and code bits b10 and b11 belong to the code bit group Gb4.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 101.

In B of FIG. 101, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 102:
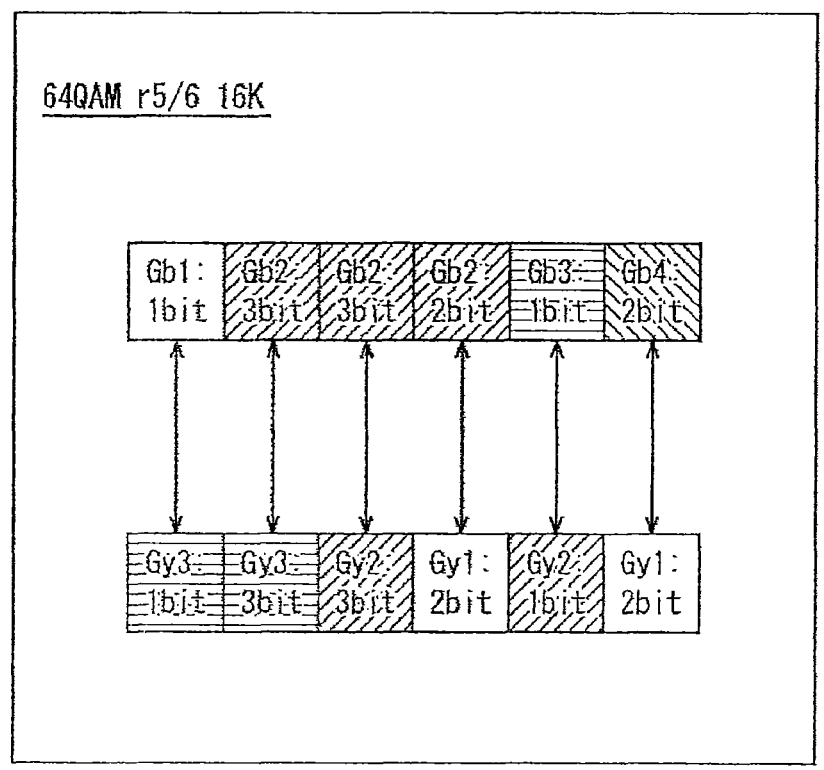
FIG. 102 is an illustration of an allocation rule when an LDPC code having a code length of 16 k and an encoding rate of 5/6 is modulated by 64 QAM and a multiple b is 2.

FIG. 102 illustrates an allocation rule when the LDPC code is an LDPC code in which the code length N is 16200 bits and the encoding rate is 5/6, the modulation method is the 64 QAM, and the multiple b is 2.

In the allocation rule of FIG. 102, the group set information (Gb1, Gy3, 1), (Gb2, Gy3, 3), (Gb2, Gy2, 3), (Gb2, Gy1, 2), (Gb3, Gy2, 1), and (Gb4, Gy2, 1) are defined.

That is, in the allocation rule of FIG. 102, allocation of one bit of the code bits of the code bit group Gb1 having the best error probability to one bit of the symbol bits of the symbol bit group Gy3 having the third best error probability is defined by the group set information (Gb1, Gy3, 1), allocation of three bits of the code bits of the code bit group Gb2 having the second best error probability to three bits of the symbol bits of the symbol bit group Gy3 having the third best error probability is defined by the group set information (Gb2, Gy3, 3), allocation of three bits of the code bits of the code bit group Gb2 having the second best error probability to three bits of the symbol bits of the symbol bit group Gy2 having the second best error probability is defined by the group set information (Gb2, Gy2, 3), allocation of two bits of the code bits of the code bit group Gb2 having the second best error probability to two bits of the symbol bits of the symbol bit group Gy1 having the best error probability is defined by the group set information (Gb2, Gy1, 2), allocation of one bit of the code bits of the code bit group Gb3 having the third best error probability to one bit of the symbol bits of the symbol bit group Gy2 having the second best error probability is defined by the group set information (Gb3, Gy2, 1), and allocation of two bits of the code bits of the code bit group Gb4 having the fourth best error probability to two bits of the symbol bits of the symbol bit group Gy1 having the best error probability is defined by the group set information (Gb4, Gy1, 2).

Figure 103:
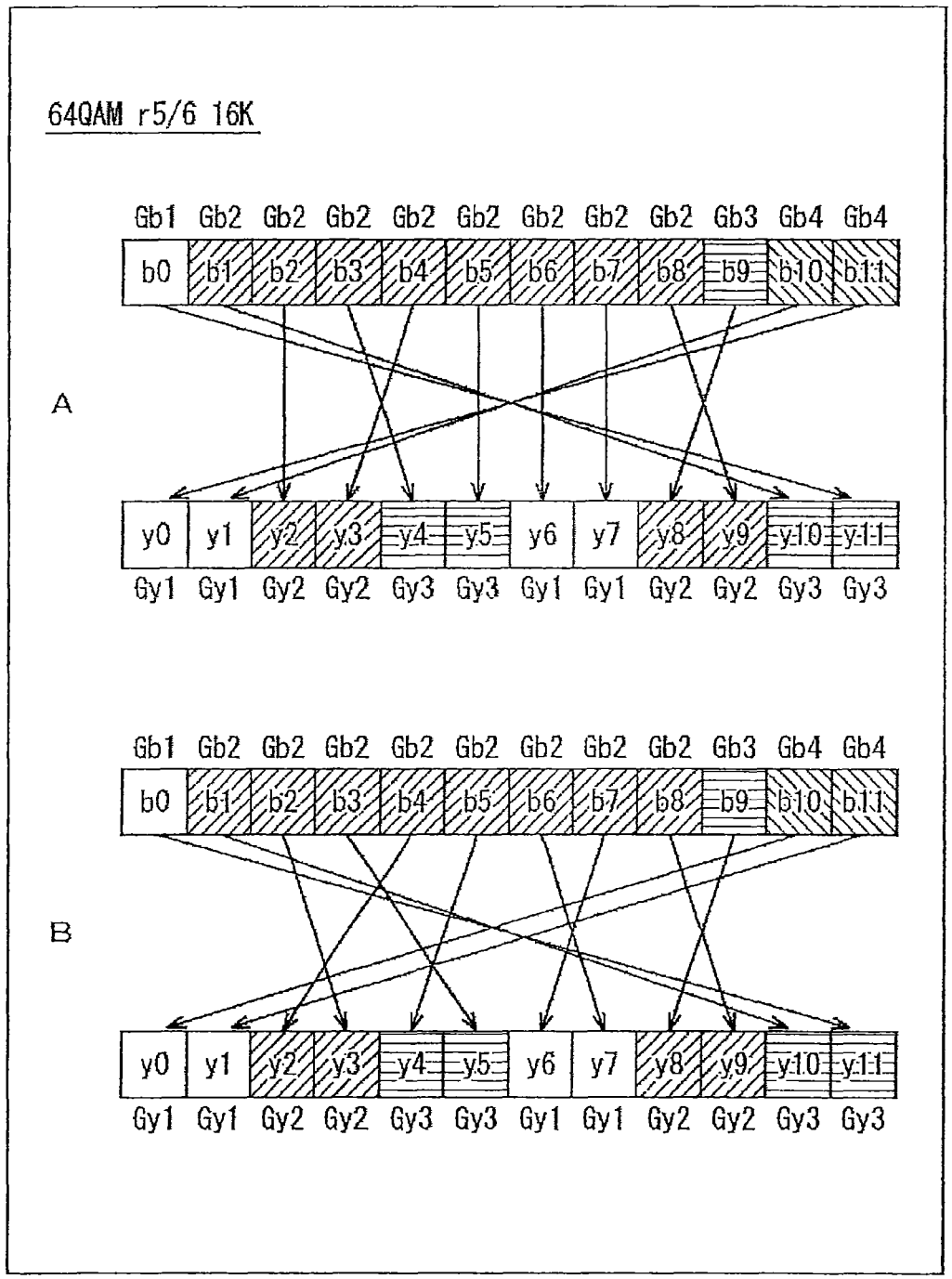
FIG. 103 is an illustration of interchange of code bits according to an allocation rule when an LDPC code having a code length of 16 k and an encoding rate of 5/6 is modulated by 64 QAM and a multiple b is 2.

FIG. 103 illustrates an example of interchanging of the code bits according to the allocation rule of FIG. 102.

That is, A of FIG. 103 illustrates a first example of interchanging of the code bits according to the allocation rule of FIG. 102, when the LDPC code is an LDPC code in which the code length N is 16200 bits and the encoding rate is 5/6, the modulation method is the 64 QAM, and the multiple b is 2.

When the LDPC code is the LDPC code in which the code length N is 16200 bits and the encoding rate is 5/6, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 103 for example, according to the allocation rule of FIG. 102.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 103 illustrates a second example of interchanging of the code bits according to the allocation rule of FIG. 102, when the LDPC code is an LDPC code in which the code length N is 16200 bits and the encoding rate is 5/6, the modulation method is the 64 QAM, and the multiple b is 2.

According to B of FIG. 103, the interchanging unit 32 performs interchanging to allocate the code bits b0, b1, b2, b3, b4, b5, b6, b7, b8, b9, b10, and b11 to the symbol bits y11, y10, y3, y5, y2, y4, y7, y6, y9, y8, y0, and y1, respectively, with respect to the code bits b0 to b11 of the 6×2 (=mb) bits read from the memory 31, according to the allocation rule of FIG. 102.

Figure 104:
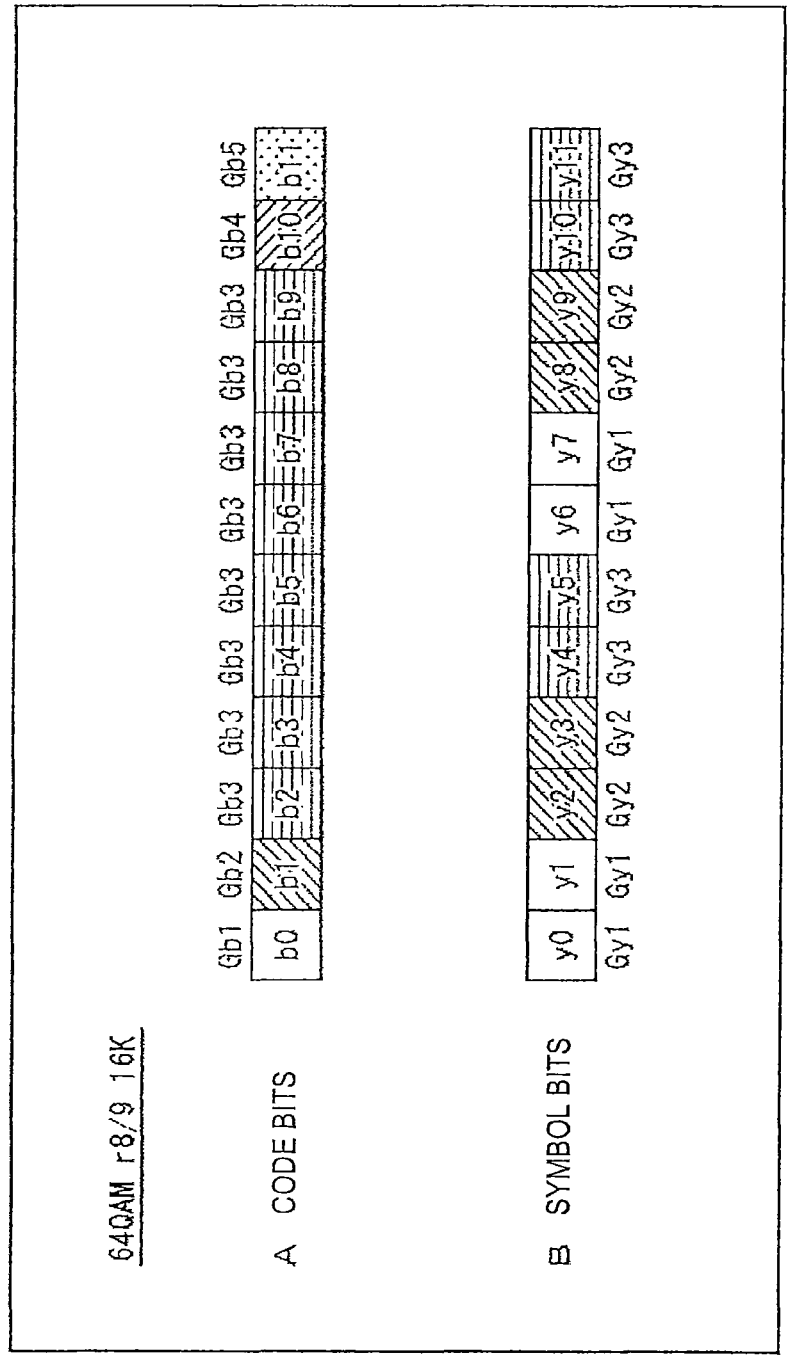
FIG. 104 is an illustration of a code bit group and a symbol bit group when an LDPC code having a code length of 16 k and an encoding rate of 8/9 is modulated by 64 QAM and a multiple b is 2.

FIG. 104 illustrates the code bit group and the symbol bit group when the LDPC code is an LDPC code in which the code length is 16200 bits and the encoding rate is 8/9, the modulation method is the 64 QAM, and the multiple b is 2.

In this case, the code bits of the 6×2 (=mb) bits that are read from the memory 31 can be grouped into five code bit groups Gb1, Gb2, Gb3, Gb4, and Gb5, according to the differences of the error probabilities, as illustrated by A of FIG. 104.

In A of FIG. 104, a code bit b0 belongs to the code bit group Gb1, a code bit b1 belongs to the code bit group Gb2, code bits b2 to b9 belong to the code bit group Gb3, a code bit b10 belongs to the code bit group Gb4, and a code bit b11 belongs to the code bit group Gb5.

When the modulation method is the 64 QAM and the multiple b is 2, the symbol bits of the 6×2 (mb) bits can be grouped into three symbol bit groups Gy1, Gy2, and Gy3, according to the differences of the error probabilities, as illustrated by B of FIG. 104.

In B of FIG. 104, as in B of FIG. 81, symbol bits y0, y1, y6, and y7 belong to the symbol bit group Gy1, symbol bits y2, y3, y8, and y9 belong to the symbol bit group Gy2, and symbol bits y4, y5, y10, and y11 belong to the symbol bit group Gy3.

Figure 105:
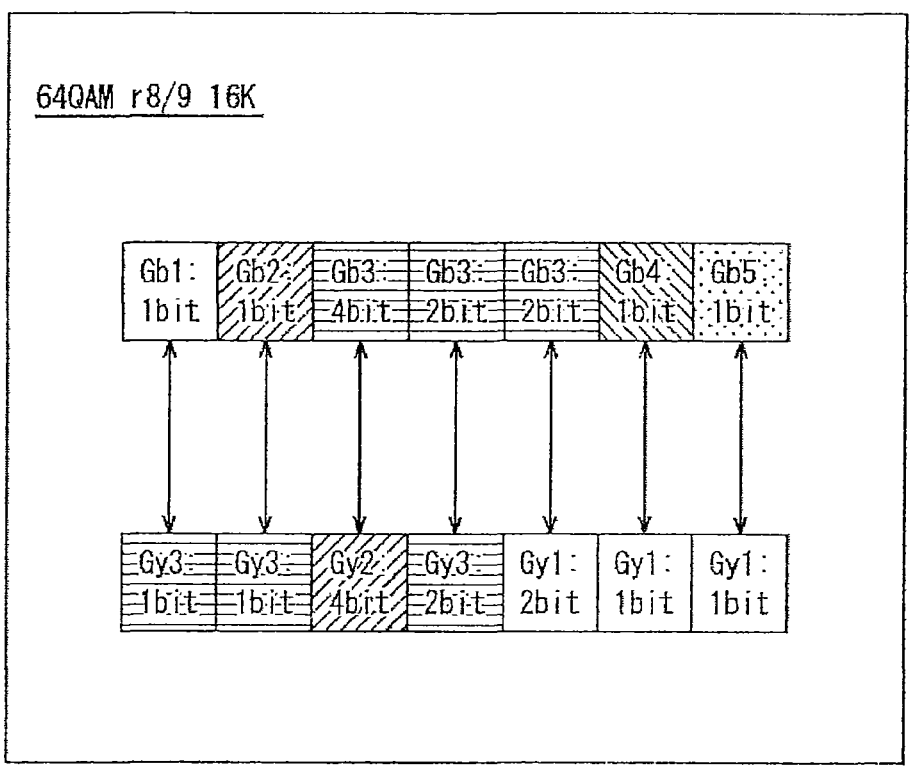
FIG. 105 is an illustration of an allocation rule when an LDPC code having a code length of 16 k and an encoding rate of 8/9 is modulated by 64 QAM and a multiple b is 2.

FIG. 105 illustrates an allocation rule when the LDPC code is an LDPC code in which the code length N is 16200 bits and the encoding rate is 8/9, the modulation method is the 64 QAM, and the multiple b is 2.

In the allocation rule of FIG. 105, the group set information (Gb1, Gy3, 1), (Gb2, Gy3, 1), (Gb3, Gy2, 4), (Gb3, Gy3, 2), (Gb3, Gy1, 2), (Gb4, Gy1, 1), and (Gb5, Gy1, 1) are defined.

That is, in the allocation rule of FIG. 105, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy3 having the third best error probability is defined by the group set information (Gb2, Gy3, 1), allocation of four bits of the code bits of the code bit group Gb3 having the third best error probability to four bits of the symbol bits of the symbol bit group Gy2 having the second best error probability is defined by the group set information (Gb3, Gy2, 4), allocation of two bits of the code bits of the code bit group Gb3 having the third best error probability to two bits of the symbol bits of the symbol bit group Gy3 having the third best error probability is defined by the group set information (Gb3, Gy3, 2), allocation of two bits of the code bits of the code bit group Gb3 having the third best error probability to two bits of the symbol bits of the symbol bit group Gy1 having the best error probability is defined by the group set information (Gb3, Gy1, 2), allocation of one bit of the code bits of the code bit group Gb4 having the fourth best error probability to one bit of the symbol bits of the symbol bit group Gy1 having the best error probability is defined by the group set information (Gb4, Gy1, 1), and allocation of one bit of the code bits of the code bit group Gb5 having the fifth best error probability to one bit of the symbol bits of the symbol bit group Gy1 having the best error probability is defined by the group set information (Gb5, Gy1, 1).

Figure 106:
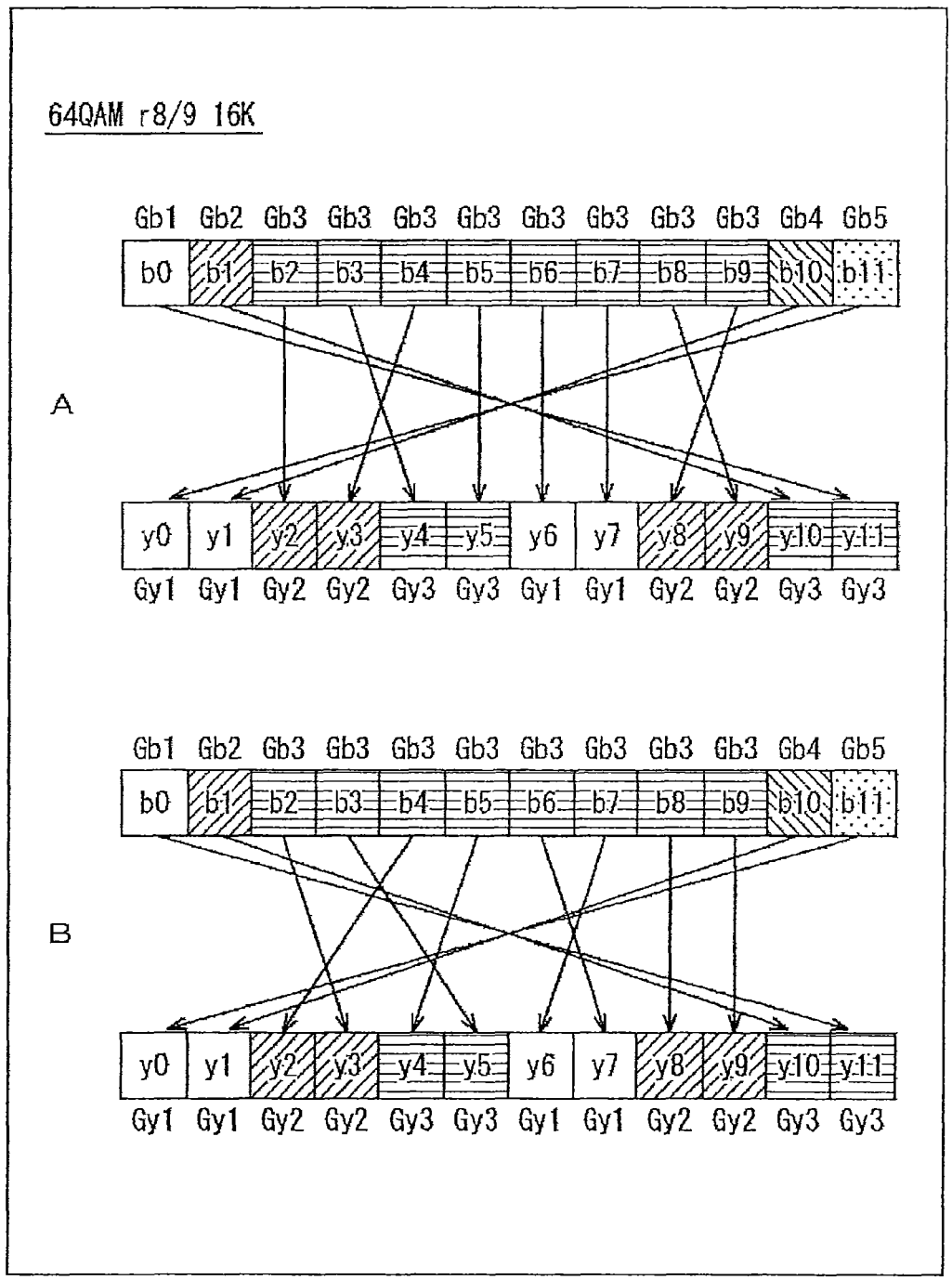
FIG. 106 is an illustration of interchange of code bits according to an allocation rule when an LDPC code having a code length of 16 k and an encoding rate of 8/9 is modulated by 64 QAM and a multiple b is 2.

FIG. 106 illustrates an example of interchanging of the code bits according to the allocation rule of FIG. 105.

That is, A of FIG. 106 illustrates a first example of interchanging of the code bits according to the allocation rule of FIG. 105, when the LDPC code is an LDPC code in which the code length N is 16200 bits and the encoding rate is 8/9, the modulation method is the 64 QAM, and the multiple b is 2.

When the LDPC code is the LDPC code in which the code length N is 16200 bits and the encoding rate is 8/9, the modulation method is the 64 QAM, and the multiple b is 2, in the demultiplexer 25, the code bits written to the memory 31 in which a column direction×a row direction are (16200/(6× 2))×(6×2) bits are read in a unit of 6×2 (=mb) bits in the row direction and are supplied to the interchanging unit 32 (FIGS. 18 and 19).

The interchanging unit 32 interchanges the code bits b0 to b11 of the 6×2 (=mb) bits such that the code bits b0 to b11 of the 6×2 (=mb) bits read from the memory 31 are allocated to the symbol bits y0 to y11 of the 6×2 (=mb) bits of the 2 (=b) symbols, as illustrated in A of FIG. 106 for example, according to the allocation rule of FIG. 105.

That is, the interchanging unit 32 performs interchanging to allocate the code bits b0, b1, b2, b3, b4, b5, b6, b7, b8, b9, b10, and b11 to the symbol bits y11, y10, y2, y4, y3, y5, y6, y7, y9, y8, y1, and y0, respectively.

B of FIG. 106 illustrates a second example of interchanging of the code bits according to the allocation rule of FIG. 105, when the LDPC code is an LDPC code in which the code length N is 16200 bits and the encoding rate is 8/9, the modulation method is the 64 QAM, and the multiple b is 2.

According to B of FIG. 106, the interchanging unit 32 performs interchanging to allocate the code bits b0, b1, b2, b3, b4, b5, b6, b7, b8, b9, b10, and b11 to the symbol bits y11, y10, y3, y5, y2, y4, y7, y6, y8, y9, y1, and y0, respectively, with respect to the code bits b0 to b11 of the 6×2 (=mb) bits read from the memory 31, according to the allocation rule of FIG. 105.

Figure 107:
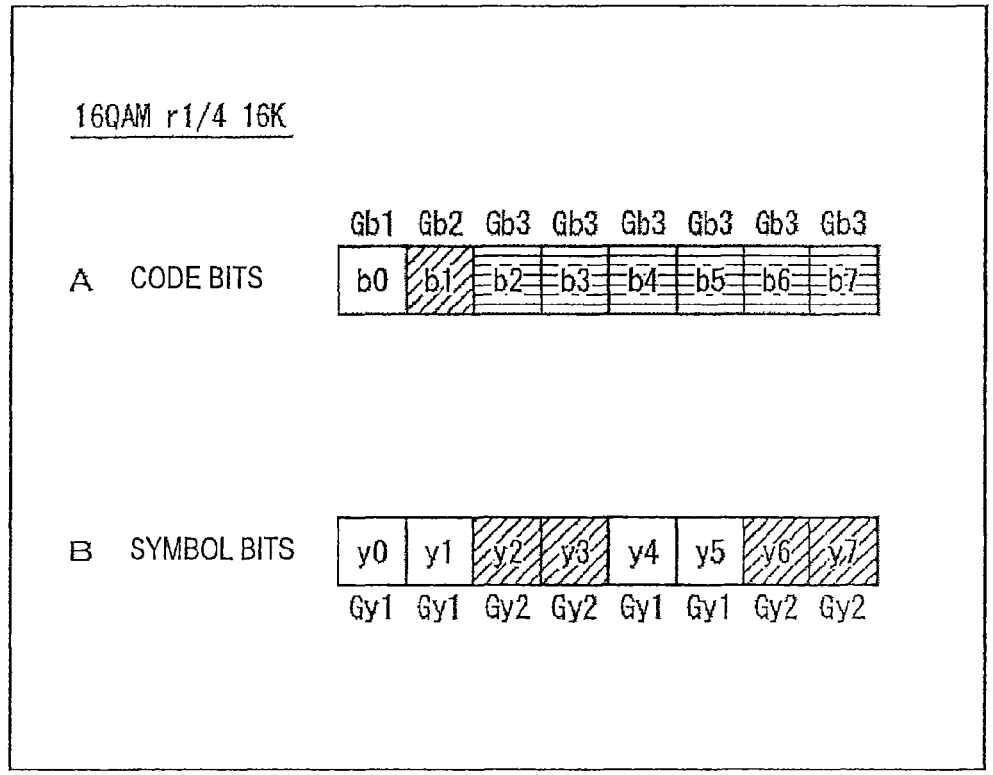
FIG. 107 is an illustration of a code bit group and a symbol bit group when an LDPC code having a code length of 16 k and an encoding rate of 1/4 is modulated by 16 QAM and a multiple b is 2.

FIG. 107 illustrates the code bit group and the symbol bit group when the LDPC code is an LDPC code in which the code length is 16200 bits and the encoding rate is 1/4, the modulation method is the 16 QAM, and the multiple b is 2.

In this case, the code bits of the 4×2 (=mb) bits that are read from the memory 31 can be grouped into there code bit groups Gb1, Gb2, and Gb3, according to the differences of the error probabilities, as illustrated by A of FIG. 107.

In A of FIG. 107, a code bit b0 belongs to the code bit group Gb1, a code bit b1 belongs to the code bit group Gb2, and code bits b2 to b7 belong to the code bit group Gb3.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 107.

In B of FIG. 107, symbol bits y0, y1, y4, and y5 belong to the symbol bit group Gy1, and symbol bits y2, y3, y6, and y7 belong to the symbol bit group Gy2.

Figure 108:
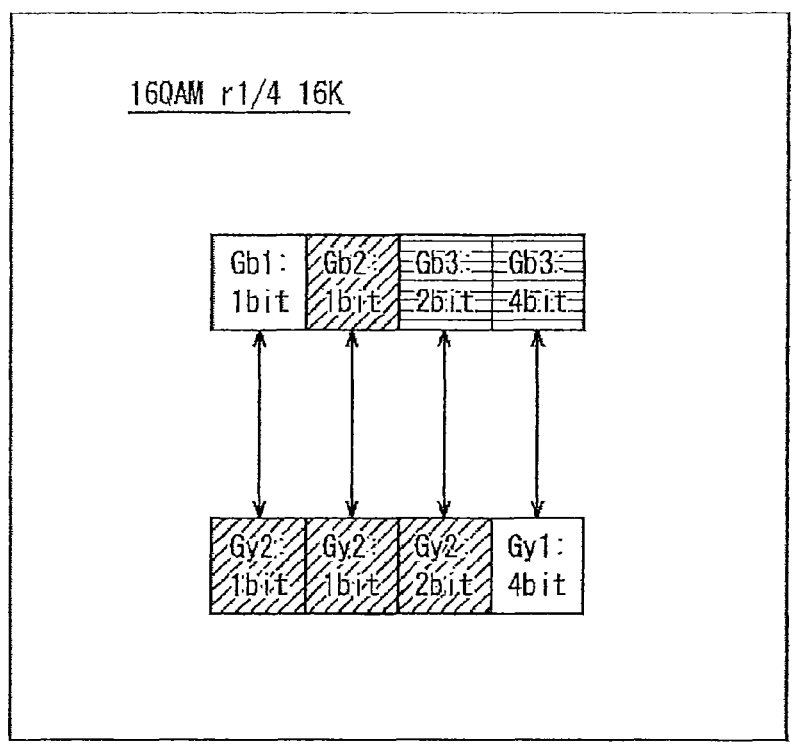
FIG. 108 is an illustration of an allocation rule when an LDPC code having a code length of 16 k and an encoding rate of 1/4 is modulated by 16 QAM and a multiple b is 2.

FIG. 108 illustrates an allocation rule when the LDPC code is an LDPC code in which the code length N is 16200 bits and the encoding rate is 1/4, the modulation method is the 16 QAM, and the multiple b is 2.

In the allocation rule of FIG. 108, the group set information (Gb1, Gy2, 1), (Gb2, Gy2, 1), (Gb3, Gy2, 2), and (Gb3, Gy1, 4) are defined.

That is, in the allocation rule of FIG. 108, allocation of one bit of the code bits of the code bit group Gb1 having the best error probability to one bit of the symbol bits of the symbol bit group Gy2 having the second best error probability is defined by the group set information (Gb1, Gy2, 1), allocation of one bit of the code bits of the code bit group Gb2 having the second best error probability to one bit of the symbol bits of the symbol bit group Gy2 having the second best error probability is defined by the group set information (Gb2, Gy2, 1), allocation of two bits of the code bits of the code bit group Gb3 having the third best error probability to two bits of the symbol bits of the symbol bit group Gy2 having the second best error probability is defined by the group set information (Gb3, Gy2, 2), and allocation of four bits of the code bits of the code bit group Gb3 having the third best error probability to four bits of the symbol bits of the symbol bit group Gy1 having the best error probability is defined by the group set information (Gb3, Gy1, 4).

Figure 109:
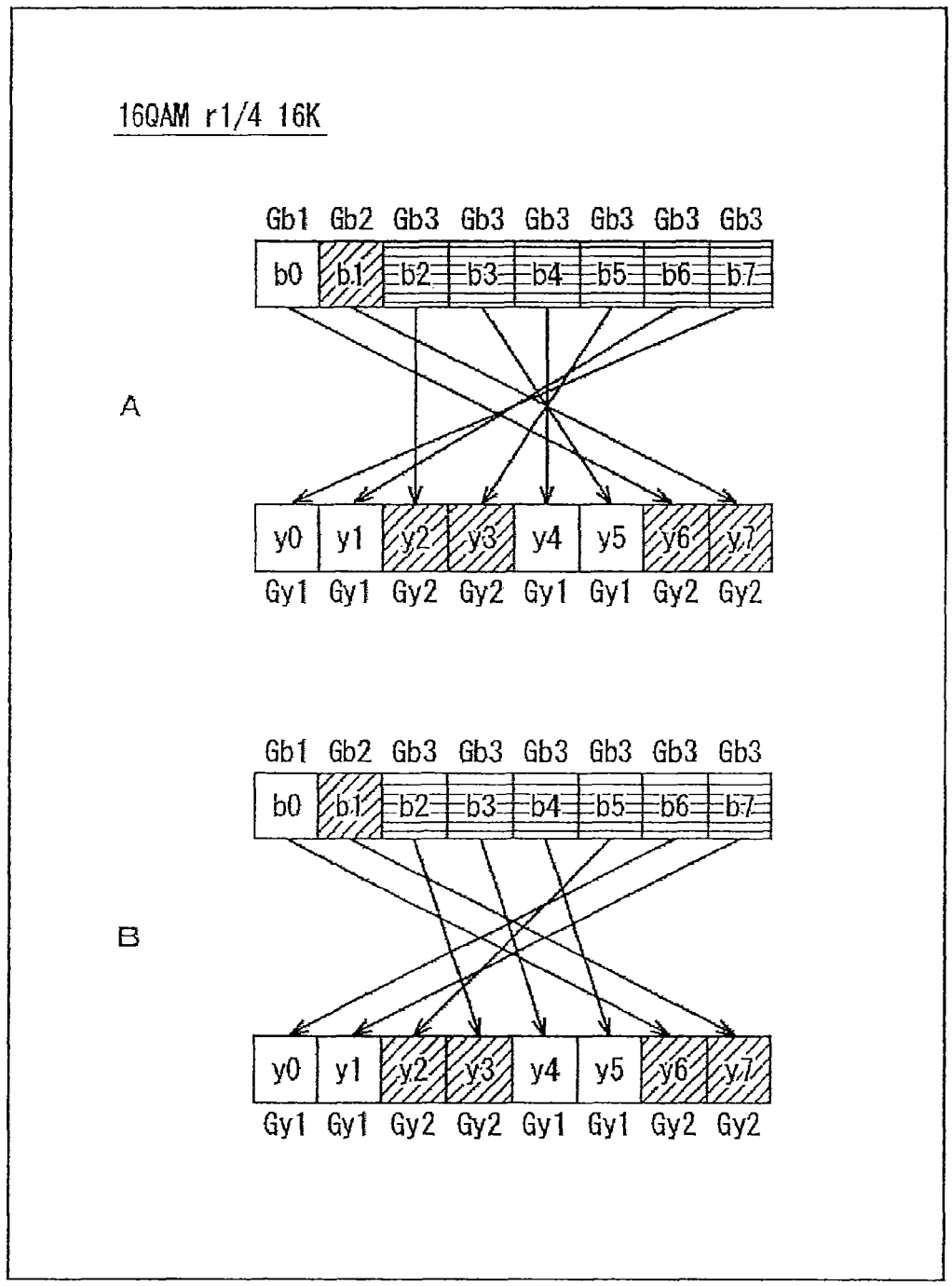
FIG. 109 is an illustration of interchange of code bits according to an allocation rule when an LDPC code having a code length of 16 k and an encoding rate of 1/4 is modulated by 16 QAM and a multiple b is 2.

FIG. 109 illustrates an example of interchanging of the code bits according to the allocation rule of FIG. 108.

That is, A of FIG. 109 illustrates a first example of interchanging of the code bits according to the allocation rule of FIG. 108, when the LDPC code is an LDPC code in which the code length N is 16200 bits and the encoding rate is 1/4, the modulation method is the 16 QAM, and the multiple b is 2.

When the LDPC code is the LDPC code in which the code length N is 16200 bits and the encoding rate is 1/4, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 109 for example, according to the allocation rule of FIG. 108.

That is, the interchanging unit 32 performs interchanging to allocate the code bits b0, b1, b2, b3, b4, b5, b6, and b7 to the symbol bits y6, y7, y2, y5, y4, y3, y1, and y0, respectively.

B of FIG. 109 illustrates a second example of interchanging of the code bits according to the allocation rule of FIG. 108, when the LDPC code is an LDPC code in which the code length N is 16200 bits and the encoding rate is 1/4, the modulation method is the 16 QAM, and the multiple b is 2.

According to B of FIG. 109, the interchanging unit 32 performs interchanging to allocate the code bits b0, b1, b2, b3, b4, b5, b6, and b7 to the symbol bits y6, y7, y3, y4, y5, y2, y0, and y1, respectively, with respect to the code bits b0 to b7 of the 4×2 (=mb) bits read from the memory 31, according to the allocation rule of FIG. 108.

Figure 110:
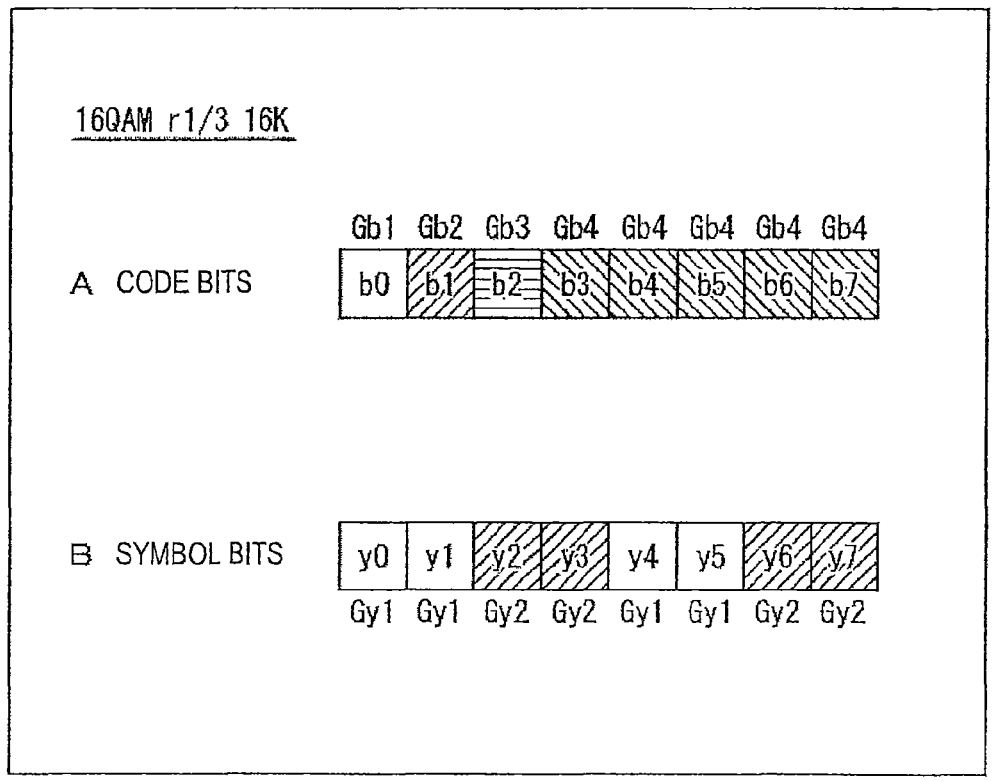
FIG. 110 is an illustration of a code bit group and a symbol bit group when an LDPC code having a code length of 16 k and an encoding rate of 1/3 is modulated by 16 QAM and a multiple b is 2.

FIG. 110 illustrates the code bit group and the symbol bit group when the LDPC code is an LDPC code in which the code length is 16200 bits and the encoding rate is 1/3, the modulation method is the 16 QAM, and the multiple b is 2.

In this case, the code bits of the 4×2 (=mb) bits that are read from the memory 31 can be grouped into four code bit groups Gb1, Gb2, Gb3, and Gb4, according to the differences of the error probabilities, as illustrated by A of FIG. 110.

In A of FIG. 110, a code bit b0 belongs to the code bit group Gb1, a code bit b1 belongs to the code bit group Gb2, a code bit b2 belongs to the code bit group Gb3, and code bits b3 to b7 belong to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 110.

In B of FIG. 110, as in B of FIG. 107, symbol bits y0, y1, y4, and y5 belong to the symbol bit group Gy1, and symbol bits y2, y3, y6, and y7 belong to the symbol bit group Gy2.

Figure 111:
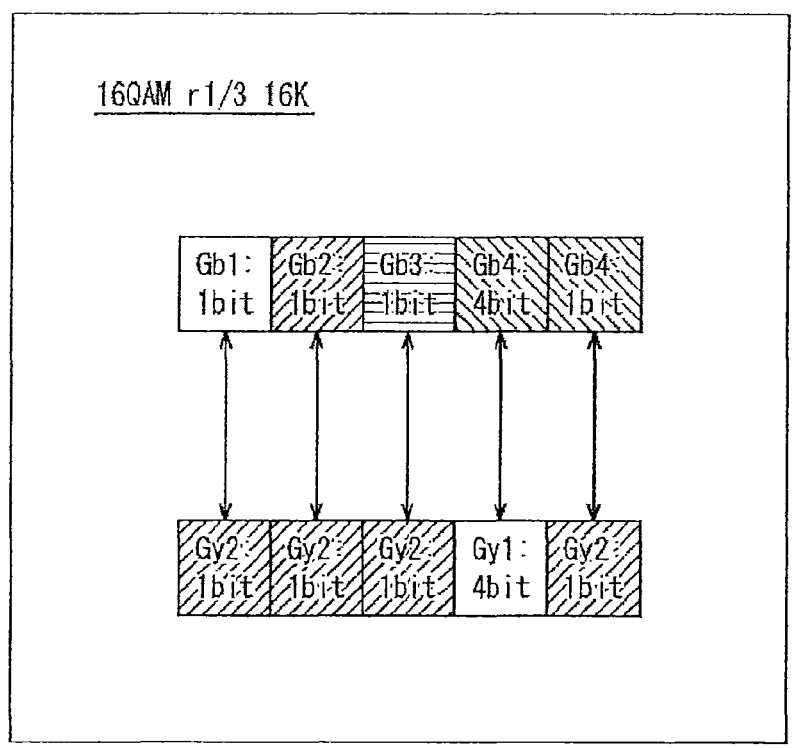
FIG. 111 is an illustration of an allocation rule when an LDPC code having a code length of 16 k and an encoding rate of 1/3 is modulated by 16 QAM and a multiple b is 2.

FIG. 111 illustrates an allocation rule when the LDPC code is an LDPC code in which the code length N is 16200 bits and the encoding rate is 1/3, the modulation method is the 16 QAM, and the multiple b is 2.

In the allocation rule of FIG. 111, the group set information (Gb1, Gy2, 1), (Gb2, Gy2, 1), (Gb3, Gy2, 1), (Gb4, Gy1, 4), and (Gb4, Gy2, 1) are defined.

That is, in the allocation rule of FIG. 111, allocation of one bit of the code bits of the code bit group Gb1 having the best error probability to one bit of the symbol bits of the symbol bit group Gy2 having the second best error probability is defined by the group set information (Gb1, Gy2, 1), allocation of one bit of the code bits of the code bit group Gb2 having the second best error probability to one bit of the symbol bits of the symbol bit group Gy2 having the second best error probability is defined by the group set information (Gb2, Gy2, 1), allocation of one bit of the code bits of the code bit group Gb3 having the third best error probability to one bit of the symbol bits of the symbol bit group Gy2 having the second best error probability is defined by the group set information (Gb3, Gy2, 1), allocation of four bits of the code bits of the code bit group Gb4 having the fourth best error probability to four bits of the symbol bits of the symbol bit group Gy1 having the best error probability is defined by the group set information (Gb4, Gy1, 4), and allocation of one bit of the code bits of the code bit group Gb4 having the fourth best error probability to one bit of the symbol bits of the symbol bit group Gy2 having the second best error probability is defined by the group set information (Gb4, Gy2, 1).

Figure 112:
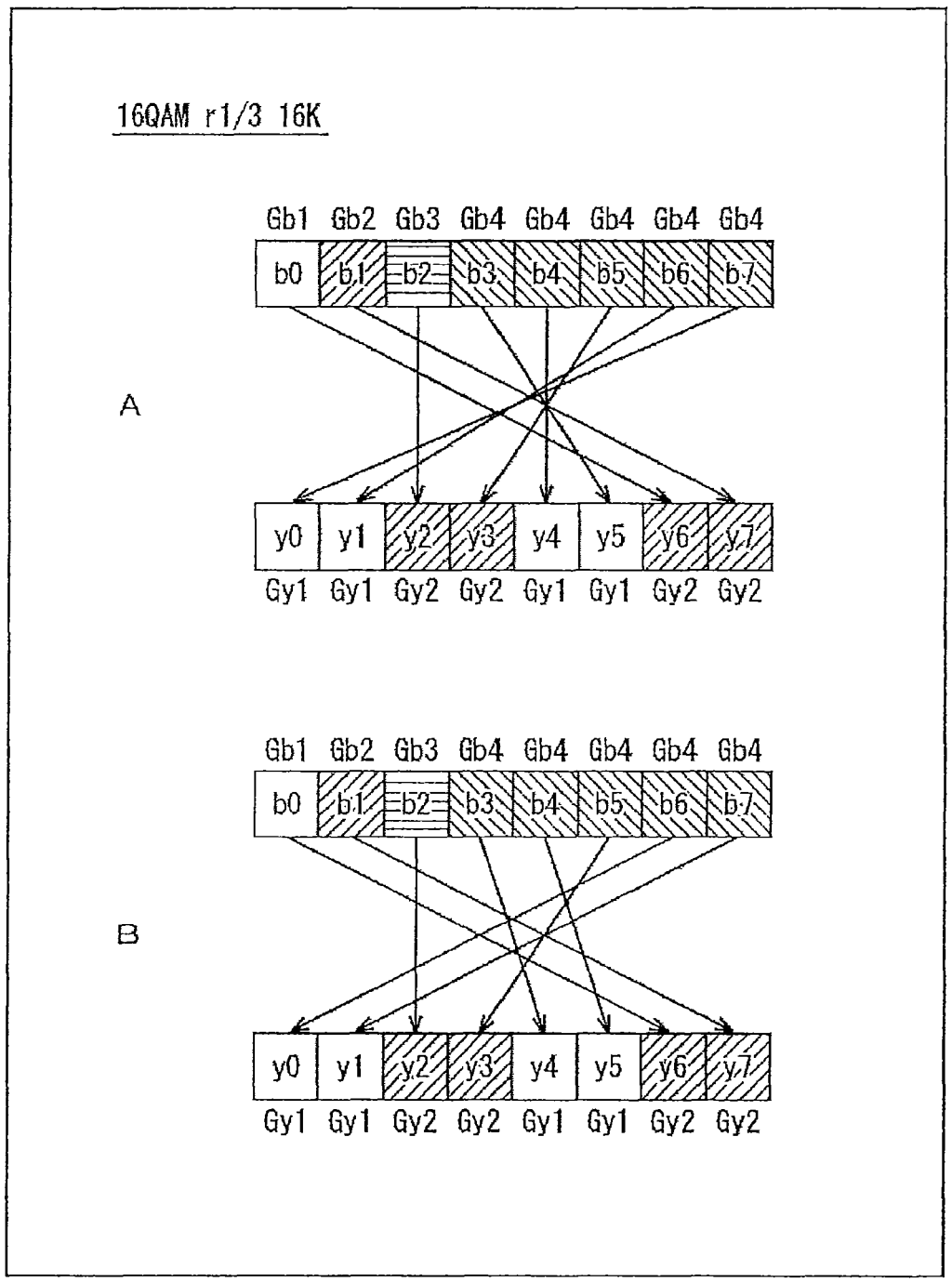
FIG. 112 is an illustration of interchange of code bits according to an allocation rule when an LDPC code having a code length of 16 k and an encoding rate of 1/3 is modulated by 16 QAM and a multiple b is 2.

FIG. 112 illustrates an example of interchanging of the code bits according to the allocation rule of FIG. 111.

That is, A of FIG. 112 illustrates a first example of interchanging of the code bits according to the allocation rule of FIG. 111, when the LDPC code is an LDPC code in which the code length N is 16200 bits and the encoding rate is 1/3, the modulation method is the 16 QAM, and the multiple b is 2.

When the LDPC code is the LDPC code in which the code length N is 16200 bits and the encoding rate is 1/3, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 112 for example, according to the allocation rule of FIG. 111.

That is, the interchanging unit 32 performs interchanging to allocate the code bits b0, b1, b2, b3, b4, b5, b6, and b7 to the symbol bits y6, y7, y2, y5, y4, y3, y1, and y0, respectively.

B of FIG. 112 illustrates a second example of interchanging of the code bits according to the allocation rule of FIG. 111, when the LDPC code is an LDPC code in which the code length N is 16200 bits and the encoding rate is 1/3, the modulation method is the 16 QAM, and the multiple b is 2.

According to B of FIG. 112, the interchanging unit 32 performs interchanging to allocate the code bits b0, b1, b2, b3, b4, b5, b6, and b7 to the symbol bits y6, y7, y2, y4, y5, y3, y0, and y1, respectively, with respect to the code bits b0 to b7 of the 4×2 (=mb) bits read from the memory 31, according to the allocation rule of FIG. 111.

Figure 113:
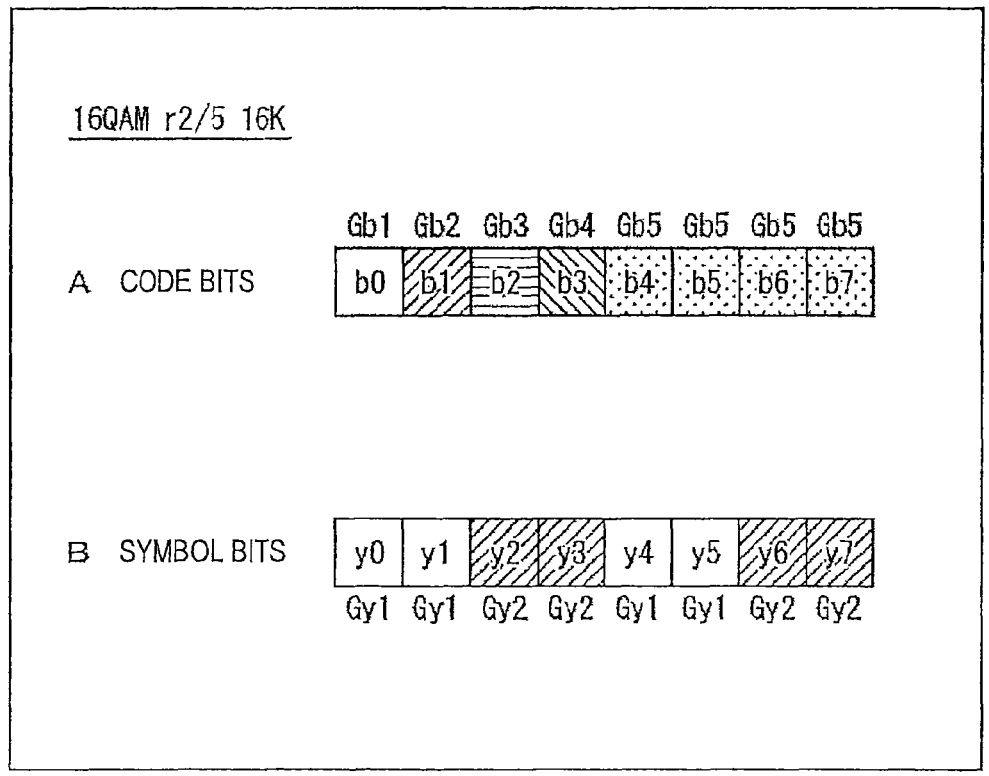
FIG. 113 is an illustration of a code bit group and a symbol bit group when an LDPC code having a code length of 16 k and an encoding rate of 2/5 is modulated by 16 QAM and a multiple b is 2.

FIG. 113 illustrates the code bit group and the symbol bit group when the LDPC code is an LDPC code in which the code length is 16200 bits and the encoding rate is 2/5, the modulation method is the 16 QAM, and the multiple b is 2.

In this case, the code bits of the 4×2 (=mb) bits that are read from the memory 31 can be grouped into five code bit groups Gb1, Gb2, Gb3, Gb4, and Gb5, according to the differences of the error probabilities, as illustrated by A of FIG. 113.

In A of FIG. 113, a code bit b0 belongs to the code bit group Gb1, a code bit b1 belongs to the code bit group Gb2, a code bit b2 belongs to the code bit group Gb3, a code bit b3 belongs to the code bit group Gb4, and code bits b4 to b7 belong to the code bit group Gb5.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 113.

In B of FIG. 113, as in B of FIG. 107, symbol bits y0, y1, y4, and y5 belong to the symbol bit group Gy1, and symbol bits y2, y3, y6, and y7 belong to the symbol bit group Gy2.

Figure 114:
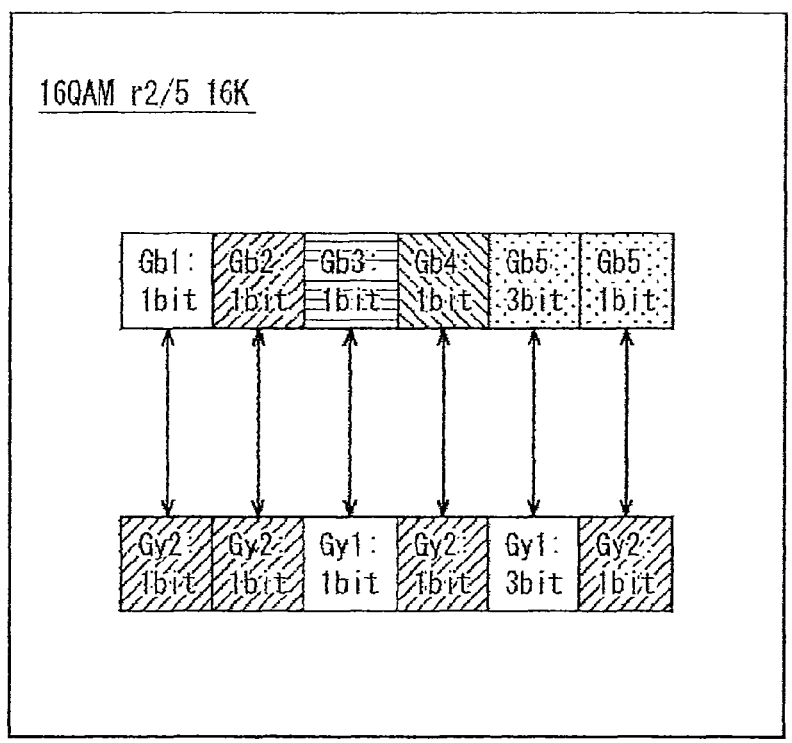
FIG. 114 is an illustration of an allocation rule when an LDPC code having a code length of 16 k and an encoding rate of 2/5 is modulated by 16 QAM and a multiple b is 2.

FIG. 114 illustrates an allocation rule when the LDPC code is an LDPC code in which the code length N is 16200 bits and the encoding rate is 2/5, the modulation method is the 16 QAM, and the multiple b is 2.

In the allocation rule of FIG. 114, the group set information (Gb1, Gy2, 1), (Gb2, Gy2, 1), (Gb3, Gy1, 1), (Gb4, Gy2, 1), (Gb5, Gy1, 3), and (Gb5, Gy2, 1) are defined.

That is, in the allocation rule of FIG. 114, allocation of one bit of the code bits of the code bit group Gb1 having the best error probability to one bit of the symbol bits of the symbol bit group Gy2 having the second best error probability is defined by the group set information (Gb1, Gy2, 1), allocation of one bit of the code bits of the code bit group Gb2 having the second best error probability to one bit of the symbol bits of the symbol bit group Gy2 having the second best error probability is defined by the group set information (Gb2, Gy2, 1), allocation of one bit of the code bits of the code bit group Gb3 having the third best error probability to one bit of the symbol bits of the symbol bit group Gy1 having the best error probability is defined by the group set information (Gb3, Gy1, 1), allocation of one bit of the code bits of the code bit group Gb4 having the fourth best error probability to one bit of the symbol bits of the symbol bit group Gy2 having the second best error probability is defined by the group set information (Gb4, Gy2, 1), allocation of three bits of the code bits of the code bit group Gb5 having the fifth best error probability to three bits of the symbol bits of the symbol bit group Gy1 having the best error probability is defined by the group set information (Gb5, Gy1, 3), and allocation of one bit of the code bits of the code bit group Gb5 having the fifth best error probability to on ebits of the symbol bits of the symbol bit group Gy2 having the second best error probability is defined by the group set information (Gb5, Gy2, 1).

Figure 115:
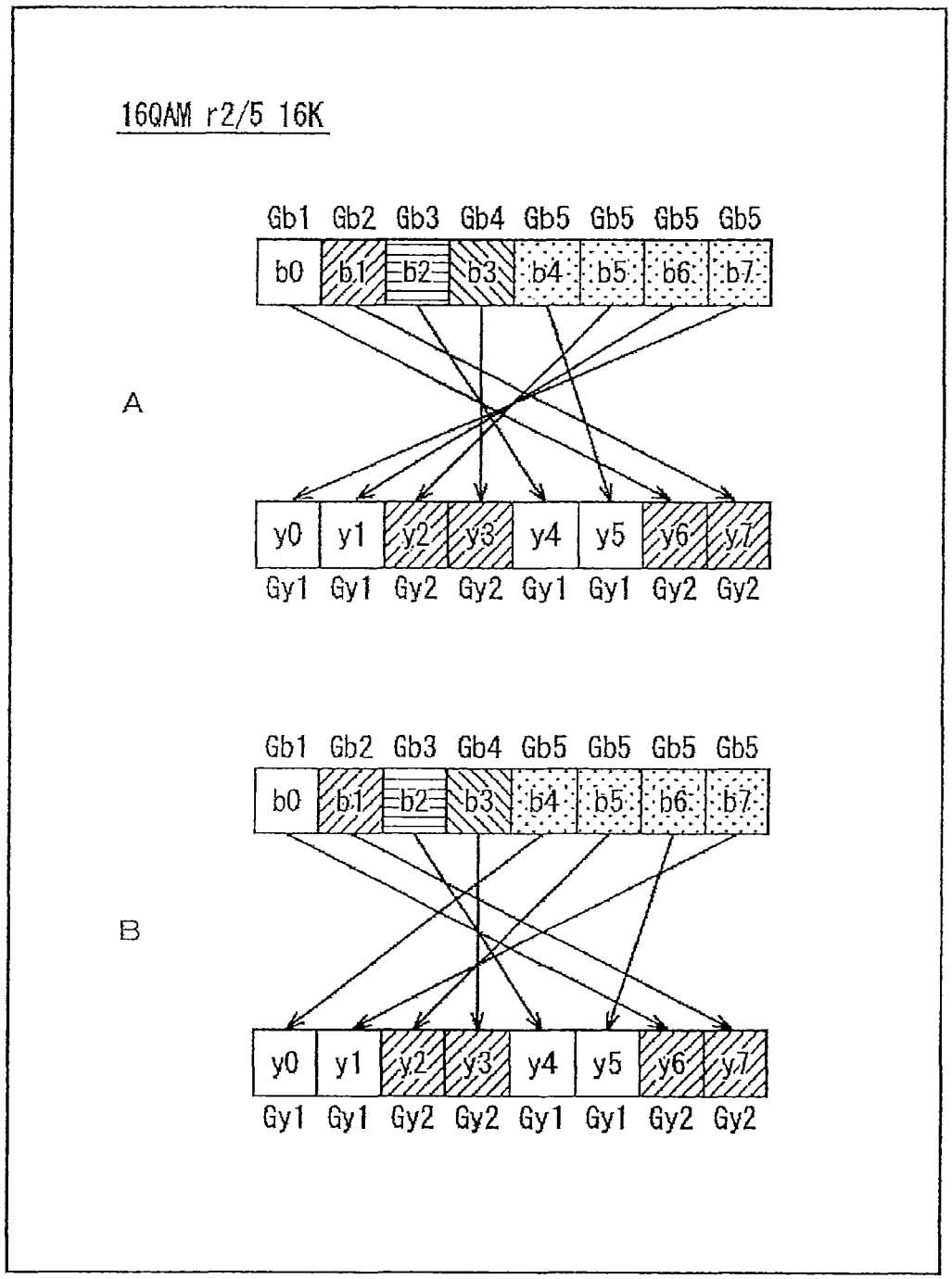
FIG. 115 is an illustration of interchange of code bits according to an allocation rule when an LDPC code having a code length of 16 k and an encoding rate of 2/5 is modulated by 16 QAM and a multiple b is 2.

FIG. 115 illustrates an example of interchanging of the code bits according to the allocation rule of FIG. 114.

That is, A of FIG. 115 illustrates a first example of interchanging of the code bits according to the allocation rule of FIG. 114, when the LDPC code is an LDPC code in which the code length N is 16200 bits and the encoding rate is 2/5, the modulation method is the 16 QAM, and the multiple b is 2.

When the LDPC code is the LDPC code in which the code length N is 16200 bits and the encoding rate is 2/5, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 115 for example, according to the allocation rule of FIG. 114.

That is, the interchanging unit 32 performs interchanging to allocate the code bits b0, b1, b2, b3, b4, b5, b6, and b7 to the symbol bits y6, y7, y4, y3, y5, y2, y1, and y0, respectively.

B of FIG. 115 illustrates a second example of interchanging of the code bits according to the allocation rule of FIG. 114, when the LDPC code is an LDPC code in which the code length N is 16200 bits and the encoding rate is 2/5, the modulation method is the 16 QAM, and the multiple b is 2.

According to B of FIG. 115, the interchanging unit 32 performs interchanging to allocate the code bits b0, b1, b2, b3, b4, b5, b6, and b7 to the symbol bits y6, y7, y4, y3, y0, y2, y5, and y1, respectively, with respect to the code bits b0 to b7 of the 4×2 (=mb) bits read from the memory 31, according to the allocation rule of FIG. 114.

Figure 116:
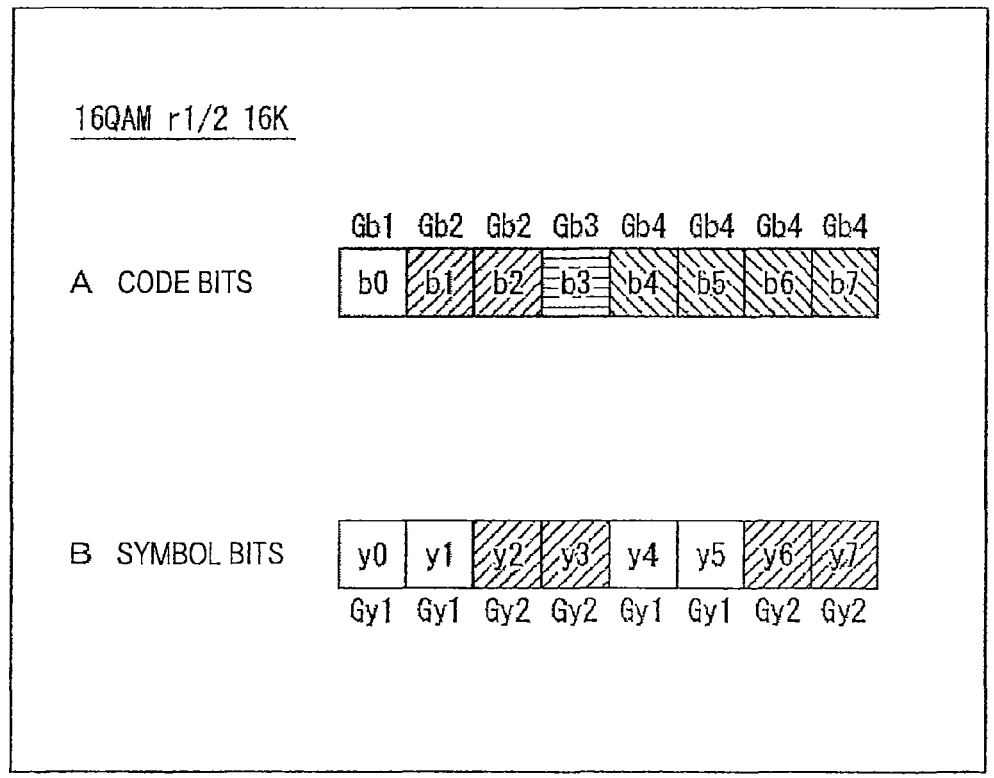
FIG. 116 is an illustration of a code bit group and a symbol bit group when an LDPC code having a code length of 16 k and an encoding rate of 1/2 is modulated by 16 QAM and a multiple b is 2.

FIG. 116 illustrates the code bit group and the symbol bit group when the LDPC code is an LDPC code in which the code length is 16200 bits and the encoding rate is 1/2, the modulation method is the 16 QAM, and the multiple b is 2.

In this case, the code bits of the 4×2 (=mb) bits that are read from the memory 31 can be grouped into four code bit groups Gb1, Gb2, Gb3, and Gb4, according to the differences of the error probabilities, as illustrated by A of FIG. 116.

In A of FIG. 116, a code bit b0 belongs to the code bit group Gb1, code bits b1 and b2 belong to the code bit group Gb2, a code bit b3 belongs to the code bit group Gb3, and code bits b4 to b7 belong to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 116.

In B of FIG. 116, as in B of FIG. 107, symbol bits y0, y1, y4, and y5 belong to the symbol bit group Gy1, and symbol bits y2, y3, y6, and y7 belong to the symbol bit group Gy2.

Figure 117:
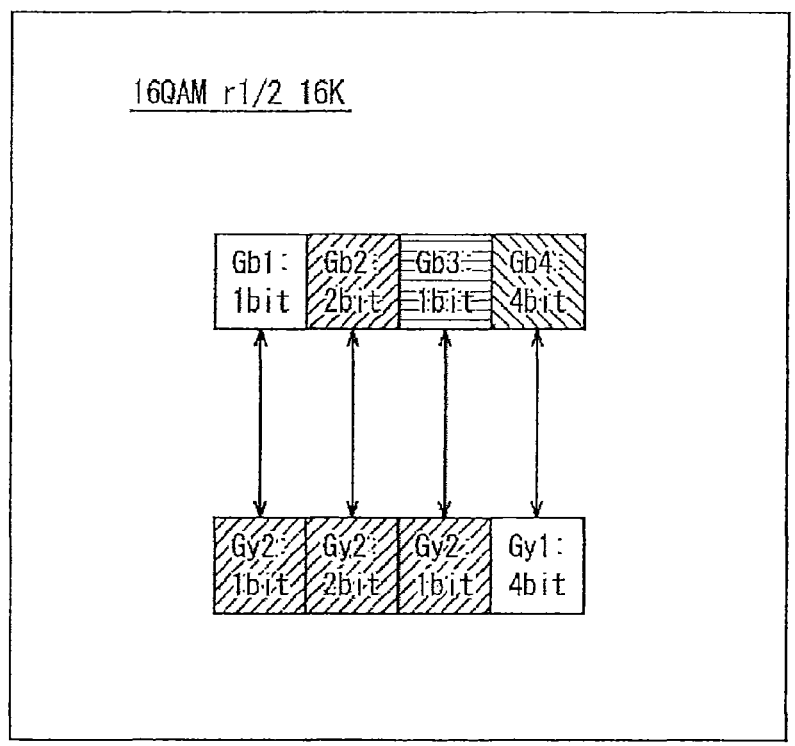
FIG. 117 is an illustration of an allocation rule when an LDPC code having a code length of 16 k and an encoding rate of 1/2 is modulated by 16 QAM and a multiple b is 2.

FIG. 117 illustrates an allocation rule when the LDPC code is an LDPC code in which the code length N is 16200 bits and the encoding rate is 1/2, the modulation method is the 16 QAM, and the multiple b is 2.

In the allocation rule of FIG. 117, the group set information (Gb1, Gy2, 1), (Gb2, Gy2, 2), (Gb3, Gy2, 1), and (Gb4, Gy1, 4) are defined.

That is, in the allocation rule of FIG. 117, allocation of one bit of the code bits of the code bit group Gb1 having the best error probability to one bit of the symbol bits of the symbol bit group Gy2 having the second best error probability is defined by the group set information (Gb1, Gy2, 1), allocation of two bits of the code bits of the code bit group Gb2 having the second best error probability to two bits of the symbol bits of the symbol bit group Gy2 having the second best error probability is defined by the group set information (Gb2, Gy2, 2), allocation of one bit of the code bits of the code bit group Gb3 having the third best error probability to one bit of the symbol bits of the symbol bit group Gy2 having the second best error probability is defined by the group set information (Gb3, Gy2, 1), and allocation of four bits of the code bits of the code bit group Gb4 having the fourth best error probability to four bits of the symbol bits of the symbol bit group Gy1 having the best error probability is defined by the group set information (Gb4, Gy1, 4).

Figure 118:
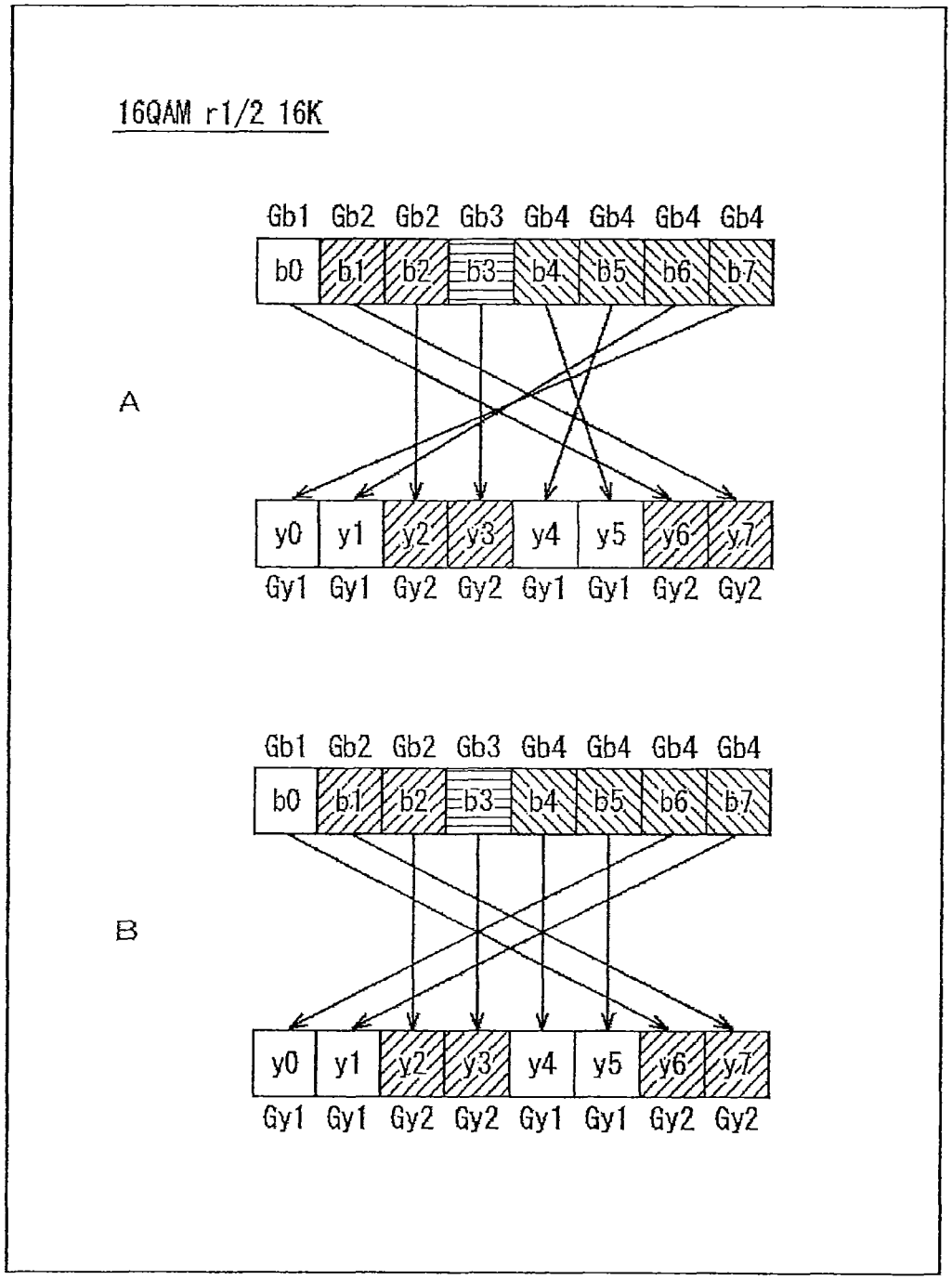
FIG. 118 is an illustration of interchange of code bits according to an allocation rule when an LDPC code having a code length of 16 k and an encoding rate of 1/2 is modulated by 16 QAM and a multiple b is 2.

FIG. 118 illustrates an example of interchanging of the code bits according to the allocation rule of FIG. 117.

That is, A of FIG. 118 illustrates a first example of interchanging of the code bits according to the allocation rule of FIG. 117, when the LDPC code is an LDPC code in which the code length N is 16200 bits and the encoding rate is 1/2, the modulation method is the 16 QAM, and the multiple b is 2.

When the LDPC code is the LDPC code in which the code length N is 16200 bits and the encoding rate is 1/2, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 118 for example, according to the allocation rule of FIG. 117.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 118 illustrates a second example of interchanging of the code bits according to the allocation rule of FIG. 117, when the LDPC code is an LDPC code in which the code length N is 16200 bits and the encoding rate is 1/2, the modulation method is the 16 QAM, and the multiple b is 2.

According to B of FIG. 118, the interchanging unit 32 performs interchanging to allocate the code bits b0, b1, b2, b3, b4, b5, b6, and b7 to the symbol bits y6, y7, y2, y3, y4, y5, y0, and y1, respectively, with respect to the code bits b0 to b7 of the 4×2 (=mb) bits read from the memory 31, according to the allocation rule of FIG. 117.

Figure 119:
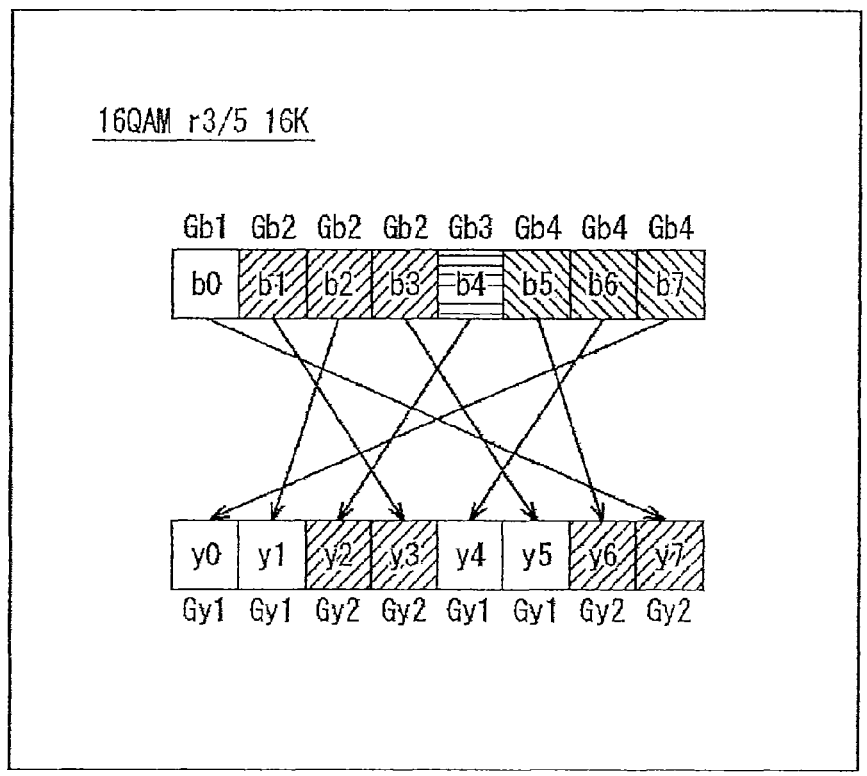
FIG. 119 is an illustration of interchange of code bits when an LDPC code having a code length of 16 k and an encoding rate of 3/5 is modulated by 16 QAM and a multiple b is 2.

FIG. 119 illustrates an example of interchanging of the code bits, when the LDPC code is an LDPC code in which the code length N is 16200 bits and the encoding rate is 3/5, the modulation method is the 16 QAM, and the multiple b is 2.

When the LDPC code is the LDPC code in which the code length N is 16200 bits and the encoding rate is 3/5, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in FIG. 119.

That is, the interchanging unit 32 performs interchanging to allocate the code bits b0, b1, b2, b3, b4, b5, b6, and b7 to the symbol bits y7, y3, y1, y5, y2, y6, y4, and y0, respectively.

In this case, the interchanging of FIG. 119 is matched with interchanging defined in the DVB-T.2, when the LDPC code is an LDPC code in which the code length N is 16200 bits and the encoding rate is 3/5 and the modulation method is the 16 QAM.

Therefore, when the LDPC code is the LDPC code in which the code length N is 16200 bits and the encoding rate is 3/5 and the modulation method is the 16 QAM, in the interchanging unit 32, the same interchanging as the interchanging defined in the DVB-T.2 is performed.

Figure 120:
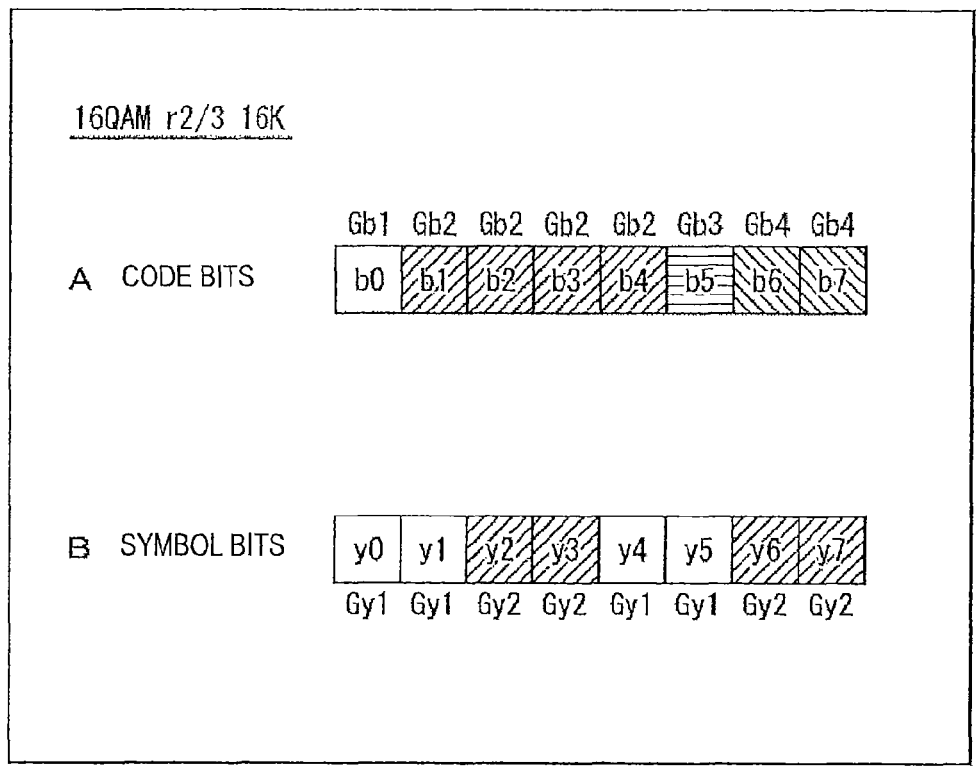

FIG. 120 illustrates the code bit group and the symbol bit group when the LDPC code is an LDPC code in which the code length is 16200 bits and the encoding rate is 2/3, the modulation method is the 16 QAM, and the multiple b is 2.

In this case, the code bits of the 4×2 (=mb) bits that are read from the memory 31 can be grouped into four code bit groups Gb1, Gb2, Gb3, and Gb4, according to the differences of the error probabilities, as illustrated by A of FIG. 120.

In A of FIG. 120, a code bit b0 belongs to the code bit group Gb1, code bits b1 to b4 belong to the code bit group Gb2, code bits b5 belongs to the code bit group Gb3, and code bits b5 and b7 belong to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 120.

In B of FIG. 120, as in B of FIG. 107, s symbol bits y0, y1, y4, and y5 belong to the symbol bit group Gy1, and symbol bits y2, y3, y6, and y7 belong to the symbol bit group Gy2.

Figure 121:
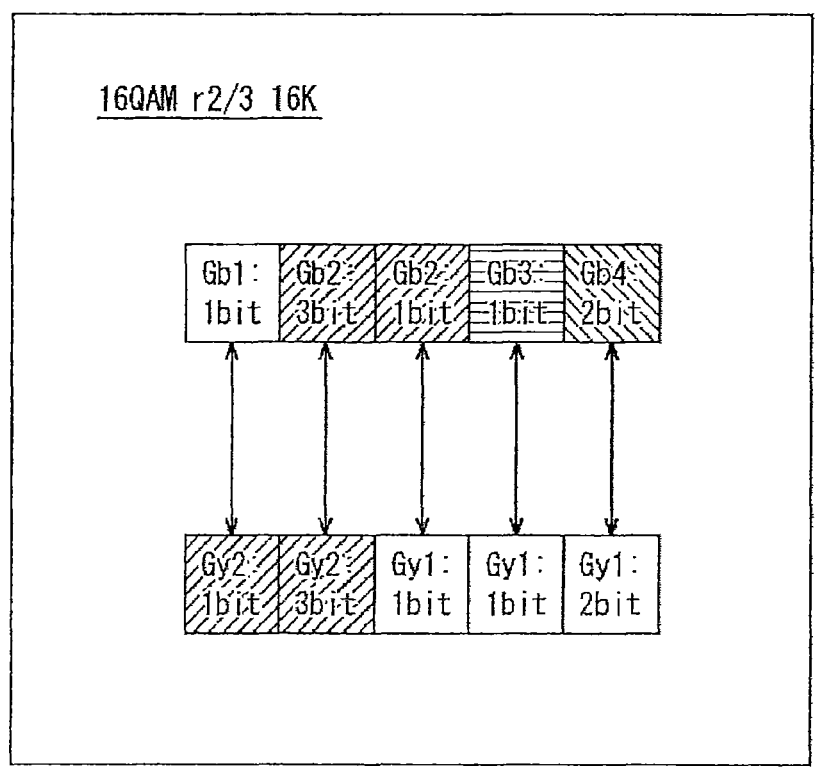

FIG. 121 illustrates an allocation rule when the LDPC code is an LDPC code in which the code length N is 16200 bits and the encoding rate is 2/3, the modulation method is the 16 QAM, and the multiple b is 2.

In the allocation rule of FIG. 121, the group set information (Gb1, Gy2, 1), (Gb2, Gy2, 3), (Gb2, Gy1, 1), (Gb3, Gy1, 1), and (Gb4, Gy1, 2) are defined.

That is, in the allocation rule of FIG. 121, allocation of one bit of the code bits of the code bit group Gb1 having the best error probability to one bit of the symbol bits of the symbol bit group Gy2 having the second best error probability is defined by the group set information (Gb1, Gy2, 1), allocation of three bits of the code bits of the code bit group Gb2 having the second best error probability to three bits of the symbol bits of the symbol bit group Gy2 having the second best error probability is defined by the group set information (Gb2, Gy2, 3), allocation of one bit of the code bits of the code bit group Gb2 having the second best error probability to one bit of the symbol bits of the symbol bit group Gy1 having the best error probability is defined by the group set information (Gb2, Gy1, 1), allocation of one bit of the code bits of the code bit group Gb3 having the third best error probability to one bit of the symbol bits of the symbol bit group Gy1 having the best error probability is defined by the group set information (Gb3, Gy1, 1), and allocation of two bits of the code bits of the code bit group Gb4 having the fourth best error probability to two bits of the symbol bits of the symbol bit group Gy1 having the best error probability is defined by the group set information (Gb4, Gy1, 2).

Figure 122:
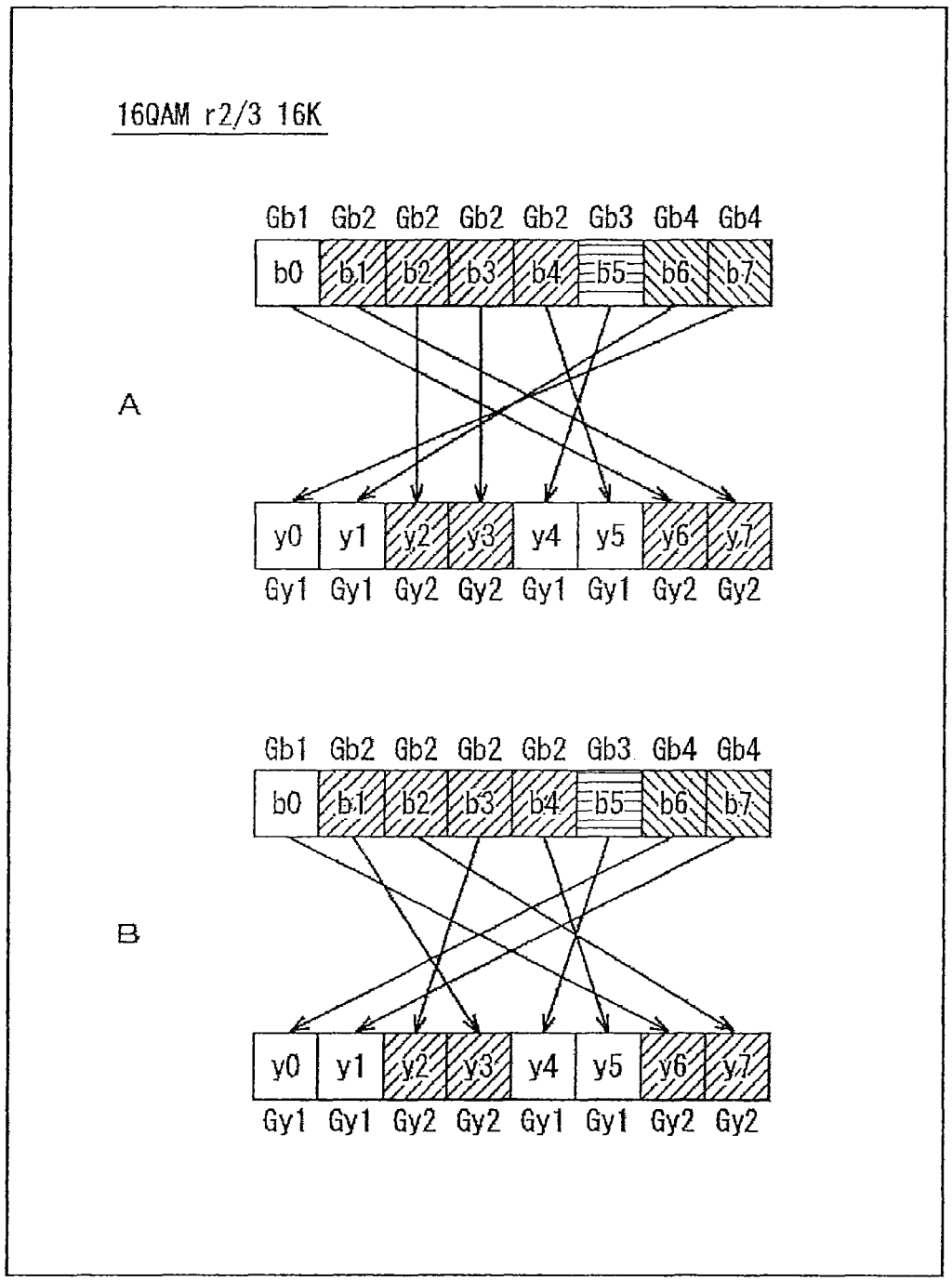

FIG. 122 illustrates an example of interchanging of the code bits according to the allocation rule of FIG. 121.

That is, A of FIG. 122 illustrates a first example of interchanging of the code bits according to the allocation rule of FIG. 111, when the LDPC code is an LDPC code in which the code length N is 16200 bits and the encoding rate is 2/3, the modulation method is the 16 QAM, and the multiple b is 2.

When the LDPC code is the LDPC code in which the code length N is 16200 bits and the encoding rate is 2/3, the modulation method is the 16 QAM, and the multiple b is 2, in the demultiplexer 25, the code bits written to the memory 31 in which a column direction×a row direction are (16200/(4×2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 122 for example, according to the allocation rule of FIG. 121.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 122 illustrates a second example of interchanging of the code bits according to the allocation rule of FIG. 121, when the LDPC code is an LDPC code in which the code length N is 16200 bits and the encoding rate is 2/3, the modulation method is the 16 QAM, and the multiple b is 2.

According to B of FIG. 122, the interchanging unit 32 performs interchanging to allocate the code bits b0, b1, b2, b3, b4, b5, b6, and b7 to the symbol bits y6, y3, y7, y2, y5, y4, y0, and y1, respectively, with respect to the code bits b0 to b7 of the 4×2 (=mb) bits read from the memory 31, according to the allocation rule of FIG. 121.

Figure 123:
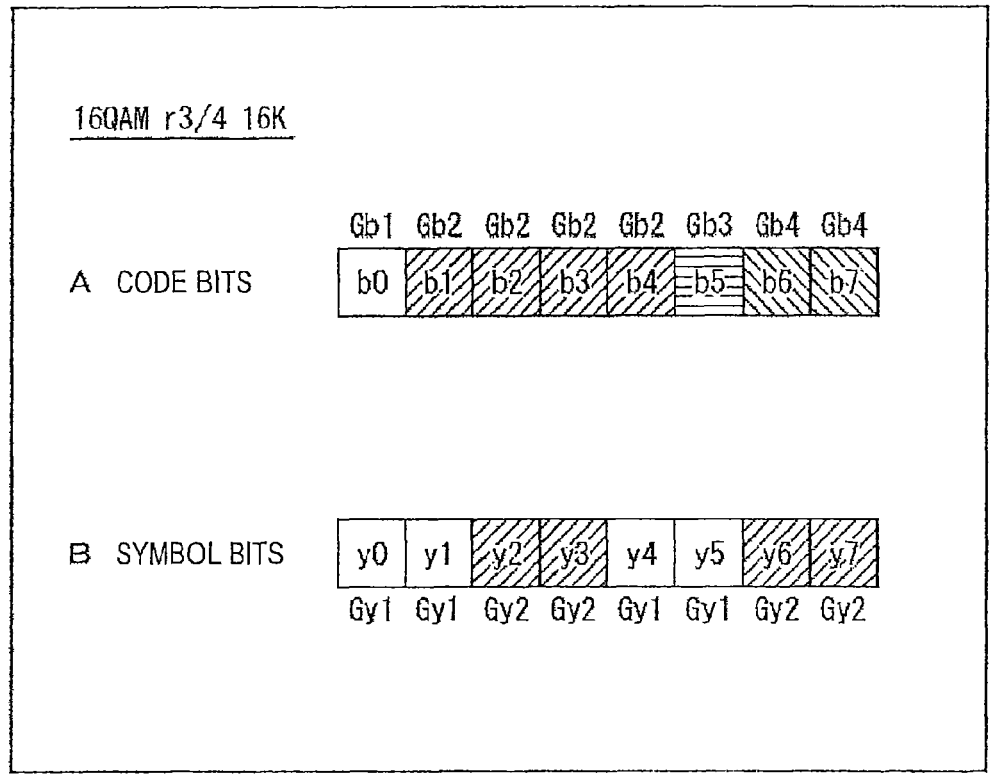

FIG. 123 illustrates the code bit group and the symbol bit group when the LDPC code is an LDPC code in which the code length is 16200 bits and the encoding rate is 3/4, the modulation method is the 16 QAM, and the multiple b is 2.

In this case, the code bits of the 4×2 (=mb) bits that are read from the memory 31 can be grouped into four code bit groups Gb1, Gb2, Gb3, and Gb4, according to the differences of the error probabilities, as illustrated by A of FIG. 123.

In A of FIG. 123, a code bit b0 belongs to the code bit group Gb1, code bits b1 to b4 belong to the code bit group Gb2, a code bit b5 belongs to the code bit group Gb3, and code bits b6 and b7 belong to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 123.

In B of FIG. 123, as in B of FIG. 107, symbol bits y0, y1, y4, and y5 belong to the symbol bit group Gy1, and symbol bits y2, y3, y6, and y7 belong to the symbol bit group Gy2.

Figure 124:
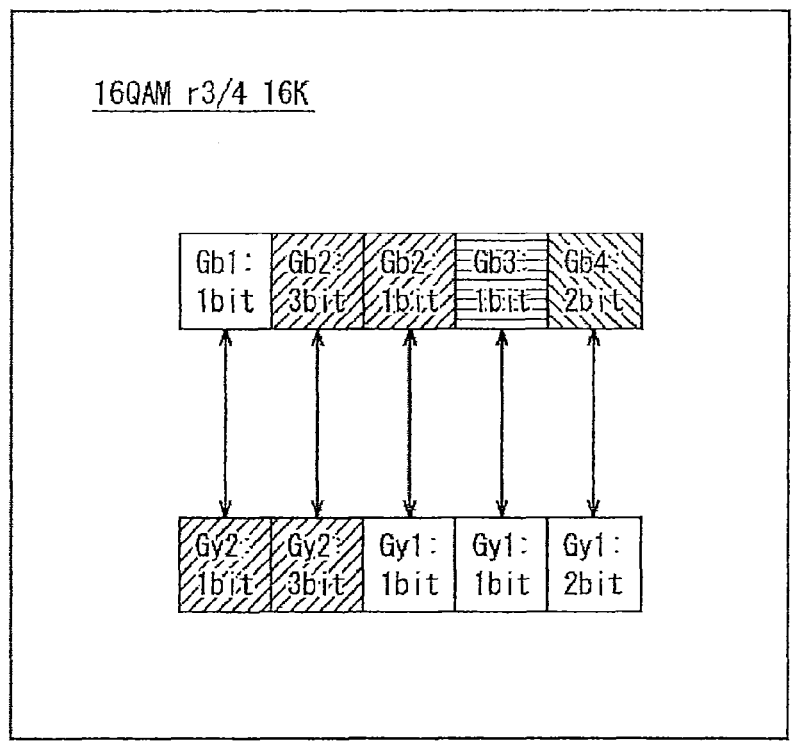

FIG. 124 illustrates an allocation rule when the LDPC code is an LDPC code in which the code length N is 16200 bits and the encoding rate is 3/4, the modulation method is the 16 QAM, and the multiple b is 2.

In the allocation rule of FIG. 124, the group set information (Gb1, Gy2, 1), (Gb2, Gy2, 3), (Gb2, Gy1, 1), (Gb3, Gy1, 1), and (Gb4, Gy1, 2) are defined.

That is, in the allocation rule of FIG. 124, allocation of one bit of the code bits of the code bit group Gb1 having the best error probability to one bit of the symbol bits of the symbol bit group Gy2 having the second best error probability is defined by the group set information (Gb1, Gy2, 1), allocation of three bits of the code bits of the code bit group Gb2 having the second best error probability to three bits of the symbol bits of the symbol bit group Gy2 having the second best error probability is defined by the group set information (Gb2, Gy2, 3), allocation of one bit of the code bits of the code bit group Gb2 having the second best error probability to one bit of the symbol bits of the symbol bit group Gy1 having the best error probability is defined by the group set information (Gb2, Gy1, 1), allocation of one bit of the code bits of the code bit group Gb3 having the third best error probability to one bit of the symbol bits of the symbol bit group Gy1 having the best error probability is defined by the group set information (Gb3, Gy1, 1), and allocation of two bits of the code bits of the code bit group Gb4 having the fourth best error probability to two bits of the symbol bits of the symbol bit group Gy1 having the best error probability is defined by the group set information (Gb4, Gy1, 2).

Figure 125:
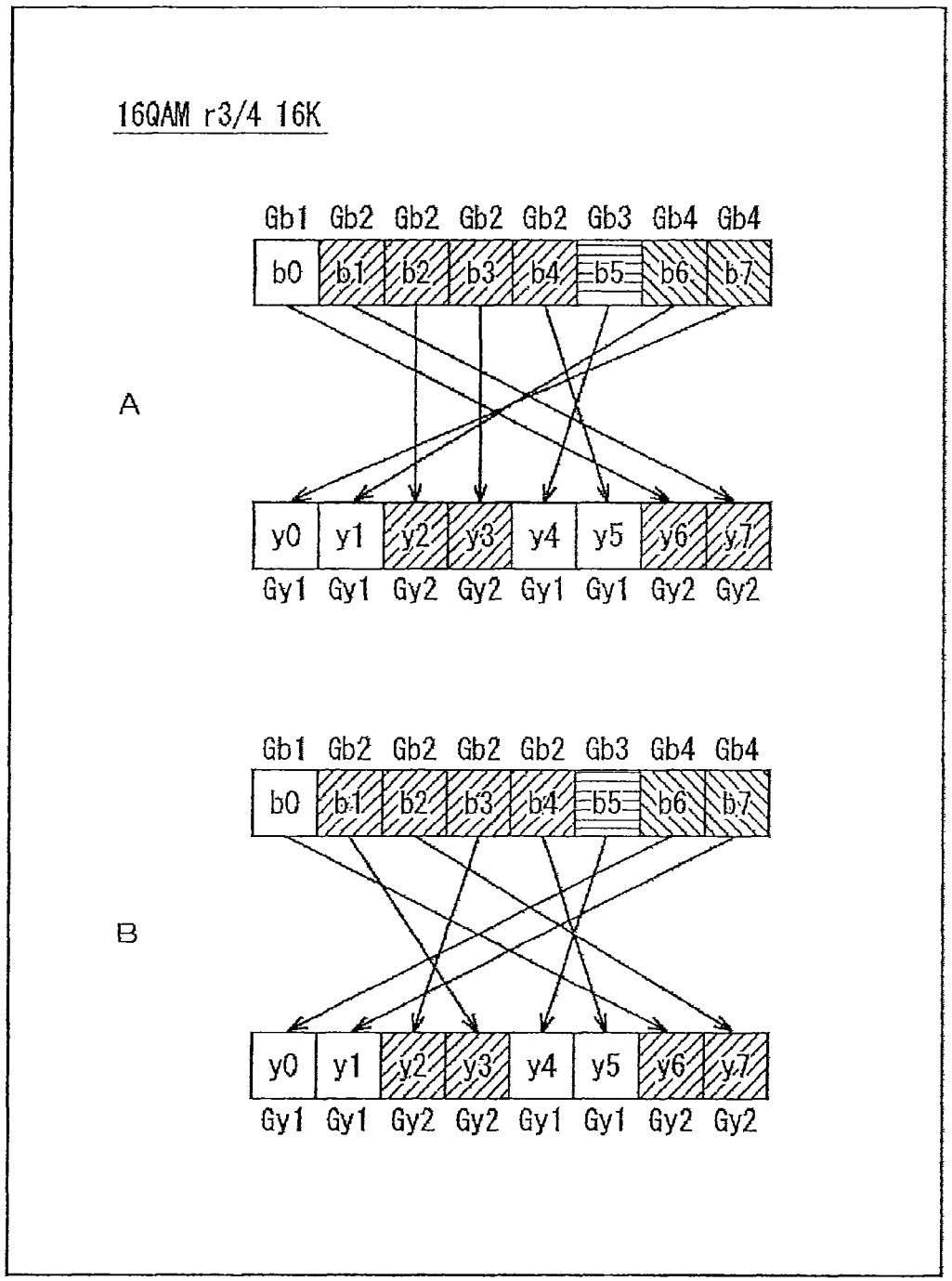

FIG. 125 illustrates an example of interchanging of the code bits according to the allocation rule of FIG. 124.

That is, A of FIG. 125 illustrates a first example of interchanging of the code bits according to the allocation rule of FIG. 124, when the LDPC code is an LDPC code in which the code length N is 16200 bits and the encoding rate is 3/4, the modulation method is the 16 QAM, and the multiple b is 2.

When the LDPC code is the LDPC code in which the code length N is 16200 bits and the encoding rate is 3/4, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 125 for example, according to the allocation rule of FIG. 124.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 125 illustrates a second example of interchanging of the code bits according to the allocation rule of FIG. 124, when the LDPC code is an LDPC code in which the code length N is 16200 bits and the encoding rate is 3/4, the modulation method is the 16 QAM, and the multiple b is 2.

According to B of FIG. 125, the interchanging unit 32 performs interchanging to allocate the code bits b0, b1, b2, b3, b4, b5, b6, and b7 to the symbol bits y6, y3, y7, y2, y5, y4, y0, and y1, respectively, with respect to the code bits b0 to b7 of the 4×2 (=mb) bits read from the memory 31, according to the allocation rule of FIG. 124.

Figure 126:
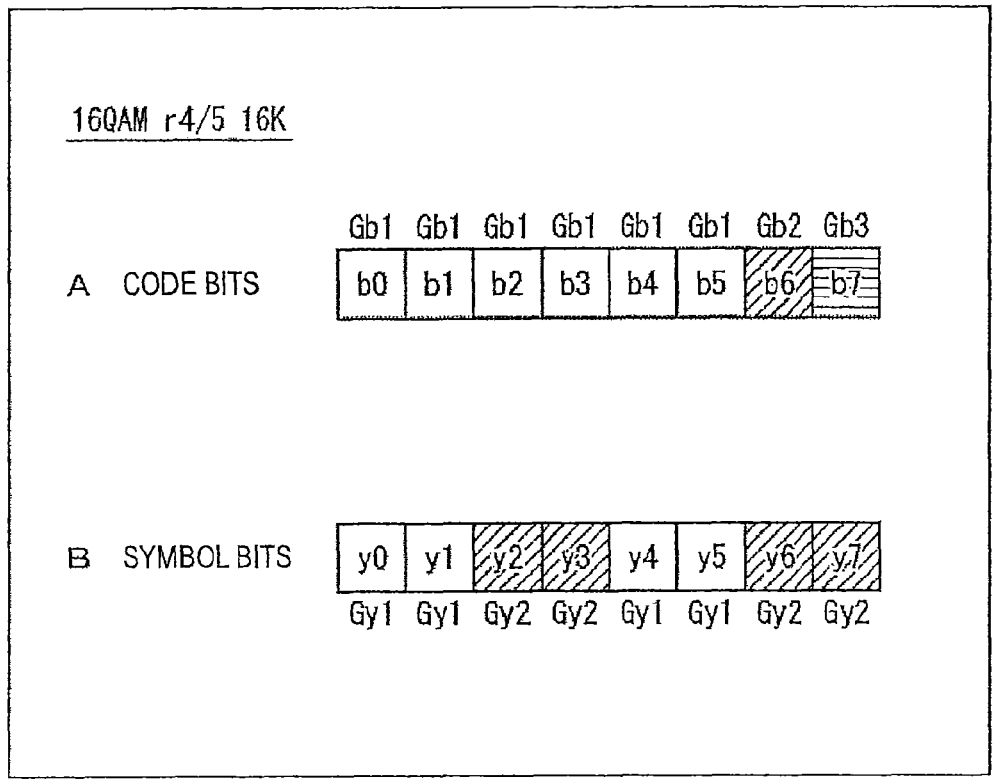

FIG. 126 illustrates the code bit group and the symbol bit group when the LDPC code is an LDPC code in which the code length is 16200 bits and the encoding rate is 4/5, the modulation method is the 16 QAM, and the multiple b is 2.

In this case, the code bits of the 4×2 (=mb) bits that are read from the memory 31 can be grouped into three code bit groups Gb1, Gb2, and Gb3, according to the differences of the error probabilities, as illustrated by A of FIG. 126.

In A of FIG. 126, code bits b0 to b5 belong to the code bit group Gb1, a code bit b6 belongs to the code bit group Gb2, and a code bit b7 belongs to the code bit group Gb3.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 116.

In B of FIG. 126, as in B of FIG. 107, symbol bits y0, y1, y4, and y5 belong to the symbol bit group Gy1, and symbol bits y2, y3, y6, and y7 belong to the symbol bit group Gy2.

Figure 127:
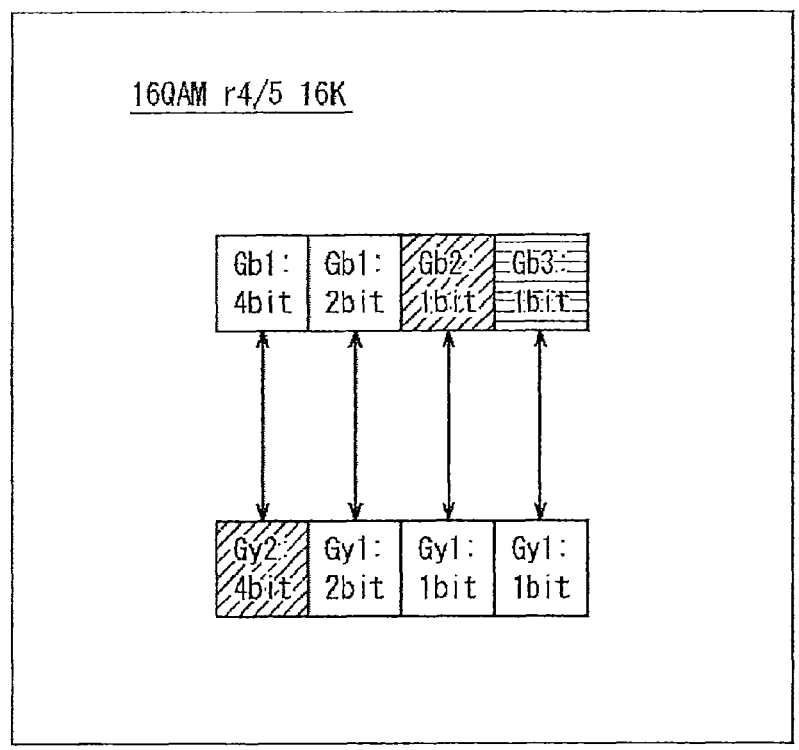

FIG. 127 illustrates an allocation rule when the LDPC code is an LDPC code in which the code length N is 16200 bits and the encoding rate is 4/5, the modulation method is the 16 QAM, and the multiple b is 2.

In the allocation rule of FIG. 127, the group set information (Gb1, Gy2, 4), (Gb1, Gy1, 2), (Gb2, Gy1, 1), and (Gb3, Gy1, 1) are defined.

That is, in the allocation rule of FIG. 127, allocation of four bits of the code bits of the code bit group Gb1 having the best error probability to four bits of the symbol bits of the symbol bit group Gy2 having the second best error probability is defined by the group set information (Gb1, Gy2, 4), allocation of two bits of the code bits of the code bit group Gb1 having the best error probability to two bits of the symbol bits of the symbol bit group Gy1 having the best error probability is defined by the group set information (Gb1, Gy1, 2), allocation of one bit of the code bits of the code bit group Gb2 having the second best error probability to one bit of the symbol bits of the symbol bit group Gy1 having the best error probability is defined by the group set information (Gb2, Gy1, 1), and allocation of one bit of the code bits of the code bit group Gb3 having the third best error probability to one bit of the symbol bits of the symbol bit group Gy1 having the best error probability is defined by the group set information (Gb3, Gy1, 1).

Figure 128:
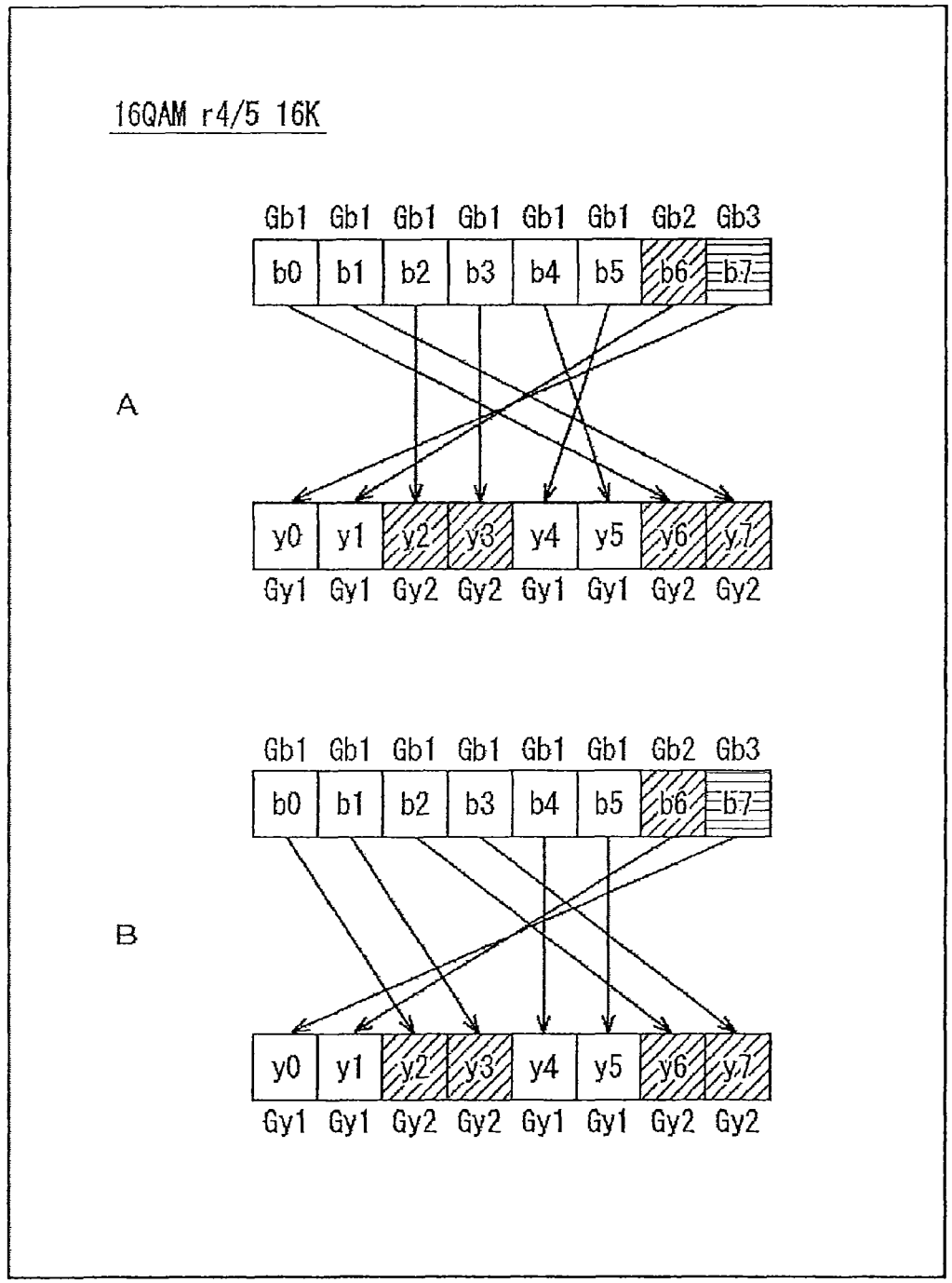

FIG. 128 illustrates an example of interchanging of the code bits according to the allocation rule of FIG. 127.

That is, A of FIG. 128 illustrates a first example of interchanging of the code bits according to the allocation rule of FIG. 127, when the LDPC code is an LDPC code in which the code length N is 16200 bits and the encoding rate is 4/5, the modulation method is the 16 QAM, and the multiple b is 2.

When the LDPC code is the LDPC code in which the code length N is 16200 bits and the encoding rate is 4/5, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 128 for example, according to the allocation rule of FIG. 127.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 128 illustrates a second example of interchanging of the code bits according to the allocation rule of FIG. 127, when the LDPC code is an LDPC code in which the code length N is 16200 bits and the encoding rate is 4/5, the modulation method is the 16 QAM, and the multiple b is 2.

According to B of FIG. 128, the interchanging unit 32 performs interchanging to allocate the code bits b0, b1, b2, b3, b4, b5, b6, and b7 to the symbol bits y2, y3, y6, y7, y4, y5, y1, and y0, respectively, with respect to the code bits b0 to b7 of the 4×2 (=mb) bits read from the memory 31, according to the allocation rule of FIG. 117.

Figure 129:
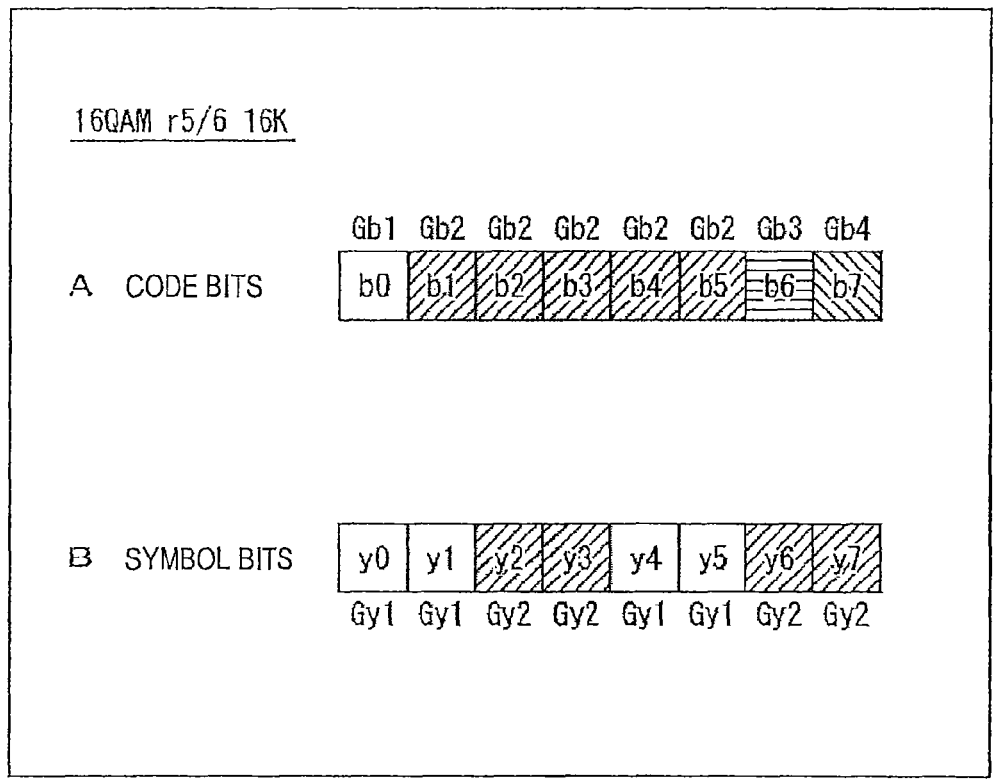

FIG. 129 illustrates the code bit group and the symbol bit group when the LDPC code is an LDPC code in which the code length is 16200 bits and the encoding rate is 5/6, the modulation method is the 16 QAM, and the multiple b is 2.

In this case, the code bits of the 4×2 (=mb) bits that are read from the memory 31 can be grouped into four code bit groups Gb1, Gb2, Gb3, and Gb4, according to the differences of the error probabilities, as illustrated by A of FIG. 129.

In A of FIG. 129, a code bit b0 belongs to the code bit group Gb1, code bits b1 to b5 belong to the code bit group Gb2, a code bit b6 belongs to the code bit group Gb3, and a code bit b7 belongs to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 129.

In B of FIG. 129, as in B of FIG. 107, s symbol bits y0, y1, y4, and y5 belong to the symbol bit group Gy1, and symbol bits y2, y3, y6, and y7 belong to the symbol bit group Gy2.

Figure 130:
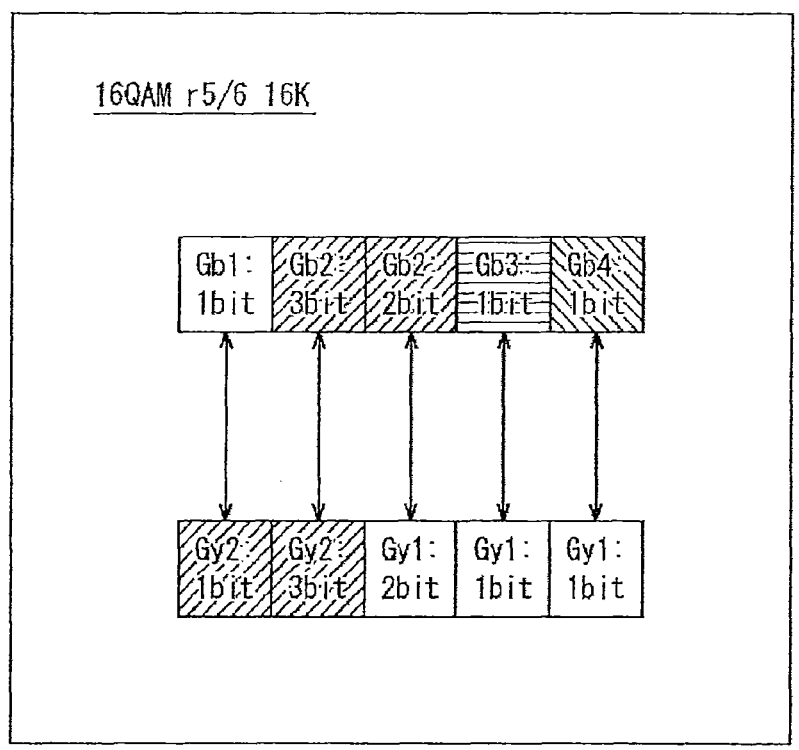

FIG. 130 illustrates an allocation rule when the LDPC code is an LDPC code in which the code length N is 16200 bits and the encoding rate is 5/6, the modulation method is the 16 QAM, and the multiple b is 2.

In the allocation rule of FIG. 130, the group set information (Gb1, Gy2, 1), (Gb2, Gy2, 3), (Gb2, Gy1, 2), (Gb3, Gy1, 1), and (Gb4, Gy1, 1) are defined.

That is, in the allocation rule of FIG. 130, allocation of one bit of the code bits of the code bit group Gb1 having the best error probability to one bit of the symbol bits of the symbol bit group Gy2 having the second best error probability is defined by the group set information (Gb1, Gy2, 1), allocation of three bits of the code bits of the code bit group Gb2 having the second best error probability to three bits of the symbol bits of the symbol bit group Gy2 having the second best error probability is defined by the group set information (Gb2, Gy2, 3), allocation of two bits of the code bits of the code bit group Gb2 having the second best error probability to two bits of the symbol bits of the symbol bit group Gy1 having the best error probability is defined by the group set information (Gb2, Gy1, 2), allocation of one bit of the code bits of the code bit group Gb3 having the third best error probability to one bit of the symbol bits of the symbol bit group Gy1 having the best error probability is defined by the group set information (Gb3, Gy1, 1), and allocation of one bit of the code bits of the code bit group Gb4 having the fourth best error probability to one bit of the symbol bits of the symbol bit group Gy1 having the best error probability is defined by the group set information (Gb4, Gy1, 1).

Figure 131:
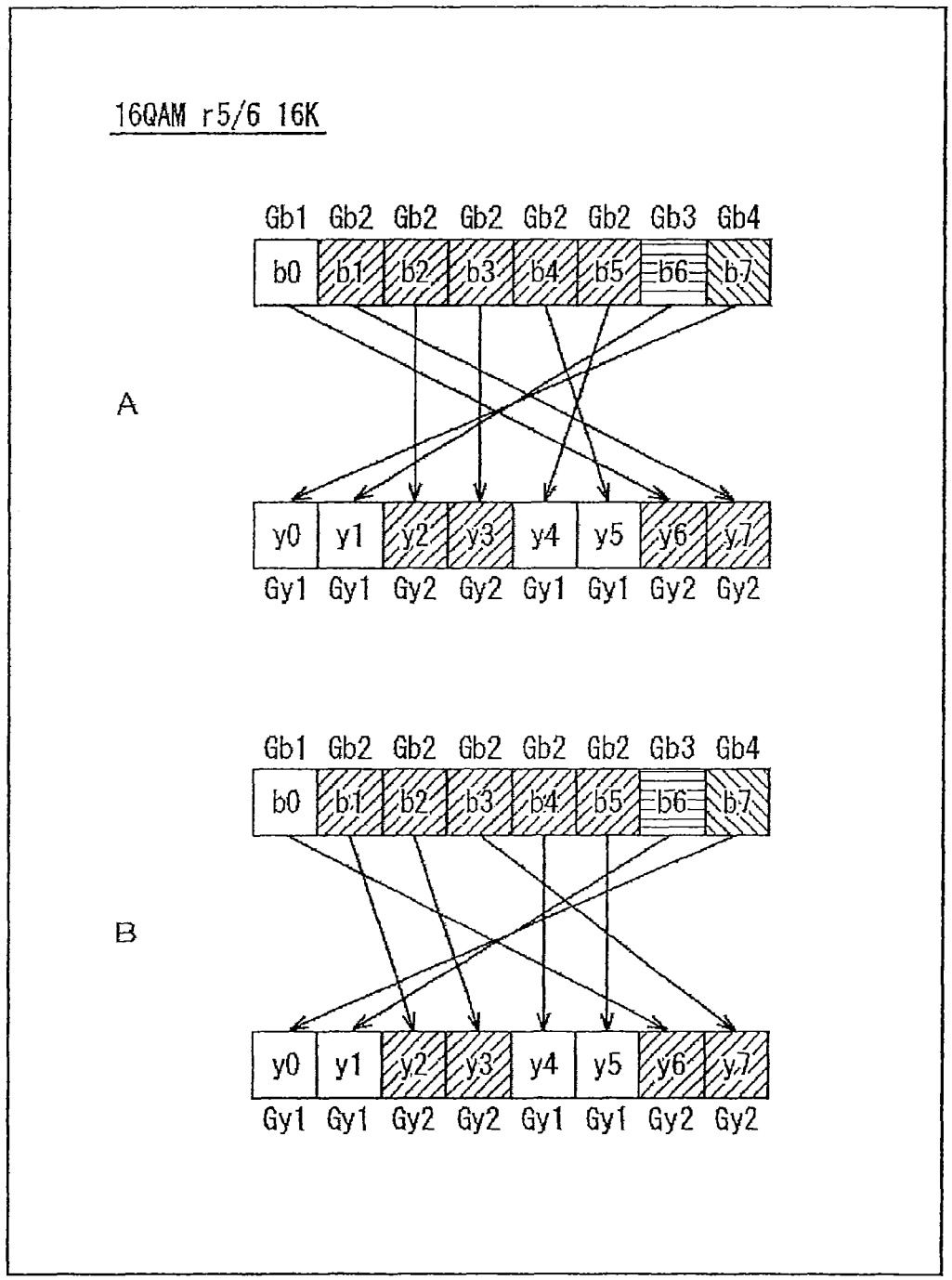

FIG. 131 illustrates an example of interchanging of the code bits according to the allocation rule of FIG. 130.

That is, A of FIG. 131 illustrates a first example of interchanging of the code bits according to the allocation rule of FIG. 130, when the LDPC code is an LDPC code in which the code length N is 16200 bits and the encoding rate is 5/6, the modulation method is the 16 QAM, and the multiple b is 2.

When the LDPC code is the LDPC code in which the code length N is 16200 bits and the encoding rate is 5/6, the modulation method is the 16 QAM, and the multiple b is 2, in the demultiplexer 25, the code bits written to the memory 31 in which a column direction×a row direction are (16200/(4×2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 131 for example, according to the allocation rule of FIG. 130.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 131 illustrates a second example of interchanging of the code bits according to the allocation rule of FIG. 130, when the LDPC code is an LDPC code in which the code length N is 16200 bits and the encoding rate is 5/6, the modulation method is the 16 QAM, and the multiple b is 2.

According to B of FIG. 131, the interchanging unit 32 performs interchanging to allocate the code bits b0, b1, b2, b3, b4, b5, b6, and b7 to the symbol bits y6, y2, y3, y7, y4, y5, y1, and y0, respectively, with respect to the code bits b0 to b7 of the 4×2 (=mb) bits read from the memory 31, according to the allocation rule of FIG. 130.

FIG. 132 illustrates the code bit group and the symbol bit group when the LDPC code is an LDPC code in which the code length is 16200 bits and the encoding rate is 8/9, the modulation method is the 16 QAM, and the multiple b is 2.

In this case, the code bits of the 4×2 (=mb) bits that are read from the memory 31 can be grouped into three code bit groups Gb1, Gb2, and Gb3, according to the differences of the error probabilities, as illustrated by A of FIG. 132.

In A of FIG. 132, a code bit b0 belongs to the code bit group Gb1, code bits b1 to b6 belong to the code bit group Gb2, and a code bit b7 belongs to the code bit group Gb3.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 132.

In B of FIG. 132, as in B of FIG. 107, symbol bits y0, y1, y4, and y5 belong to the symbol bit group Gy1, and symbol bits y2, y3, y6, and y7 belong to the symbol bit group Gy2.

FIG. 133 illustrates an allocation rule when the LDPC code is an LDPC code in which the code length N is 16200 bits and the encoding rate is 8/9, the modulation method is the 16 QAM, and the multiple b is 2.

In the allocation rule of FIG. 133, the group set information (Gb1, Gy2, 1), (Gb2, Gy2, 3), (Gb2, Gy1, 3), and (Gb3, Gy1, 1) are defined.

That is, in the allocation rule of FIG. 133, allocation of one bit of the code bits of the code bit group Gb1 having the best error probability to one bit of the symbol bits of the symbol bit group Gy2 having the second best error probability is defined by the group set information (Gb1, Gy2, 1), allocation of three bits of the code bits of the code bit group Gb2 having the second best error probability to three bits of the symbol bits of the symbol bit group Gy2 having the second best error probability is defined by the group set information (Gb2, Gy2, 3), allocation of three bits of the code bits of the code bit group Gb2 having the second best error probability to three bits of the symbol bits of the symbol bit group Gy1 having the best error probability is defined by the group set information (Gb2, Gy1, 3), and allocation of one bit of the code bits of the code bit group Gb3 having the third best error probability to one bit of the symbol bits of the symbol bit group Gy1 having the best error probability is defined by the group set information (Gb3, Gy1, 1).

FIG. 134 illustrates an example of interchanging of the code bits according to the allocation rule of FIG. 133.

That is, A of FIG. 134 illustrates a first example of interchanging of the code bits according to the allocation rule of FIG. 133, when the LDPC code is an LDPC code in which the code length N is 16200 bits and the encoding rate is 8/9, the modulation method is the 16 QAM, and the multiple b is 2.

When the LDPC code is the LDPC code in which the code length N is 16200 bits and the encoding rate is 8/9, the modulation method is the 16 QAM, and the multiple b is 2, in the demultiplexer 25, the code bits written to the memory 31 in which a column direction×a row direction are (16200/(4×2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 134 for example, according to the allocation rule of FIG. 133.

That is, the interchanging unit 32 performs interchanging to allocate the code bits b0, b1, b2, b3, b4, b5, b6, and b7 to the symbol bits y6, y7, y2, y3, y5, y4, y1, and y0, respectively.

B of FIG. 134 illustrates a second example of interchanging of the code bits according to the allocation rule of FIG. 133, when the LDPC code is an LDPC code in which the code length N is 16200 bits and the encoding rate is 8/9, the modulation method is the 16 QAM, and the multiple b is 2.

According to B of FIG. 134, the interchanging unit 32 performs interchanging to allocate the code bits b0, b1, b2, b3, b4, b5, b6, and b7 to the symbol bits y6, y2, y3, y7, y4, y1, y5, and y0, respectively, with respect to the code bits b0 to b7 of the 4×2 (=mb) bits read from the memory 31, according to the allocation rule of FIG. 133.

FIGS. 135, 136, 137, 138, 139, 140, 141, 142, 143, 144, 145, 146, 147, 148, 149, 150, and 151 illustrate simulation results of a BER (Bit Error Rate) in the case in which interchange processing of a new interchange method is executed and in the case in which interchange processing of a current method is executed.

That is, FIGS. 135 to 142 illustrate BERs when LDPC codes having the code length N of 16200 and the encoding rates of 1/4, 1/3, 1/2, 2/3, 3/4, 4/5, 5/6, and 8/9 are targeted and the 64 QAM is adopted as the modulation method.

FIGS. 143 to 151 illustrate BERs when LDPC codes having the code length N of 16200 and the encoding rates of 1/4, 1/3, 2/5, 1/2, 2/3, 3/4, 4/5, 5/6, and 8/9 are targeted and the 16 QAM is adopted as the modulation method.

In FIGS. 135 to 151, the multiple b is 2.

In FIGS. 135 to 151, a transverse axis represents $E_s/N_0$ (ratio of signal power to noise power for each symbol) and a longitudinal axis represents the BER. In addition, a circle (O) mark represents a BER when the interchange processing of the new interchange method is executed and an asterisk represents a BER when the interchange processing of the current method is executed.

In this case, the current method is the interchange method that is defined in the DVB-T.2.

According to the interchange processing of the new interchange method from FIGS. 135 to 151, as compared with the interchange processing of the current method, the BER is improved as a whole or at $E_s/N_0$ of a certain level or more. Therefore, it can be known that tolerance against the error is improved.

In this case, as the interchange method of the code bits of the LDPC codes in the interchange processing by the interchanging unit 32, that is, an allocation pattern (hereinafter, referred to as a bit allocation pattern) of the code bits of the LDPC code and the symbol bits representing the symbol, a bit allocation pattern that is exclusively used for each LDPC code can be adopted with respect to each of the LDPC codes having the different encoding rates.

However, if the bit allocation pattern exclusively used for each LDPC code is adopted with respect to each of the LDPC codes having the different encoding rates, it is necessary to mount a number of bit allocation patterns to the transmitting device 11 and it is necessary to change (switch) the bit allocation patterns for each of the LDPC codes of the kinds in which the encoding rates are different.

Meanwhile, according to the interchange processing described in FIGS. 81 to 134, the bit allocation patterns that are mounted to the transmitting device 11 can be decreased.

That is, when the code length N is 16200 bits and the modulation method is the 64 QAM, a bit allocation pattern to allocate the code bits b0, b1, b2, b3, b4, b5, b6, b7, b8, b9, b10, and b11 illustrated in A of FIGS. 83 and 86 to the symbol bits y11, y10, y2, y3, y4, y5, y6, y7, y8, y9, y1, and y0, respectively, is adopted with respect to the LDPC codes having the encoding rates of 1/4 and 1/3, a bit allocation pattern to allocate the code bits b0 to b11 illustrated in A of FIGS. 90, 94, 97, 100, and 103 and FIG. 106 to the symbol bits y11, y10, y2, y4, y3, y5, y6, y7, y9, y8, y1, and y0, respectively, is adopted with respect to the LDPC codes having the encoding rates of 1/2, 2/3, 3/4, 4/5, 5/6, and 8/9, and a bit allocation pattern to allocate the code bits b0 to b11 illustrated in FIGS. 87 and 91 to the symbol bits y11, y7, y3, y10, y6, y2, y9, y5, y1, y8, y4, and y0, respectively, is adopted with respect to the LDPC codes having the encoding rates of 2/5 and 3/5 and the bit allocation patterns of the three patterns are mounted to the transmitting device 11.

When the code length N is 16200 bits and the modulation method is the 16 QAM, a bit allocation pattern to allocate the code bits b0 to b7 illustrated in A of FIGS. 109 and 112 to the symbol bits y6, y7, y2, y5, y4, y3, y1, and y0, respectively, is adopted with respect to the LDPC codes having the encoding rates of 1/4 and 1/3, a bit allocation pattern to allocate the code bits b0 to b7 illustrated in A of FIG. 115 to the symbol bits y6, y7, y4, y3, y5, y2, y1, and y0, respectively, is adopted with respect to the LDPC codes having the encoding rate of 2/5, a bit allocation pattern to allocate the code bits b0 to b7 illustrated in A of FIGS. 118, 122, 125, 128, 131, and 134 to the symbol bits y6, y7, y2, y3, y5, y4, y1, and y0, respectively, is adopted with respect to the LDPC codes having the encoding rates of 1/2, 2/3, 3/4, 4/5, 5/6, and 8/9, and a bit allocation pattern to allocate the code bits b0 to b7 illustrated in FIG. 119 to the symbol bits y7, y3, y1, y5, y2, y6, y4, and y0, respectively, is adopted with respect to the LDPC codes having the encoding rate of 3/5 and the bit allocation patterns of the four patterns are mounted to the transmitting device 11.

In this embodiment, for the convenience of explanation, in the demultiplexer 25, the interchanging unit 32 executes the interchange processing with respect to the code bits read from the memory 31. However, the interchange processing can be executed by writing or reading of the code bits with respect to the memory 31.

That is, the interchange processing can be executed by controlling addresses (read addresses) to read the code bits, such that reading of the code bits from the memory 31 is performed in order of the code bits after interchanging.

FIG. 152 is a block diagram illustrating a configuration example of the receiving device 12 of FIG. 7.

An OFDM operating unit 151 receives an OFDM signal from the transmitting device 11 (FIG. 7) and executes signal processing of the OFDM signal. Data (symbol) that is obtained by executing the signal processing by the OFDM operating unit 151 is supplied to a frame managing unit 152.

The frame managing unit 152 executes processing (frame interpretation) of a frame configured by the symbol supplied from the OFDM operating unit 151 and supplies a symbol of target data obtained as a result and a symbol of signaling to frequency deinterleavers 161 and 153.

The frequency deinterleaver 153 performs frequency deinterleave for each symbol, with respect to the symbol supplied from the frame managing unit 152, and supplies the symbol to a QAM decoder 154.

The QAM decoder 154 demaps (signal point arrangement decoding) the symbol (symbol arranged on a signal point) supplied from the frequency deinterleaver 153, performs orthogonal demodulation, and supplies data (LDPC code) obtained as a result to a LDPC decoder 155.

The LDPC decoder 155 performs LDPC decoding of the LDPC code supplied from the QAM decoder 154 and supplies LDPC target data (in this case, a BCH code) obtained as a result to a BCH decoder 156.

The BCH decoder 156 performs BCH decoding of the LDPC target data supplied from the LDPC decoder 155 and outputs signaling obtained as a result.

Meanwhile, the frequency deinterleaver 161 performs frequency deinterleave for each symbol, with respect to the symbol supplied from the frame managing unit 152, and supplies the symbol to a MISO/MIMO decoder 162.

The MISO/MIMO decoder 162 performs spatiotemporal decoding of the data (symbol) supplied from the frequency deinterleaver 161 and supplies the data to a time deinterleaver 163.

The time deinterleaver 163 performs time deinterleave for each symbol, with respect to the data (symbol) supplied from the MISO/MIMO decoder 162, and supplies the data to a QAM decoder 164.

The QAM decoder 164 demaps (signal point arrangement decoding) the symbol (symbol arranged on a signal point) supplied from the time deinterleaver 163, performs orthogonal demodulation, and supplies data (symbol) obtained as a result to a bit deinterleaver 165.

The bit deinterleaver 165 performs bit deinterleave of the data (symbol) supplied from the QAM decoder 164 and supplies an LDPC code obtained as a result to an LDPC decoder 166.

The LDPC decoder 166 performs LDPC decoding of the LDPC code supplied from the bit deinterleaver 165 and supplies LDPC target data (in this case, a BCH code) obtained as a result to a BCH decoder 167.

The BCH decoder 167 performs BCH decoding of the LDPC target data supplied from the LDPC decoder 155 and supplies data obtained as a result to a BB descrambler 168.

The BB descrambler 168 executes energy reverse diffusion processing with respect to the data supplied from the BCH decoder 167 and supplies data obtained as a result to a null deletion unit 169.

The null deletion unit 169 deletes null inserted by the padder 112 of FIG. 8, from the data supplied from the BB descrambler 168, and supplies the data to a demultiplexer 170.

The demultiplexer 170 individually separates one or more streams (target data) multiplexed with the data supplied from the null deletion unit 169 and outputs the streams as output streams.

FIG. 153 is a block diagram illustrating a configuration example of the bit deinterleaver 165 of FIG. 152.

The bit deinterleaver 165 includes a multiplexer (MUX) 54 and a column twist deinterleaver 55 and performs (bit) deinterleave of symbol bits of the symbol supplied from the QAM decoder 164 (FIG. 152).

That is, the multiplexer 54 executes reverse interchange processing (reverse processing of the interchange processing) corresponding to the interchange processing executed by the demultiplexer 25 of FIG. 9, that is, reverse interchange processing for returning positions of the code bits (symbol bits) of the LDPC codes interchanged by the interchange processing to original positions, with respect to the symbol bits of the symbol supplied from the QAM decoder 164, and supplies an LDPC code obtained as a result to the column twist deinterleaver 55.

The column twist deinterleaver 55 performs the column twist deinterleave (reverse processing of the column twist interleave) corresponding to the column twist interleave as the rearrangement processing executed by the column twist interleaver 24 of FIG. 9, that is, the column twist deinterleave as the reverse rearrangement processing for returning the code bits of the LDPC codes of which an arrangement is changed by the column twist interleave as the rearrangement processing to the original arrangement, with respect to the LDPC code supplied from the multiplexer 54.

Specifically, the column twist deinterleaver 55 writes the code bits of the LDPC code to a memory for deinterleave having the same configuration as the memory 31 illustrated in FIG. 24, reads the code bits, and performs the column twist deinterleave.

However, in the column twist deinterleaver 55, writing of the code bits is performed in a row direction of the memory for the deinterleave, using read addresses when the code bits are read from the memory 31 as write addresses. In addition, reading of the code bits is performed in a column direction of the memory for the deinterleave, using write addresses when the code bits are written to the memory 31 as read addresses.

The LDPC code that is obtained as a result of the column twist deinterleave is supplied from the column twist deinterleaver 55 to the LDPC decoder 166.

In this case, in the LDPC code that is supplied from the QAM decoder 164 to the bit deinterleaver 165, the parity interleave, the column twist interleave, and the interchange processing are executed sequentially. However, in the bit deinterleaver 165, only the reverse interchange processing corresponding to the interchange processing and the column twist deinterleave corresponding to the column twist interleave are performed. Therefore, the parity deinterleave (reverse processing of the parity interleave) corresponding to the parity interleave, that is, the parity deinterleave for returning the code bits of the LDPC code of which the arrangement is changed by the parity interleave to the original arrangement is not performed.

Therefore, the LDPC code in which the reverse interchange processing and the column twist deinterleave are performed and the parity deinterleave is not performed is supplied from (the column twist deinterleaver 55 of) the bit deinterleaver 165 to the LDPC decoder 166.

The LDPC decoder 166 performs the LDPC decoding of the LDPC code supplied from the bit deinterleaver 165, using a transformed parity check matrix obtained by performing at least column replacement corresponding to the parity interleave with respect to the parity check matrix H used by the LDPC encoder 115 of FIG. 8 to perform the LDPC encoding, and outputs data obtained as a result to a decoding result of LDPC target data.

FIG. 154 is a flowchart illustrating processing that is executed by the QAM decoder 164, the bit deinterleaver 165, and the LDPC decoder 166 of FIG. 153.

In step S111, the QAM decoder 164 demaps the symbol (symbol mapped to a signal point) supplied from the time deinterleaver 163, performs orthogonal modulation, and supplies the symbol to the bit deinterleaver 165, and the processing proceeds to step S112.

In step S112, the bit deinterleaver 165 performs deinterleave (bit deinterleave) of the symbol bits of the symbol supplied from the QAM decoder 164 and the processing proceeds to step S113.

That is, in step S112, in the bit deinterleaver 165, the multiplexer 54 executes reverse interchange processing with respect to the symbol bits of the symbol supplied from the QAM decoder 164 and supplies code bits of an LDPC code obtained as a result to the column twist deinterleaver 55.

The column twist deinterleaver 55 performs the column twist deinterleave with respect to the LDPC code supplied from the multiplexer 54 and supplies an LDPC code obtained as a result to the LDPC decoder 166.

In step S113, the LDPC decoder 166 performs the LDPC decoding of the LDPC code supplied from the column twist deinterleaver 55, using a transformed parity check matrix obtained by performing at least column replacement corresponding to the parity interleave with respect to the parity check matrix H used by the LDPC encoder 115 of FIG. 8 to perform the LDPC encoding, and outputs data obtained as a result, as a decoding result of LDPC target data, to the BCH decoder 167.

In FIG. 153, for the convenience of explanation, the multiplexer 54 that executes the reverse interchange processing and the column twist deinterleaver 55 that performs the column twist deinterleave are individually configured, similar to the case of FIG. 9. However, the multiplexer 54 and the column twist deinterleaver 55 can be integrally configured.

In the bit interleaver 116 of FIG. 9, when the column twist interleave is not performed, it is not necessary to provide the column twist deinterleaver 55 in the bit deinterleaver 165 of FIG. 153.

Next, the LDPC decoding that is performed by the LDPC decoder 166 of FIG. 152 will be further described.

In the LDPC decoder 166 of FIG. 152, as described above, the LDPC decoding of the LDPC code from the column twist deinterleaver 55, in which the reverse interchange processing and the column twist deinterleave are performed and the parity deinterleave is not performed, is performed using a transformed parity check matrix obtained by performing at least column replacement corresponding to the parity interleave with respect to the parity check matrix H used by the LDPC encoder 115 of FIG. 8 to perform the LDPC encoding.

In this case, LDPC decoding that can suppress an operation frequency at a sufficiently realizable range while suppressing a circuit scale, by performing the LDPC decoding using the transformed parity check matrix, is previously suggested (for example, refer to JP 2004-343170A).

Therefore, first, the previously suggested LDPC decoding using the transformed parity check matrix will be described with reference to FIGS. 155 to 158.

FIG. 155 illustrates an example of a parity check matrix H of an LDPC code in which a code length N is 90 and an encoding rate is 2/3.

In FIG. 155 (and FIGS. 156 and 157 to be described later), 0 is represented by a period (.).

In the parity check matrix H of FIG. 155, the parity matrix becomes a staircase structure.

FIG. 156 illustrates a parity check matrix H' that is obtained by executing row replacement of an expression (11) and column replacement of an expression (12) with respect to the parity check matrix H of FIG. 155.

Row Replacement:$(6s+t+1)$-th row→$(5t+s+1)$-th row  (11)

Column Replacement:$(6x+y+61)$-th column→$(5y+x+61)$-th column  (12)

In the expressions (11) and (12), s, t, x, and y are integers in ranges of $0 \leq s < 5$, $0 \leq t < 6$, $0 \leq x < 5$, and $0 \leq t < 6$, respectively.

According to the row replacement of the expression (11), replacement is performed such that the 1st, 7th, 13th, 19th, and 25th rows having remainders of 1 when being divided by 6 are replaced with the 1st, 2nd, 3rd, 4th, and 5th rows, and the 2nd, 8th, 14th, 20th, and 26th rows having remainders of 2 when being divided by 6 are replaced with the 6th, 7th, 8th, 9th, and 10th rows, respectively.

According to the column replacement of the expression (12), replacement is performed such that the 61st, 67th, 73rd, 79th, and 85th columns having remainders of 1 when being divided by 6 are replaced with the 61st, 62nd, 63rd, 64th, and 65th columns, respectively, and the 62nd, 68th, 74th, 80th, and 86th columns having remainders of 2 when being divided by 6 are replaced with the 66th, 67th, 68th, 69th, and 70th columns, respectively, with respect to the 61st and following columns (parity matrix).

In this way, a matrix that is obtained by performing the replacements of the rows and the columns with respect to the parity check matrix H of FIG. 155 is a parity check matrix H' of FIG. 156.

In this case, even when the row replacement of the parity check matrix H is performed, the arrangement of the code bits of the LDPC code is not influenced.

The column replacement of the expression (12) corresponds to parity interleave to interleave the $(K+qx+y+1)$-th code bit into the position of the $(K+Py+x+1)$-th code bit, when the information length K is 60, the column number P of the unit of the cyclic structure is 5, and the divisor q $(=M/P)$ of the parity length M (in this case, 30) is 6.

If the parity check matrix (hereinafter, appropriately referred to as a replaced parity check matrix) H' of FIG. 156 is multiplied with a result obtained by performing the same replacement as the expression (12) with respect to the LDPC code of the parity check matrix (hereinafter, appropriately referred to as an original parity check matrix) H of FIG. 155, a zero vector is output. That is, if a row vector obtained by performing the column replacement of the expression (12) with respect to a row vector c as the LDPC code (one code word) of the original parity check matrix H is represented as c', $Hc^T$ becomes the zero vector from the property of the parity check matrix. Therefore, $H'c'^T$ naturally becomes the zero vector.

Thereby, the transformed parity check matrix H' of FIG. 156 becomes a parity check matrix of an LDPC code c' that is obtained by performing the column replacement of the expression (12) with respect to the LDPC code c of the original parity check matrix H.

Therefore, the column replacement of the expression (12) is performed with respect to the LDPC code of the original parity check matrix H, the LDPC code c' after the column replacement is decoded (LDPC decoding) using the transformed parity check matrix H' of FIG. 156, reverse replacement of the column replacement of the expression (12) is performed with respect to a decoding result, and the same decoding result as the case in which the LDPC code of the original parity check matrix H is decoded using the parity check matrix H can be obtained.

FIG. 157 illustrates the transformed parity check matrix H' of FIG. 156 with being spaced in units of 5×5 matrixes.

In FIG. 157, the transformed parity check matrix H' is represented by a combination of a 5×5 unit matrix, a matrix (hereinafter, appropriately referred to as a quasi unit matrix) obtained by setting one or more 1 of the unit matrix to zero, a matrix (hereinafter, appropriately referred to as a shifted matrix) obtained by cyclically shifting the unit matrix or the quasi unit matrix, a sum (hereinafter, appropriately referred to as a sum matrix) of two or more matrixes of the unit matrix, the quasi unit matrix, and the shifted matrix, and a 5×5 zero matrix.

The transformed parity check matrix H' of FIG. 157 can be configured using the 5×5 unit matrix, the quasi unit matrix, the shifted matrix, the sum matrix, and the zero matrix. Therefore, the 5×5 matrixes that constitute the transformed parity check matrix H' are appropriately referred to as constitutive matrixes hereinafter.

When the LDPC code represented by the parity check matrix represented by the P×P constitutive matrixes is decoded, an architecture in which P check node operations and variable node operations are simultaneously performed can be used.

FIG. 158 is a block diagram illustrating a configuration example of a decoding device that performs the decoding.

That is, FIG. 158 illustrates the configuration example of the decoding device that performs decoding of the LDPC code, using the transformed parity check matrix H' of FIG. 157 obtained by performing at least the column replacement of the expression (12) with respect to the original parity check matrix H of FIG. 155.

The decoding device of FIG. 158 includes a branch data storing memory 300 that includes 6 FIFOs $300_1$ to $300_6$, a selector 301 that selects the FIFOs $300_1$ to $300_6$, a check node calculating unit 302, two cyclic shift circuits 303 and 308, a branch data storing memory 304 that includes 18 FIFOs $304_1$ to $304_{18}$, a selector 305 that selects the FIFOs $304_1$ to $304_{18}$, a reception data memory 306 that stores reception information, a variable node calculating unit 307, a decoding word calculating unit 309, a reception data rearranging unit 310, and a decoded data rearranging unit 311.

First, a method of storing data in the branch data storing memories 300 and 304 will be described.

The branch data storing memory 300 includes the 6 FIFOs $300_1$ to $300_6$ that correspond to a number obtained by dividing a row number 30 of the transformed parity check matrix H' of FIG. 157 by a row number 5 of the constitutive matrix. The FIFO $300_y$ (y=1, 2, . . . , and 6) includes a plurality of steps of storage regions. In the storage region of each step, messages corresponding to five branches to be a row number and a column number of the constitutive matrix can be simultaneously read or written. The number of steps of the storage regions of the FIFO $300_y$ becomes 9 to be a maximum number of the number (Hamming weight) of 1 of a row direction of the transformed parity check matrix of FIG. 157.

In the FIFO $300_1$, data (messages $v_1$ from variable nodes) corresponding to positions of 1 in the first to fifth rows of the transformed parity check matrix H' of FIG. 157 is stored in a form filling each row in a transverse direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $300_1$. In the storage region of the second step, data corresponding to positions of 1 of a shifted matrix (shifted matrix obtained by cyclically shifting the 5×5 unit matrix to the right side by 3) of (1, 21) to (5, 25) of the transformed parity check matrix H' is stored. Similar to the above case, in the storage regions of the third to eighth steps, data is stored in association with the transformed parity check matrix H'. In the storage region of the ninth step, data corresponding to positions of 1 of a shifted matrix (shifted matrix obtained by replacing 1 of the first row of the 5×5 unit matrix with 0 and cyclically shifting the unit matrix to the left side by 1) of (1, 86) to (5, 90) of the transformed parity check matrix H' is stored.

In the FIFO $300_2$, data corresponding to positions of 1 in the sixth to tenth rows of the transformed parity check matrix H' of FIG. 157 is stored. That is, in the storage region of the first step of the FIFO $300_2$, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the second step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $300_1$ to $300_6$).

Subsequently, in the storage regions of the third to ninth steps, data is stored in association with the transformed parity check matrix H', similar to the above case.

In the FIFOs $300_3$ to $300_6$, data is stored in association with the transformed parity check matrix H', similar to the above case.

The branch data storing memory 304 includes 18 FIFOs $304_1$ to $304_{18}$ that correspond to a number obtained by dividing a column number 90 of the transformed parity check matrix H' by 5 to be a column number of a constitutive matrix. The FIFO $304_x$ (x=1, 2, . . . , and 18) includes a plurality of steps of storage regions. In the storage region of each step, messages corresponding to five branches corresponding to a row number and a column number of the transformed constitutive matrix H' can be simultaneously read or written.

In the FIFO $304_1$, data (messages $u_j$ from check nodes) corresponding to positions of 1 in the first to fifth columns of the transformed parity check matrix H' of FIG. 157 is stored in a form filling each column in a longitudinal direction (a form in which 0 is ignored). That is, if a j-th row and an i-th column are represented as (j, i), data corresponding to positions of 1 of a 5×5 unit matrix of (1, 1) to (5, 5) of the transformed parity check matrix H' is stored in the storage region of the first step of the FIFO $304_1$. In the storage region of the second step, data corresponding to positions of 1 of the first shifted matrix constituting a sum matrix (sum matrix to be a sum of the first shifted matrix obtained by cyclically shifting the 5×5 unit matrix to the right side by 1 and the second shifted matrix obtained by cyclically shifting the 5×5 unit matrix to the right side by 2) of (6, 1) to (10, 5) of the transformed parity check matrix H' is stored. In addition, in the storage region of the third step, data corresponding to positions of 1 of the second shifted matrix constituting the sum matrix of (6, 1) to (10, 5) of the transformed parity check matrix H' is stored.

That is, with respect to a constitutive matrix of which the weight is two or more, when the constitutive matrix is represented by a sum of multiple parts of a P×P unit matrix of which the weight is 1, a quasi unit matrix in which one or more elements of 1 in the unit matrix become 0, or a shifted matrix obtained by cyclically shifting the unit matrix or the quasi unit matrix, data (messages corresponding to branches belonging to the unit matrix, the quasi unit matrix, or the shifted matrix) corresponding to the positions of 1 in the unit matrix of the weight of 1, the quasi unit matrix, or the shifted matrix is stored at the same address (the same FIFO among the FIFOs $304_1$ to $304_{18}$).

Subsequently, in the storage regions of the fourth and fifth steps, data is stored in association with the transformed parity check matrix H', similar to the above case. The number of steps of the storage regions of the FIFO $304_1$ becomes 5 to be a maximum number of the number (Hamming weight) of 1 of a row direction in the first to fifth columns of the transformed parity check matrix H'.

In the FIFOs $304_2$ and $304_3$, data is stored in association with the transformed parity check matrix H', similar to the above case, and each length (the number of steps) is 5. In the FIFOs $304_4$ to $304_{12}$, data is stored in association with the transformed parity check matrix H', similar to the above case, and each length is 3. In the FIFOs $304_{13}$ to $304_{18}$, data is stored in association with the transformed parity check matrix H', similar to the above case, and each length is 2.

Next, an operation of the decoding device of FIG. 158 will be described.

The branch data storing memory 300 includes the 6 FIFOs $300_1$ to $300_6$. According to information (matrix data) D312 on which row of the transformed parity check matrix H' five messages D311 supplied from a cyclic shift circuit 308 of a previous step belongs to, the FIFO storing data is selected from the FIFOs $300_1$ to $300_6$ and the five messages D311 are collectively stored sequentially in the selected FIFO. When the data is read, the branch data storing memory 300 sequentially reads the five messages $D300_1$ from the FIFO $300_1$ and supplies the messages to the selector 301 of a next step. After reading of the messages from the FIFO $300_1$ ends, the branch data storing memory 300 reads the messages sequentially from the FIFOs $300_2$ to $300_6$ and supplies the messages to the selector 301.

The selector 301 selects the five messages from the FIFO from which data is currently read, among the FIFOs $300_1$ to $300_6$, according to a select signal D301, and supplies the selected messages as messages D302 to the check node calculating unit 302.

The check node calculating unit 302 includes five check node calculators $302_1$ to $302_5$. The check node calculating unit 302 performs a check node operation according to the expression (7), using the messages D302 ($D302_1$ to $D302_5$) (messages $v_i$ of the expression 7) supplied through the selector 301, and supplies five messages D303 ($D303_1$ to $D303_5$) (messages $u_j$ of the expression (7)) obtained as a result of the check node operation to a cyclic shift circuit 303.

The cyclic shift circuit 303 cyclically shifts the five messages $D303_1$ to $D303_5$ calculated by the check node calculating unit 302, on the basis of information (matrix data) D305 on how many the unit matrixes becoming the origin in the transformed parity check matrix H' are cyclically shifted to obtain the corresponding branches, and supplies a result as messages D304 to the branch data storing memory 304.

The branch data storing memory 304 includes the 18 FIFOs $304_1$ to $304_{18}$. According to information (matrix data) D305 on which row of the transformed parity check matrix H' five messages D304 supplied from a cyclic shift circuit 303 of a previous step belongs to, the FIFO storing data is selected from the FIFOs $304_1$ to $304_{18}$ and the five messages D304 are collectively stored sequentially in the selected FIFO. When the data is read, the branch data storing memory 304 sequentially reads the five messages $D306_1$ from the FIFO $304_1$ and supplies the messages to the selector 305 of a next step. After reading of the messages from the FIFO $304_1$ ends, the branch data storing memory 304 reads the messages sequentially from the FIFOs $304_2$ to $304_{18}$ and supplies the messages to the selector 305.

The selector 305 selects the five messages from the FIFO from which data is currently read, among the FIFOs $304_1$ to $304_{18}$, according to a select signal D307, and supplies the selected messages as messages D308 to the variable node calculating unit 307 and the decoding word calculating unit 309.

Meanwhile, the reception data rearranging unit 310 rearranges the LDPC code D313 received through the communication path by performing the column replacement of the expression (12) and supplies the LDPC code as reception data D314 to the reception data memory 306. The reception data memory 306 calculates a reception LLR (Log Likelihood Ratio) from the reception data D314 supplied from the reception data rearranging unit 310, stores the reception LLR, collects five reception LLRs, and supplies the reception LLRs as reception values D309 to the variable node calculating unit 307 and the decoding word calculating unit 309.

The variable node calculating unit 307 includes five variable node calculators $307_1$ to $307_5$. The variable node calculating unit 307 performs the variable node operation according to the expression (1), using the messages D308 ($D308_1$ to $D308_5$) (messages $u_j$ of the expression (1)) supplied through the selector 305 and the five reception values D309 (reception values $u_{0i}$ of the expression (1)) supplied from the reception data memory 306, and supplies messages D310 ($D310_1$ to $D310_5$) (message $v_i$ of the expression (1)) obtained as an operation result to the cyclic shift circuit 308.

The cyclic shift circuit 308 cyclically shifts the messages $D310_1$ to $D310_5$ calculated by the variable node calculating unit 307, on the basis of information on how many the unit matrixes becoming the origin in the transformed parity check matrix H' are cyclically shifted to obtain the corresponding branches, and supplies a result as messages D311 to the branch data storing memory 300.

By circulating the above operation in one cycle, decoding of the LDPC code can be performed once. After decoding the LDPC code by the predetermined number of times, the decoding device of FIG. 158 calculates a final decoding result and outputs the final decoding result, in the decoding word calculating unit 309 and the decoded data rearranging unit 311.

That is, the decoding word calculating unit 309 includes five decoding word calculators $309_1$ to $309_5$. The decoding word calculating unit 309 calculates a decoding result (decoding word) on the basis of the expression (5), as a final step of multiple decoding, using the five messages D308 ($D308_1$ to $D308_5$) (messages $u_j$ of the expression) output by the selector 305 and the five reception values D309 (reception values $u_{01}$ of the expression (5)) supplied from the reception data memory 306, and supplies decoded data D315 obtained as a result to the decoded data rearranging unit 311.

The decoded data rearranging unit 311 performs the reverse replacement of the column replacement of the expression (12) with respect to the decoded data D315 supplied from the decoding word calculating unit 309, rearranges the order thereof, and outputs the decoded data as a final decoding result D316.

As described above, one of the row replacement and the column replacement or both the row replacement and the column replacement are performed with respect to the parity check matrix (original parity check matrix), the parity check matrix is transformed into a combination of a P×P unit matrix, a quasi unit matrix in which one or more elements of 1 in the unit matrix become 0, a shifted matrix obtained by cyclically shifting the unit matrix or the quasi unit matrix, a sum matrix that is a sum of a plurality of matrixes of the unit matrix, the quasi unit matrix, or the shifted matrix, and a P×P zero matrix, that is, a parity check matrix (transformed parity check matrix) that can be represented by a combination of constitutive matrixes, and an architecture in which P check node operations and variable node operations can be simultaneously performed in the decoding of the LDPC code can be adopted. Thereby, an operation frequency is suppressed in a realizable range by simultaneously performing the P node operations and multiple repetition decoding can be performed.

The LDPC decoder 166 that constitutes the receiving device 12 of FIG. 152 performs the LDPC decoding by simultaneously performing P check node operations and variable node operations, similar to the decoding device of FIG. 158.

That is, for the simplification of explanation, if the parity check matrix of the LDPC code output by the LDPC encoder 115 constituting the transmitting device 11 of FIG. 8 is regarded as the parity check matrix H illustrated in FIG. 155 in which the parity matrix becomes a staircase structure, in the parity interleaver 23 of the transmitting device 11, the parity interleave to interleave the (K+qx+y+1)-th code bit into the position of the (K+Py+x+1)-th code bit is performed in a state in which the information K is set to 60, the column number P of the unit of the cyclic structure is set to 5, and the divisor q (=M/P) of the parity length M is set to 6.

Because the parity interleave corresponds to the column replacement of the expression (12) as described above, it is not necessary to perform the column replacement of the expression (12) in the LDPC decoder 166.

For this reason, in the receiving device 12 of FIG. 152, as described above, the LDPC code in which the parity deinterleave is not performed, that is, the LDPC code in a state in which the column replacement of the expression (12) is performed is supplied from the column twist deinterleaver 55 to the LDPC decoder 166. In the LDPC decoder 166, the same processing as the decoding device of FIG. 158, except that the column replacement of the expression (12) is not performed, is executed.

That is, FIG. 159 illustrates a configuration example of the LDPC decoder 166 of FIG. 152.

In FIG. 159, the LDPC decoder 166 has the same configuration as the decoding device of FIG. 158, except that the reception data rearranging unit 310 of FIG. 158 is not provided, and executes the same processing as the decoding device of FIG. 158, except that the column replacement of the expression (12) is not performed. Therefore, explanation of the LDPC decoder is omitted.

As described above, because the LDPC decoder 166 can be configured without providing the reception data rearranging unit 310, a scale can be decreased as compared with the decoding device of FIG. 158.

In FIGS. 155 to 159, for the simplification of explanation, the code length N of the LDPC code is set to 90, the information length K is set to 60, the column number (the row number and the column number of the constitutive matrix) P of the unit of the cyclic structure is set to 5, and the divisor q (=M/P) of the parity length M is set to 6. However, the code length N, the information length K, the column number P of the unit of the cyclic structure, and the divisor q (=M/P) are not limited to the above values.

That is, in the transmitting device 11 of FIG. 8, the LDPC encoder 115 outputs the LDPC code in which the code length N is set to 64800 or 16200, the information length K is set to N−Pq (=N−M), the column number P of the unit of the cyclic structure is set to 360, and the divisor q is set to M/P. However, the LDPC decoder 166 of FIG. 159 can be applied to the case in which P check node operation and variable node operations are simultaneously performed with respect to the LDPC code and the LDPC decoding is performed.

FIG. 160 is an illustration of processing of the multiplexer 54 constituting the bit deinterleaver 165 of FIG. 153.

That is, A of FIG. 160 illustrates a functional configuration example of the multiplexer 54.

The multiplexer 54 includes a reverse interchanging unit 1001 and a memory 1002.

The multiplexer 54 executes reverse interchange processing (reverse processing of the interchange processing) corresponding to the interchange processing executed by the demultiplexer 25 of the transmitting device 11, that is, reverse interchange processing for returning positions of the code bits (symbol bits) of the LDPC codes interchanged by the interchange processing to original positions, with respect to the symbol bits of the symbol supplied from the QAM decoder 164 of the previous step, and supplies an LDPC code obtained as a result to the column twist deinterleaver 55 of the following step.

That is, in the multiplexer 54, symbol bits $y_0, y_1, \ldots,$ and $y_{mb-1}$ of mb bits of b symbols are supplied to the reverse interchanging unit 1001 in a unit of the b (consecutive) symbols.

The reverse interchanging unit 1001 performs reverse interchanging for returning the symbol bits $y_0, y_1, \ldots,$ and $y_{mb-1}$ of the mb bits to an arrangement of code bits $b_0, b_1, \ldots,$ and $b_{mb-1}$ of original mb bits (arrangement of the code bits $b_0$ to $b_{mb-1}$ before interchanging is performed in the interchanging unit 32 constituting the demultiplexer 25 of the side of the transmitting apparatus 11) and outputs the code bits $b_0$ to $b_{mb-1}$ of the mb bits obtained as a result.

The memory 1002 has a storage capacity to store the mb bits in a row (transverse) direction and store N/(mb) bits in a column (longitudinal) direction, similar to the memory 31 constituting the demultiplexer 25 of the side of the transmitting device 11. That is, the memory 1002 includes mb columns that store N/(mb) bits.

However, in the memory 1002, writing of the code bits of the LDPC code output by the reverse interchanging unit 1001 is performed in a direction in which reading of the code bits from the memory 31 of the demultiplexer 25 of the transmitting device 11 is performed and reading of the code bits written to the memory 1002 is performed in a direction in which writing of the code bits to the memory 31 is performed.

That is, in the multiplexer 54 of the receiving device 12, as illustrated by A of FIG. 160, writing of the code bits of the LDPC code output by the reverse interchanging unit 1001 in the row direction in a unit of the mb bits is sequentially performed toward the lower rows from the first row of the memory 1002.

If writing of the code bits corresponding to one code length ends, the multiplexer 54 reads the code bits from the memory 1002 in the column direction and supplies the code bits to the column twist deinterleaver 55 of a following step.

In this case, B of FIG. 160 is an illustration of reading of the code bits from the memory 1002.

In the multiplexer 54, reading of the code bits of the LDPC code in the downward direction (column direction) from the upper side of the columns constituting the memory 1002 is performed toward the columns of the rightward direction from the left side.

FIG. 161 is an illustration of processing of the column twist deinterleaver 55 constituting the bit deinterleaver 165 of FIG. 153.

That is, FIG. 161 illustrates a configuration example of the memory 1002 of the multiplexer 54.

The memory 1002 has a storage capacity to store the mb bits in the column (longitudinal) direction and store the N/(mb) bits in the row (transverse) direction and includes mb columns.

The column twist deinterleaver 55 writes the code bits of the LDPC code to the memory 1002 in the row direction, controls a read start position when the code bits are read in the column direction, and performs the column twist deinterleave.

That is, in the column twist deinterleaver 55, a read start position to start reading of the code bits is appropriately changed with respect to each of the plurality of columns and the reverse rearrangement processing for returning the arrangement of the code bits rearranged by the column twist interleave to the original arrangement is executed.

In this case, FIG. 161 illustrates a configuration example of the memory 1002 when the modulation method is the 16 QAM and the multiple b is 1. Therefore, a bit number m of one symbol is 4 bits and the memory 1002 includes four (=mb) columns.

The column twist deinterleaver 55, (instead of the multiplexer 54), sequentially performs writing of the code bits of the LDPC code output by the interchanging unit 1001 in the row direction, toward the lower rows from the first row of the memory 1002.

If writing of the code bits corresponding to one code length ends, the column twist deinterleaver 55 performs reading of the code bits in the downward direction (column direction) from the upper side of the memory 1002, toward the columns of the rightward direction from the left side.

However, the column twist deinterleaver 55 performs reading of the code bits from the memory 1002, using the write start position to write the code bits by the column twist interleaver 24 of the side of the transmitting device 11 as the read start position of the code bits.

That is, if an address of a position of a head (top) of each column is set to 0 and an address of each position of the column direction is represented by an integer of ascending order, when the modulation method is the 16 QAM and the multiple b is 1, in the column twist deinterleaver 55, a read start position is set as a position of which an address is 0, with respect the leftmost column. With respect the second column (from the left side), a read start position is set as a position of which an address is 2. With respect the third column, a read start position is set as a position of which an address is 4. With respect the fourth column, a read start position is set as a position of which an address is 7.

With respect to the columns in which the read start positions are the positions other than the position of which the address is 0, after reading of the code bits is performed to the lowermost position, the position returns to the head (position of which the address is 0), and reading to the position immediately before the read start position is performed. Then, reading from a next (right) column is performed.

By performing the column twist deinterleave described above, the arrangement of the code bits that are rearranged by the column twist interleave returns to the original arrangement.

FIG. 162 is a block diagram illustrating another configuration example of the bit deinterleaver 165 of FIG. 152.

In the drawings, portions that correspond to the case of FIG. 153 are denoted with the same reference numerals and explanation thereof is appropriately omitted hereinafter.

That is, the bit deinterleaver 165 of FIG. 162 has the same configuration as the case of FIG. 153, except that a parity deinterleaver 1011 is newly provided.

In FIG. 162, the bit deinterleaver 165 includes a multiplexer (MUX) 54, a column twist deinterleaver 55, and a parity deinterleaver 1011 and performs bit deinterleave of code bits of the LDPC code supplied from the QAM decoder 164.

That is, the multiplexer 54 executes the reverse interchange processing (reverse processing of the interchange processing) corresponding to the interchange processing executed by the demultiplexer 25 of the transmitting device 11, that is, the reverse interchange processing for returning the positions of the code bits interchanged by the interchange processing to the original positions, with respect to the LDPC code supplied from the QAM decoder 164, and supplies an LDPC code obtained as a result to the column twist deinterleaver 55.

The column twist deinterleaver 55 performs the column twist deinterleave corresponding to the column twist interleave as the rearranging processing executed by the column twist interleaver 24 of the transmitting device 11, with respect to the LDPC code supplied from the multiplexer 54.

The LDPC code that is obtained as a result of the column twist deinterleave is supplied from the column twist deinterleaver 55 to the parity deinterleaver 1011.

The parity deinterleaver 1011 performs the parity deinterleave (reverse processing of the parity interleave) corresponding to the parity interleave performed by the parity interleaver 23 of the transmitting device 11, that is, the parity deinterleave to return the arrangement of the code bits of the LDPC code of which an arrangement is changed by the parity interleave to the original arrangement, with respect to the code bits after the column twist deinterleave in the column twist deinterleaver 55.

The LDPC code that is obtained as a result of the parity deinterleave is supplied from the parity deinterleaver 1011 to the LDPC decoder 166.

Therefore, in the bit deinterleaver 165 of FIG. 162, the LDPC code in which the reverse interchange processing, the column twist deinterleave, and the parity deinterleave are performed, that is, the LDPC code that is obtained by the LDPC encoding according to the parity check matrix H is supplied to the LDPC decoder 166.

The LDPC decoder 166 performs the LDPC decoding of the LDPC code supplied from the bit deinterleaver 165, using the parity check matrix H used by the LDPC encoder 115 of the transmitting device 11 to perform the LDPC encoding or a transformed parity check matrix obtained by performing at least column replacement corresponding to the parity interleave with respect to the parity check matrix H, and outputs data obtained as a result to a decoding result of LDPC target data.

In FIG. 162, the LDPC code that is obtained by the LDPC encoding according to the parity check matrix H is supplied from (the parity deinterleaver 1011 of) the bit deinterleaver 165 to the LDPC decoder 166. For this reason, when the LDPC decoding of the LDPC code is performed using the parity check matrix H used by the LDPC encoder 115 of the transmitting device 11 to perform the LDPC encoding, the LDPC decoder 166 can be configured by a decoding device performing the LDPC decoding according to a full serial decoding method to sequentially perform operations of messages (a check node message and a variable node message) for each node or a decoding device performing the LDPC decoding according to a full parallel decoding method to simultaneously (in parallel) perform operations of messages for all nodes.

In the LDPC decoder 166, when the LDPC decoding of the LDPC code is performed using the transformed parity check matrix obtained by performing at least the column replacement corresponding to the parity interleave with respect to the parity check matrix H used by the LDPC encoder 115 of the transmitting device 11 to perform the LDPC encoding, the LDPC decoder 166 can be configured by a decoding device (FIG. 158) that is a decoding device of an architecture simultaneously performing P (or divisor of P other than 1) check node operations and variable node operations and has the reception data rearranging unit 310 to perform the same column replacement as the column replacement to obtain the transformed parity check matrix with respect to the LDPC code and rearrange the code bits of the LDPC code.

In FIG. 162, for the convenience of explanation, the multiplexer 54 executing the reverse interchange processing, the column twist deinterleaver 55 performing the column twist deinterleave, and the parity deinterleaver 1011 performing the parity deinterleave are individually configured. However, two or more elements of the multiplexer 54, the column twist deinterleaver 55, and the parity deinterleaver 1011 can be integrally configured, similar to the parity interleaver 23, the column twist interleaver 24, and the demultiplexer 25 of the transmitting device 11.

FIG. 163 is a block diagram illustrating a first configuration example of a reception system that can be applied to the receiving device 12.

FIG. 163, the reception system includes an acquiring unit 1101, a transmission path decoding processing unit 1102, and an information source decoding processing unit 1103.

The acquiring unit 1101 acquires a signal including an LDPC code obtained by performing at least LDPC encoding with respect to LDPC target data such as image data or sound data of a program, through a transmission path not illustrated in the drawings, such as terrestrial digital broadcasting, satellite digital broadcasting, a CATV network, the Internet, or other networks, and supplies the signal to the transmission path decoding processing unit 1102.

In this case, when the signal acquired by the acquiring unit 1101 is broadcast from a broadcasting station through a ground wave, a satellite wave, or a CATV (Cable Television) network, the acquiring unit 1101 is configured using a tuner and an STB (Set Top Box). When the signal acquired by the acquiring unit 1101 is transmitted from a web server by multicasting like an IPTV (Internet Protocol Television), the acquiring unit 11 is configured using a network I/F (Interface) such as an NIC (Network Interface Card).

The transmission path decoding processing unit 1102 executes transmission path decoding processing including at least processing for correcting error generated in a transmission path, with respect to the signal acquired by the acquiring unit 1101 through the transmission path, and supplies a signal obtained as a result to the information source decoding processing unit 1103.

That is, the signal that is acquired by the acquiring unit 1101 through the transmission path is a signal that is obtained by performing at least error correction encoding to correct the error generated in the transmission path. The transmission path decoding processing unit 1102 executes transmission path decoding processing such as error correction processing, with respect to the signal.

As the error correction encoding, for example, LDPC encoding or BCH encoding exists. In this case, as the error correction encoding, at least the LDPC encoding is performed.

The transmission path decoding processing includes demodulation of a modulation signal.

The information source decoding processing unit 1103 executes information source decoding processing including at least processing for extending compressed information to original information, with respect to the signal on which the transmission path decoding processing is executed.

That is, compression encoding that compresses information may be performed with respect to the signal acquired by the acquiring unit 1101 through the transmission path to decrease a data amount of an image or a sound corresponding to information. In this case, the information source decoding processing unit 1103 executes the information source decoding processing such as the processing (extension processing) for extending the compressed information to the original information, with respect to the signal on which the transmission path decoding processing is executed.

When the compression encoding is not performed with respect to the signal acquired by the acquiring unit 1101 through the transmission path, the processing for extending the compressed information to the original information is not executed in the information source decoding processing unit 1103.

In this case, as the extension processing, for example, MPEG decoding exists. In the transmission path decoding processing, in addition to the extension processing, descramble may be included.

In the reception system that is configured as described above, in the acquiring unit 1101, a signal in which the compression encoding such as the MPEG encoding and the error correction encoding such as the LDPC encoding are performed with respect to data such as an image or a sound is acquired through the transmission path and is supplied to the transmission path decoding processing unit 1102.

In the transmission path decoding processing unit 1102, the same processing as the orthogonal demodulating unit 51, the QAM decoder 164, the bit deinterleaver 165, and the LDPC decoder 166 (or the LDPC decoder 166) is executed as the transmission path decoding processing with respect to the signal supplied from the acquiring unit 1101 and a signal obtained as a result is supplied to the information source decoding processing unit 1103.

In the information source decoding processing unit 1103, the information source decoding processing such as the MPEG decoding is executed with respect to the signal supplied from the transmission path decoding processing unit 1102 and an image or a sound obtained as a result is output.

The reception system of FIG. 163 described above can be applied to a television tuner to receive television broadcasting corresponding to digital broadcasting.

Each of the acquiring unit 1101, the transmission path decoding processing unit 1102, and the information source decoding processing unit 1103 can be configured as one independent device (hardware (IC (Integrated Circuit) and the like) or software module).

With respect to the acquiring unit 1101, the transmission path decoding processing unit 1102, and the information source decoding processing unit 1103, each of a set of the acquiring unit 1101 and the transmission path decoding processing unit 1102, a set of the transmission path decoding processing unit 1102 and the information source decoding processing unit 1103, and a set of the acquiring unit 1101, the transmission path decoding processing unit 1102, and the information source decoding processing unit 1103 can be configured as one independent device.

FIG. 164 is a block diagram illustrating a second configuration example of the reception system that can be applied to the receiving device 12.

In the drawings, portions that correspond to the case of FIG. 163 are denoted with the same reference numerals and explanation thereof is appropriately omitted hereinafter.

The reception system of FIG. 164 is common to the case of FIG. 163 in that the acquiring unit 1101, the transmission path decoding processing unit 1102, and the information source decoding processing unit 1103 are provided and is different from the case of FIG. 136 in that an output unit 1111 is newly provided.

The output unit 1111 is a display device to display an image or a speaker to output a sound and outputs an image or a sound corresponding to a signal output from the information source decoding processing unit 1103. That is, the output unit 1111 displays the image or outputs the sound.

The reception system of FIG. 164 described above can be applied to a TV (television receiver) receiving television broadcasting corresponding to digital broadcasting or a radio receiver receiving radio broadcasting.

When the compression encoding is not performed with respect to the signal acquired in the acquiring unit 1101, the signal that is output by the transmission path decoding processing unit 1102 is supplied to the output unit 1111.

FIG. 165 is a block diagram illustrating a third configuration example of the reception system that can be applied to the receiving device 12.

In the drawings, portions that correspond to the case of FIG. 163 are denoted with the same reference numerals and explanation thereof is appropriately omitted hereinafter.

The reception system of FIG. 165 is common to the case of FIG. 163 in that the acquiring unit 1101 and the transmission path decoding processing unit 1102 are provided.

However, the reception system of FIG. 165 is different from the case of FIG. 163 in that the information source decoding processing unit 1103 is not provided and a recording unit 1121 is newly provided.

The recording unit 1121 records (stores) a signal (for example, TS packets of TS of MPEG) output by the transmission path decoding processing unit 1102 on recording (storage) media such as an optical disk, a hard disk (magnetic disk), and a flash memory.

The reception system of FIG. 165 described above can be applied to a recorder that records television broadcasting.

In FIG. 165, the reception system is configured by providing the information source decoding processing unit 1103 and can record the signal obtained by executing the information source decoding processing by the information source decoding processing unit 1103, that is, the image or the sound obtained by decoding, by the recording unit 1121.

[Other Example of Interchange Processing in New Interchange Method]

Hereinafter, other example of interchange processing in a new interchange method will be described.

FIG. 166 illustrates the code bit group and the symbol bit group when the LDPC code is an LDPC code f DVB-S.2 in which a code length N is 16200 bits and an encoding rate is 1/3, the modulation method is the 16 QAM, and the multiple b is 2.

In this case, an LDPC code of DVB-S.2 in which a code length N is 16200 bits and an encoding rate is 1/3 can be generated from the parity check matrix initial value table of FIG. 34.

In this case, the code bits of the 4×2 (=mb) bits that are read from the memory 31 can be grouped into 4 code bit groups Gb1, Gb2, Gb3, and Gb4, according to the differences of the error probabilities, as illustrated by A of FIG. 166.

In A of FIG. 166, a code bit b0 belongs to the code bit group Gb1, a code bit b1 belongs to the code bit group Gb2, a code bit b2 belongs to the code bit group Gb3, and code bits b3 to b7 belong to the code bit group Gb4.

When the modulation method is the 16 QAM and the multiple b is 2, the symbol bits of the 4×2 (mb) bits can be grouped into two symbol bit groups Gy1 and Gy2, according to the differences of the error probabilities, as illustrated by B of FIG. 166.

In B of FIG. 166, symbol bits y0, y1, y4, and y5 belong to the symbol bit group Gy1, and symbol bits y2, y3, y6, and y7 belong to the symbol bit group Gy2.

FIG. 167 illustrates an allocation rule when the LDPC code is an LDPC code of DVB-S.2 in which the code length N is 16200 bits and the encoding rate is 1/3, the modulation method is the 16 QAM, and the multiple b is 2.

In the allocation rule of FIG. 167, the group set information (Gb1, Gy2, 1), (Gb2, Gy1, 1), (Gb3, Gy2, 1), (Gb4, Gy1, 3), and (Gb4, Gy2, 2) are defined.

That is, in the allocation rule of FIG. 167, allocation of one bit of the code bits of the code bit group Gb1 having the best error probability to one bit of the symbol bits of the symbol bit group Gy2 having the second best error probability is defined by the group set information (Gb1, Gy2, 1), allocation of one bit of the code bits of the code bit group Gb2 having the second best error probability to one bit of the symbol bits of the symbol bit group Gy1 having the best error probability is defined by the group set information (Gb2, Gy1, 1), allocation of one bit of the code bits of the code bit group Gb3 having the third best error probability to one bit of the symbol bits of the symbol bit group Gy2 having the second best error probability is defined by the group set information (Gb3, Gy2, 1), allocation of three bits of the code bits of the code bit group Gb4 having the fourth best error probability to three bits of the symbol bits of the symbol bit group Gy1 having the best error probability is defined by the group set information (Gb4, Gy1, 3), and allocation of two bits of the code bits of the code bit group Gb4 having the fourth best error probability to two bits of the symbol bits of the symbol bit group Gy2 having the second best error probability is defined by the group set information (Gb4, Gy2, 2).

FIG. 168 illustrates an example of interchanging of the code bits according to the allocation rule of FIG. 167.

That is, A of FIG. 168 illustrates a first example of interchanging of the code bits according to the allocation rule of FIG. 167, when the LDPC code is an LDPC code of DVB-S.2 in which the code length N is 16200 bits and the encoding rate is 1/3, the modulation method is the 16 QAM, and the multiple b is 2.

When the LDPC code is the LDPC code in which the code length N is 16200 bits and the encoding rate is 1/3, the modulation method is the 16 QAM, and the multiple b is 2, in the demultiplexer 25, the code bits written to the memory 31 in which a column direction×a row direction are (16200/(4×2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 168, according to the allocation rule of FIG. 167.

That is, the interchanging unit 32 performs interchanging to allocate the code bits b0, b1, b2, b3, b4, b5, b6, and b7 to the symbol bits y6, y0, y3, y4, y5, y2, y1, and y7, respectively.

B of FIG. 168 illustrates a second example of interchanging of the code bits according to the allocation rule of FIG. 82, when the LDPC code is an LDPC code of DVB-S.2 in which the code length N is 16200 bits and the encoding rate is 1/3, the modulation method is the 16 QAM, and the multiple b is 2.

According to B of FIG. 168, the interchanging unit 32 performs interchanging to allocate the code bits b0, b1, b2, b3, b4, b5, b6, and b7 to the symbol bits y6, y1, y2, y4, y5, y3, y0, and y7, respectively, with respect to the code bits b0 to b7 of the 4×2 (=mb) bits read from the memory 31, according to the allocation rule of FIG. 167.

FIG. 169 illustrates the code bit group and the symbol bit group when the LDPC code is an LDPC code of DVB-S.2 in which the code length is 16200 bits and the encoding rate is 2/5, the modulation method is the 16 QAM, and the multiple b is 2.

In this case, an LDPC code of DVB-S.2 in which a code length N is 16200 bits and an encoding rate is 2/5 can be generated from the parity check matrix initial value table of FIG. 35.

In this case, the code bits of the 4×2 (=mb) bits that are read from the memory 31 can be grouped into 5 code bit groups Gb1, Gb2, Gb3, Gb4, and Gb5, according to the differences of the error probabilities, as illustrated by A of FIG. 169.

In A of FIG. 169, a code bit b0 belongs to the code bit group Gb1, a code bit b1 belongs to the code bit group Gb2, a code bit b2 belongs to the code bit group Gb3, a code bit b3 belongs to the code bit group Gb4, and code bits b4 to b7 belong to the code bit group Gb5.

When the modulation method is the 16 QAM and the multiple b is 2, the symbol bits of the 4×2 (mb) bits can be grouped into three symbol bit groups Gy1 and Gy2, according to the differences of the error probabilities, as illustrated by B of FIG. 169.

In B of FIG. 169, symbol bits y0, y1, y4, and y5 belong to the symbol bit group Gy1, and symbol bits y2, y3, y6, and y7 belong to the symbol bit group Gy2.

FIG. 170 illustrates an allocation rule when the LDPC code is an LDPC code of DVB-S.2 in which the code length N is 16200 bits and the encoding rate is 2/5, the modulation method is the 16 AM, and the multiple b is 2.

In the allocation rule of FIG. 170, the group set information (Gb1, Gy2, 1), (Gb2, Gy1, 1), (Gb3, Gy1, 1), (Gb4, Gy1, 1), (Gb5, Gy2, 3), and (Gb5, Gy1, 1) are defined.

That is, in the allocation rule of FIG. 170, allocation of one bit of the code bits of the code bit group Gb1 having the best error probability to one bit of the symbol bits of the symbol bit group Gy2 having the second best error probability is defined by the group set information (Gb1, Gy2, 1), allocation of one bit of the code bits of the code bit group Gb2 having the second best error probability to one bit of the symbol bits of the symbol bit group Gy1 having the best error probability is defined by the group set information (Gb2, Gy1, 1), allocation of one bit of the code bits of the code bit group Gb3 having the third best error probability to one bit of the symbol bits of the symbol bit group Gy1 having the best error probability is defined by the group set information (Gb3, Gy1, 1), allocation of one bit of the code bits of the code bit group Gb4 having the fourth best error probability to one bit of the symbol bits of the symbol bit group Gy1 having the best error probability is defined by the group set information (Gb4, Gy1, 1), allocation of three bits of the code bits of the code bit group Gb5 having the fifth best error probability to three bits of the symbol bits of the symbol bit group Gy2 having the second best error probability is defined by the group set information (Gb5, Gy2, 3), and allocation of one bit of the code bits of the code bit group Gb5 having the fifth best error probability to one bit of the symbol bits of the symbol bit group Gy1 having the best error probability is defined by the group set information (Gb5, Gy1, 1).

FIG. 171 illustrates an example of interchanging of the code bits according to the allocation rule of FIG. 170.

That is, A of FIG. 171 illustrates a first example of interchanging of the code bits according to the allocation rule of FIG. 170, when the LDPC code is an LDPC code of DVB-S.2 in which the code length N is 16200 bits and the encoding rate is 2/5, the modulation method is the 16 QAM, and the multiple b is 2.

When the LDPC code is the LDPC code in which the code length N is 16200 bits and the encoding rate is 2/5, the modulation method is the 16 QAM, and the multiple b is 2, in the demultiplexer 25, the code bits written to the memory 31 in which a column direction×a row direction are (16200/(4× 2))×(4×2) bits are read in a unit of 4×2 (=mb) bits in the row direction and are supplied to the interchanging unit 32 (FIGS. 18 and 19).

The interchanging unit 32 interchanges the code bits b0 to b7 of the 4×2 (=mb) bits such that the code bits b0 to b7 of the 4×2 (=mb) bits read from the memory 31 are allocated to the symbol bits y0 to y7 of the 4×2 (=mb) bits of the 2 (=b) symbols, as illustrated in A of FIG. 171 for example, according to the allocation rule of FIG. 170.

That is, the interchanging unit 32 performs interchanging to allocate the code bits b0, b1, b2, b3, b4, b5, b6, and b7 to the symbol bits y7, y5, y4, y0, y3, y1, y2, and y6, respectively.

B of FIG. 171 illustrates a second example of interchanging of the code bits according to the allocation rule of FIG. 170, when the LDPC code is an LDPC code of DVB-S.2 in which the code length N is 16200 bits and the encoding rate is 2/5, the modulation method is the 16 QAM, and the multiple b is 2.

According to B of FIG. 171, the interchanging unit 32 performs interchanging to allocate the code bits b0, b1, b2, b3, b4, b5, b6, and b7 to the symbol bits y3, y4, y5, y0, y6, y1, y2, and y7, respectively, with respect to the code bits b0 to b7 of the 4×2 (=mb) bits read from the memory 31, according to the allocation rule of FIG. 173.

FIG. 172 illustrates the code bit group and the symbol bit group when the LDPC code is an LDPC code of DVB-S.2 in which the code length is 16200 bits and the encoding rate is 1/3, the modulation method is the 256 QAM, and the multiple b is 1.

In this case, an LDPC code of DVB-S.2 in which a code length N is 16200 bits and an encoding rate is 1/3 can be generated from the parity check matrix initial value table of FIG. 34.

In this case, the code bits of the 8×1 (=mb) bits that are read from the memory 31 can be grouped into 4 code bit groups Gb1, Gb2, Gb3, and Gb4, according to the differences of the error probabilities, as illustrated by A of FIG. 172.

In A of FIG. 172, a code bit b0 belongs to the code bit group Gb1, a code bit b1 belongs to the code bit group Gb2, a code bit b2 belongs to the code bit group Gb3, and code bits b3 and b4 belong to the code bit group Gb4.

When the modulation method is the 256 QAM and the multiple b is 1, the symbol bits of the 8×1 (mb) bits can be grouped into three symbol bit groups Gy1, Gy2, Gy3,and Gy4, according to the differences of the error probabilities, as illustrated by B of FIG. 172.

In B of FIG. 172, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

FIG. 173 illustrates an allocation rule when the LDPC code is an LDPC code of DVB-S.2 in which the code length N is 16200 bits and the encoding rate is 1/3, the modulation method is the 256 QAM, and the multiple b is 1.

In the allocation rule of FIG. 173, the group set information (Gb1, Gy3, 1), (Gb2, Gy2, 1), (Gb3, Gy4, 1), (Gb4, Gy2, 1), (Gb4, Gy1, 2), (Gb4, Gy4, 1), and (Gb4, Gy3, 1) are defined.

That is, in the allocation rule of FIG. 173, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy2 having the second best error probability is defined by the group set information (Gb2, Gy2, 1), allocation of one bit of the code bits of the code bit group Gb3 having the third best error probability to one bit of the symbol bits of the symbol bit group Gy4 having the fourth best error probability is defined by the group set information (Gb3, Gy4, 1), allocation of one bit of the code bits of the code bit group Gb4 having the fourth best error probability to one bit of the symbol bits of the symbol bit group Gy2 having the second best error probability is defined by the group set information (Gb4, Gy2, 1), allocation of two bits of the code bits of the code bit group Gb4 having the fourth best error probability to two bits of the symbol bits of the symbol bit group Gy1 having the best error probability is defined by the group set information (Gb4, Gy1, 2), allocation of one bit of the code bits of the code bit group Gb4 having the fourth best error probability to one bit of the symbol bits of the symbol bit group Gy4 having the fourth best error probability is defined by the group set information (Gb4, Gy4, 1), and allocation of one bit of the code bits of the code bit group Gb4 having the fourth best error probability to one bit of the symbol bits of the symbol bit group Gy3 having the third best error probability is defined by the group set information (Gb4, Gy3, 1).

FIG. 174 illustrates an example of interchanging of the code bits according to the allocation rule of FIG. 173.

That is, A of FIG. 174 illustrates a first example of interchanging of the code bits according to the allocation rule of FIG. 173, when the LDPC code is an LDPC code of DVB-S.2 in which the code length N is 16200 bits and the encoding rate is 1/3, the modulation method is the 256 QAM, and the multiple b is 1.

When the LDPC code is the LDPC code in which the code length N is 16200 bits and the encoding rate is 1/3, the modulation method is the 256 QAM, and the multiple b is 1, in the demultiplexer 25, the code bits written to the memory 31 in which a column direction×a row direction are (16200/(8×1))×(8×1) bits are read in a unit of 8×1 mb) bits in the row direction and are supplied to the interchanging unit 32 (FIGS. 18 and 19).

The interchanging unit 32 interchanges the code bits b0 to b7 of the 8×1 (=mb) bits such that the code bits b0 to b7 of the 8×1 (=mb) bits read from the memory 31 are allocated to the symbol bits y0 to y7 of the 8×1 (=mb) bits of the 1 (=b) symbol, as illustrated in A of FIG. 174 for example, according to the allocation rule of FIG. 173.

That is, the interchanging unit 32 performs interchanging to allocate the code bits b0, b1, b2, b3, b4, b5, b6, and b7 to the symbol bits y5, y2, y6, y3, y1, y7, y4, and y0, respectively.

B of FIG. 174 illustrates a second example of interchanging of the code bits according to the allocation rule of FIG. 173, when the LDPC code is an LDPC code of DVB-S.2 in which the code length N is 16200 bits and the encoding rate is 1/3, the modulation method is the 256 QAM, and the multiple b is 1.

According to B of FIG. 174, the interchanging unit 32 performs interchanging to allocate the code bits b0, b1, b2, b3, b4, b5, b6, and b7 to the symbol bits y4, y2, y7, y3, y0, y5, y6, and y1, respectively, with respect to the code bits b0 to b7 of the 8×1 mb) bits read from the memory 31, according to the allocation rule of FIG. 173.

FIG. 175 illustrates the code bit group and the symbol bit group when the LDPC code is an LDPC code of DVB-S.2 in which the code length is 16200 bits and the encoding rate is 2/5, the modulation method is the 256 QAM, and the multiple b is 1.

Here, an LDPC code of DVB-S.2 in which a code length N is 16200 bits and an encoding rate is 2/5 can be generated from the parity check matrix initial value table of FIG. 35.

In this case, the code bits of the 8×1 mb) bits that are read from the memory 31 can be grouped into 5 code bit groups Gb1, Gb2, Gb3, Gb4, and Gb5, according to the differences of the error probabilities, as illustrated by A of FIG. 175.

In A of FIG. 175, a code bit b0 belongs to the code bit group Gb1, a code bit b1 belongs to the code bit group Gb2, a code bit b2 belongs to the code bit group Gb3, a code bit b3 belongs to the code bit group Gb4, and code bits b4 to b7 belong to the code bit group Gb5.

When the modulation method is the 256 QAM and the multiple b is 1, the symbol bits of the 8×1 (mb) bits can be grouped into four symbol bit groups Gy1, Gy2, Gy3, and Gy4, according to the differences of the error probabilities, as illustrated by B of FIG. 175.

In B of FIG. 175, symbol bits y0 and y1 belong to the symbol bit group Gy1, symbol bits y2 and y3 belong to the symbol bit group Gy2, symbol bits y4 and y5 belong to the symbol bit group Gy3, and symbol bits y6 and y7 belong to the symbol bit group Gy4.

FIG. 176 illustrates an allocation rule when the LDPC code is an LDPC code in which the code length N is 16200 bits and the encoding rate is 2/5, the modulation method is the 256 QAM, and the multiple b is 1.

In the allocation rule of FIG. 176, the group set information (Gb1, Gy3, 1), (Gb2, Gy4, 1), (Gb3, Gy1, 1), (Gb4, Gy3, 1), (Gb5, Gy4, 1), (Gb5, Gy2, 2), and (Gb5, Gy1, 1) are defined.

That is, in the allocation rule of FIG. 176, allocation of one bit of the code bits of the code bit group Gb1 having the best error probability to one bit of the symbol bits of the symbol bit group Gy3 having the third best error probability is defined by the group set information (Gb1, Gy3, 1), allocation of one bit of the code bits of the code bit group Gb2 having the second best error probability to one bit of the symbol bits of the symbol bit group Gy4 having the fourth best error probability is defined by the group set information (Gb2, Gy4, 1), allocation of one bit of the code bits of the code bit group Gb3 having the third best error probability to one bit of the symbol bits of the symbol bit group Gy1 having the best error probability is defined by the group set information (Gb3, Gy1, 1), allocation of one bit of the code bits of the code bit group Gb4 having the fourth best error probability to one bit of the symbol bits of the symbol bit group Gy3 having the third best error probability is defined by the group set information (Gb4, Gy3, 1), allocation of one bit of the code bits of the code bit group Gb5 having the fifth best error probability to one bit of the symbol bits of the symbol bit group Gy4 having the fourth best error probability is defined by the group set information (Gb5, Gy4, 1), allocation of two bits of the code bits of the code bit group Gb5 having the fifth best error probability to two bits of the symbol bits of the symbol bit group Gy2 having the second best error probability is defined by the group set information (Gb5, Gy2, 2), and allocation of one bit of the code bits of the code bit group Gb5 having the fifth best error probability to one bit of the symbol bits of the symbol bit group Gy1 having the best error probability is defined by the group set information (Gb5, Gy1, 1).

FIG. 177 illustrates an example of interchanging of the code bits according to the allocation rule of FIG. 176.

That is, A of FIG. 177 illustrates a first example of interchanging of the code bits according to the allocation rule of FIG. 176, when the LDPC code is an LDPC code of DVB-S.2 in which the code length N is 16200 bits and the encoding rate is 2/5, the modulation method is the 256 QAM, and the multiple b is 1.

When the LDPC code is the LDPC code in which the code length N is 16200 bits and the encoding rate is 2/5, the modulation method is the 256 QAM, and the multiple b is 1, in the demultiplexer 25, the code bits written to the memory 31 in which a column direction×a row direction are (16200/(8×1))×(8×1) bits are read in a unit of 8×1 (=mb) bits in the row direction and are supplied to the interchanging unit 32 (FIGS. 18 and 19).

The interchanging unit 32 interchanges the code bits b0 to b7 of the 8×1 (=mb) bits such that the code bits b0 to b7 of the 8×1 (=mb) bits read from the memory 31 are allocated to the symbol bits y0 to y7 of the 8×1 (=mb) bits of the 1 (=b) symbol, as illustrated in A of FIG. 177 for example, according to the allocation rule of FIG. 176.

That is, the interchanging unit 32 performs interchanging to allocate the code bits b0, b1, b2, b3, b4, b5, b6, and b7 to the symbol bits y4, y6, y0, y5, y7, y3, y1, and y2, respectively.

B of FIG. 177 illustrates a second example of interchanging of the code bits according to the allocation rule of FIG. 176, when the LDPC code is an LDPC code of DVB-S.2 in which the code length N is 16200 bits and the encoding rate is 2/5, the modulation method is the 256 QAM, and the multiple b is 1.

According to B of FIG. 177, the interchanging unit 32 performs interchanging to allocate the code bits b0, b1, b2, b3, b4, b5, b6, and b7 to the symbol bits y4, y6, y1, y5, y3, y2, y0, and y7, respectively, with respect to the code bits b0 to b7 of the 8×1 (=mb) bits read from the memory 31, according to the allocation rule of FIG. 176.

Next, the series of processing described above can be executed by hardware or can be executed by software. In the case in which the series of processing is executed by the software, a program configuring the software is installed in a general-purpose computer.

Therefore, FIG. 178 illustrates a configuration example of an embodiment of the computer in which a program executing the series of processing is installed.

The program can be previously recorded on a hard disk 705 and a ROM 703 corresponding to recording media embedded in the computer.

Alternatively, the program can be temporarily or permanently stored (recorded) on removable recording media 711 such as a flexible disk, a CD-ROM (Compact Disc Read Only Memory), an MO (Magneto Optical) disk, a DVD (Digital Versatile Disc), a magnetic disk, and a semiconductor memory. The removable recording media 711 can be provided as so-called package software.

The program is installed from the removable recording media 711 to the computer. In addition, the program can be transmitted from a download site to the computer by wireless through an artificial satellite for digital satellite broadcasting or can be transmitted to the computer by wire through a network such as a LAN (Local Area Network) or the Internet.

The computer can receive the program transmitted as described above by a communication unit 708 and install the program in the embedded hard disk 705.

The computer includes a CPU (Central Processing Unit) 702 embedded therein. An input/output interface 710 is connected to the CPU 702 through a bus 701. If a user operates an input unit 707 configured using a keyboard, a mouse, and a microphone and a command is input through the input/output interface 710, the CPU 702 executes the program stored in the ROM (Read Only Memory) 703, according to the command. Alternatively, the CPU 702 loads the program stored in the hard disk 705, the program transmitted from a satellite or a network, received by the communication unit 708, and installed in the hard disk 705, or the program read from the removable recording media 711 mounted to a drive 709 and installed in the hard disk 705 to the RAM (Random Access Memory) 704 and executes the program. Thereby, the CPU 702 executes the processing according to the flowcharts described above or the processing executed by the configurations of the block diagrams described above. In addition, the CPU 702 outputs the processing result from the output unit 706 configured using an LCD (Liquid Crystal Display) or a speaker, transmits the processing result from the communication unit 708, and records the processing result on the hard disk 705, through the input/output interface 710, according to necessity.

In the present specification, it is not necessary to process the processing steps describing the program for causing the computer to execute the various processing in time series according to the order described as the flowcharts and processing executed in parallel or individually (for example, parallel processing or processing using an object) is also included.

The program may be processed by one computer or may be processed by a plurality of computers in a distributed manner. The program may be transmitted to a remote computer and may be executed.

The preferred embodiments of the present invention have been described above with reference to the accompanying drawings, whilst the present invention is not limited to the above examples, of course. A person skilled in the art may find various alternations and modifications within the scope of the appended claims, and it should be understood that they will naturally come under the technical scope of the present invention.

The present technology may also be configured as below.
[Transmitting Device in the Case in which Encoding Rate is 1/3 and Modulation Method is 256 QAM]

A data processing device including:

an encoding unit that performs LDPC encoding in which a code length is 16200 bits and an encoding rate is 1/3, based on a parity check matrix of an LDPC code; and an interchanging unit that interchanges code bits of the encoded LDPC code with symbol bits of a symbol corresponding to any one of 256 signal points determined by 256 QAM, wherein the encoded LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, wherein the parity check matrix initial value table is a table that represents positions of elements of 1 of the information matrix portion for every 360 columns and is configured as follows, 416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267, and wherein, when code bits of 8 bits stored in eight storage units having storage capacities of 16200/8 bits and read from the respective storage units one bit by one bit are allocated to one symbol, the interchanging unit sets a (#i+1)-th bit from a most significant bit of the code bits of the 8 bits as a bit b#i and a (#i+1)-th bit from a most significant bit of symbol bits of 8 bits of one symbol as a bit y#i and interchanges bits b0, b1, b2, b3, b4, b5, b6, and b7 with bits y5, y2, y6, y3, y1, y7, y4, and y0, respectively.

[Transmitting Device in the Case in which Encoding Rate is 2/5 and Modulation Method is 256 QAM]

A data processing device including:

an encoding unit that performs LDPC encoding in which a code length is 16200 bits and an encoding rate is 2/5, based on a parity check matrix of an LDPC code; and an interchanging unit that interchanges code bits of the encoded LDPC code with symbol bits of a symbol corresponding to any one of 256 signal points determined by 256 QAM, wherein the encoded LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, wherein the parity check matrix initial value table is a table that represents positions of elements of 1 of the information matrix portion for every 360 columns and is configured as follows, 5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660, and wherein, when code bits of 8 bits stored in eight storage units having storage capacities of 16200/8 bits and read from the respective storage units one bit by one bit are allocated to one symbol, the interchanging unit sets a (#i+1)-th bit from a most significant bit of the code bits of the 8 bits as a bit b#i and a (#i+1)-th bit from a most significant bit of symbol bits of 8 bits of the one symbol as a bit y#i and interchanges bits b0, b1, b2, b3, b4, b5, b6, and b7 with bits y4, y6 y0, y5, y7, y3, y1, and y2, respectively.

[Receiving Device in the Case in which Encoding Rate is 1/3 and Modulation Method is 256 QAM]

A data processing device including:

a reverse interchanging unit that interchanges symbol bits of a symbol corresponding to any one of 256 signal points determined by 256 QAM with code bits of an LDPC code in which a code length is 16200 bits and an encoding rate is 1/3; and a decoding unit that decodes the LDPC code interchanged by the reverse interchanging unit, based on a parity check matrix of the LDPC code, wherein, when code bits of 8 bits stored in eight storage units having storage capacities of 16200/8 bits and read from the respective storage units one bit by one bit are allocated to one symbol, the reverse interchanging unit sets a (#i+1)-th bit from a most significant bit of the code bits of the 8 bits as a bit b#i and a (#i+1)-th bit from a most significant bit of symbol bits of 8 bits of the one symbol as a bit y#i and interchanges bits y5, y2, y6, y3, y1, y7, y4, and y0 with bits b0, b1, b2, b3, b4, b5, b6, and b7, respectively, wherein the LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, and wherein the parity check matrix initial value table is a table that represents positions of elements of 1 of the information matrix portion for every 360 columns and is configured as follows, 416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267.

[Receiving Device in the Case in which Encoding Rate is 2/5 and Modulation Method is 256 QAM]

A data processing device comprising:

a reverse interchanging unit that interchanges symbol bits of a symbol corresponding to any one of 256 signal points determined by 256 QAM with code bits of an LDPC code in which a code length is 16200 bits and an encoding rate is 2/5; and a decoding unit that decodes the LDPC code interchanged by the reverse interchanging unit, based on a parity check matrix of the LDPC code, wherein, when code bits of 8 bits stored in eight storage units having storage capacities of 16200/8 bits and read from the respective storage units one bit by one bit are allocated to one symbol, the reverse interchanging unit sets a (#i+1)-th bit from a most significant bit of the code bits of the 8 bits as a bit b#i and a (#i+1)-th bit from a most significant bit of symbol bits of 8 bits of the one symbol as a bit y#i and interchanges bits y4, y6, y0, y5, y7, y3, y1, and y2 with bits b0, b1, b2, b3, b4, b5, b6, and b7, respectively, wherein the LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, and wherein the parity check matrix initial value table is a table that represents positions of elements of 1 of the information matrix portion for every 360 columns and is configured as follows, 5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

REFERENCE SIGNS LIST 11 transmitting device
12 receiving device
23 parity interleaver
24 column twist interleaver
25 demultiplexer
31 memory
32 interchanging unit
54 multiplexer
55 column twist interleaver
111 mode adaptation/multiplexer
112 padder
113 BB scrambler
114 BCH encoder
115 LDPC encoder
116 bit interleaver
117 QAM encoder
118 time interleaver
119 MISO/MIMO encoder
120 frequency interleaver
121 BCH encoder
122 LDPC encoder
123 QAM encoder
124 frequency interleaver
131 frame builder/resource allocation unit
132 OFDM generating unit
151 OFDM operating unit
152 frame managing unit
153 frequency deinterleaver
154 QAM decoder
155 LDPC decoder
156 BCH decoder
161 frequency deinterleaver
162 MISO/MIMO decoder
163 time deinterleaver
164 QAM decoder
165 bit deinterleaver
166 LDPC decoder
167 BCH decoder
168 BB descrambler
169 null deletion unit
170 demultiplexer
300 branch data storing memory
301 selector
302 check node calculating unit
303 cyclic shift circuit
304 branch data storing memory
305 selector
306 reception data memory
307 variable node calculating unit
308 cyclic shift circuit
309 decoding word calculating unit
310 reception data rearranging unit
311 decoded data rearranging unit
601 encoding processing unit
602 storage unit
611 encoding rate setting unit
612 initial value table reading unit
613 parity check matrix generating unit
614 information bit reading unit
615 encoding parity operation unit
616 control unit
701 bus
702 CPU
703 ROM
704 RAM
705 hard disk
706 output unit
707 input unit
708 communication unit
709 drive
710 input/output interface
711 removable recording media
1001 reverse interchanging unit
1002 memory
1011 parity deinterleaver
1101 acquiring unit 1101 transmission path decoding processing unit
1103 information source decoding processing unit
1111 output unit
1121 recording unit

The invention claimed is:

1. A data processing device comprising:
an encoding unit that performs LDPC encoding in which a code length is 16200 bits and an encoding rate is 1/3, based on a parity check matrix of an LDPC code; and
an interchanging unit that interchanges code bits of the encoded LDPC code with symbol bits of a symbol corresponding to any one of 16 signal points determined by 16 QAM,
wherein the encoded LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table,
wherein the parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267, and
wherein, when code bits of 8 bits stored in eight storage units having storage capacities of 16200/8 bits and read from the respective storage units one bit by one bit are allocated to two consecutive symbols, the interchanging unit sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y6, y0, y3, y4, y5, y2, y1, and y7, respectively.

2. A data processing device comprising:
an encoding unit that performs LDPC encoding in which a code length is 16200 bits and an encoding rate is 2/5, based on a parity check matrix of an LDPC code; and
an interchanging unit that interchanges code bits of the encoded LDPC code with symbol bits of a symbol corresponding to any one of 16 signal points determined by 16 QAM,
wherein the encoded LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table,
wherein the parity check matrix initial value table is a table that represents positions of elements of 1 of the information matrix portion for every 360 columns and is configured as follows,
5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660, and
wherein, when code bits of 8 bits stored in eight storage units having storage capacities of 16200/8 bits and read from the respective storage units one bit by one bit are allocated to two consecutive symbols, the interchanging unit sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y7, y5 y4, y0, y3, y1, y2, and y6, respectively.

3. A data processing method comprising:
an encoding step that performs LDPC encoding in which a code length is 16200 bits and an encoding rate is 1/3, based on a parity check matrix of an LDPC code; and
an interchanging step that interchanges code bits of the encoded LDPC code with symbol bits of a symbol corresponding to any one of 16 signal points determined by 16 QAM,
wherein the encoded LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table,
wherein the parity check matrix initial value table is a table that represents positions of elements of 1 of the information matrix portion for every 360 columns and is configured as follows,
416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420

6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267, and wherein, when code bits of 8 bits stored in eight storage units having storage capacities of 16200/8 bits and read from the respective storage units one bit by one bit are allocated to two consecutive symbols, the interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y6, y0, y3, y4, y5, y2, y1, and y7, respectively.

4. A data processing method comprising:
an encoding step that performs LDPC encoding in which a code length is 16200 bits and an encoding rate is 2/5, based on a parity check matrix of an LDPC code; and
an interchanging step that interchanges code bits of the encoded LDPC code with symbol bits of a symbol corresponding to any one of 16 signal points determined by 16 QAM,
wherein the encoded LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table,
wherein the parity check matrix initial value table is a table that represents positions of elements of 1 of the information matrix portion for every 360 columns and is configured as follows, 5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660, and wherein, when code bits of 8 bits stored in eight storage units having storage capacities of 16200/8 bits and read from the respective storage units one bit by one bit are allocated to two consecutive symbols, the interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits b0, b1, b2, b3, b4, b5, b6, and b7 with bits y7, y5 y4, y0, y3, y1, y2, and y6, respectively.

5. A data processing device comprising:
a reverse interchanging unit that interchanges symbol bits of a symbol corresponding to any one of 16 signal points determined by 16 QAM with code bits of an LDPC code in which a code length is 16200 bits and an encoding rate is 1/3; and
a decoding unit that decodes the LDPC code interchanged by the reverse interchanging unit, based on a parity check matrix of the LDPC code,
wherein, when code bits of 8 bits stored in eight storage units having storage capacities of 16200/8 bits and read from the respective storage units one bit by one bit are allocated to two consecutive symbols, the reverse interchanging unit sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y6, y0, y3, y4, y5, y2, y1, and y7 with bits b0, b1, b2, b3, b4, b5, b6, and b7, respectively,
wherein the LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table, and
wherein the parity check matrix initial value table is a table that represents positions of elements of 1 of the information matrix portion for every 360 columns and is configured as follows, 416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267.

6. A data processing device comprising:
a reverse interchanging unit that interchanges symbol bits of a symbol corresponding to any one of 16 signal points determined by 16 QAM with code bits of an LDPC code in which a code length is 16200 bits and an encoding rate is 2/5; and
a decoding unit that decodes the LDPC code interchanged by the reverse interchanging unit, based on a parity check matrix of the LDPC code, wherein, when code bits of 8 bits stored in eight storage units having storage capacities of 16200/8 bits and read from the respective storage units one bit by one bit are allocated to two consecutive symbols, the reverse interchanging unit sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y7, y5, y4, y0, y3, y1, y2, and y6 with bits b0, b1, b2, b3, b4, b5, b6, and b7, respectively, wherein the LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, and wherein the parity check matrix initial value table is a table that represents positions of elements of 1 of the information matrix portion for every 360 columns and is configured as follows, 5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

7. A data processing method comprising:
a reverse interchanging step that interchanges symbol bits of a symbol corresponding to any one of 16 signal points determined by 16 QAM with code bits of an LDPC code in which a code length is 16200 bits and an encoding rate is 1/3; and
a decoding step that decodes the LDPC code interchanged by the reverse interchanging step, based on a parity check matrix of the LDPC code,
wherein, when code bits of 8 bits stored in eight storage units having storage capacities of 16200/8 bits and read from the respective storage units one bit by one bit are allocated to two consecutive symbols, the reverse interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y6, y0, y3, y4, y5, y2, y1, and y7 with bits b0, b1, b2, b3, b4, b5, b6, and b7, respectively,
wherein the LDPC code includes information bits and parity bits, wherein the parity check matrix includes an information matrix portion corresponding to the information bits and a parity matrix portion corresponding to the parity bits, wherein the information matrix portion is represented by a parity check matrix initial value table, and wherein the parity check matrix initial value table is a table that represents positions of elements of 1 of the information matrix portion for every 360 columns and is configured as follows, 416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267.

8. A data processing method comprising:
a reverse interchanging step that interchanges symbol bits of a symbol corresponding to any one of 16 signal points determined by 16 QAM with code bits of an LDPC code in which a code length is 16200 bits and an encoding rate is 2/5; and
a decoding step that decodes the LDPC code interchanged by the reverse interchanging step, based on a parity check matrix of the LDPC code,
wherein, when code bits of 8 bits stored in eight storage units having storage capacities of 16200/8 bits and read from the respective storage units one bit by one bit are allocated to two consecutive symbols, the reverse interchanging step sets a (#i+1)-th bit from a most significant bit of the code bits of the 8 bits as a bit b#i and a (#i+1)-th bit from a most significant bit of symbol bits of 8 bits of the two symbols as a bit y#i and interchanges bits y7, y5, y4, y0, y3, y1, y2, and y6 with bits b0, b1, b2, b3, b4, b5, b6, and b7, respectively,
wherein the LDPC code includes information bits and parity bits,
wherein the parity check matrix includes an information matrix portion corresponding to the information bits and a parity matrix portion corresponding to the parity bits,
wherein the information matrix portion is represented by a parity check matrix initial value table, and
wherein the parity check matrix initial value table is a table that represents positions of elements of 1 of the information matrix portion for every 360 columns and is configured as follows, 5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254

4247 888 4367 8821 9660 324 5864 4774 227 7889 6405
8963
9693 500 2520 2227 1811 9330 1928 5140 4030 4824 806
3134
1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660.

\* \* \* \* \*